(12) United States Patent
Sugizaki et al.

(10) Patent No.: US 9,184,361 B2
(45) Date of Patent: Nov. 10, 2015

(54) SEMICONDUCTOR LIGHT EMITTING DEVICE AND METHOD FOR MANUFACTURING THE SAME

(71) Applicant: KABUSHIKI KAISHA TOSHIBA, Tokyo (JP)

(72) Inventors: Yoshiaki Sugizaki, Fujisawa (JP); Akihiro Kojima, Yokohama (JP); Hideto Furuyama, Yokohama (JP); Yosuke Akimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/293,713

(22) Filed: Jun. 2, 2014

(65) Prior Publication Data

US 2014/0302625 A1     Oct. 9, 2014

Related U.S. Application Data

(62) Division of application No. 13/601,487, filed on Aug. 31, 2012, now Pat. No. 8,772,810.

(30) Foreign Application Priority Data

Mar. 26, 2012  (JP) ................. 2012-069504

(51) Int. Cl.
*H01L 21/00*     (2006.01)
*H01L 21/339*    (2006.01)
(Continued)

(52) U.S. Cl.
CPC ............ *H01L 33/647* (2013.01); *H01L 33/385* (2013.01); *H01L 33/502* (2013.01); *H01L 33/20* (2013.01); *H01L 33/505* (2013.01); *H01L 2933/0016* (2013.01)

(58) Field of Classification Search
CPC ................ H01L 33/647; H01L 33/502; H01L 2933/0016
USPC ................ 438/27; 257/98, E33.061
See application file for complete search history.

(56) References Cited

U.S. PATENT DOCUMENTS 8,110,421 B2    2/2012  Sugizaki et al.
9,059,015 B2 *  6/2015  Seo et al. ............... 1/1
(Continued)

FOREIGN PATENT DOCUMENTS

EP    2390933 A1    11/2011
JP    2004172578 A   6/2004
(Continued)

OTHER PUBLICATIONS

Japanese Office Action dated Jul. 9, 2014, filed in Japanese counterpart Application No. 2012-069504, 6 pages (with translation).
(Continued)

*Primary Examiner* — Daniel Shook
*Assistant Examiner* — Moazzam Hossain
(74) *Attorney, Agent, or Firm* — Patterson & Sheridan, LLP

(57) ABSTRACT

According to one embodiment, a semiconductor light emitting device includes: a semiconductor layer including a first face, a second face, a side face, and a light emitting layer; a p-side electrode provided on the second face; an n-side electrode provided on the side face; a first p-side metal layer provided on the p-side electrode; a first n-side metal layer provided on the periphery of the n-side electrode; a first insulating layer provided on a face on the second face side in the first n-side metal layer; a second p-side metal layer connected with the first p-side metal layer on the first p-side metal layer, and provided, extending from on the first p-side metal layer to on the first insulating layer; and a second n-side metal layer provided on a face on the second face side in the first n-side metal layer in a peripheral region of the semiconductor layer.

6 Claims, 110 Drawing Sheets

(51) Int. Cl.
*H01L 33/00* (2010.01)
*H01L 33/64* (2010.01)
*H01L 33/38* (2010.01)
*H01L 33/50* (2010.01)
*H01L 33/20* (2010.01)

(56) References Cited

U.S. PATENT DOCUMENTS

| | | |
|---|---|---|
| 2006/0214173 A1 | 9/2006 | Beeson et al. |
| 2009/0283787 A1 | 11/2009 | Donofrio et al. |
| 2010/0148198 A1 | 6/2010 | Sugizaki et al. |
| 2010/0258822 A1* | 10/2010 | Kobayashi .................... 257/88 |
| 2011/0073890 A1 | 3/2011 | Sugizaki et al. |
| 2011/0284910 A1 | 11/2011 | Iduke et al. |

FOREIGN PATENT DOCUMENTS

| | | |
|---|---|---|
| JP | 2010123717 A | 6/2010 |
| JP | 2010141176 A | 6/2010 |
| JP | 2010251807 A | 11/2010 |
| JP | 201171273 A | 4/2011 |

OTHER PUBLICATIONS

Taiwanese Office Action dated Oct. 22, 2014, filed in Taiwan counterpart Application No. 101145462, 8 pages (with translation).
European Search Report dated Sep. 12, 2013, issued in European counterpart Application No. 12182357.9, 7 pages.
Taiwanese Office Action dated Apr. 20, 2015, filed in Taiwanese counterpart Application No. 101145462, 12 pages (with translation).

* cited by examiner

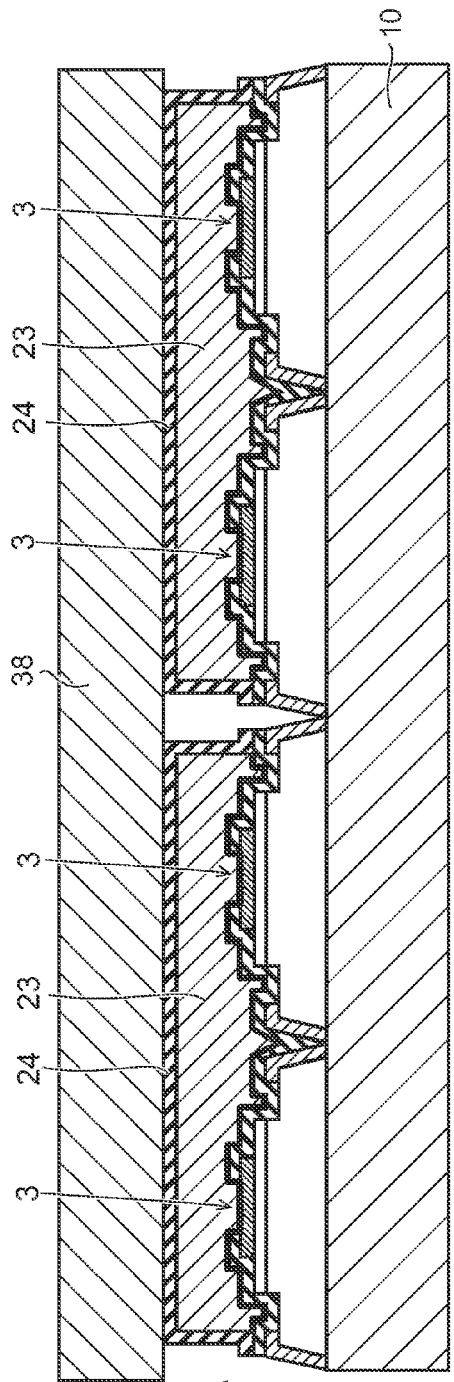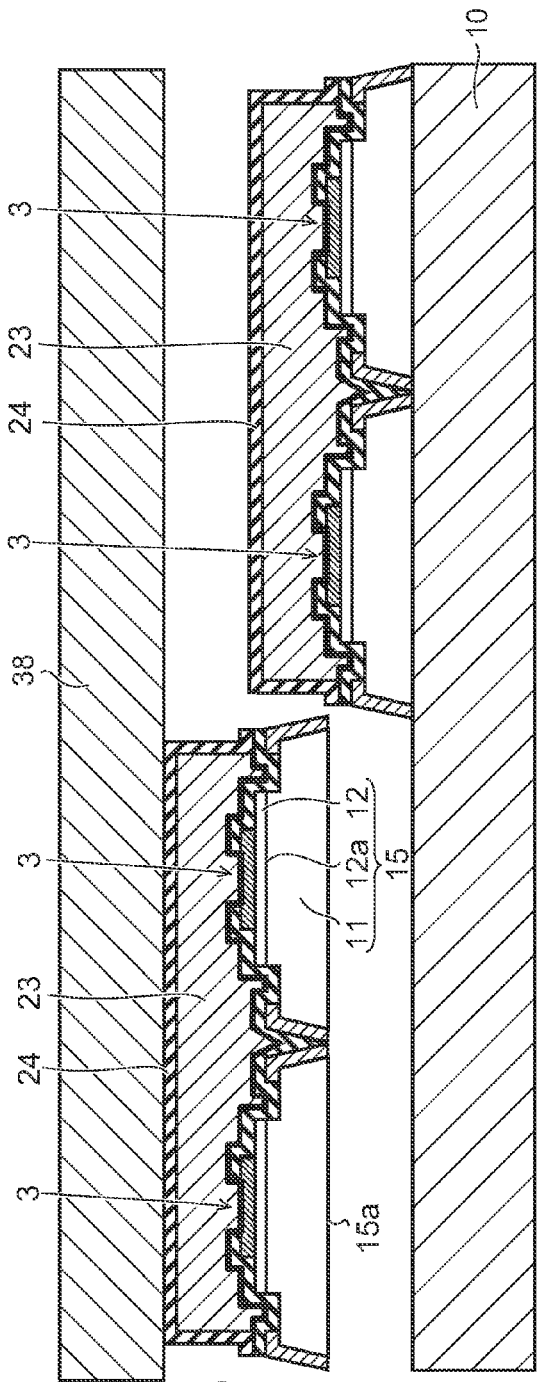

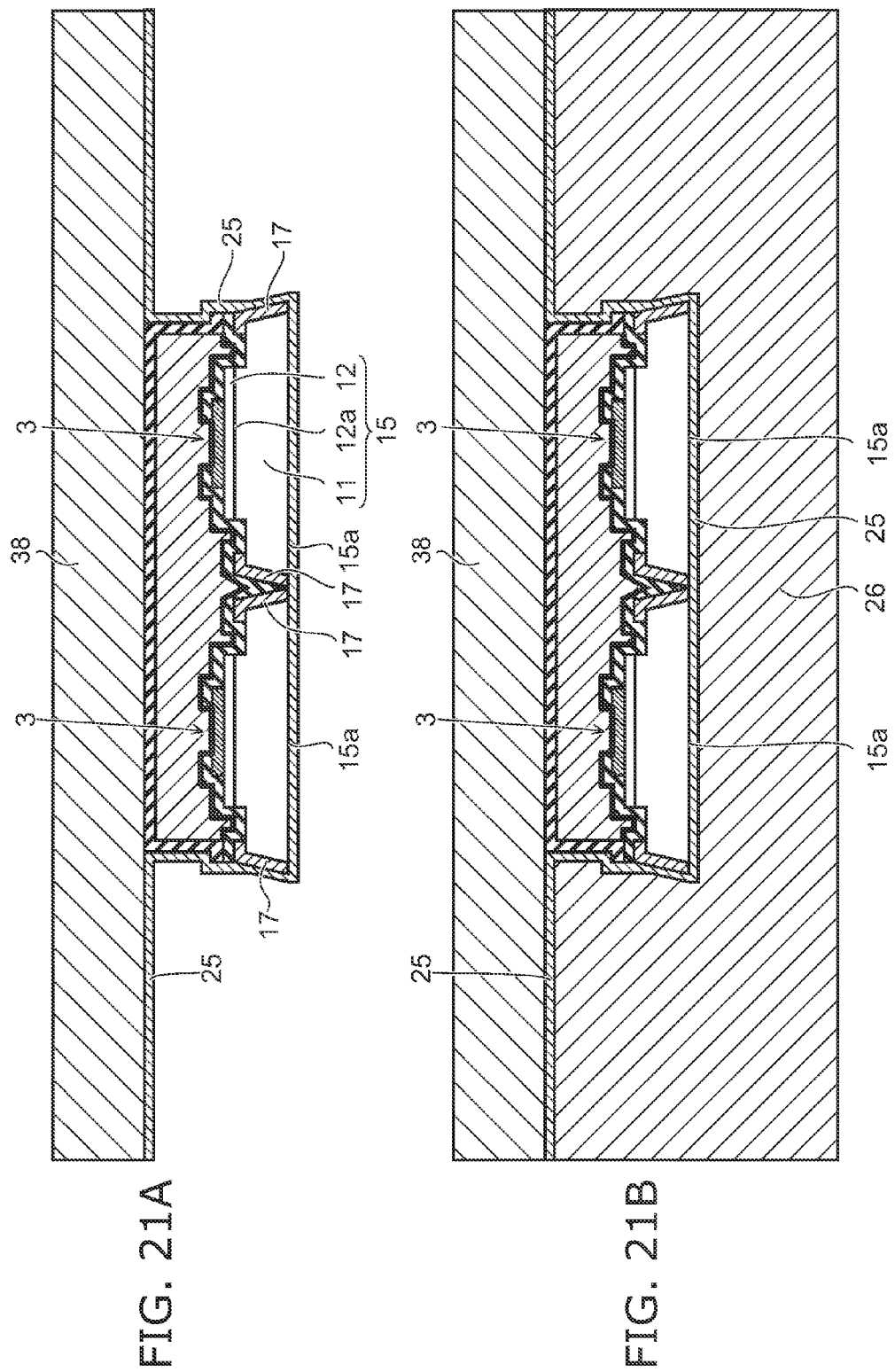

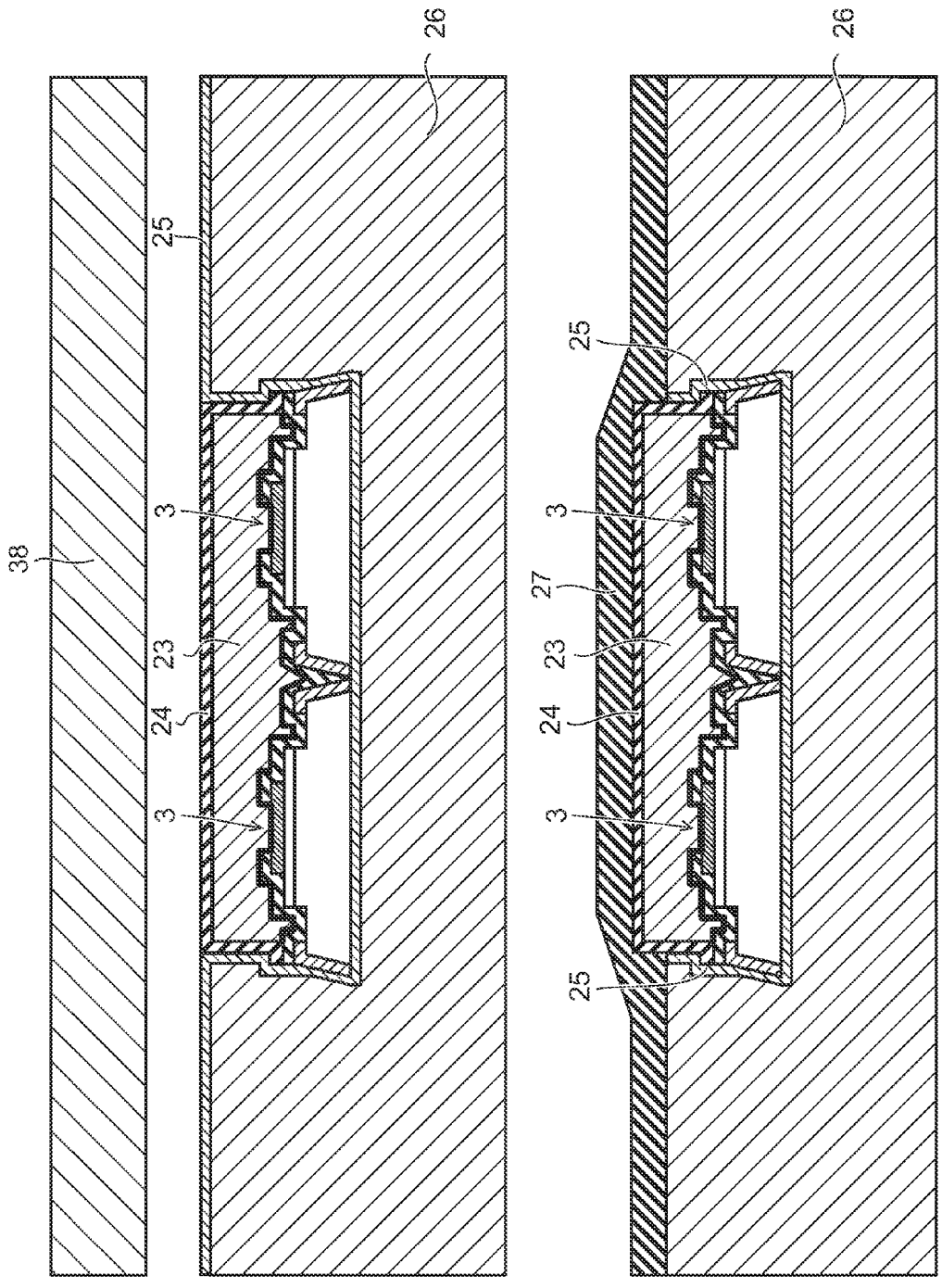

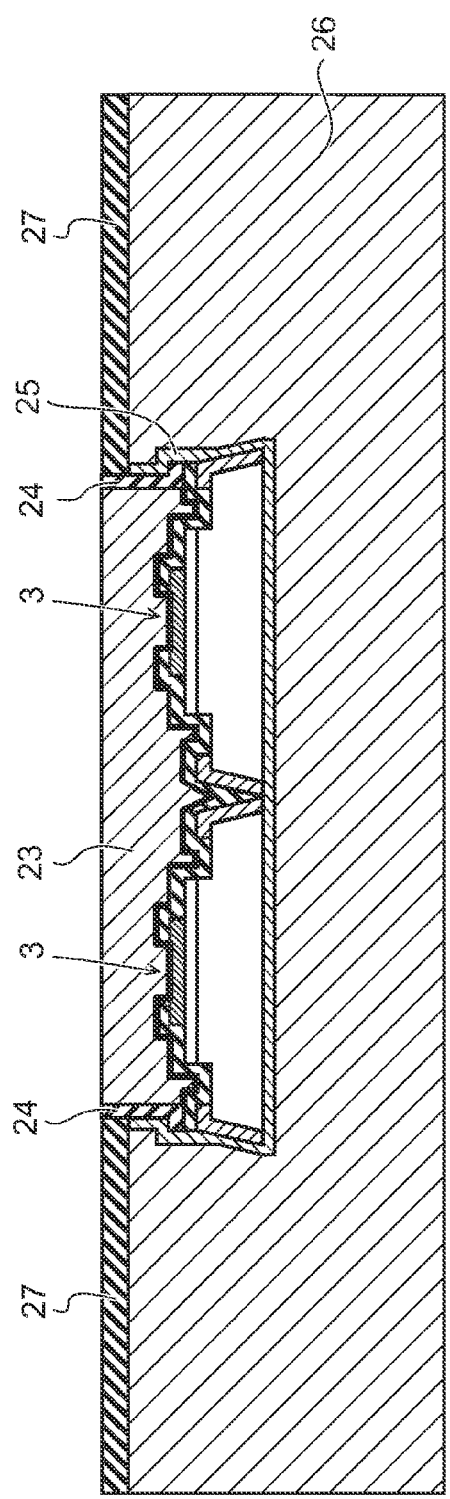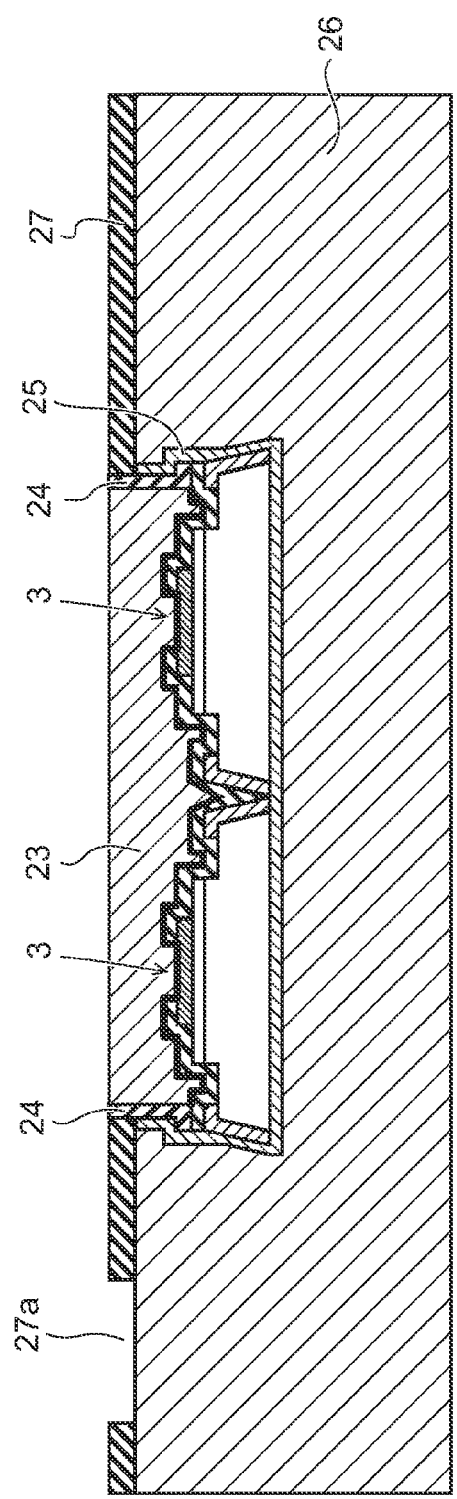
FIG. 23A
FIG. 23B

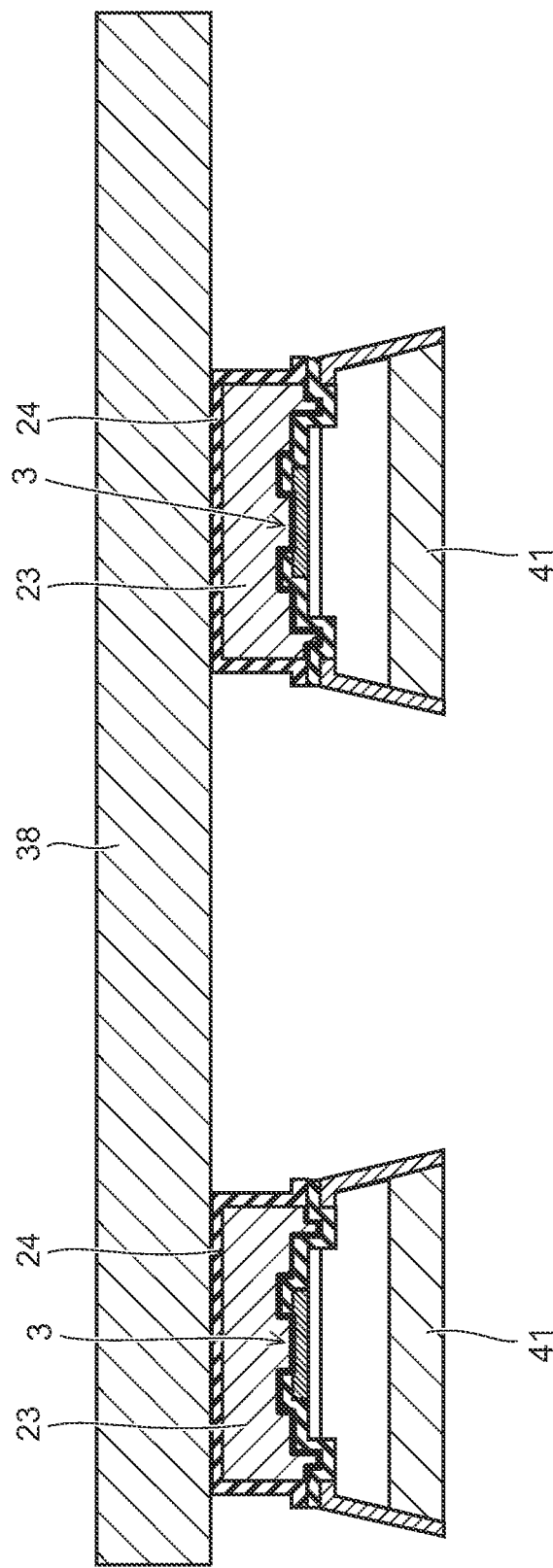

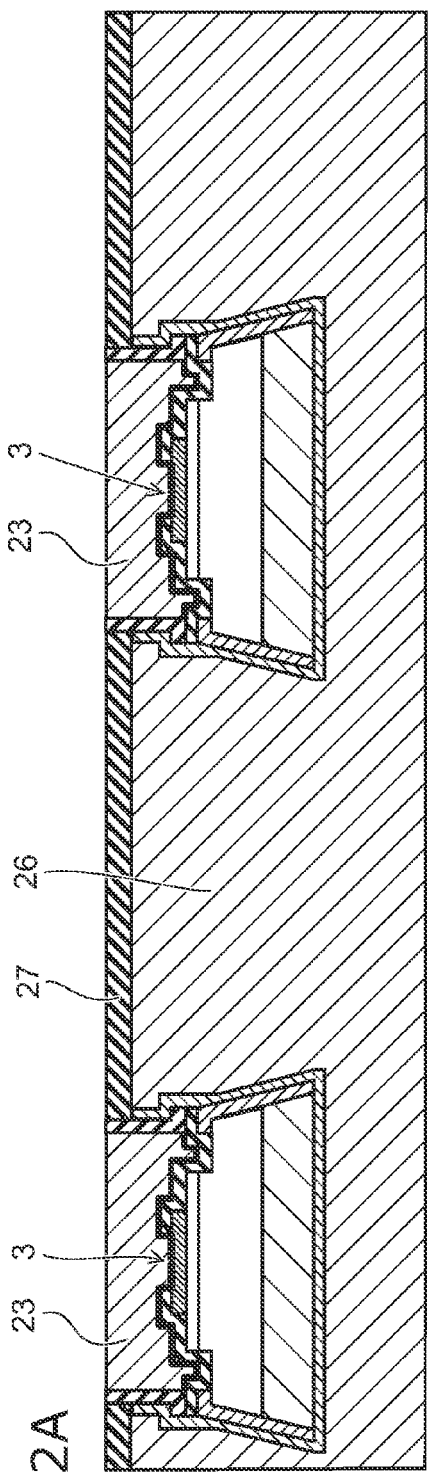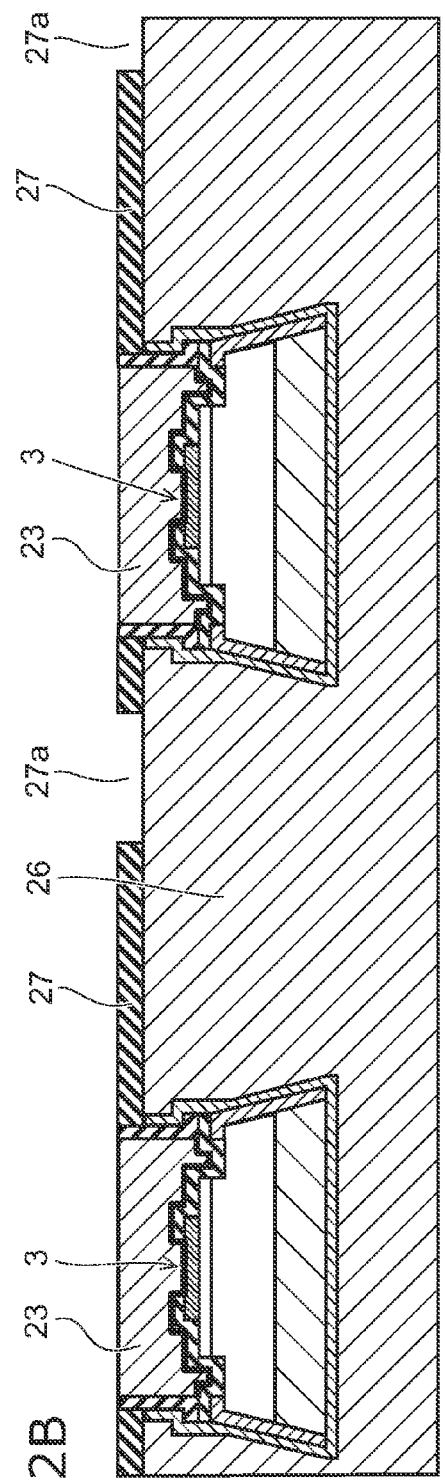

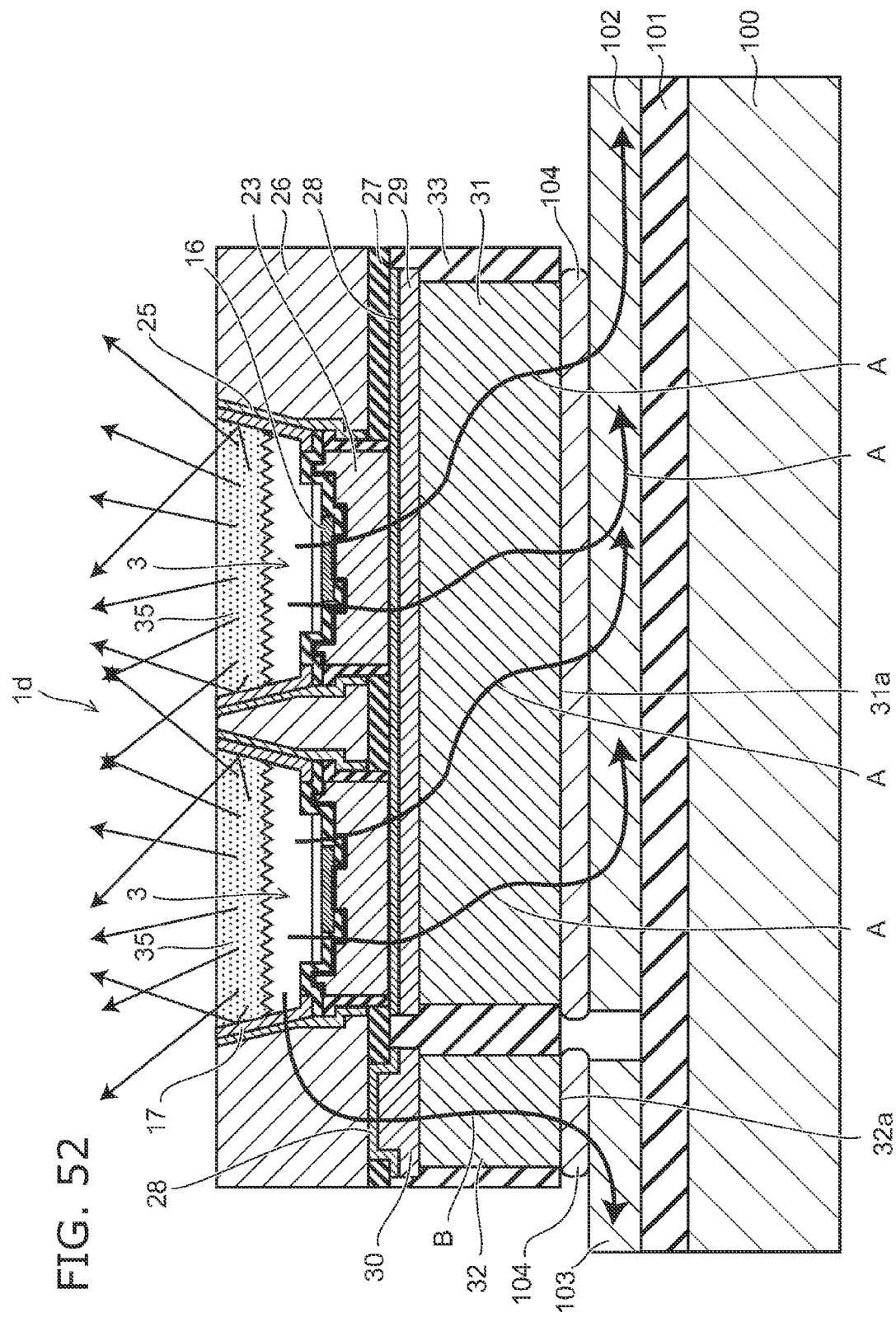

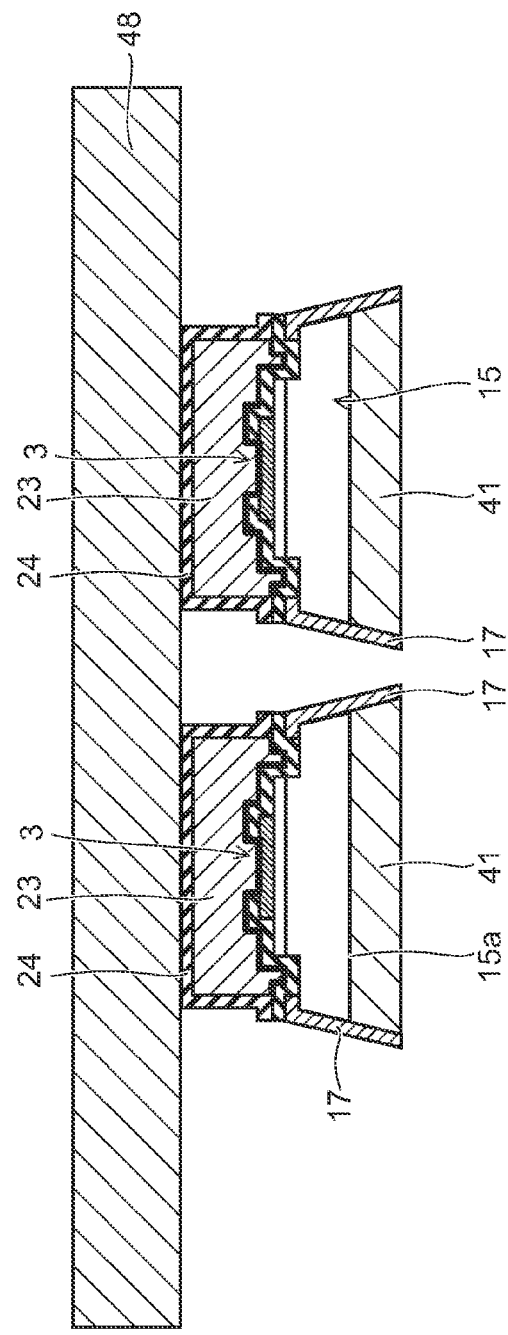
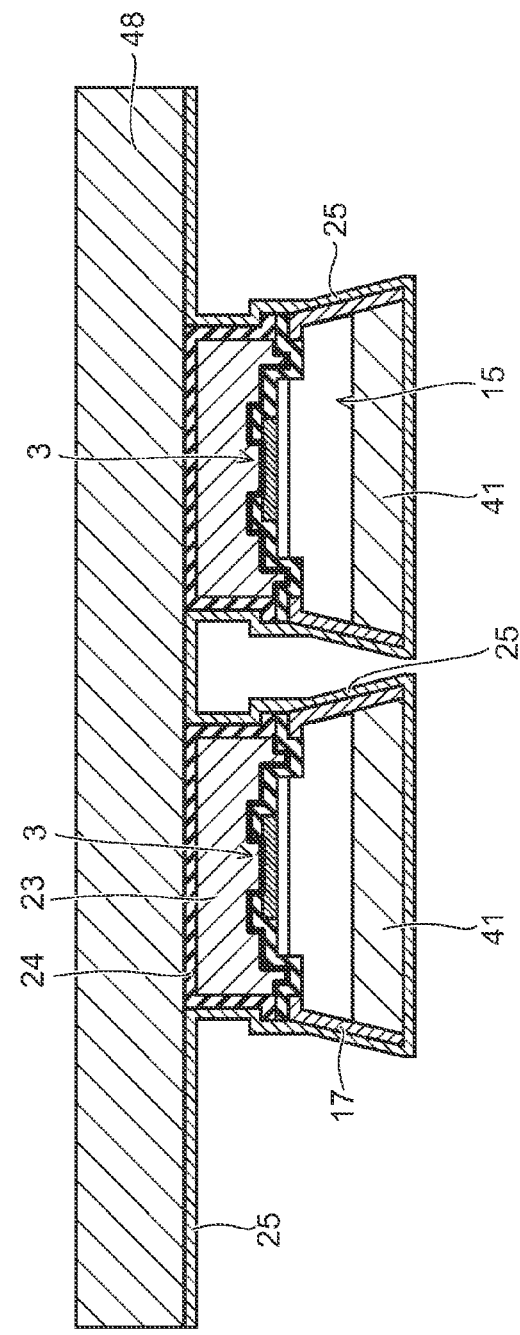
FIG. 53A
FIG. 53B

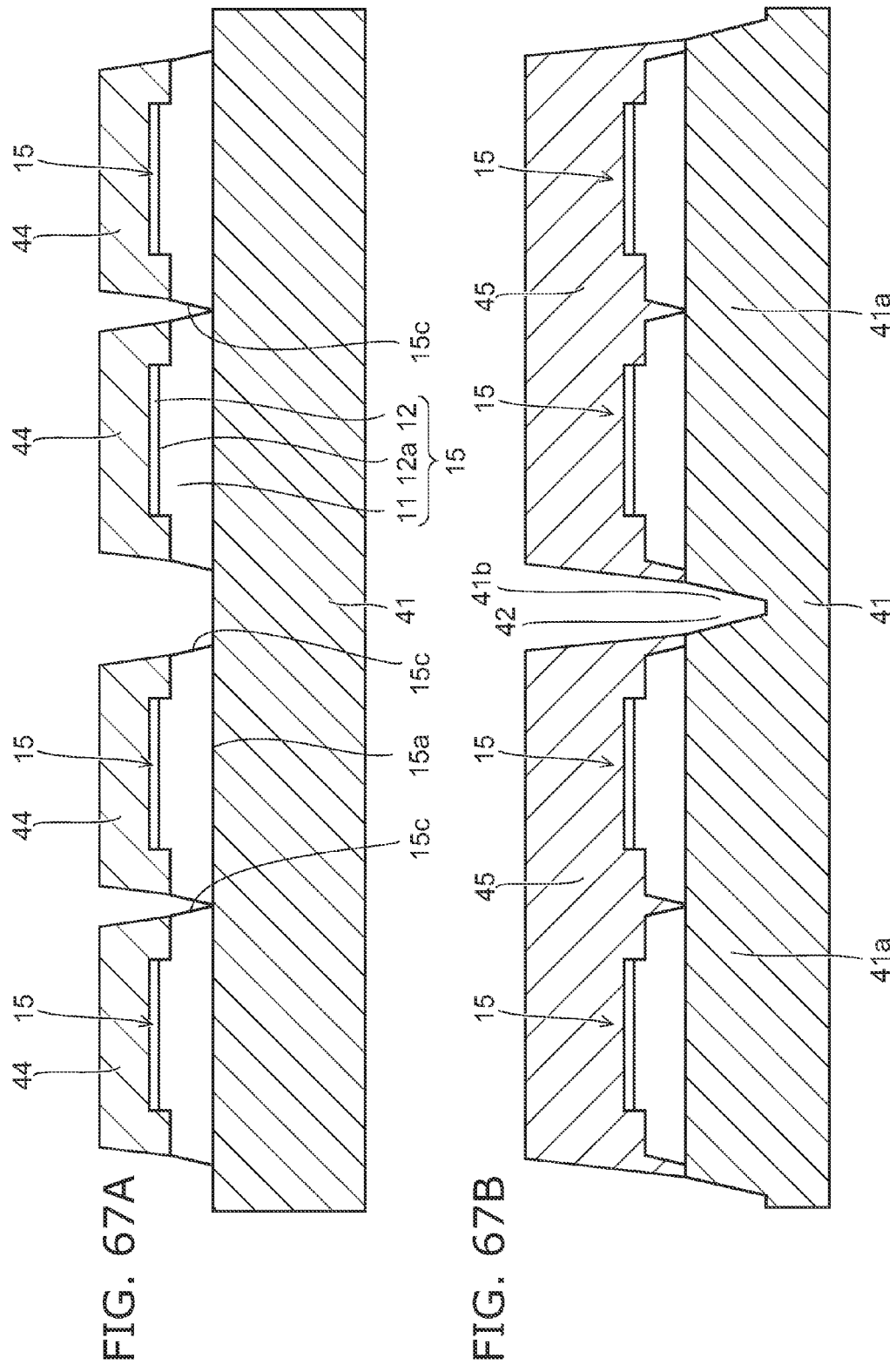

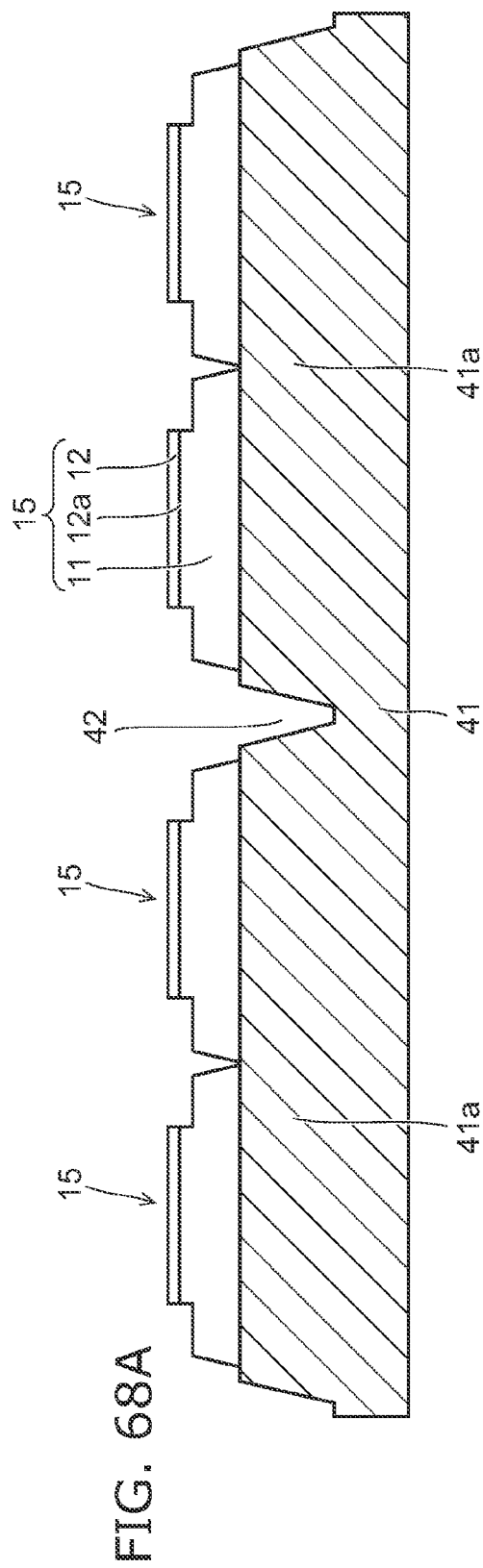
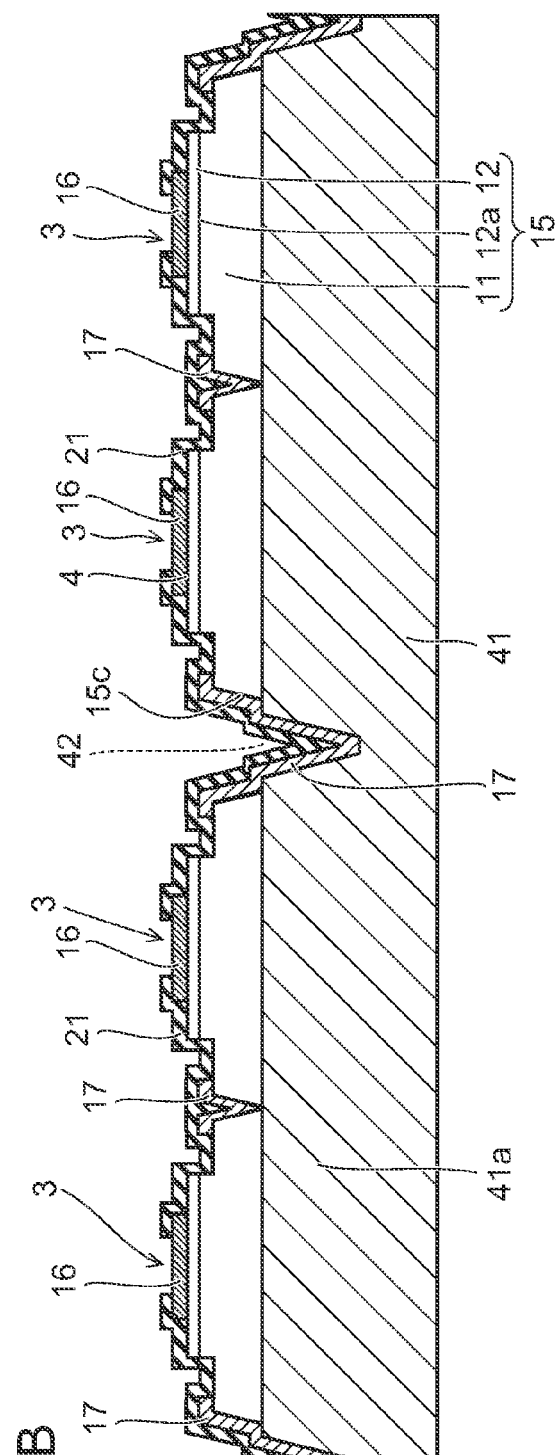

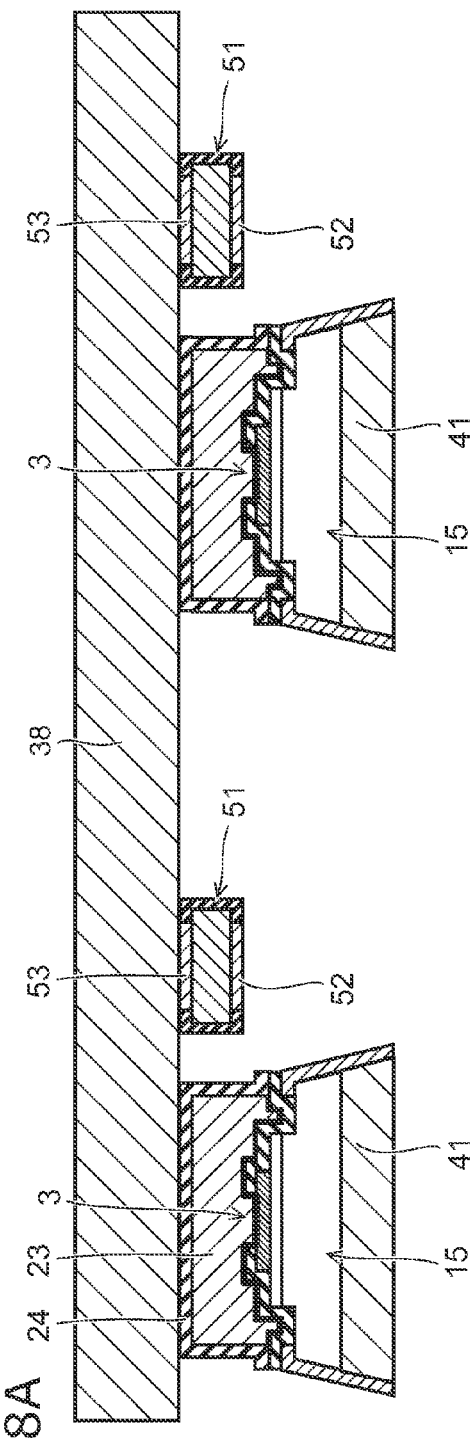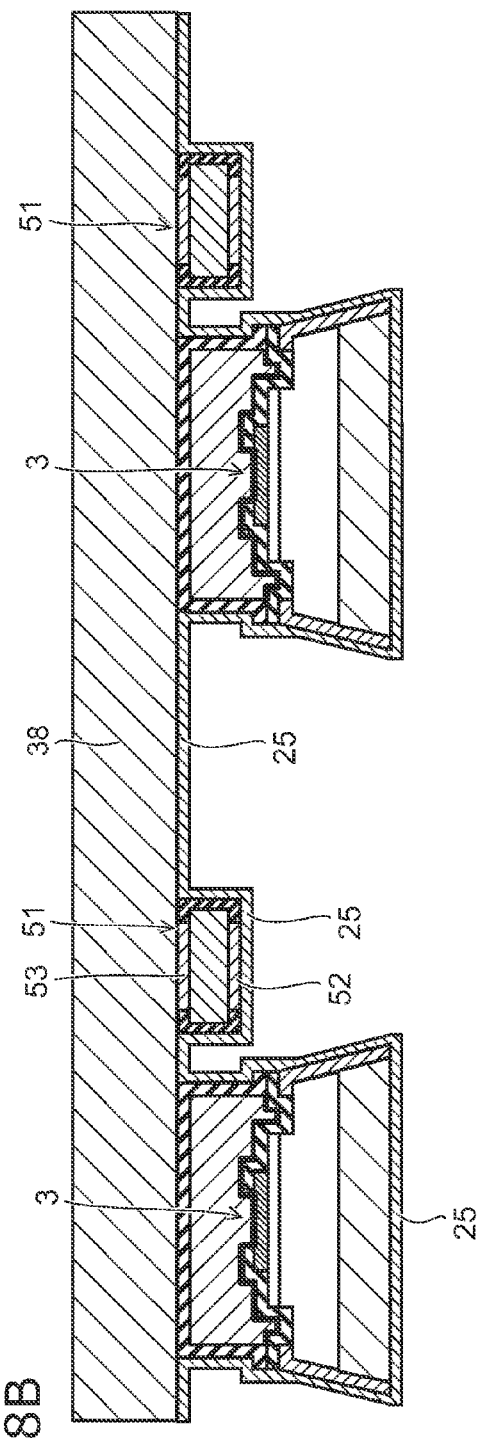

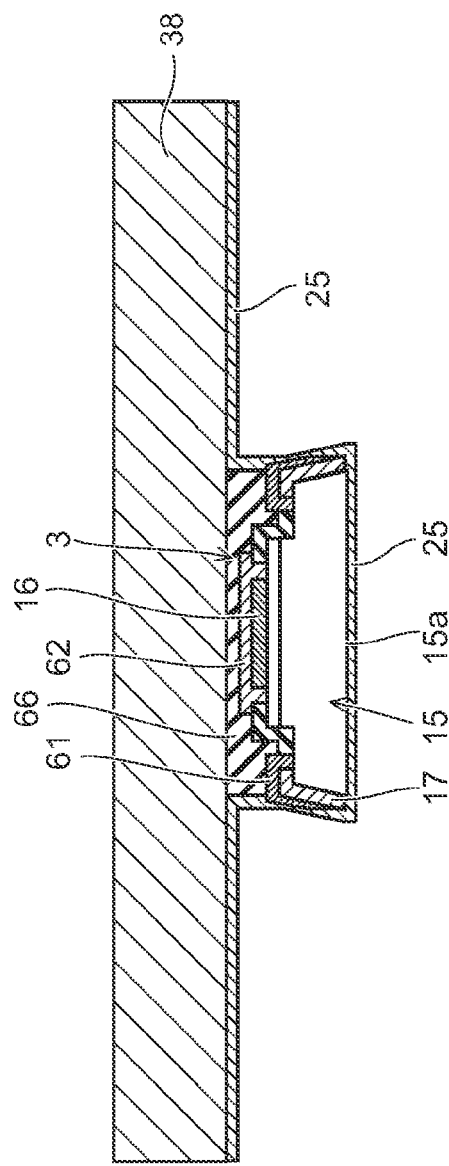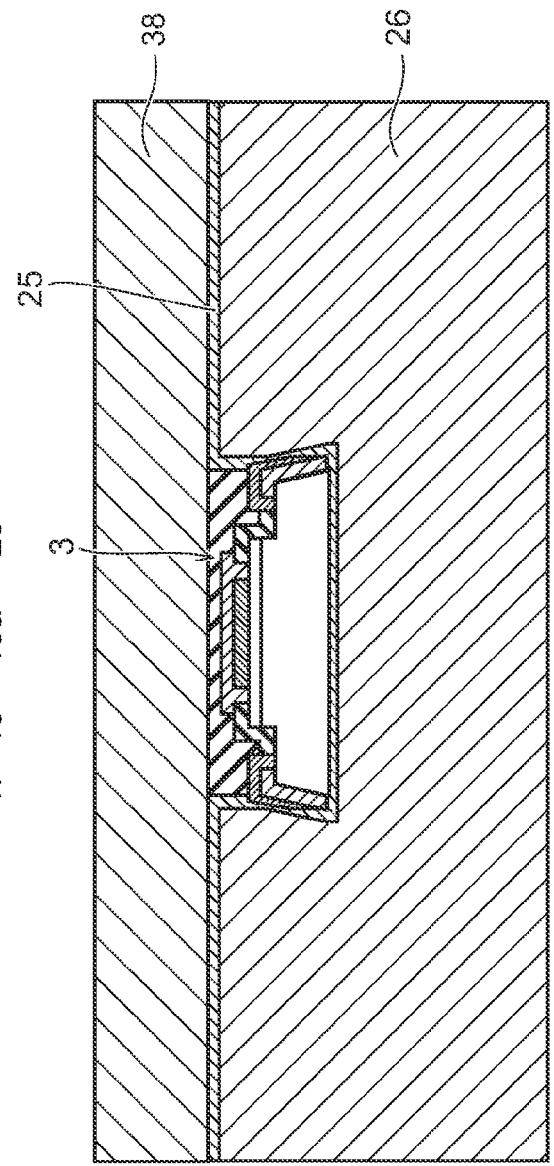

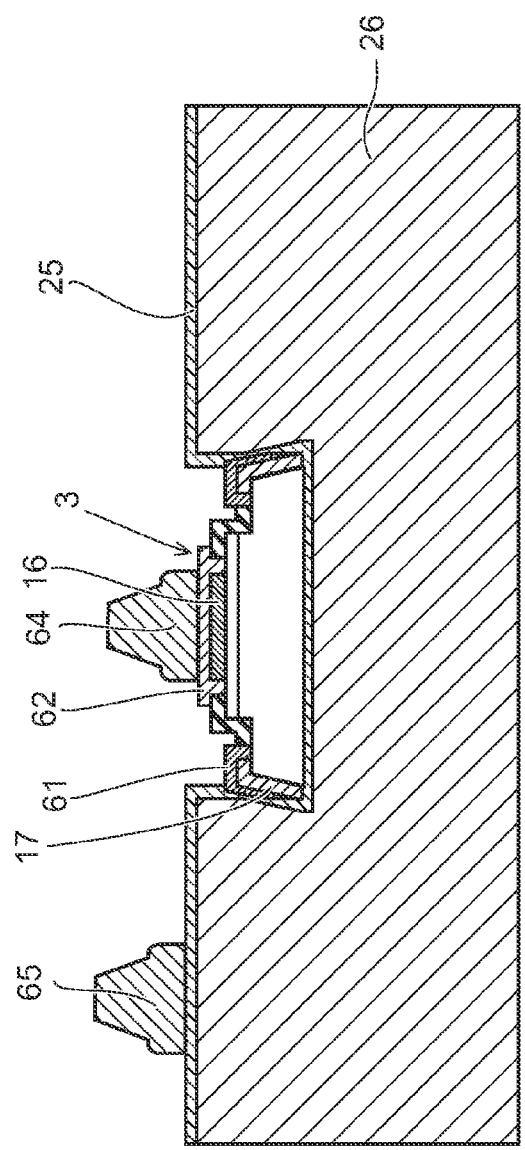
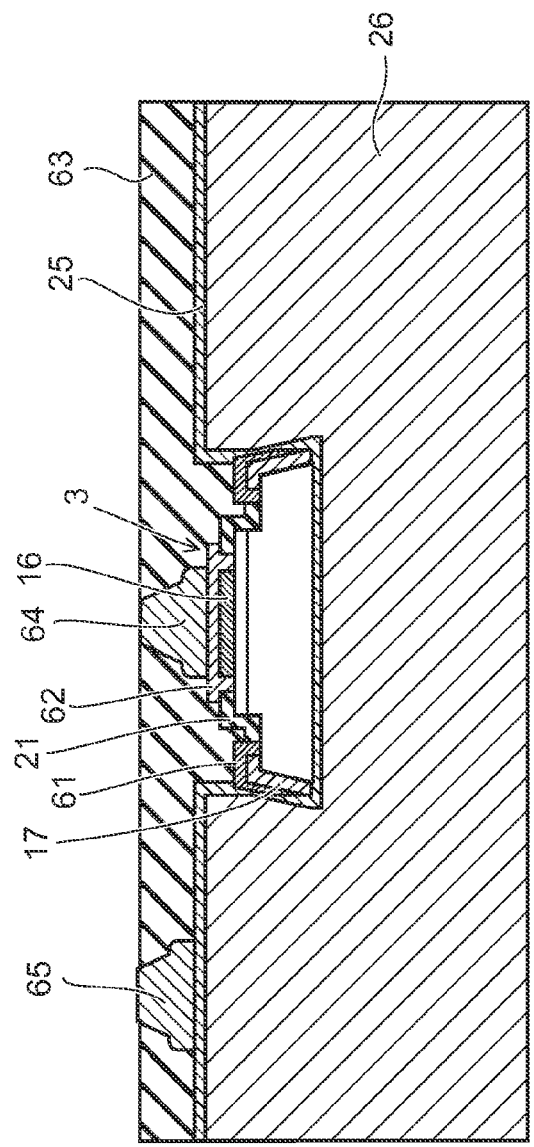
FIG. 106A
FIG. 106B

SEMICONDUCTOR LIGHT EMITTING DEVICE AND METHOD FOR MANUFACTURING THE SAME

CROSS-REFERENCE TO RELATED APPLICATIONS

This application is a division of U.S. patent application Ser. No. 13/601,487, filed on Aug. 31, 2012, which is based upon and claims the benefit of priority from the prior Japanese Patent Application No. 2012-69504, filed on Mar. 26, 2012, the entire contents of each of which are incorporated herein by reference.

FIELD

Embodiments described herein relate generally to a semiconductor light emitting device and a method for manufacturing the same.

BACKGROUND

For LED (Light Emitting Diode) to which large electric power is applied, high heat dissipation performance is required. A larger outer shape of an LED package leads to an advantageous heat dissipation. Moreover, packaging at wafer level is advantageous for drastic cost reduction, and, in addition, there is a need for technology of high productivity for a package structure that satisfies the request for heat dissipation.

BRIEF DESCRIPTION OF THE DRAWINGS

FIGS. 18A to 30 are schematic cross-sectional views showing a method for manufacturing the semiconductor light emitting device of the second embodiment;

FIGS. 34A to 49 are schematic cross-sectional views showing a method for manufacturing the semiconductor light emitting device of the third embodiment;

FIG. 52 is a schematic cross-sectional view of a state where the semiconductor light emitting device of the fourth embodiment is mounted on a mounting substrate;

FIGS. 53A to 65 are schematic cross-sectional views showing a method for manufacturing the semiconductor light emitting device of the fourth embodiment;

FIGS. 67A to 86 are schematic cross-sectional views showing a method for manufacturing the semiconductor light emitting device of the fifth embodiment;

FIGS. 88A to 100 are schematic cross-sectional views showing a method for manufacturing the semiconductor light emitting device of the sixth embodiment;

FIGS. 102A to 108 are schematic cross-sectional views showing a method for manufacturing the semiconductor light emitting device of the seventh embodiment;

DETAILED DESCRIPTION

In general, according to one embodiment, a semiconductor light emitting device includes: a semiconductor layer including a first face, a second face opposite to the first face, a side face, and a light emitting layer; a p-side electrode provided on the second face; an n-side electrode provided on the side face; a first p-side metal layer provided on the p-side electrode and connected electrically with the p-side electrode; a first n-side metal layer provided on the periphery of the n-side electrode and connected electrically with the n-side electrode; a first insulating layer provided on a face on the second face side in the first n-side metal layer; a second p-side metal layer connected electrically with the first p-side metal layer on the first p-side metal layer, and provided, extending from on the first p-side metal layer to on the first insulating layer; and a second n-side metal layer provided on a face on the second face side in the first n-side metal layer in a peripheral region of the semiconductor layer and connected electrically with the first n-side metal layer.

According to one embodiment, a method for manufacturing a semiconductor light emitting device includes: forming a first p-side metal layer connected electrically with a p-side electrode on the p-side electrode in a plurality of chips separated on a substrate, each of the plurality of chips including a semiconductor layer including a first face, a second face opposite to the first face, a side face and a light emitting layer, the p-side electrode provided on the second face and an n-side electrode provided on the side face; supporting a target chip among the plurality of chips by a support on the first p-side metal layer side and transferring the target chip from the substrate to the support; forming a first n-side metal layer connected electrically with the n-side electrode on a periphery of the n-side electrode on the support; removing the support and forming a first insulating layer on a surface of the first n-side metal from which the support has been removed; forming a second p-side metal layer connected electrically with the first p-side metal layer on the first p-side metal layer and extending from on the first p-side metal layer to on the first insulating layer; and forming a second n-side metal layer provided on the first n-side metal layer in a peripheral region of the semiconductor layer and penetrating through the first insulating layer to be connected electrically with the first n-side metal layer.

Hereinafter, embodiments will be explained with reference to the drawings. In respective drawings, the same numeral is given to the same element.

First Embodiment

Figure 1:
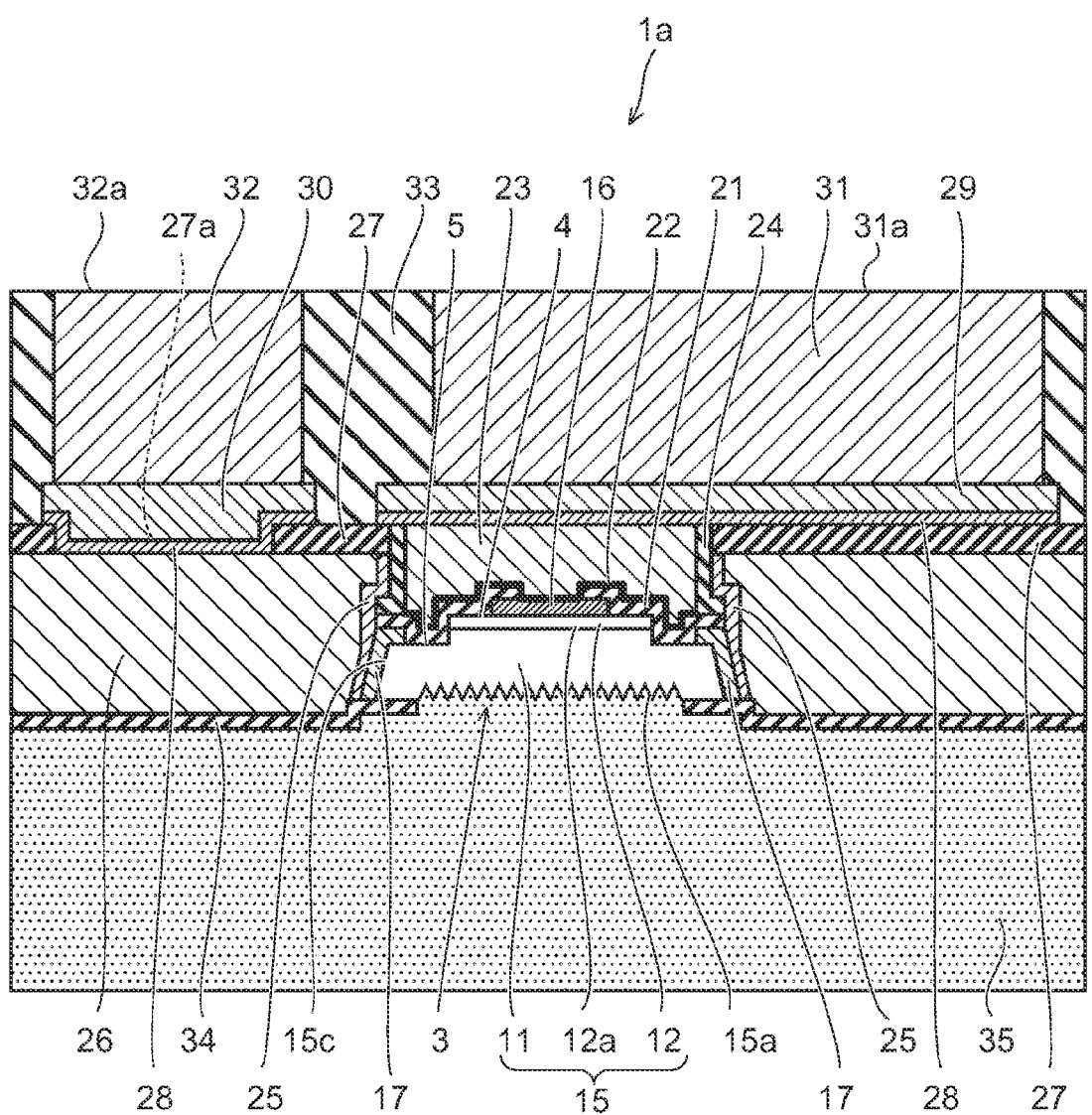
FIG. 1 is a schematic cross-sectional view of a semiconductor light emitting device of a first embodiment.

FIG. 1 is a schematic cross-sectional view of a semiconductor light emitting device 1a of a first embodiment.

The semiconductor light emitting device 1a has a chip 3, a package part (or a wiring part) that is thicker and larger in a planar size than the chip 3, and a phosphor layer 35.

The chip 3 includes a semiconductor layer 15. The semiconductor layer 15 has a first face 15a and a second face provided on the side opposite thereto. From the first face (the lower face in FIG. 1) 15a of the semiconductor layer 15, light is mainly emitted to the outside.

The semiconductor layer 15 has a first semiconductor layer 11 and a second semiconductor layer 12. The first semiconductor layer 11 and the second semiconductor layer 12 include a material containing, for example, gallium nitride. The first semiconductor layer 11 includes an n-type layer that functions, for example, as a transverse route of a current, etc. The second semiconductor layer 12 includes a p-type layer and a light emitting layer (an active layer) 12a.

The second face of the semiconductor layer 15 is processed in irregular shapes, and a part of the light emitting layer 12a is removed. Accordingly, the second face of the semiconductor layer 15 has a region 4 that includes the light emitting layer 12a (or faces the light emitting layer 12a), and a region 5 that does not include the light emitting layer 12a (or does not face the light emitting layer 12a).

On the region 4 in the second face, a p-side electrode 16 is provided. The p-side electrode 16 contains a metal having reflectivity with respect to the emitting light of the light emitting layer 12a, such as silver or aluminum.

For a side face 15c of the first semiconductor layer 11 not including the light emitting layer 12a in the semiconductor layer 15, an n-side electrode 17 is provided. The n-side electrode 17 is provided over the whole side face 15c, and surrounds continuously the periphery of the first semiconductor layer 11. A part of the n-side electrode 17 is also provided on the region 5 not including the light emitting layer 12a in the second face. The n-side electrode 17 also contains a metal having reflectivity with respect to the emitting light of the light emitting layer 12a, such as silver or aluminum.

A step between the region 5 and the region 4 in the second face is covered with an insulating film 21. The n-side electrode 17 on the region 5 is covered with the insulating film 21. A part of the p-side electrode 16 is also covered with the insulating film 21. The insulating film 21 is an inorganic film such as a silicon oxide film or a silicon nitride film.

On the insulating film 21 and the p-side electrode 16, a first p-side metal layer 23 is provided. The first p-side metal layer 23 is connected electrically with the p-side electrode 16 through an opening formed in the insulating film 21.

The first p-side metal layer 23 contains, as described later, copper that is formed, for example, by an electrolytic plating method. A metal film 22 that is a seed metal in the plating is provided between the first p-side metal layer 23 and the insulating film 21, and between the first p-side metal layer 23 and the p-side electrode 16.

On the side face of the first p-side metal layer 23, an insulating film 24 is provided. The insulating film 24 covers the whole face of the side face of the first p-side metal layer 23. The insulating film 24 is an inorganic film such as a silicon oxide film or a silicon nitride film. Alternatively, the use of an organic insulating film such as polyimide is also possible.

Around the n-side electrode 17, a first n-side metal layer 26 is provided. The first n-side metal layer 26 is thicker than the chip 3, and is also provided around the first p-side metal layer 23.

Figure 2A:
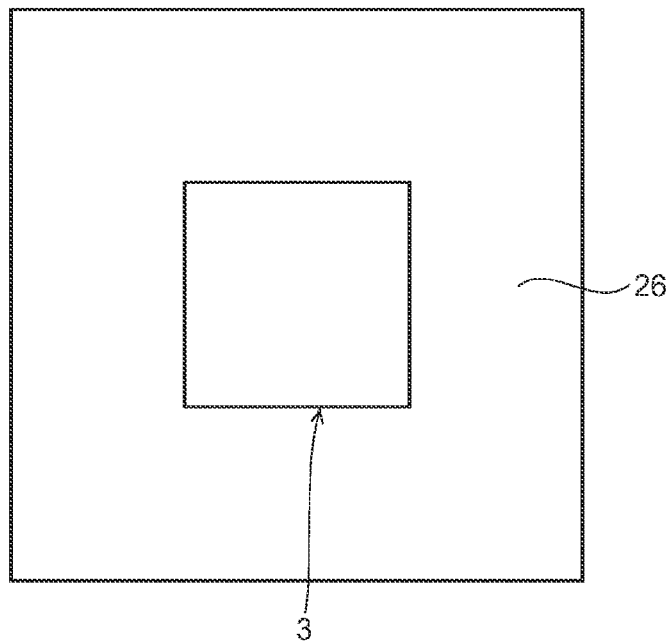
FIGS. 2A and 2B are schematic plan views of the semiconductor light emitting device of the first embodiment.

FIG. 2A is a schematic plan view showing the planar arrangement relation between the chip 3 and the first n-side metal layer 26.

The first n-side metal layer 26 surrounds continuously the periphery of the side face 15c of the semiconductor layer 15 and the n-side electrode 17 provided on the side face 15c.

The first n-side metal layer 26 contains, as described later, copper that is formed, for example, by an electrolytic plating method. A metal film 25 that is a seed metal in the plating is provided between the first n-side metal layer 26 and the n-side electrode 17. The metal film 25 is provided on the whole face of the side face of the n-side electrode 17. The first n-side metal layer 26 is connected electrically with the n-side electrode 17 via the metal film 25.

Between the first n-side metal layer 26 and the first p-side metal layer 23, the insulating film 24 is provided, and the first n-side metal layer 26 and the first p-side metal layer 23 are not short-circuited.

Between the surface (the upper face in FIG. 1) of the first n-side metal layer 26 and the surface (the upper face in FIG. 1) of the first p-side metal layer 23, a step corresponding to the thickness of a first insulating layer (hereinafter, it is simply referred to as an insulating layer) 27 is formed. That is, the surface of the first n-side metal layer 26 is retreated to the chip 3 side from the surface of the first p-side metal layer 23.

The insulating layer 27 is provided on the surface of the first n-side metal layer 26. The insulating layer 27 is, for example, a resin layer. Alternatively, as the insulating layer 27, an inorganic material may be used. The surface of the insulating layer 27 is flush with the surface of the first p-side metal layer 23 to be a flat face.

On the first p-side metal layer 23, a second p-side metal layer 29 is provided. The second p-side metal layer 29 is provided, extending from on the first p-side metal layer 23 to on the insulating layer 27, and has an area larger than an area of the first p-side metal layer 23.

The second p-side metal layer 29 contains, as described later, copper that is formed, for example, by an electrolytic plating method. A metal film 28 that is a seed metal in the plating is provided between the second p-side metal layer 29 and the first p-side metal layer 23, and between the second p-side metal layer 29 and the insulating layer 27. The second p-side metal layer 29 is connected electrically with the first p-side metal layer 23 via the metal film 28.

On the insulating layer 27, a second n-side metal layer 30 is provided, separated relative to the second p-side metal layer 29. The second n-side metal layer 30 is provided on the first n-side metal layer 26 in the peripheral region of the semiconductor layer 15 (chip 3), and is connected electrically with the first n-side metal layer 26 via an opening 27a formed in a part of the insulating layer 27.

The second n-side metal layer 30 contains, as described later, copper that is formed, for example, by an electrolytic plating method. The metal film 28 that is a seed metal in the plating is provided between the second n-side metal layer 30 and the first n-side metal layer 26, and between the second n-side metal layer 30 and the insulating layer 27. The second n-side metal layer 30 is connected electrically with the first n-side metal layer 26 via the metal film 28.

On the face opposite to the insulating layer 27 in the second p-side metal layer 29, a third p-side metal layer (or a p-side metal pillar) 31 is provided. The third p-side metal layer 31 is thicker than the second p-side metal layer 29. Alternatively, instead of providing the third p-side metal layer 31 separately from the second p-side metal layer 29, the second p-side metal layer 29 itself may be made thicker.

On the face opposite to the insulating layer 27 in the second n-side metal layer 30, a third n-side metal layer (or an n-side metal pillar) 32 is provided. The third n-side metal layer 32 is thicker than the second n-side metal layer 30. Alternatively, instead of providing the third n-side metal layer 32 separately from the second n-side metal layer 30, the second n-side metal layer 30 itself may be made thicker.

On the insulating layer 27, a resin layer 33 is provided as a second insulating layer. The resin layer 33 covers the periphery of the second p-side metal layer 29, the periphery of the third p-side metal layer 31, the periphery of the second n-side metal layer 30, and the periphery of the third n-side metal layer 32.

Faces in the second p-side metal layer 29 other than the connection face with the third p-side metal layer 31, and faces in the second n-side metal layer 30 other than the connection face with the third n-side metal layer 32 are covered with the resin layer 33. The resin layer 33 is also filled and provided between the third p-side metal layer 31 and the third n-side metal layer 32 to cover the side face of the third p-side metal layer 31 and the side face of the third n-side metal layer 32.

The face opposite to the second p-side metal layer 29 in the third p-side metal layer 31 is not covered with the resin layer 33 but is exposed, and functions as a p-side external terminal 31a to be joined to a mounting substrate. The face opposite to the second n-side metal layer 30 in the third n-side metal layer 32 is not covered with the resin layer 33 but is exposed, and functions as an n-side external terminal 32a to be joined to a mounting substrate.

Figure 2B:
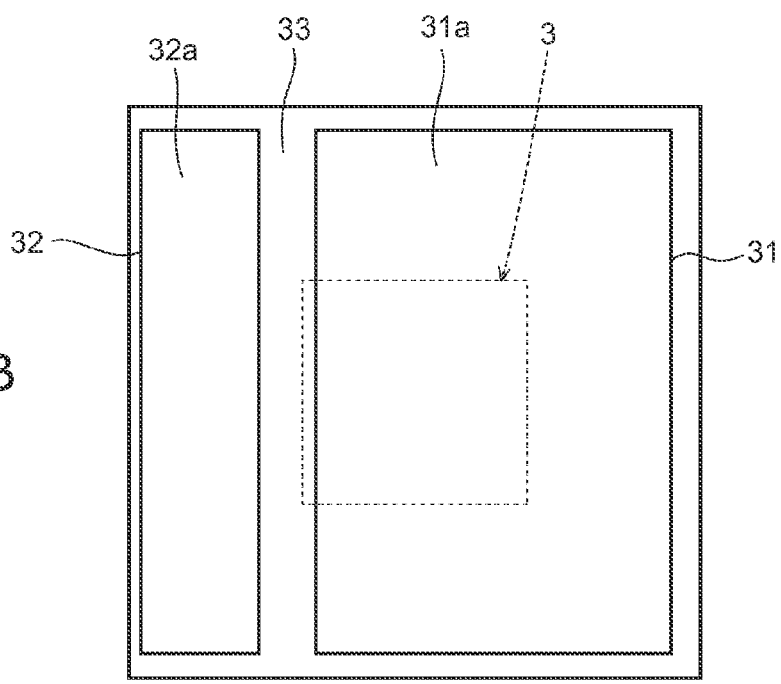

FIG. 2B is a schematic plan view on the mounting surface side in the semiconductor light emitting device 1a. Shapes, positions, the ratio of sizes etc. of the p-side external terminal 31a and the n-side external terminal 32a are not limited to the form shown in the drawing.

The thickness of each of the third p-side metal layer 31, the third n-side metal layer 32 and the resin layer 33 is thicker than the thickness of the semiconductor layer 15. The aspect ratio (the ratio of the thickness to the planar size) of the third p-side metal layer 31 and the third n-side metal layer 32 is not limited to not less than one, but the ratio may be smaller than one.

The third p-side metal layer 31, the third n-side metal layer 32 and the resin layer 33 that reinforces these function as a support of the chip 3 including the semiconductor layer 15. Accordingly, even if the substrate used for forming the semiconductor layer 15 is removed as described later, it is possible to support stably the semiconductor layer 15 by the support including the third p-side metal layer 31, the third n-side metal layer 32 and the resin layer 33, and to enhance the mechanical strength of the semiconductor light emitting device 1a.

The stress that is applied to the semiconductor layer 15 in a state where the semiconductor light emitting device 1a is mounted on a mounting substrate can also be relaxed by the absorption by the pillar-shaped third p-side metal layer 31 and third n-side metal layer 32.

The first p-side metal layer 23, the second p-side metal layer 29 and the third p-side metal layer 31 form a p-side wiring part that connects electrically between the p-side external terminal 31a and the p-side electrode 16. The first n-side metal layer 26, the second n-side metal layer 30 and the third n-side metal layer 32 form an n-side wiring part that connects electrically between the n-side external terminal 32a and the n-side electrode 17.

As the material of these metal layers, copper, gold, nickel, silver or the like may be used. Among these, the use of copper gives good thermal conductivity, high migration resistivity and excellent adherence with an insulating material.

The first semiconductor layer 11 is connected electrically with the n-side external terminal 32a via the n-side electrode 17 and the n-side wiring part. The second semiconductor layer 12 including the light emitting layer 12a is connected electrically with the p-side external terminal 31a via the p-side electrode 16 and the p-side wiring part.

As the resin layer 33, it is desirable to use a material that has a coefficient of thermal expansion same as or close to the coefficient of thermal expansion of the mounting substrate. Examples of such resin layers can include layers of epoxy resin, silicone resin, fluorine resin etc.

On the first face 15a of the semiconductor layer 15, a phosphor layer 35 is provided. The phosphor layer 35 is also provided on the first n-side metal layer 26 via a protection film 34, and extends into the peripheral region of the chip 3.

The phosphor layer 35 contains a plurality of phosphors in a powdery or particulate shape that are capable of absorbing emitting light (exciting light) of the light emitting layer 12a and emitting wavelength-converted light. The phosphors are dispersed, for example, in transparent resin as transparent media that are transparent relative to the emitting light of the light emitting layer 12a and the emitting light (wavelength-converted light) of the phosphor. The semiconductor light emitting device 1a may release a mixed light of the light from the light emitting layer 12a and the wavelength-converted light by the phosphor.

For example, when assuming that the phosphor is a yellow phosphor that emits yellow light, as a mixed light of blue light from the light emitting layer 12a that is of a GaN-based material and yellow light as the wavelength-converted light in the phosphor layer 35, white light, incandescent-lamp color, or the like can be obtained. Alternatively, the phosphor layer 35 may have a configuration containing a plurality of kinds of phosphors (for example, a red phosphor that emits red light and a green phosphor that emits green light).

For the first face 15a, fine irregularities are formed by frost processing to achieve the improvement of a light extraction efficiency. On the face opposite to the insulating layer 27 in the first n-side metal layer 26 (the lower face in FIG. 1), a protection film (an insulating film) 34 in the frost processing is formed. And, the protection film 34 also covers and protects the edge part on the first face 15a side in the n-side electrode 17, and the edge part on the first face 15a side in the metal film 25.

According to the semiconductor light emitting device 1a of the embodiment, the n-side electrode 17 is provided on the side face 15c of the semiconductor layer 15. Consequently, the coverage of the p-side electrode 16 in the second face can be made large. As the result, the area of the region 4 including the light emitting layer 12a that is a region wherein the p-side electrode 16 is provided can be made large, and, while achieving size reduction of the planar size of the chip 3, the assurance of a large light-emitting face becomes possible. The reduction in the chip size leads to lowering of cost.

On the second face of the semiconductor layer 15, the first p-side metal layer 23, which covers approximately the whole face of the second face, is provided. On the first p-side metal layer 23, the second p-side metal layer 29 is provided with an area larger than the area of the first p-side metal layer 23, and on the second p-side metal layer 29, the third p-side metal layer 31 is provided with an area larger than the area of the first p-side metal layer 23.

Heat generated in the light emitting layer 12a is conducted through a metallic body on the p-side (a wiring part) including the p-side electrode 16, the metal film 22, the first p-side metal layer 23, the metal film 28, the second p-side metal layer 29 and the third p-side metal layer 31, and, furthermore, is dissipated from the p-side external terminal 31a joined with the mounting substrate by solder etc. to the mounting substrate. Since the p-side metallic body (the wiring part) is provided on the second face with a larger area and larger thickness than the chip 3, a high heat dissipation performance can be obtained.

Moreover, the heat generated in the light emitting layer 12a is conducted through a metallic body on the n-side (a wiring part) including the n-side electrode 17, the metal film 25, the first n-side metal layer 26, the metal film 28, the second n-side metal layer 30 and the third n-side metal layer 32, and furthermore is dissipated from the n-side external terminal 32a joined with the mounting substrate by solder etc. to the mounting substrate. The dissipation route includes the first n-side metal layer 26 provided around the chip 3 and having a larger area and thickness than the chip 3. Accordingly, a heat dissipation performance from the side face side of the chip 3 is also high.

The second face and side faces other than the first face 15a that is the major light extraction face in the chip 3 are surrounded by a metallic body having a volume, that is, a thermal capacity larger than the chip 3. Accordingly, it has a high reliability, also, for transitional and instantaneous heating. In addition, a structure in which the chip 3 is reinforced by such a metallic body is obtained, and the semiconductor light emitting device 1a is also excellent in mechanical strength.

Next, with reference to FIGS. 3A to 15, the method for manufacturing the semiconductor light emitting device 1a of the first embodiment will be explained.

Figure 3A:
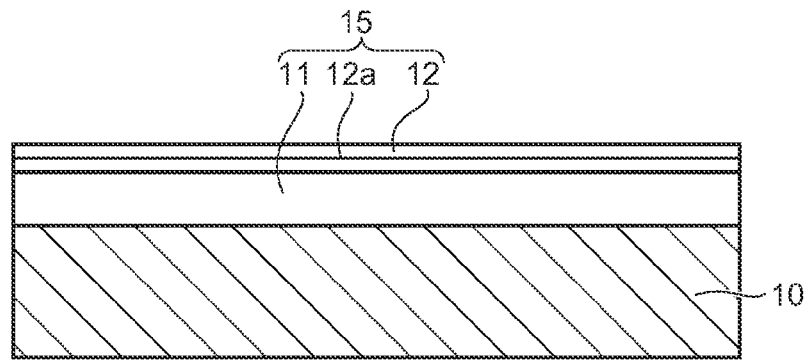
FIGS. 3A to 15 are schematic cross-sectional views showing a method for manufacturing the semiconductor light emitting device of the first embodiment.

FIG. 3A shows a cross-section of a wafer having the semiconductor layer 15 formed on the major surface of the substrate 10, the layer 15 including the first semiconductor layer 11 and the second semiconductor layer 12. On the major surface of the substrate 10, the first semiconductor layer 11 is formed, and on the first semiconductor layer 11, the second semiconductor layer 12 is formed.

For example, the first semiconductor layer 11 and the second semiconductor layer 12 including a gallium nitride-based material can epitaxially be grown on a sapphire substrate by an MOCVD (metal organic chemical vapor deposition) method.

The first semiconductor layer 11 includes a foundation buffer layer and an n-type GaN layer. The second semiconductor layer 12 includes a light emitting layer 12a and a p-type GaN layer. As the light emitting layer 12a, a layer that emits a light of blue, violet, violet-blue, near ultraviolet, ultraviolet or the like can be used.

Figure 3B:
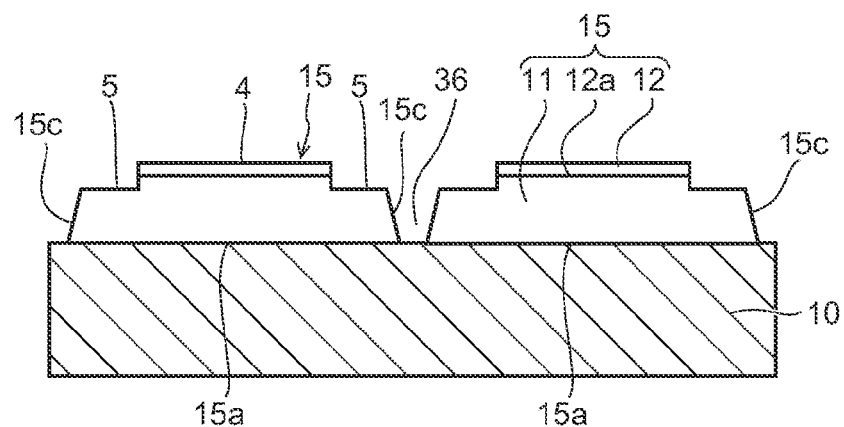

After the formation of the semiconductor layer 15 on the substrate 10, for example, by RIE (Reactive Ion Etching) using a resist not shown, the second semiconductor layer 12 is selectively removed to expose selectively, as shown in FIG. 3B, the first semiconductor layer 11. The region 5 where the first semiconductor layer 11 is exposed does not include the light emitting layer 12a.

Moreover, for example, by RIE using a resist mask not shown, a trench 36 that penetrates through the semiconductor layer 15 to reach the substrate 10 is formed. The trench 36 is formed, for example, in a lattice-shaped planar pattern on the substrate 10 in a wafer state. The semiconductor layer 15 is separated into a plurality of parts on the substrate 10 by the trench 36. In the trench 36, the side face 15c of the semiconductor layer 15 (the first semiconductor layer 11) is exposed.

The process of separating the semiconductor layer 15 into a plurality of parts may be performed after the formation of the p-side electrode 16 and the n-side electrode 17 to be explained below.

Figure 3C:
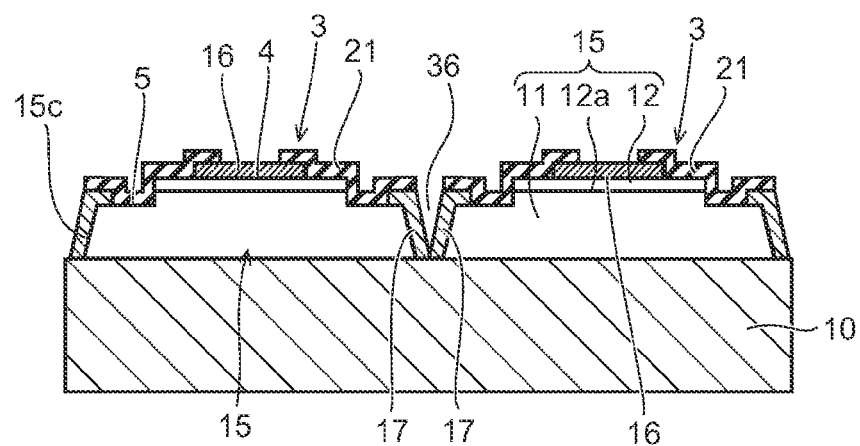

On the region 4 including the light emitting layer 12a in the second face of the semiconductor layer 15 (on the surface of the second semiconductor layer 12), as shown in FIG. 3C, the p-side electrode 16 is formed.

On the side face 15c of the semiconductor layer 15 exposed in the trench 36, the n-side electrode 17 is formed. The n-side electrode 17 does not fill up the trench 36.

In the second face, on the face where the p-side electrode 16 and the n-side electrode 17 have not been formed, the insulating film 21 is formed. A part of the insulating film 21 on the p-side electrode 16 is opened. After that, by a heat treatment, the p-side electrode 16 and the n-side electrode 17 are ohmic-contacted with the semiconductor layer 15.

Figure 4A:
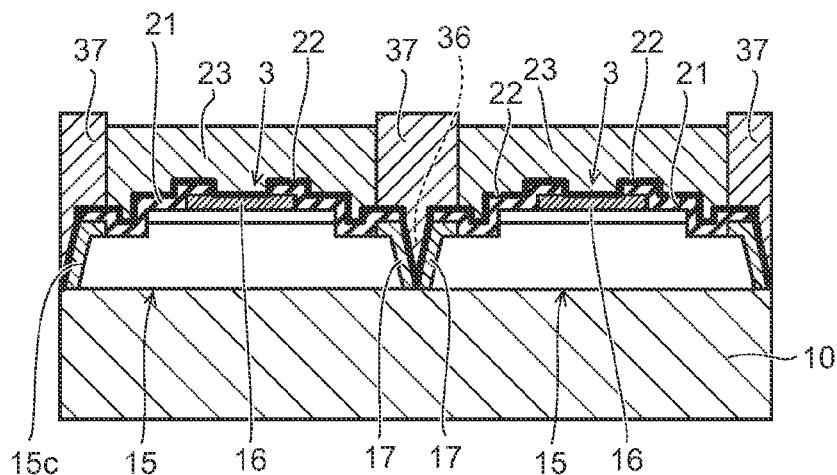

On the exposed part on the substrate 10 in FIG. 3C, the metal film 22 shown in FIG. 4A is formed conformally. The metal film 22 contains a metal having reflectivity relative to emitting light of the light emitting layer 12a, such as aluminum. Accordingly, on the second face side, a reflective metal is also provided between the p-side electrode 16 and the n-side electrode 17, which can reflect light travelling from between the p-side electrode 16 and the n-side electrode 17 toward the second face side toward the first face 15a side.

And, on the metal film 22, a resist 37 is selectively formed, and Cu electrolytic plating using the metal film 22 as a current path is performed. The resist 37 is formed in the trench 36 and on the trench 36.

By the electrolytic plating, the first p-side metal layer 23 is formed on the metal film 22. The first p-side metal layer 23 is connected with the p-side electrode 16 through the opening formed in the insulating film 21.

Figure 4B:
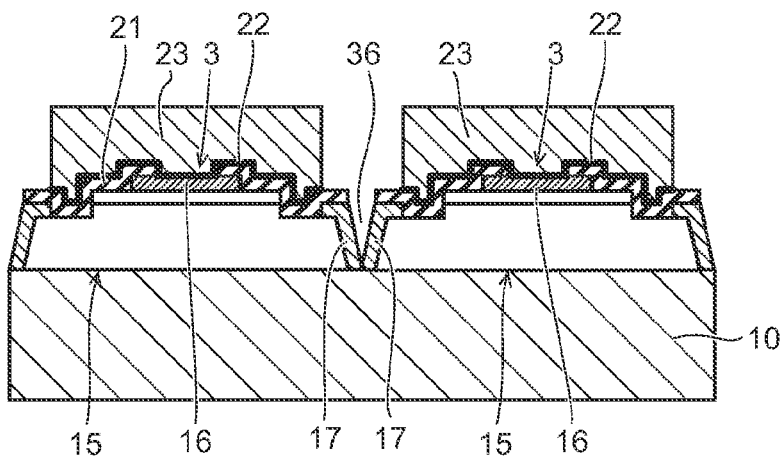

Next, the resist 37 is removed, and furthermore, as shown in FIG. 4B, the exposed part of the metal film 22 having been used as the seed metal is removed. Thereby, the connection between the p-side electrode 16 and the n-side electrode 17 through the metal film 22 is disconnected.

Figure 4C:
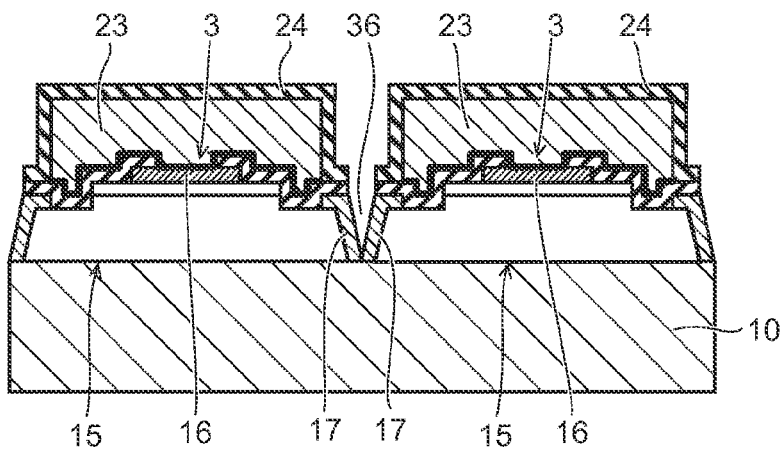

Next, for example, by a CVD (Chemical Vapor Deposition) method, the insulating film 24 shown in FIG. 4C is formed conformally on the whole face of the exposed part, and, after that, the insulating film 24 in the trench 36 is removed. The n-side electrode 17 is exposed, and the upper face and side face of the first p-side metal layer 23 are covered with the insulating film 24.

Figure 5A:
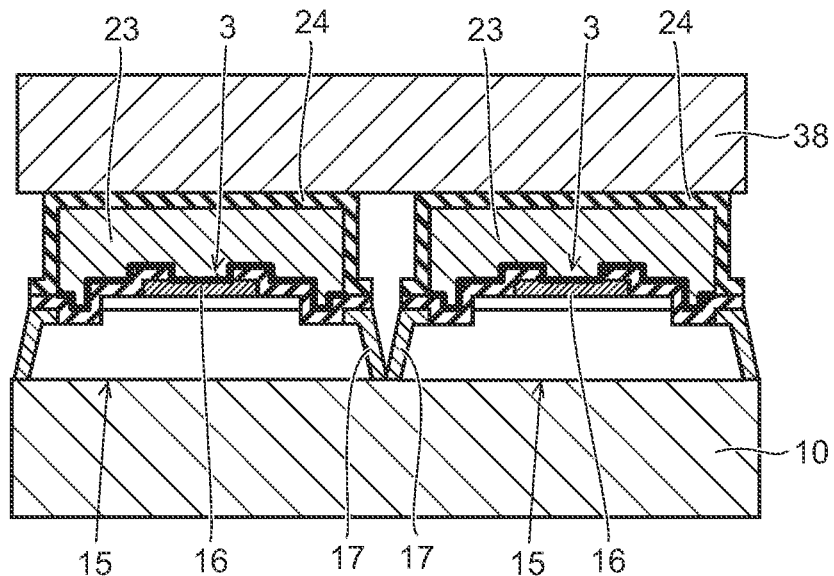
Figure 5B:
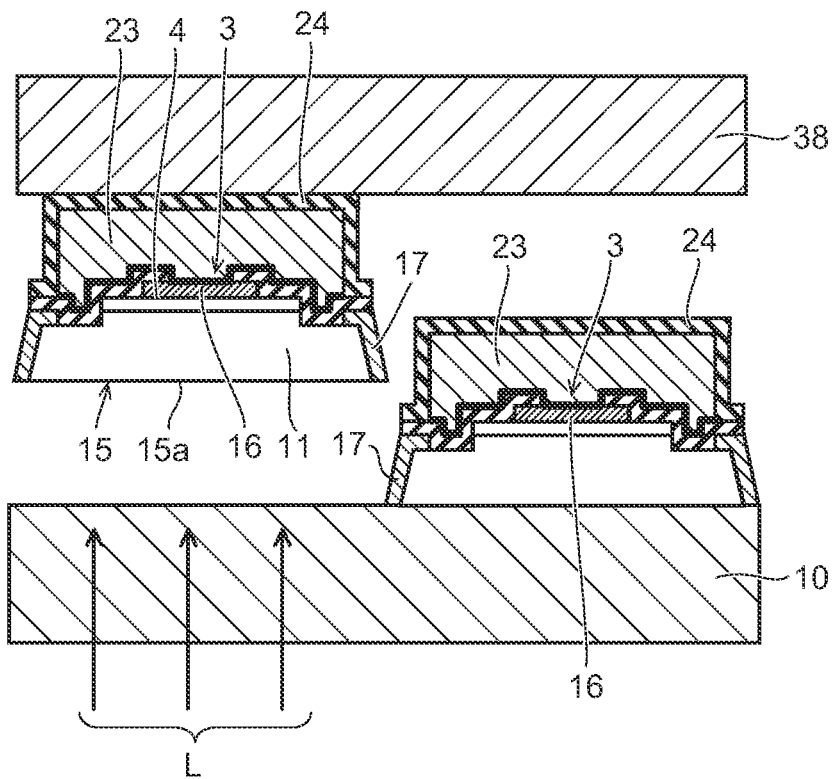

Next, as shown in FIG. 5A, to the upper face of the insulating film 24, for example, a film (or a sheet) 38 made of resin is attached as a support. Then, as shown in FIG. 5B, the target chip 3 selected from the chip 3 on the substrate 10 is removed from on the substrate 10 and is moved onto the film 38. The chip 3 removed from the substrate 10 is supported by the film 38 via the first p-side metal layer 23.

When the substrate 10 is a sapphire substrate, the substrate 10 and the chip 3 can be separated by a laser lift off method. As shown in FIG. 5B, laser light L is irradiated toward the first semiconductor layer 11 of the target chip 3 from the rear face side of the substrate 10. The laser light L has a wavelength that has transmittivity for the substrate 10, but becomes an absorption region for the first semiconductor layer 11.

When the laser light L arrives at the boundary between the substrate 10 and the first semiconductor layer 11, the first semiconductor layer 11 near the boundary absorbs the energy of the laser light L and is decomposed. For example, the first semiconductor layer 11 of a GaN-based material is decomposed into gallium (Ga) and nitrogen gas. By the decomposition reaction, a minute gap is formed between the substrate 10 and the first semiconductor layer 11, and the substrate 10 and the first semiconductor layer 11 are separated from each other.

The first p-side metal layer 23 covers the whole face of the region 4 including the light emitting layer 12a, and is provided over approximately the whole face of the second face of the semiconductor layer 15. Accordingly, the semiconductor layer 15 is supported by the first p-side metal layer 23 and is mechanically reinforced.

Consequently, even without the substrate 10, the semiconductor layer 15 is stably supported. Moreover, the metal (for example, copper) that forms the first p-side metal layer 23 is a material more flexible as compared with the semiconductor layer 15 of a GaN-based material. Therefore, even if large internal stress generated in epitaxial growth for forming the semiconductor layer 15 on the substrate 10 is released at once in the peeling of the substrate 10, the destruction of the semiconductor layer 15 can be avoided.

Figure 6A:
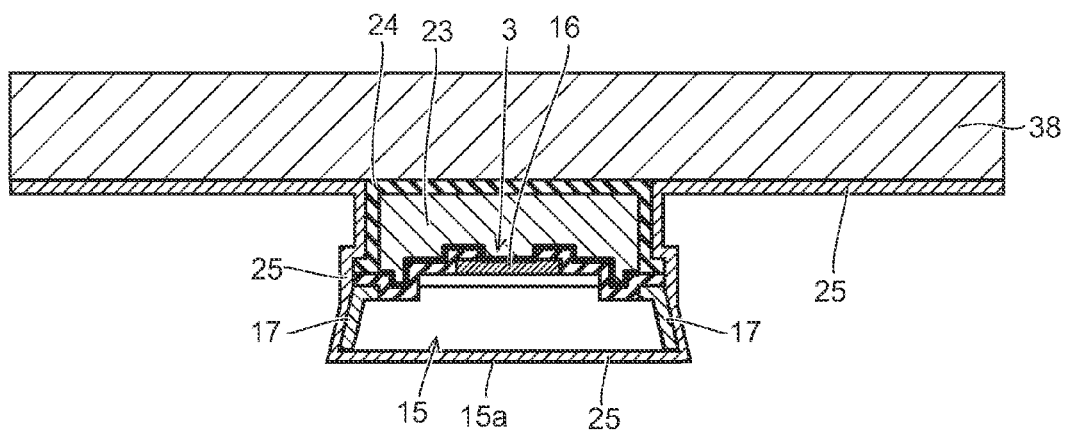

Next, as shown in FIG. 6A, on the surface of the film 38, the metal film 25 that functions as a seed metal of plating is formed. The metal film 25 is formed over the whole exposed face from the first face 15a, through the side face of the n-side electrode 17 and the side face of the insulating film 24, up to the surface of the film 38.

Figure 6B:
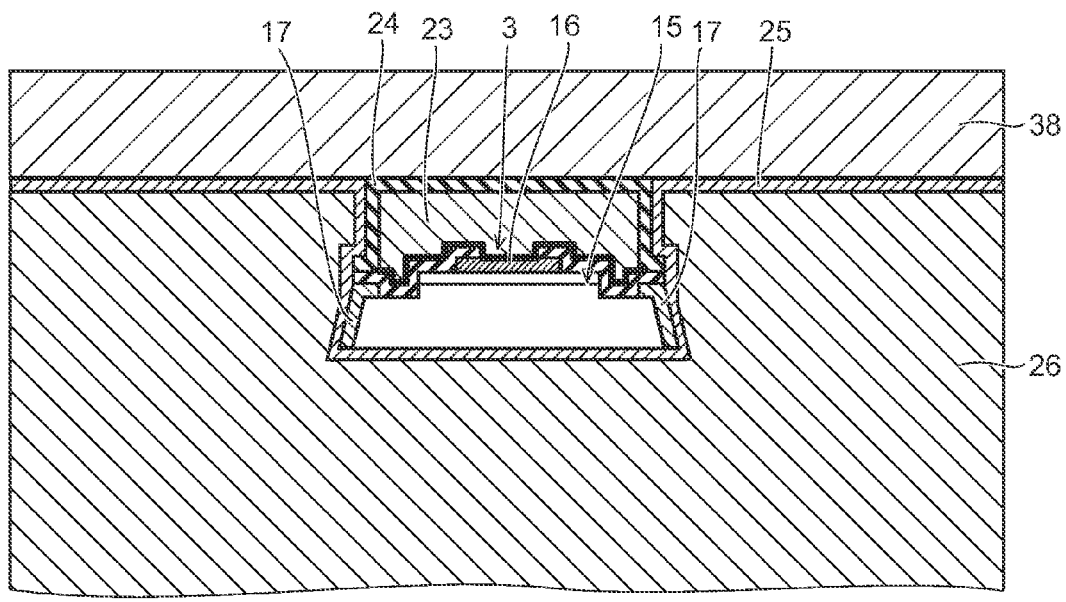

Then, Cu electrolytic plating using the metal film 25 as a current path is performed. Thereby, as shown in FIG. 6B, the first n-side metal layer 26 is formed on the metal film 25. The first n-side metal layer 26 is formed around the chip 3 and on the first face 15a. The surface of the first n-side metal layer 26 (the lower face in FIG. 6B) is ground if required and is flattened as shown in FIG. 7A.

Figure 7A:
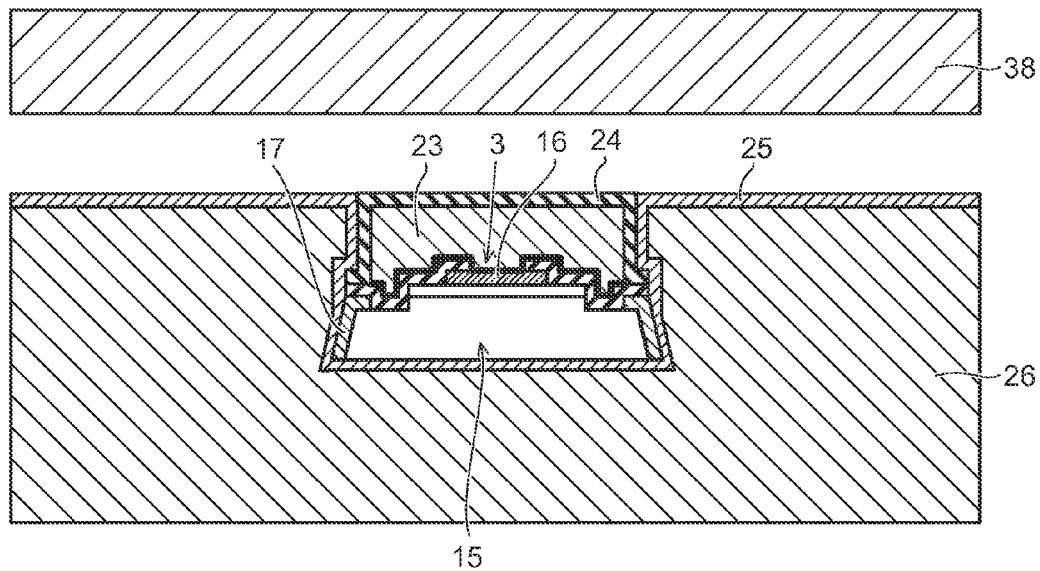

After the formation of the first n-side metal layer 26, as shown in FIG. 7A, the film 38 is peeled. By the peeling of the film 38, surfaces of the metal film 25 and the insulating film 24 are exposed.

Figure 7B:
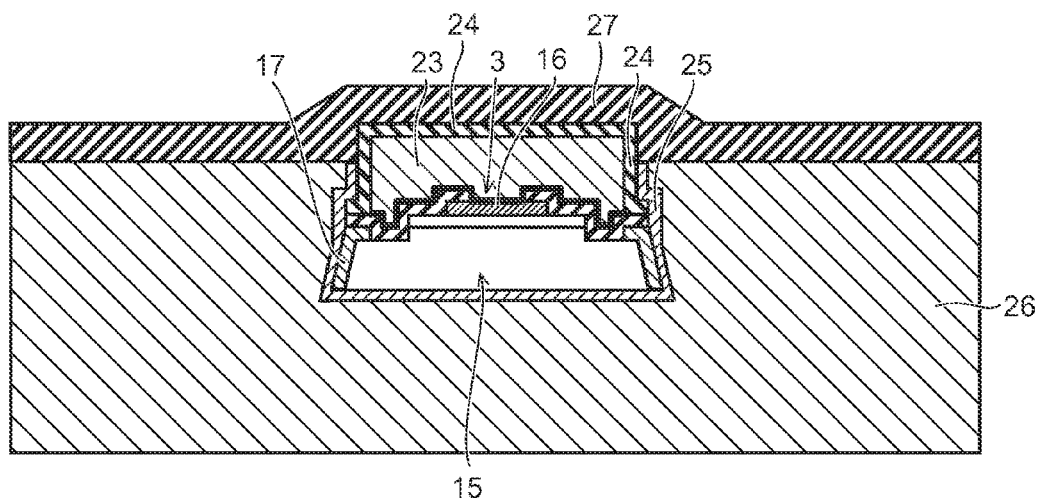

Then, the metal film 25 and the first n-side metal layer 26 are etched back so that, as shown in FIG. 7B, the surface of the first p-side metal layer 23 and the surface of the insulating film 24 are made to protrude from the surface of the first n-side metal layer 26 to form a step between the surface of the first p-side metal layer 23 and the surface of the insulating film 24, and the surface of the first n-side metal layer 26.

Then, so as to cover the step, on the surface of the insulating film 24 and on the surface of the first n-side metal layer 26, the insulating layer 27 is formed.

Figure 8A:
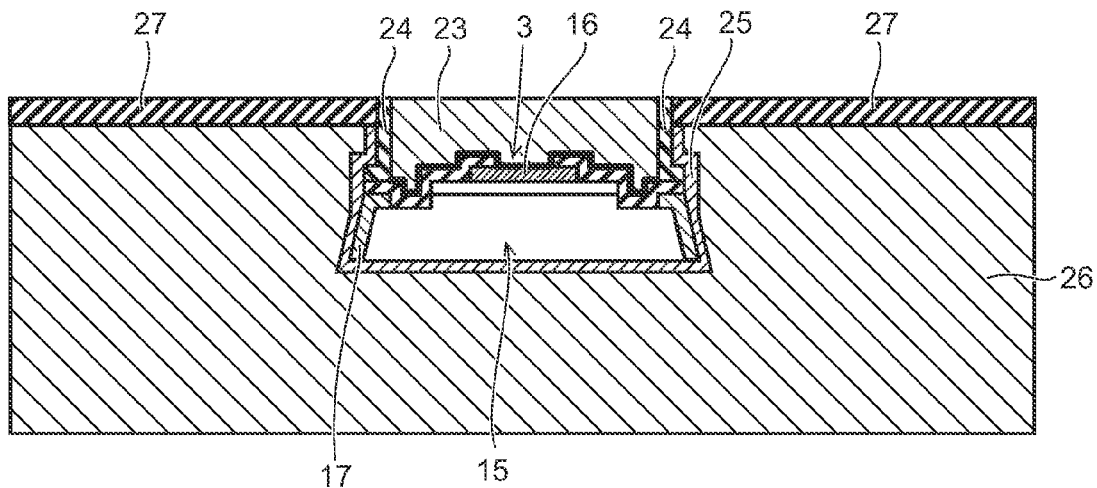

Next, for example, by a CMP (Chemical Mechanical Polishing) method, the insulating layer 27 on the surface of the insulating film 24 and the insulating film 24 are removed to expose, as shown in FIG. 8A, the surface of the first p-side metal layer 23. On the surface of the first n-side metal layer 26, the insulating layer 27 is left.

According to the process explained above, no opening alignment is required for exposing the first p-side metal layer 23 from the insulating layer 27.

Figure 8B:
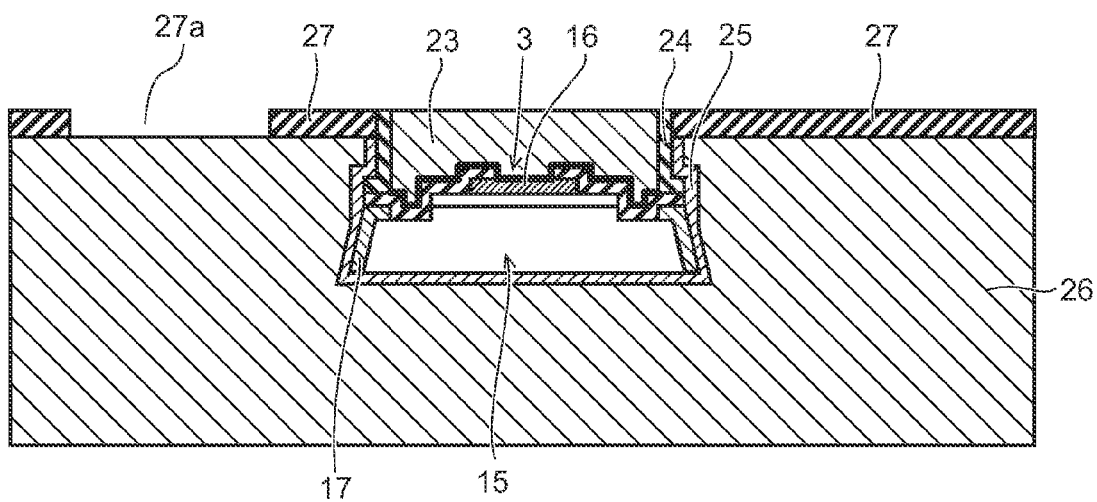

Next, as shown in FIG. 8B, an opening 27a is selectively formed in the insulating layer 27 on the peripheral region of the chip 3 to expose a part of the first n-side metal layer 26.

Figure 9A:
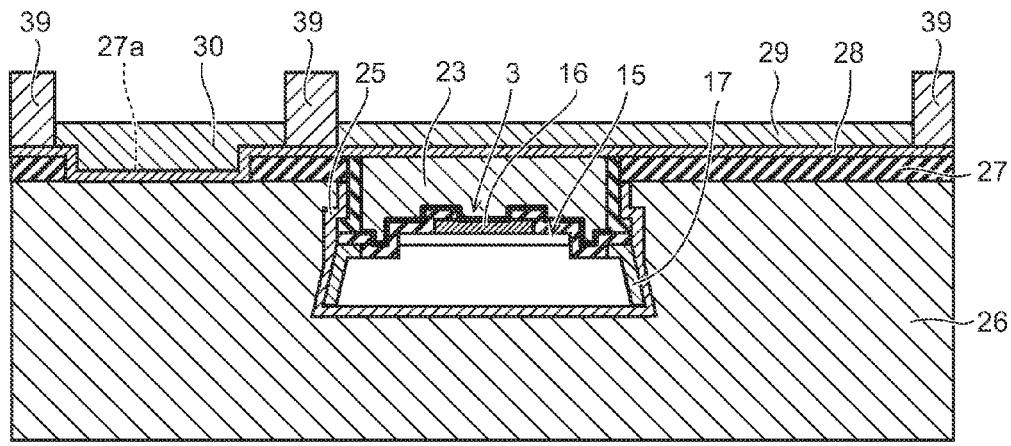

Next, as shown in FIG. 9A, in the opening 27a, on the surface of the insulating layer 27 and on the surface of the first p-side metal layer 23, the metal film 28 that functions as a seed metal in plating is formed. Then, using the resist 39, Cu electrolytic plating using the metal film 28 as a current path is performed.

Thereby, on the metal film 28, the second p-side metal layer 29 and the second n-side metal layer 30 are formed. The second p-side metal layer 29 is formed, extending from on the first p-side metal layer 23 to on the insulating layer 27 in the peripheral region of the chip 3. The second n-side metal layer 30 is provided on the peripheral region opposite to the peripheral region where the second p-side metal layer 29 extends with the chip 3 interposed therebetween.

The second p-side metal layer 29 is connected electrically with the first p-side metal layer 23 via the metal film 28 on the first p-side metal layer 23. The second n-side metal layer 30 is connected electrically with the first n-side metal layer 26 via the metal film 28 formed in the opening 27a.

Figure 9B:
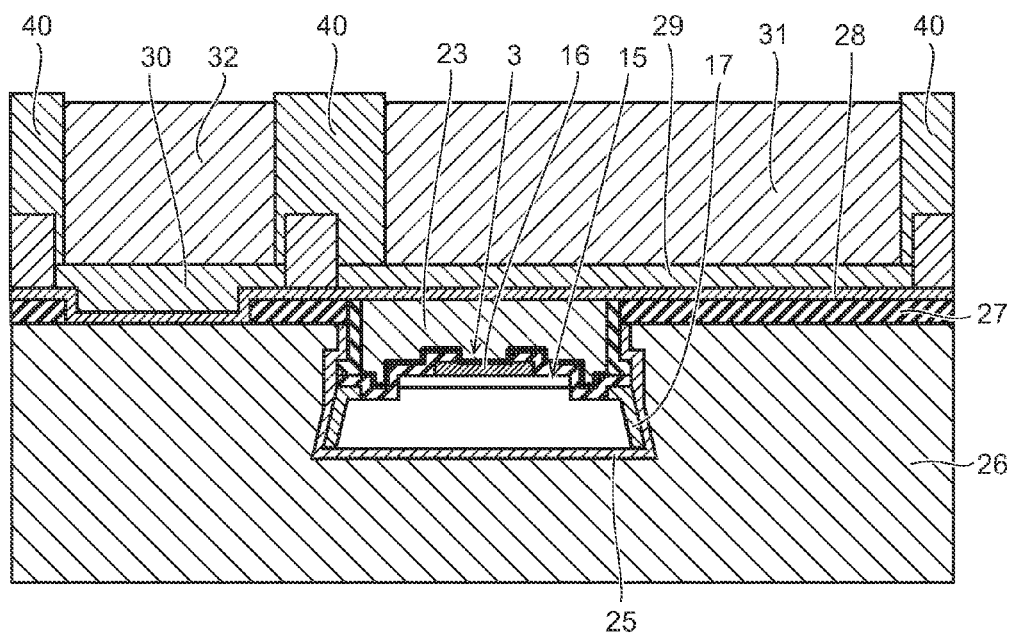

Next, as shown in FIG. 9B, using the resist 40, Cu electrolytic plating using the metal film 28 as a current path is performed.

Thereby, the third p-side metal layer 31 is formed on the second p-side metal layer 29, and the third n-side metal layer 32 is formed on the second n-side metal layer 30.

Figure 10:
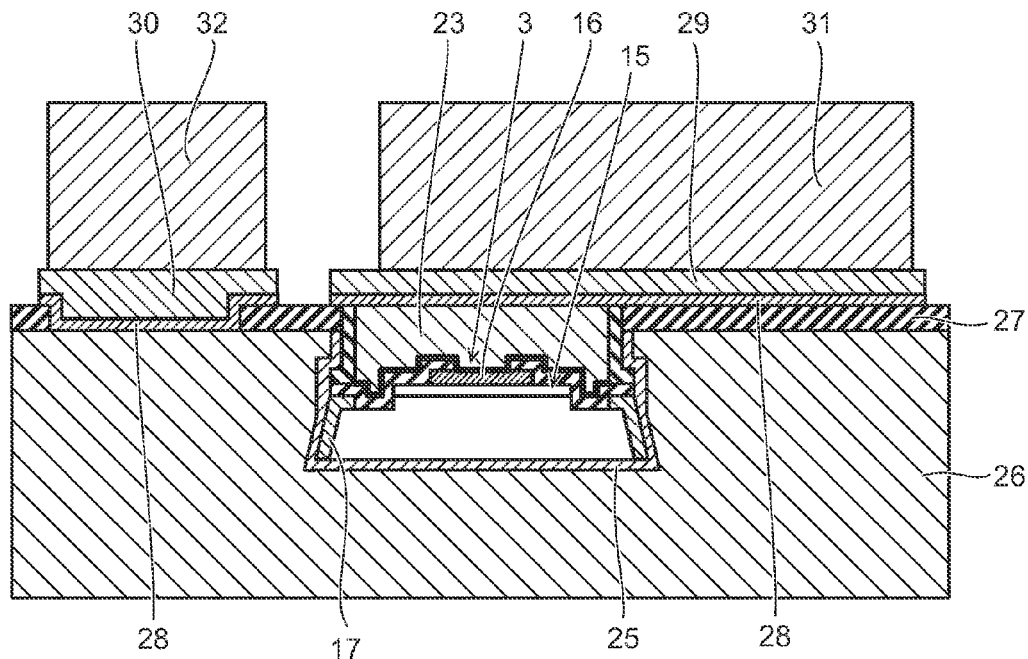

Next, the resist 40 is removed, and furthermore, as shown in FIG. 10, the exposed part of the metal film 28 having been used as the seed metal is removed. Thereby, the connection between the second p-side metal layer 29 and the second n-side metal layer 30, and the connection between the third p-side metal layer 31 and the third n-side metal layer 32, through the metal film 28, are disconnected.

Figure 11:
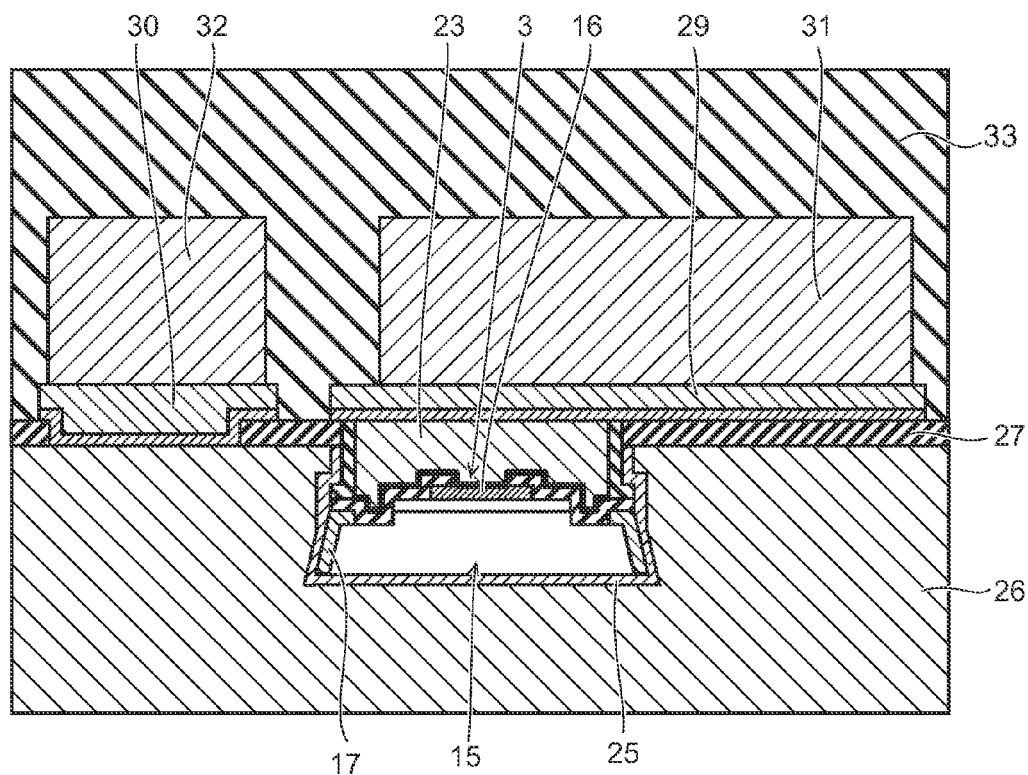

Next, on the insulating layer 27, the resin layer 33 shown in FIG. 11 is formed. The resin layer 33 covers the insulating layer 27, the second p-side metal layer 29, the second n-side metal layer 30, the third p-side metal layer 31, and the third n-side metal layer 32.

Figure 12:
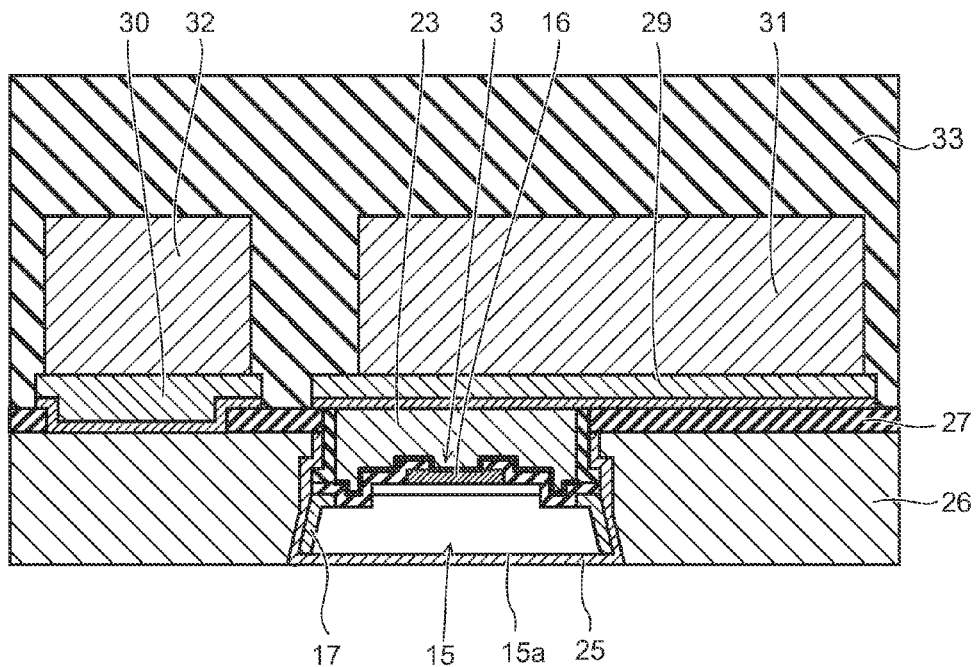

Next, the surface of the first n-side metal layer 26 (the lower face in FIG. 11) is ground to expose, as shown in FIG. 12, the metal film 25 on the first face 15a, and furthermore, the metal film 25 is removed to expose the first face 15a.

Figure 13:
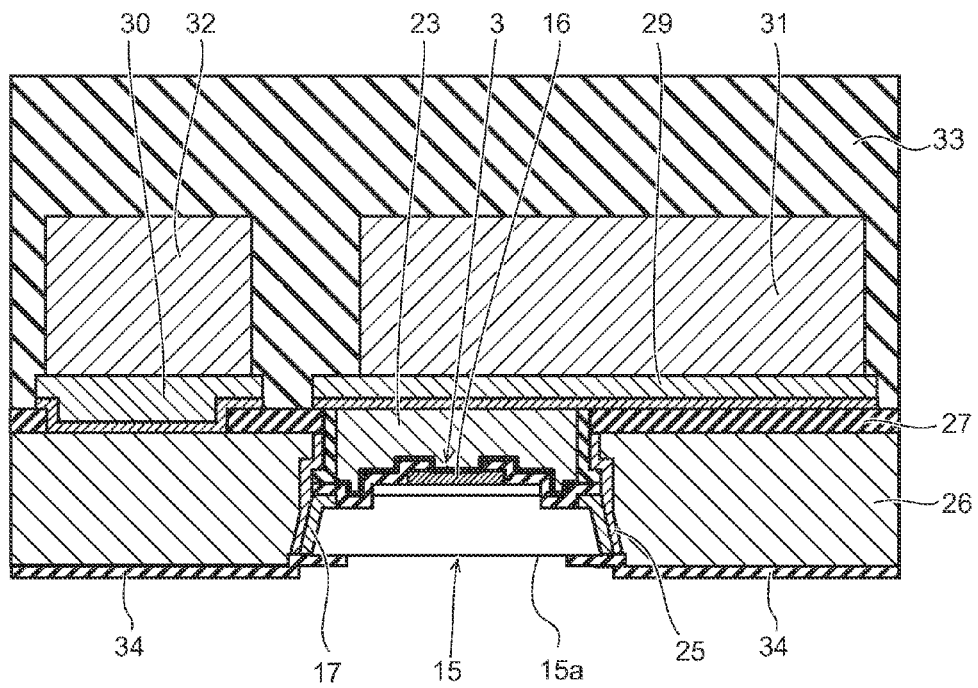

Next, as shown in FIG. 13, on the surface of the first n-side metal layer 26 and on the first face 15a, the protection film 34 is formed, and the protection film 34 on the first face 15a is removed.

Figure 14:
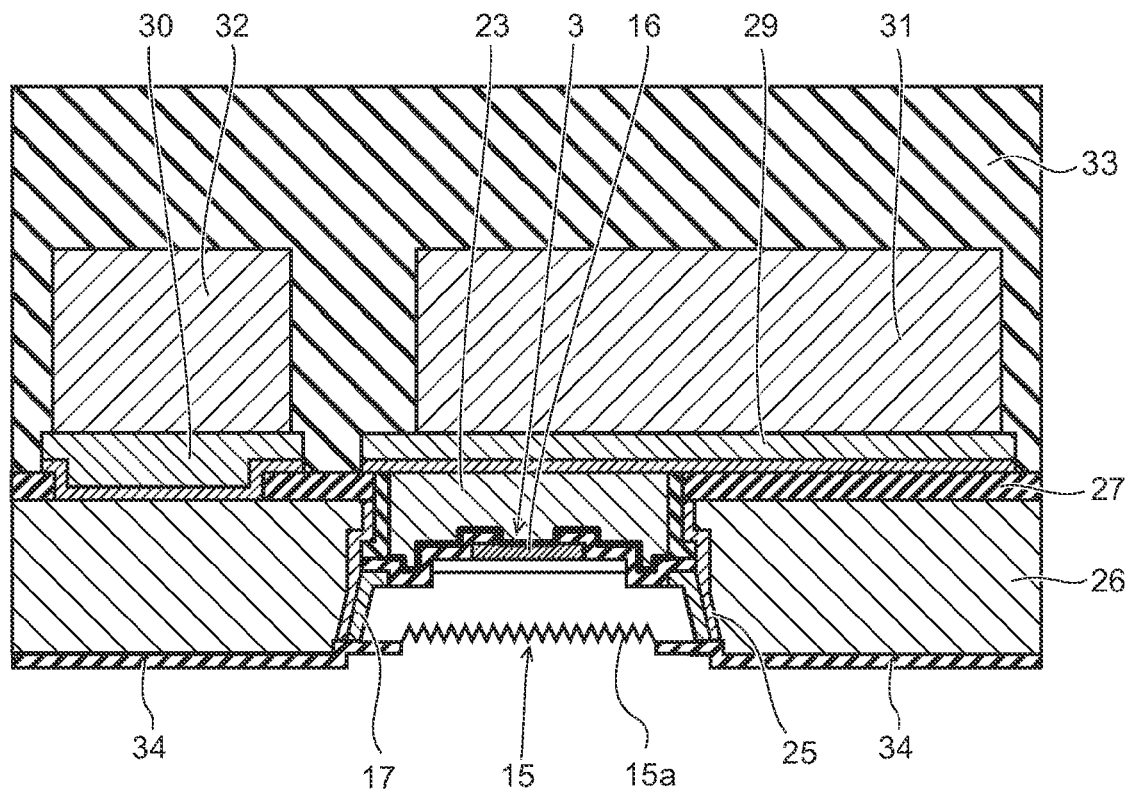

The first face 15a having been exposed is cleaned, and, after that, as shown in FIG. 14, is subjected to frost processing for forming irregularity. The formation of fine irregularity on the first face 15a can improve the light extraction efficiency.

In the frost processing, for example, a strong base is used. Copper (Cu) and silver (Ag) are non corrosive-resistant against a strong base. Accordingly, when copper is used in the first n-side metal layer 26 and the metal film 25 and silver is used in the n-side electrode 17, the protection film 34 may not be formed. When aluminum that is corroded by a strong base is used in the n-side electrode 17, the aluminum needs to be protected from the strong base by the protection film 34.

Figure 15:
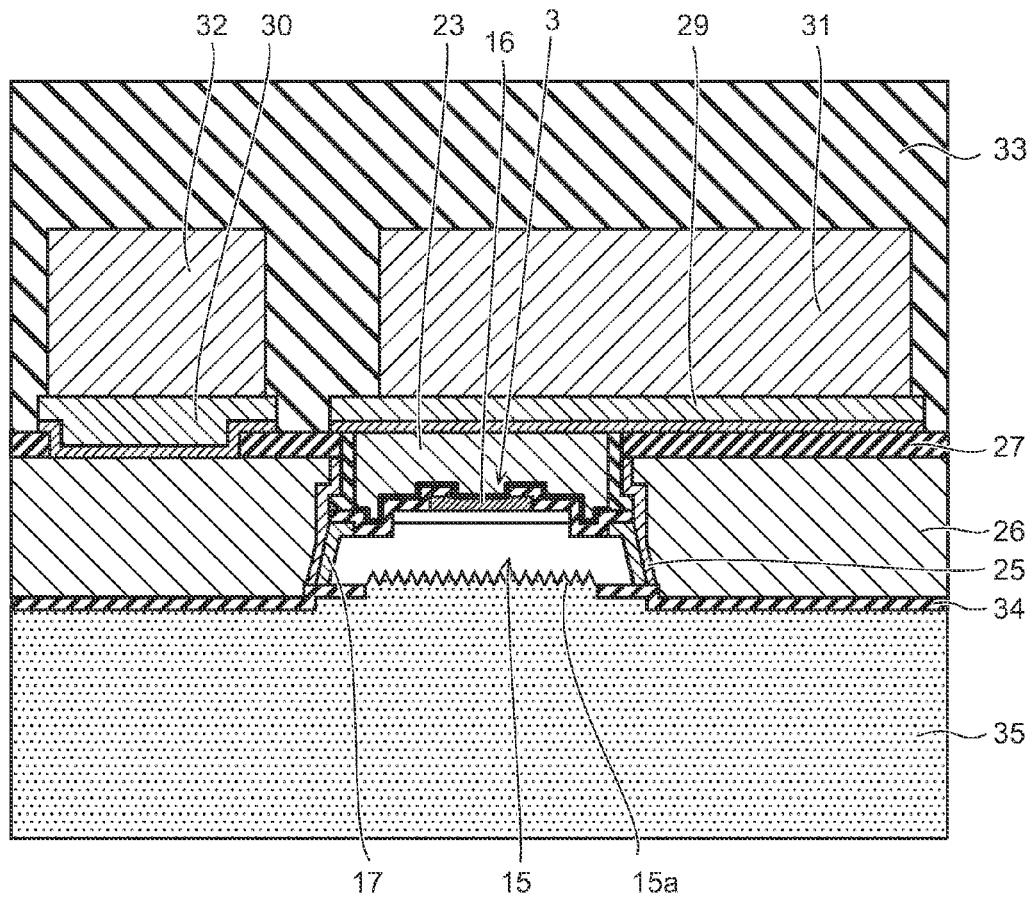

After the frost processing, as shown in FIG. 15, on the first face 15a and on the first n-side metal layer 26, the phosphor layer 35 is formed.

The surface of the resin layer 33 is ground to expose, as shown in FIG. 1, the p-side external terminal 31a and the n-side external terminal 32a.

Processes until the chip 3 is transferred to the film 38 are performed collectively and simultaneously for a plurality of chips 3 on the substrate 10 in a wafer state.

Only one target chip 3 to be transferred from the substrate 10 to the film 38 is shown in FIG. 5B, but a plurality of target chips 3 are transferred from the substrate 10 to the film 38. Then, processes after chips 3 have been transferred to the film 38 are performed collectively and simultaneously for the plurality of chips 3 on the film 38.

Then, after forming the first n-side metal layer 26 in FIG. 6B, the plurality of chips 3 can be treated as a wafer via the first n-side metal layer 26. Accordingly, processes after the removal of the film 38 are also performed collectively and simultaneously for the plurality of chips 3 in a wafer state.

And, in a position between a chip 3 and another chip 3, the resin layer 33, the insulating layer 27, the first n-side metal layer 26, the protection film 34 and the phosphor layer 35 are diced and separated into pieces of the semiconductor light emitting device 1a shown in FIG. 1.

In the dicing region, no semiconductor layer 15 is provided, but, for example, a resin and metal that are more flexible than the GaN-based semiconductor layer 15 are provided. Consequently, damage incurred in the semiconductor layer 15 in the dicing can be avoided.

Respective processes before the dicing are performed collectively in a wafer state. Accordingly, there is no necessity to perform a formation of a support, a formation of a wiring part, a formation of a radiator and the protection of the chip 3 for every chip 3 after the dicing, which enables a considerable cost reduction.

The chip 3 itself can be manufactured in a wafer process on the substrate 10, and can be miniaturized independently from the structure and process of the package part (the wiring part). Accordingly, chip cost can be lowered. And, while making the chip size smaller, by advancing the above-mentioned processes after transferring the chip 3 from the substrate 10 to another support (the film 38), a package part (a wiring part) that gives high heat dissipation performance and mechanical strength can be realized.

Even if the position of respective chips 3 on the film 38 has slightly been moved from an intended position when a plurality of chips 3 are transferred from the substrate 10 to the film 38, by setting the position of the opening 27a that is formed in the insulating layer 27 in the process in FIG. 8B to be sufficiently apart from the first p-side metal layer 23, the wiring part can be formed without short-circuiting the p side and the n side.

Accordingly, when a plurality of chips 3 are aligned again from on the substrate 10 to on the film 38, high positional preciseness is not required, and a method of a high productivity and low cost can be selected.

Here, as a Comparative example, in a structure where the n-side electrode is provided on the second face to contact the n-side electrode with the metal layer of an upper layer on the second face, the existence of the p-side electrode and the p-side metal layer provided on the same second face impose restrictions to make the assurance of a large contact area difficult.

In contrast, according to the embodiment, by forming the n-side electrode 17 on the side face 15c of the semiconductor layer 15, it is possible to contact the n-side electrode 17 with the metal layer 30 of the upper layer in the peripheral region of the chip 3 that does not overlap the chip 3 and the p-side wiring part. This also makes the heat dissipation performance from the n-side electrode 17 side high.

That is, according to the embodiment, while miniaturizing chip 3, a structure excellent in the heat dissipation performance and mechanical strength can be realized with a high productivity, and the semiconductor light emitting device 1a of a low cost and high reliability can be provided.

Hereinafter, other embodiments will be explained. The same numeral is given to an element same as the element in the first embodiment, and detailed explanation thereof is omitted.

Second Embodiment

Figure 16:
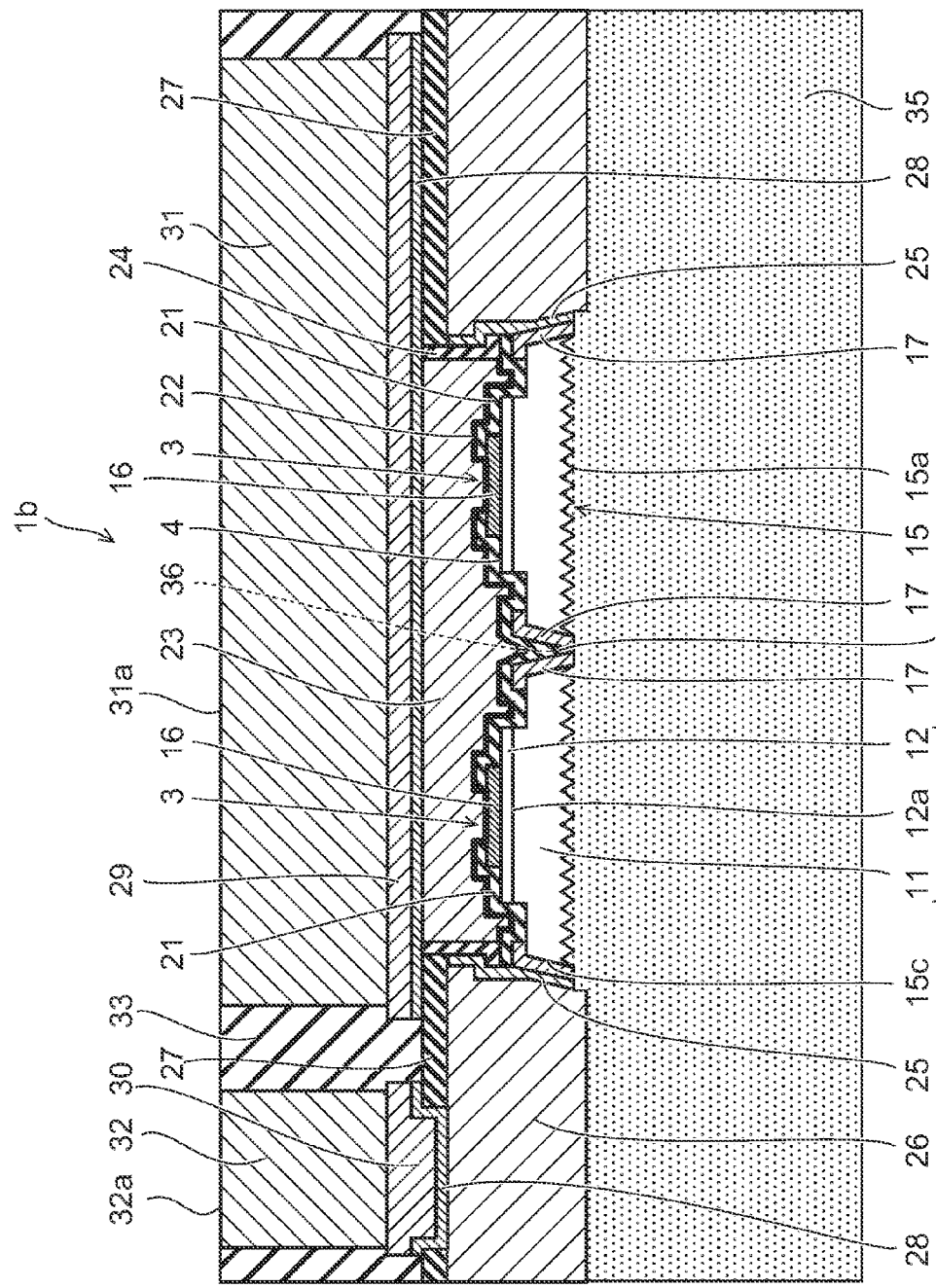
FIG. 16 is a schematic cross-sectional view of a semiconductor light emitting device of a second embodiment.

FIG. 16 is a schematic cross-sectional view of a semiconductor light emitting device 1b of a second embodiment.

The semiconductor light emitting device 1b has a plurality of chips 3, a package part (or a wiring part) that is thicker and larger in the planar size than the chip 3, and the phosphor layer 35.

Figure 17A:
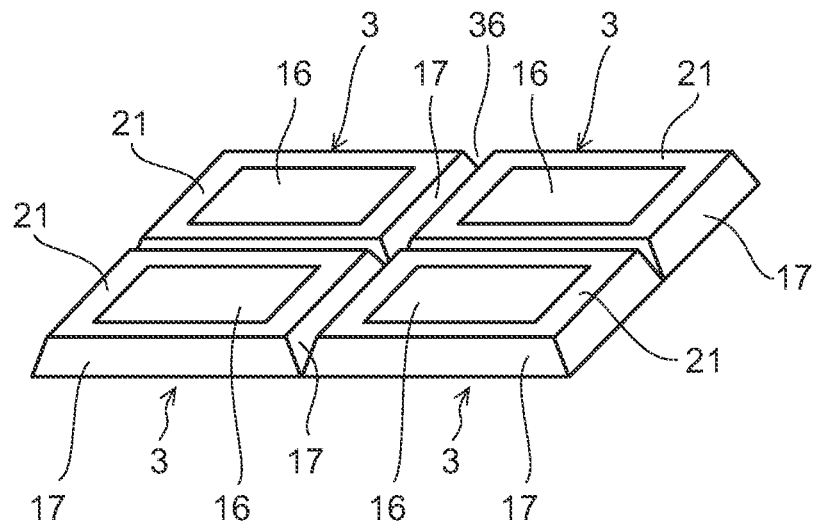
FIGS. 17A and 17B are schematic perspective views of a plurality of chips included in the semiconductor light emitting device of the second embodiment.
Figure 17B:
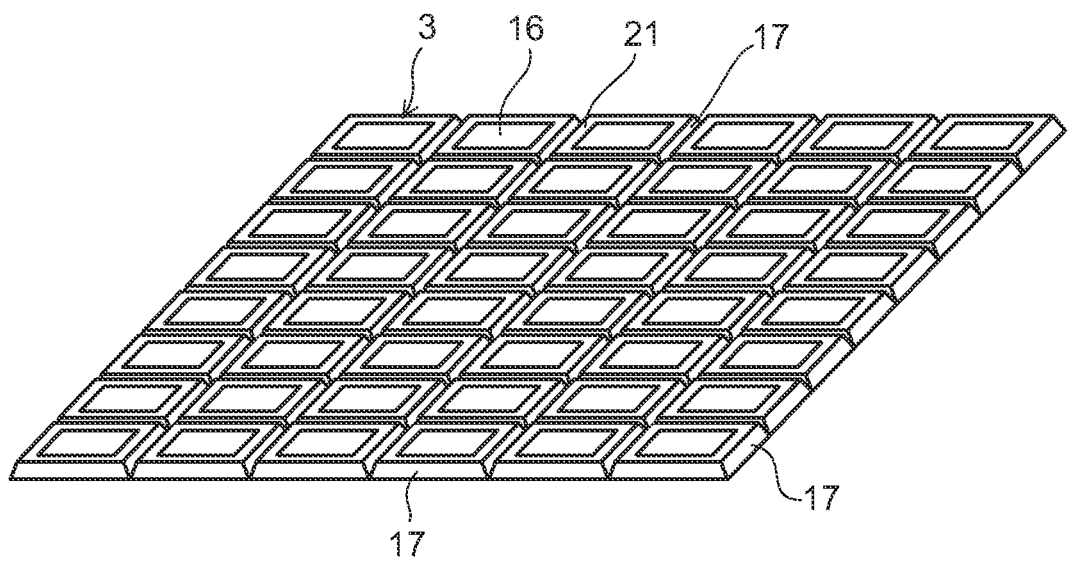

FIGS. 17A and 17B are schematic perspective views of a plurality of chips 3 included in the semiconductor light emitting device 1b. In FIG. 17A, for example, four chips 3 are shown. Alternatively, as shown in FIG. 17B, the semiconductor light emitting device 1b may include more chips 3.

Each of chips 3 has the semiconductor layer 15 including the first face 15a, the second face, the side face 15c and the light emitting layer 12a. The plurality of semiconductor layers 15 are separated from each other by the trench 36. The trench 36 is formed, for example, in a lattice-shaped planar pattern.

On the side face of the trench 36, the n-side electrode 17 is formed. That is, on the side face 15c adjacent to another semiconductor layer 15 with the trench 36 interposed therebetween, the n-side electrode 17 is formed. The n-side electrode 17 is provided on every side face 15c of each of the separated semiconductor layers 15. Consequently, as compared with a case where the n-side electrode 17 is provided only on the side face outside the semiconductor layer 15, the total area of the n-side electrode 17 in the semiconductor light emitting device 1b becomes larger, which can lower the contact resistance of the n-side electrode 17.

The n-side electrodes 17 provided on the side face 15c between the plurality of semiconductor layers 15 are connected with each other in the bottom part of the trench 36. Accordingly, the n-side electrodes 17 provided on the side face 15c between the plurality of semiconductor layers 15 are connected electrically with each other.

Thereby, current distribution to each of chips 3 can be made uniform. Moreover, thermal resistance of the side face of each of chips 3 can be made low, and heat dissipation performance of each of chips 3 can be enhanced.

When a current density is increased, current supply toward the inside when seen in a plan view is likely to become difficult. In contrast, according to the embodiment, the current can be supplied even to the inside by dividing finely the semiconductor layer 15 and utilizing the n-side electrode 17 provided on the side face 15c of each of the divided semiconductor layers 15.

Since the fine trench 36 can be formed by lithography in a wafer state, the loss of a light emitting area as the result of forming the trench 36 can be suppressed to the minimum.

The first p-side metal layer 23, the second p-side metal layer 29 and the third p-side metal layer 31 extend continuously on the plurality of chips 3 to the region including the plurality of chips 3 to reinforce integrally the plurality of chips 3.

Next, with reference to FIGS. 18A to 30, the method for manufacturing the semiconductor light emitting device 1b of the second embodiment will be explained.

Figure 18A:
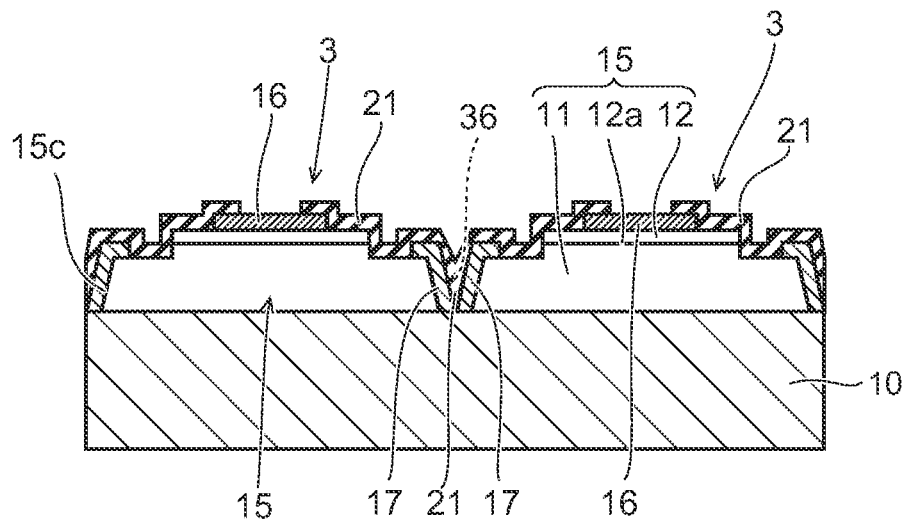

Until the above-mentioned processes shown in FIG. 3C, they are advanced in the same manner as in the first embodiment. However, in the second embodiment, as shown in FIG. 18A, the insulating film 21 in the trench 36 is not removed but left.

Figure 18B:
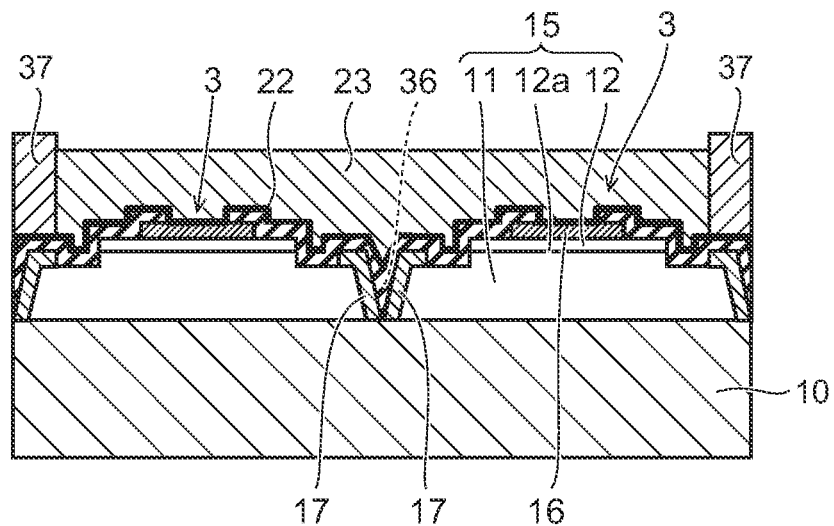

After that, as shown in FIG. 18B, after the formation of the metal film 22 on the exposed part on the substrate 10, the resist 37 is formed selectively on the metal film 22, and Cu electrolytic plating using the metal film 22 as a current path is performed.

By the electrolytic plating, the first p-side metal layer 23 is formed on the metal film 22. The first p-side metal layer 23 is formed continuously and integrally in common relative to the plurality of chips 3. The first p-side metal layer 23 is connected with the p-side electrode 16 of each of chips 3 through an opening formed in the insulating film 21.

Figure 19A:
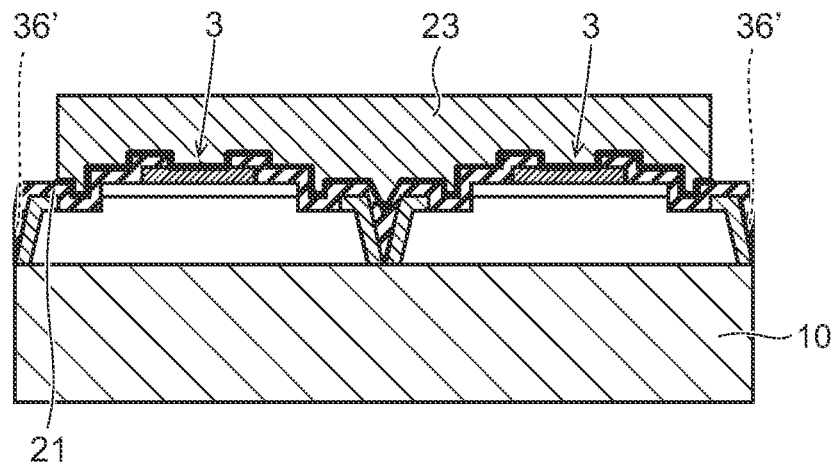

Next, the resist 37 is removed, and furthermore, as shown in FIG. 19A, the exposed part of the metal film 22 having been used as a seed metal is removed.

Figure 19B:
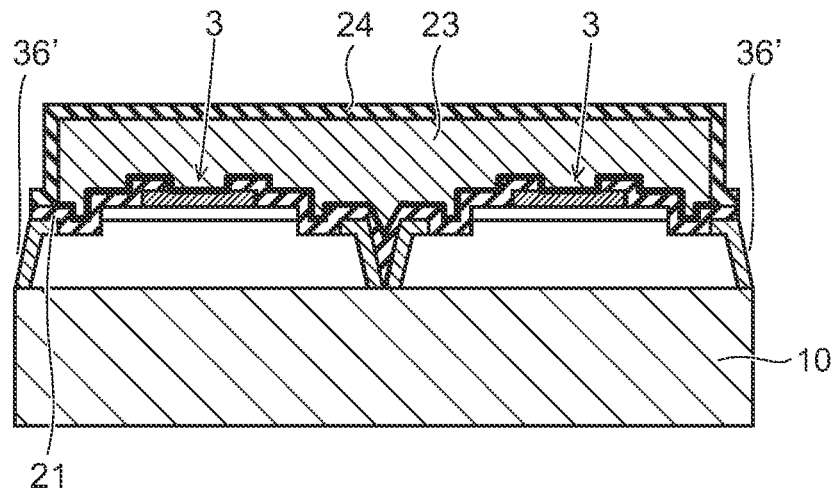

Next, for example, by a CVD method, after the conformal formation of the insulating film 24 over the whole face of the exposed part, as shown in FIG. 19B, the insulating film 21 and the insulating film 24 in a trench 36' lying outside the part linked by the first p-side metal layer 23 are removed, and, as shown in FIG. 20A, onto the upper face of the insulating film 24, for example, a film (or a sheet) 38 made of a resin is attached as a support.

Then, as shown in FIG. 20B, the target chip 3 selected from chips 3 on the substrate 10 is removed from on the substrate 10 and transferred to the film 38. The chip 3 having been removed from the substrate 10 is supported by the film 38 via the first p-side metal layer 23.

When the substrate 10 is a sapphire substrate, the substrate 10 and the chip 3 can be separated by a laser lift off method.

Since the plurality of chips 3 are reinforced by the continuous and integral first p-side metal layer 23, the plurality of chips 3 can be processed as if they were one chip. Moreover, since the chips 3 are supported by the common first p-side metal layer 23 in a separated state, stress applied to the chip 3 can be alleviated as compared with a case of a string of chips in the same size.

Next, as shown in FIG. 21A, after the formation of the metal film 25 in the exposed part on the film 38, Cu electrolytic plating using the metal film 25 as a current path is performed.

Consequently, as shown in FIG. 21B, the first n-side metal layer 26 is formed on the metal film 25. The first n-side metal layer 26 is formed around the chip 3 and on the first face 15a.

After the formation of the first n-side metal layer 26, as shown in FIG. 22A, the film 38 is peeled. By the peeling of the film 38, surfaces of the metal film 25 and the insulating film 24 are exposed.

Then, the metal film 25 and the first n-side metal layer 26 are etched back so that, as shown in FIG. 22B, the surface of the first p-side metal layer 23 and the surface of the insulating film 24 are made to protrude from the surface of the first n-side metal layer 26 to form a step between the surface of the first p-side metal layer 23 and the surface of the insulating film 24, and the surface of the first n-side metal layer 26.

Then, so as to cover the step, on the surface of the insulating film 24 and on the surface of the first n-side metal layer 26, the insulating layer 27 is formed.

Next, for example, by a CMP method, the insulating layer 27 on the surface of the insulating film 24 and the insulating film 24 are removed to expose, as shown in FIG. 23A, the surface of the first p-side metal layer 23. On the surface of the first n-side metal layer 26, the insulating layer 27 is left.

Next, as shown in FIG. 23B, the opening 27a is formed selectively in the insulating layer 27 on the peripheral region of the chip 3 to expose a part of the first n-side metal layer 26.

Figure 24:
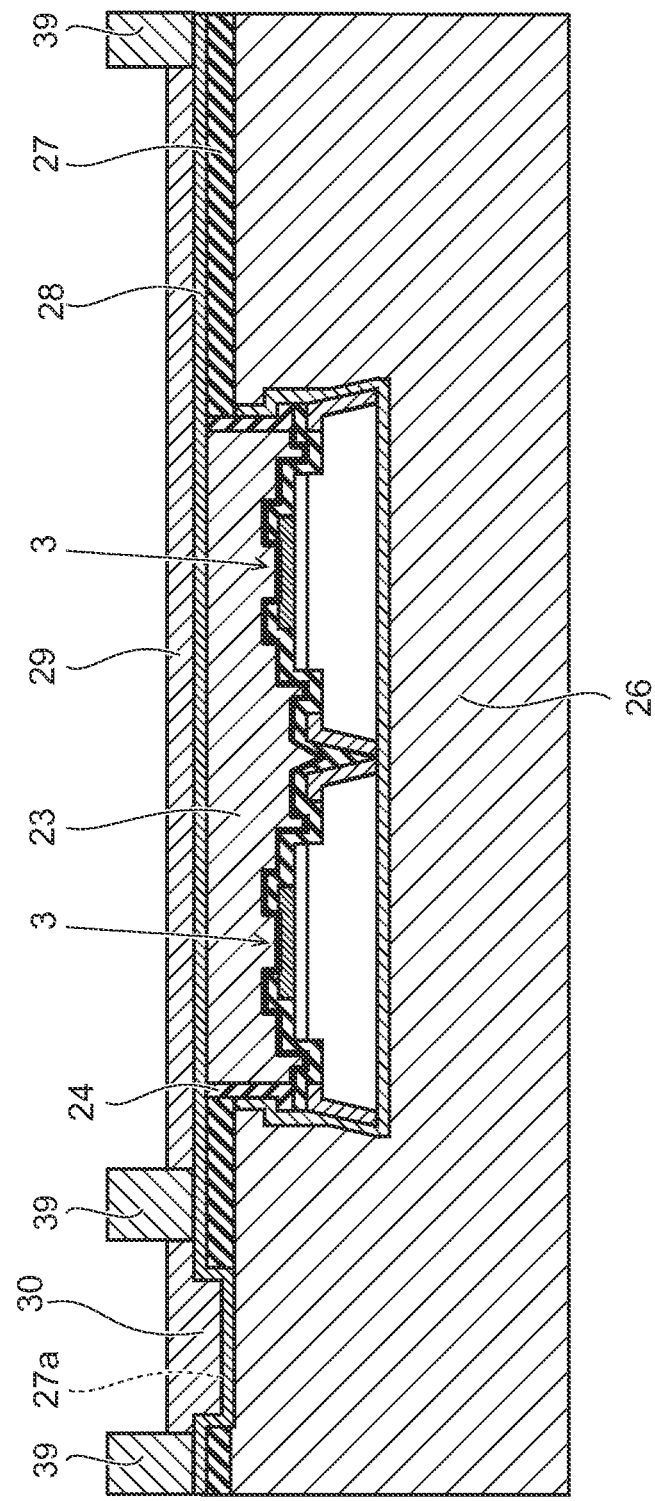

Next, as shown in FIG. 24, in the opening 27a, on the surface of the insulating layer 27 and on the surface of the first p-side metal layer 23, the metal film 28 that functions as a seed metal in plating is formed. Then, using the resist 39, Cu electrolytic plating using the metal film 28 as a current path is performed.

Consequently, on the metal film 28, the second p-side metal layer 29 and the second n-side metal layer 30 are formed. The second p-side metal layer 29 is formed, extending from on the first p-side metal layer 23 to on the insulating layer 27 in the peripheral region of the chip 3. The second n-side metal layer 30 is provided on the peripheral region opposite to the peripheral region where the second p-side metal layer 29 extends with the chip 3 interposed therebetween.

Figure 25:
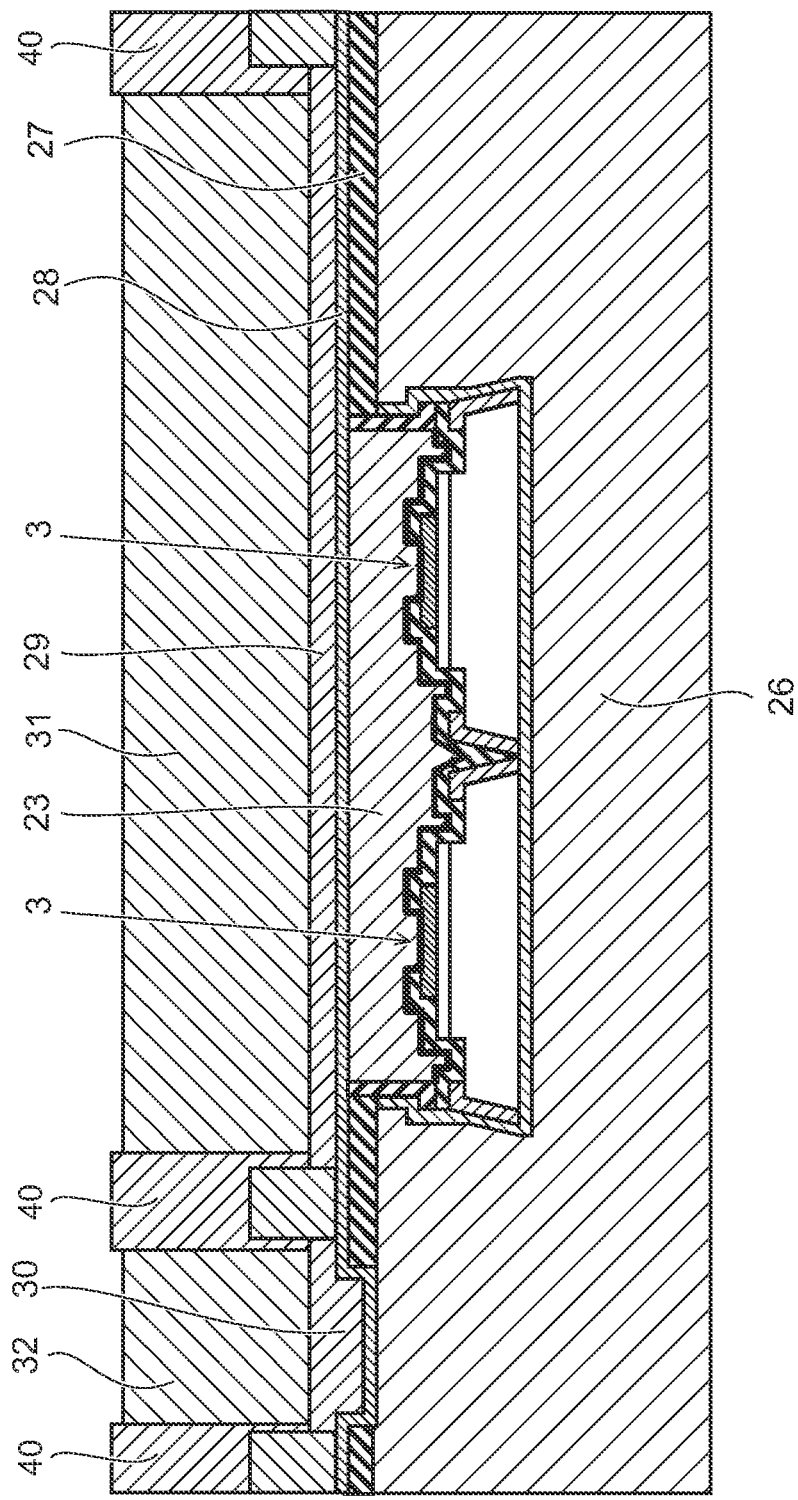

Next, as shown in FIG. 25, using the resist 40, Cu electrolytic plating using the metal film 28 as a current path is performed.

Consequently, the third p-side metal layer 31 is formed on the second p-side metal layer 29, and the third n-side metal layer 32 is formed on the second n-side metal layer 30.

Figure 26:
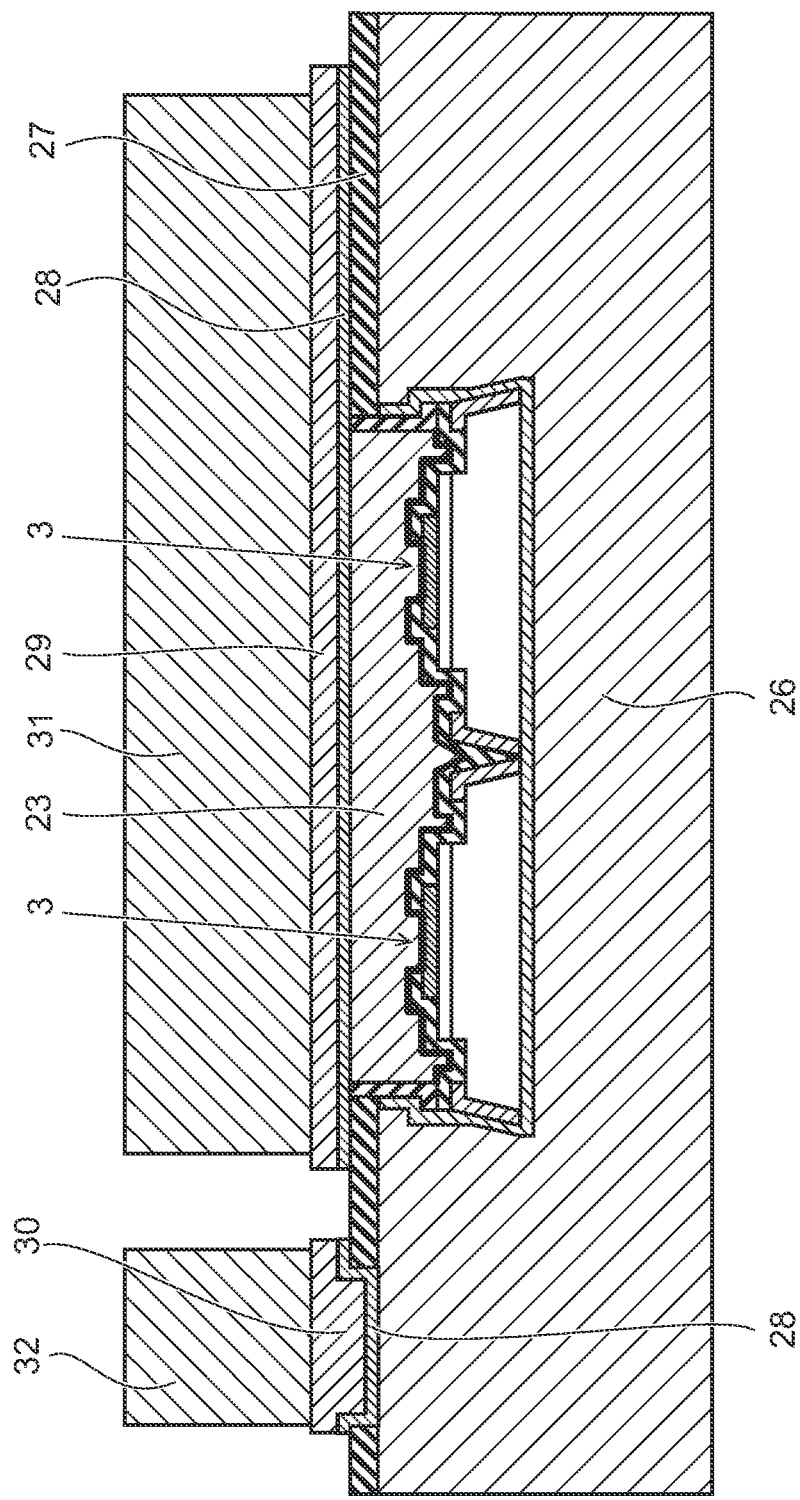

Next, the resist 40 is removed, and furthermore, as shown in FIG. 26, the exposed part of the metal film 28 having been used as the seed metal is removed. Consequently, the connection between the second p-side metal layer 29 and the second n-side metal layer 30, and the connection between the third p-side metal layer 31 and the third n-side metal layer 32, through the metal film 28, are disconnected.

Figure 27:
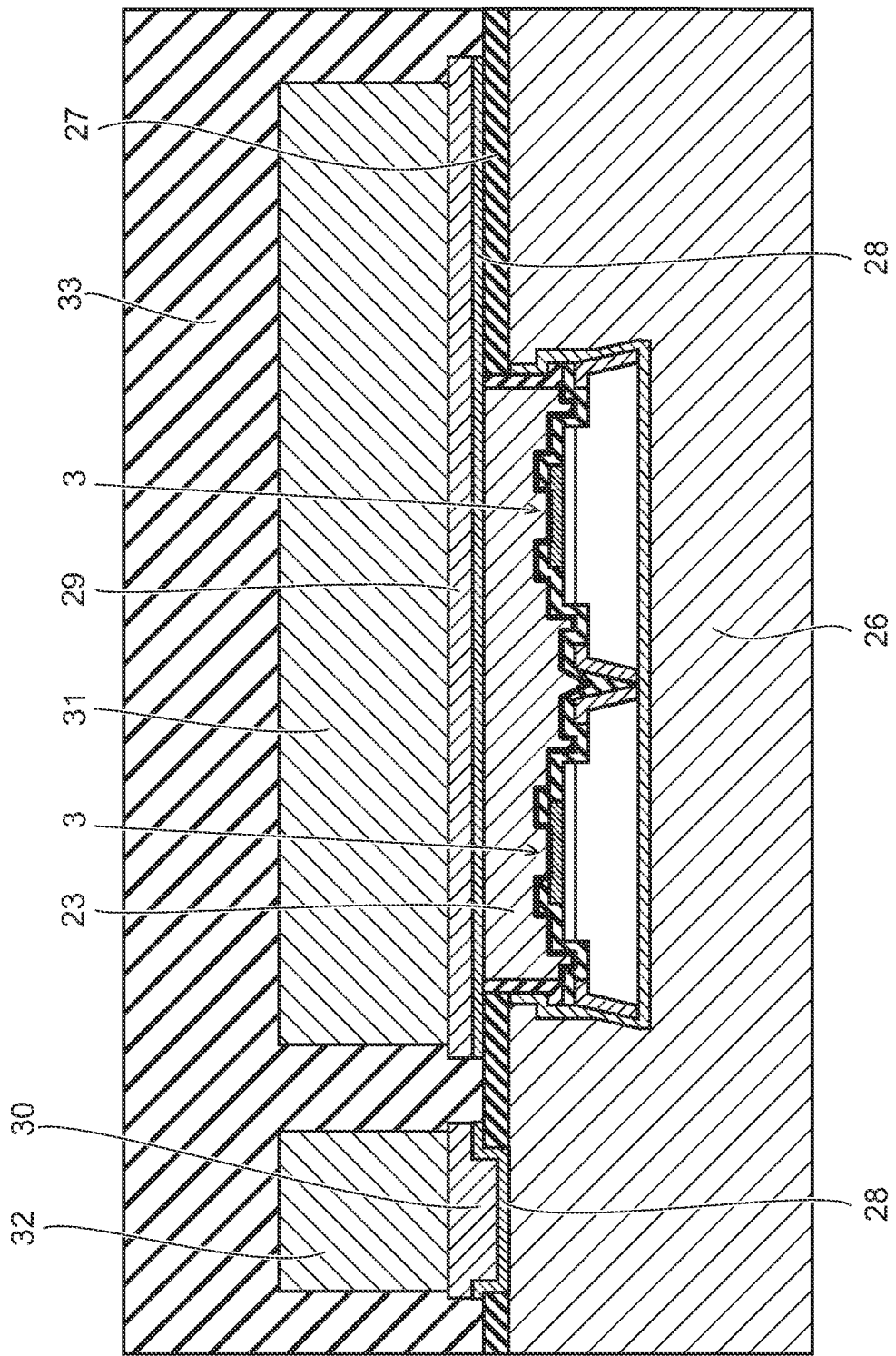

Next, on the insulating layer 27, the resin layer 33 shown in FIG. 27 is formed. The resin layer 33 covers the insulating layer 27, the second p-side metal layer 29, the second n-side metal layer 30, the third p-side metal layer 31, and the third n-side metal layer 32.

Figure 28:
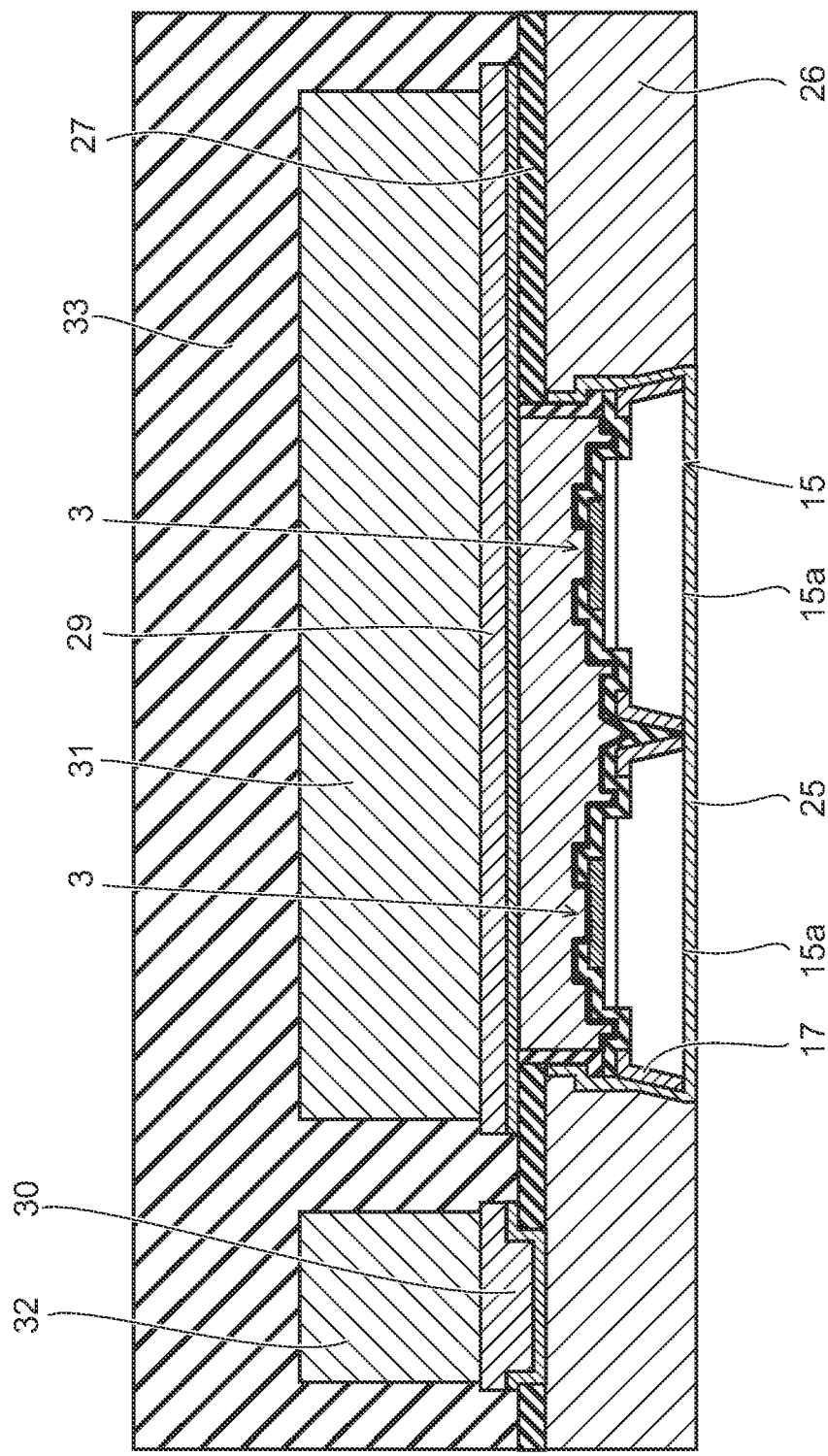

Next, the surface of the first n-side metal layer 26 (the lower face in FIG. 27) is ground to expose, as shown in FIG. 28, the metal film 25 on the first face 15a, and furthermore, the metal film 25 is removed to expose the first face 15a.

Figure 29:
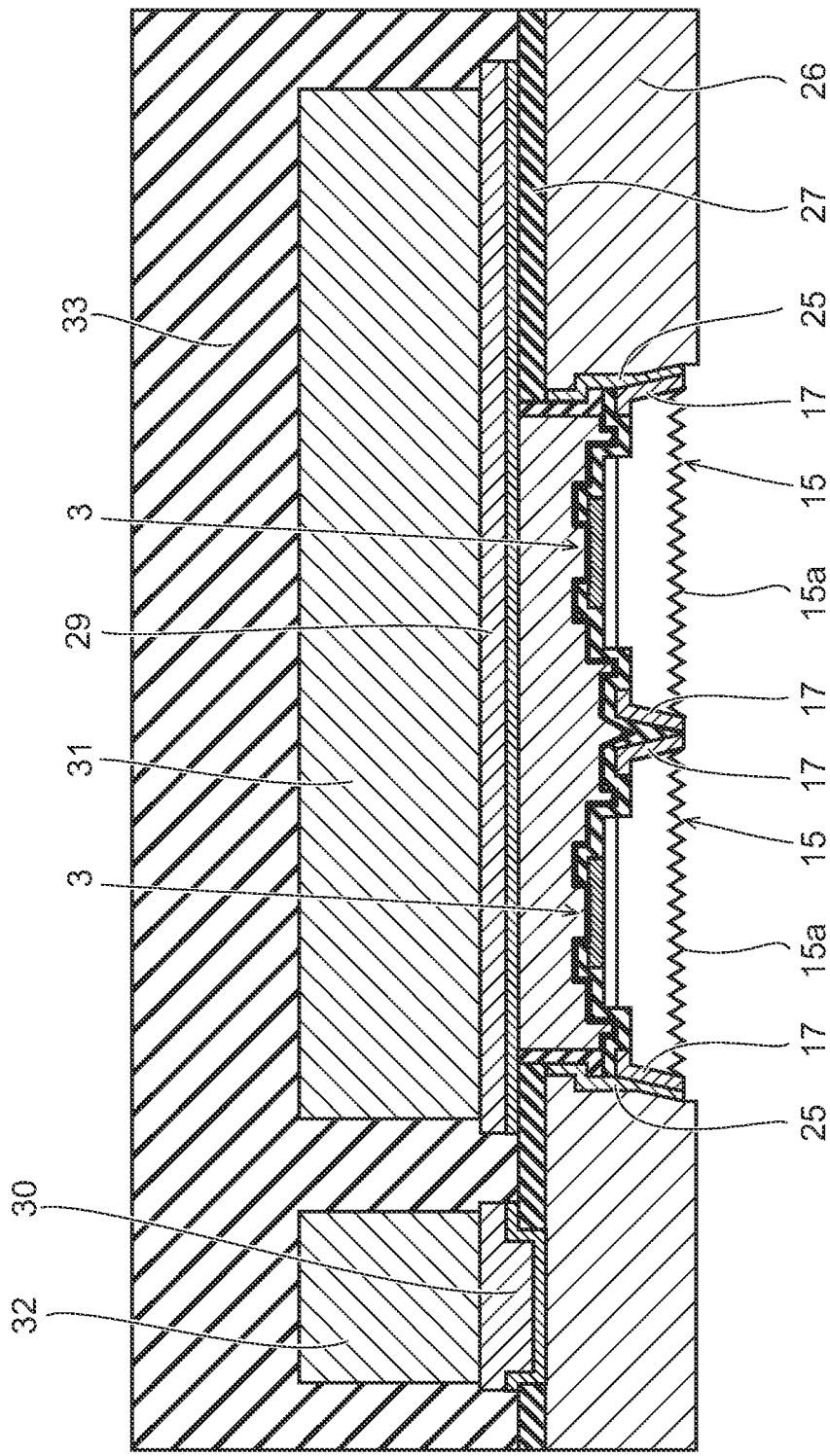

The first face 15a having been exposed is cleaned, and, after that, as shown in FIG. 29, is subjected to frost processing for forming irregularity.

Figure 30:
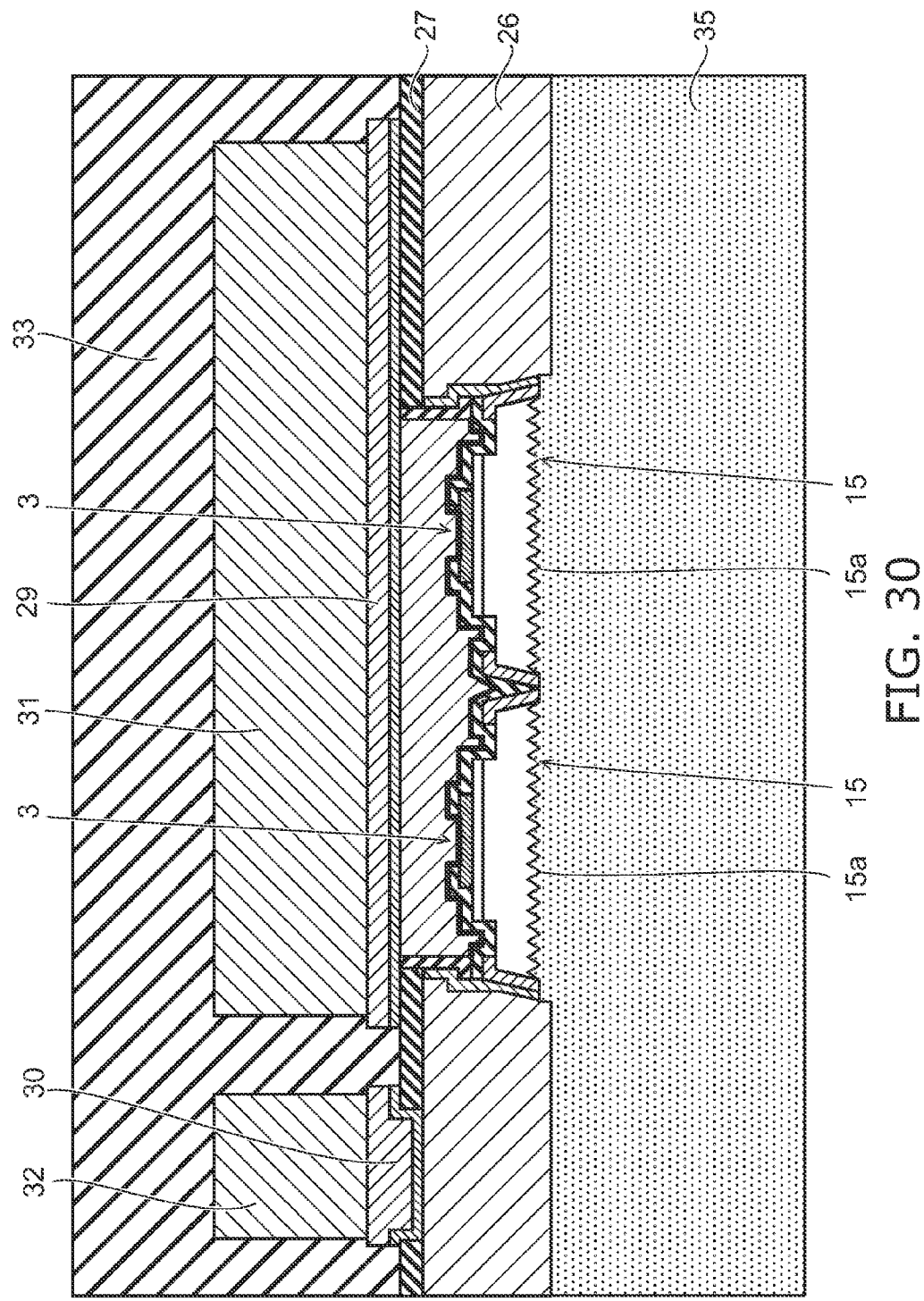

After the frost processing, as shown in FIG. 30, on the first face 15a and on the first n-side metal layer 26, the phosphor layer 35 is formed.

The surface of the resin layer 33 is ground to expose, as shown in FIG. 16, the p-side external terminal 31a and the n-side external terminal 32a.

Then, in an intended position, the resin layer 33, the insulating layer 27, the first n-side metal layer 26, and the phosphor layer 35 are diced and separated into pieces of the semiconductor light emitting device 1b shown in FIG. 16.

According to the second embodiment, the aforementioned series of processes are advanced in a state where the chips 3 are divided into a plurality of parts to give the semiconductor light emitting layer 1b including the plurality of chips 3. Consequently, mechanical stress applied to the chip 3 can be lowered, resulting in high reliability.

Third Embodiment

Figure 31:
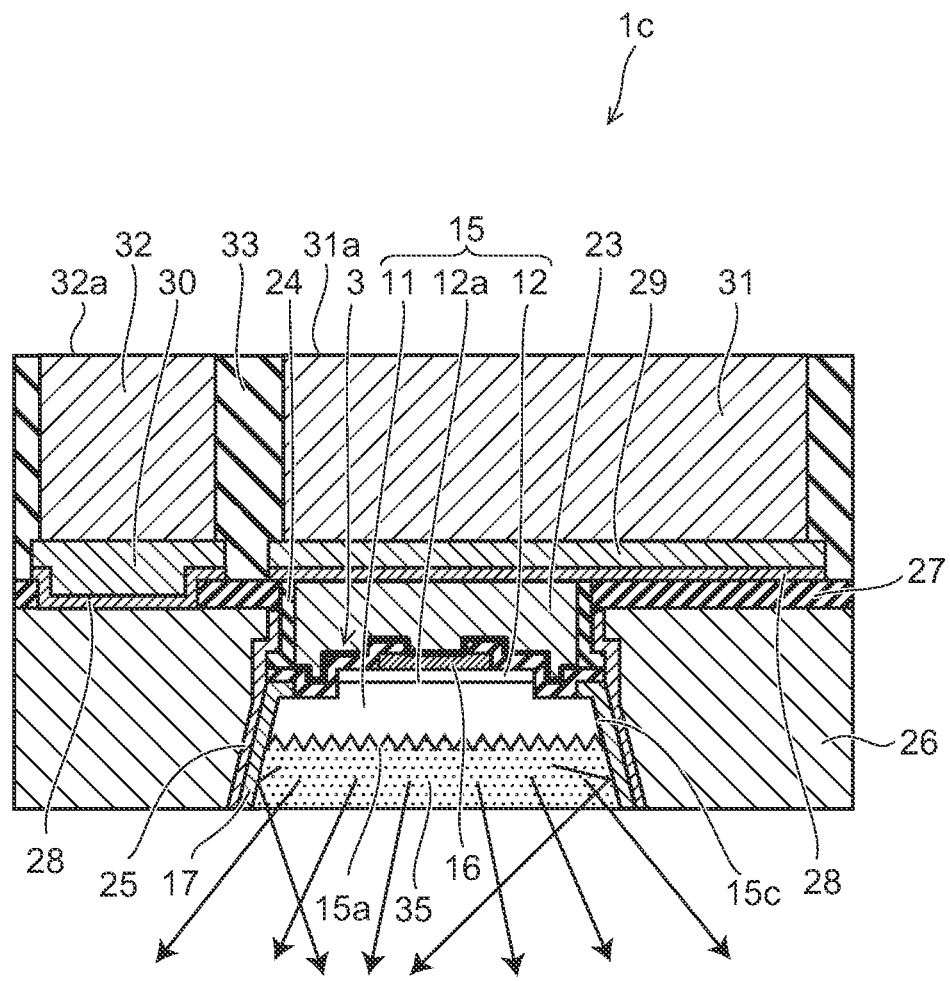
FIG. 31 is a schematic cross-sectional view of a semiconductor light emitting device of a third embodiment.

FIG. 31 is a schematic cross-sectional view of a semiconductor light emitting device 1c of a third embodiment.

Figure 32A:
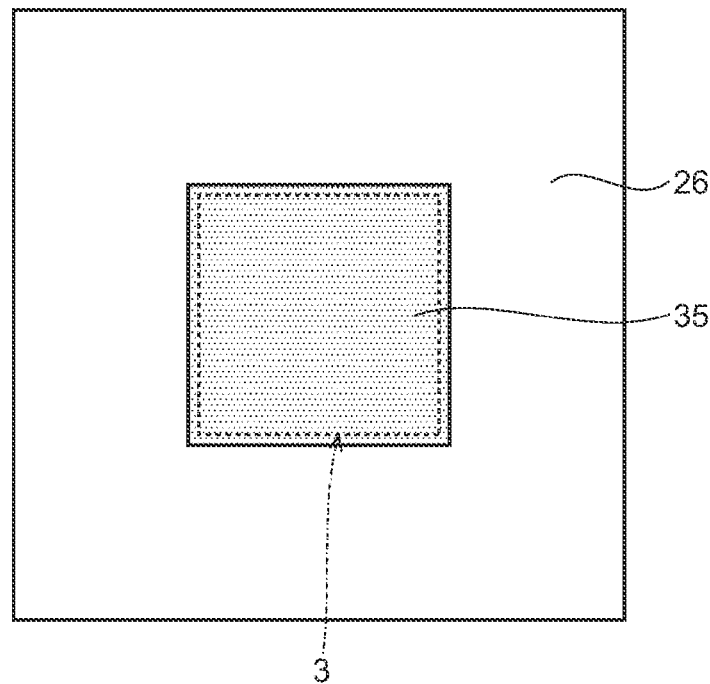
FIGS. 32A and 32B are schematic plan views of the semiconductor light emitting device of the third embodiment.

FIG. 32A is a schematic plan view showing a planar arrangement relation of the chip 3, the first n-side metal layer 26 and the phosphor layer 35 in the semiconductor light emitting device 1c.

Figure 32B:
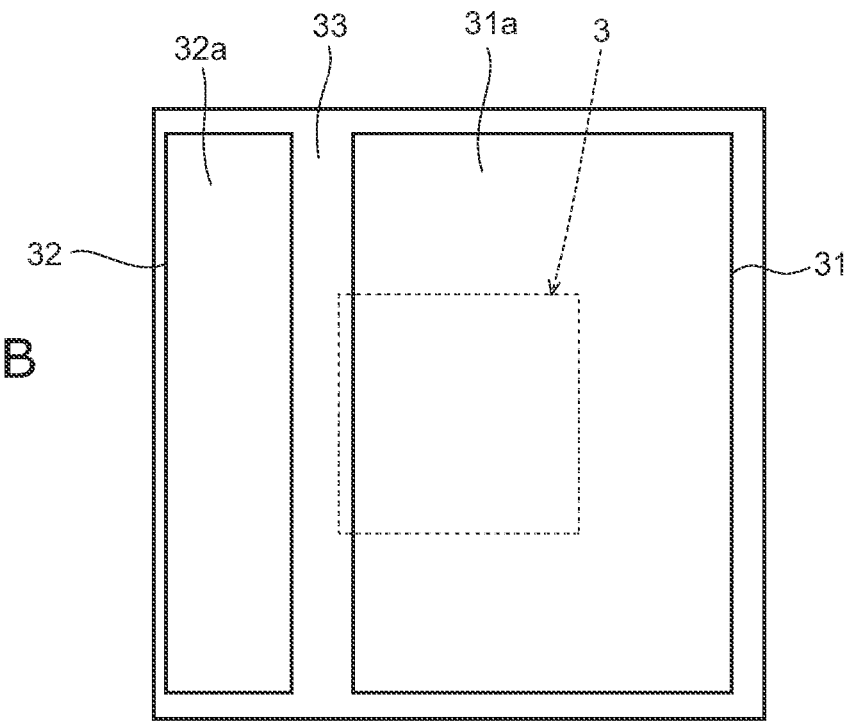

FIG. 32B is a schematic plan view on the mounting surface side in the semiconductor light emitting device 1c.

The semiconductor light emitting device 1c has a chip 3, a package part (a wiring part) that is thicker and larger in the planar size than the chip 3, and the phosphor layer 35.

In the semiconductor light emitting device 1c of the third embodiment, too, the n-side electrode 17 is provided on the side face 15c of the first semiconductor layer 11 not including the light emitting layer 12a. The n-side electrode 17 is provided over the whole face of the side face 15c, and surrounds continuously the periphery of the first semiconductor layer 11.

Figure 48:
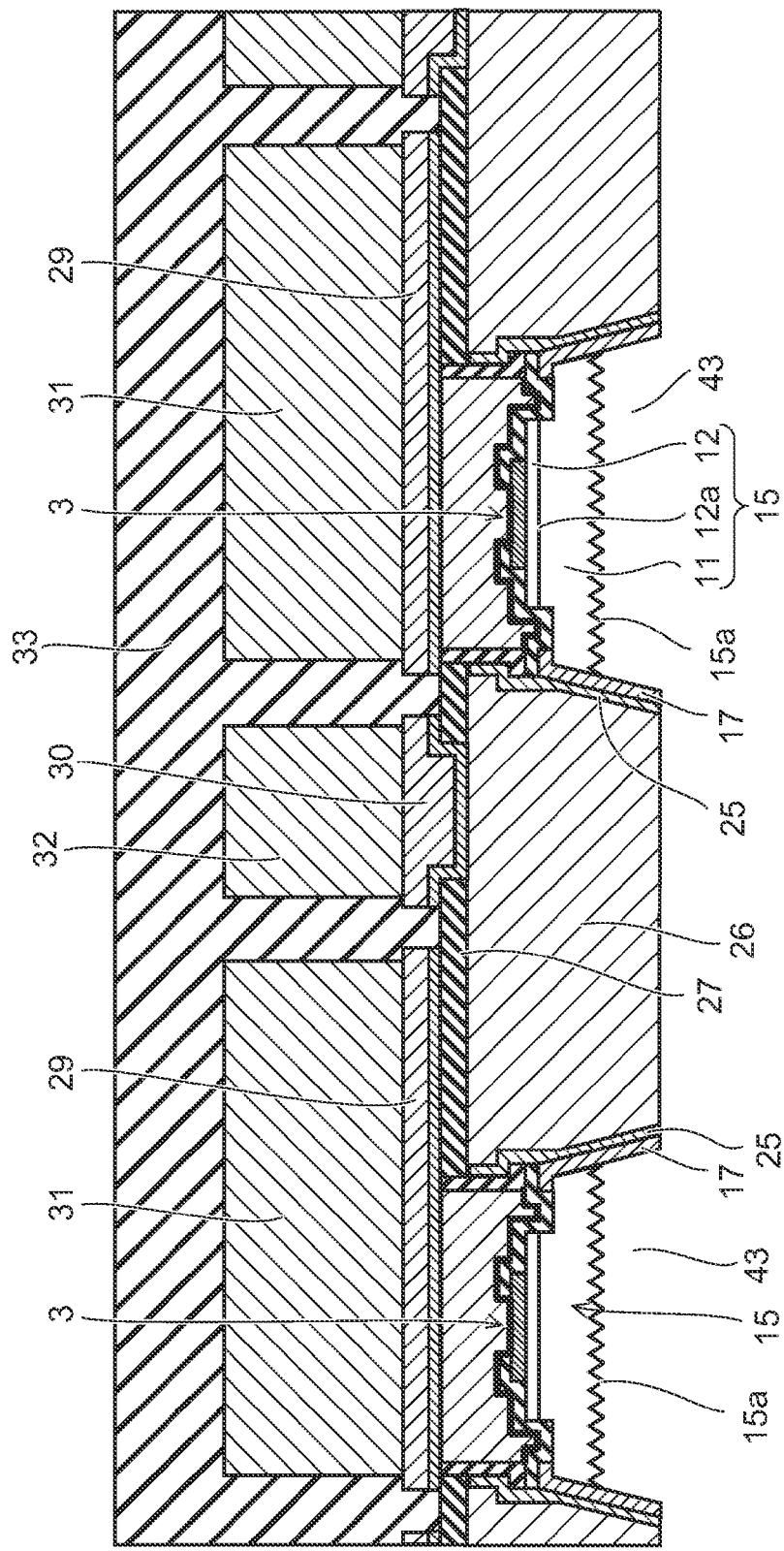

Furthermore, a part of the n-side electrode 17 protrudes downward from the side face 15c beyond the first face 15a in FIG. 31. As shown in FIG. 48 described later, on the first face 15a, a space 43 with a periphery surrounded by the n-side electrode 17 is formed, and, for the space 43, the phosphor layer 35 is provided. The n-side electrode 17 protruding from the first face 15a surrounds continuously the periphery of the phosphor layer 35 on the first face 15a.

Around the n-side electrode 17 protruding from the first face 15a, too, the first n-side metal layer 26 is provided via the metal film 25. The first n-side metal layer 26 is thicker than the chip 3, and surrounds continuously the periphery of the semiconductor layer 15 and the phosphor layer 35 via the n-side electrode 17 and the metal film 25.

Figure 33:
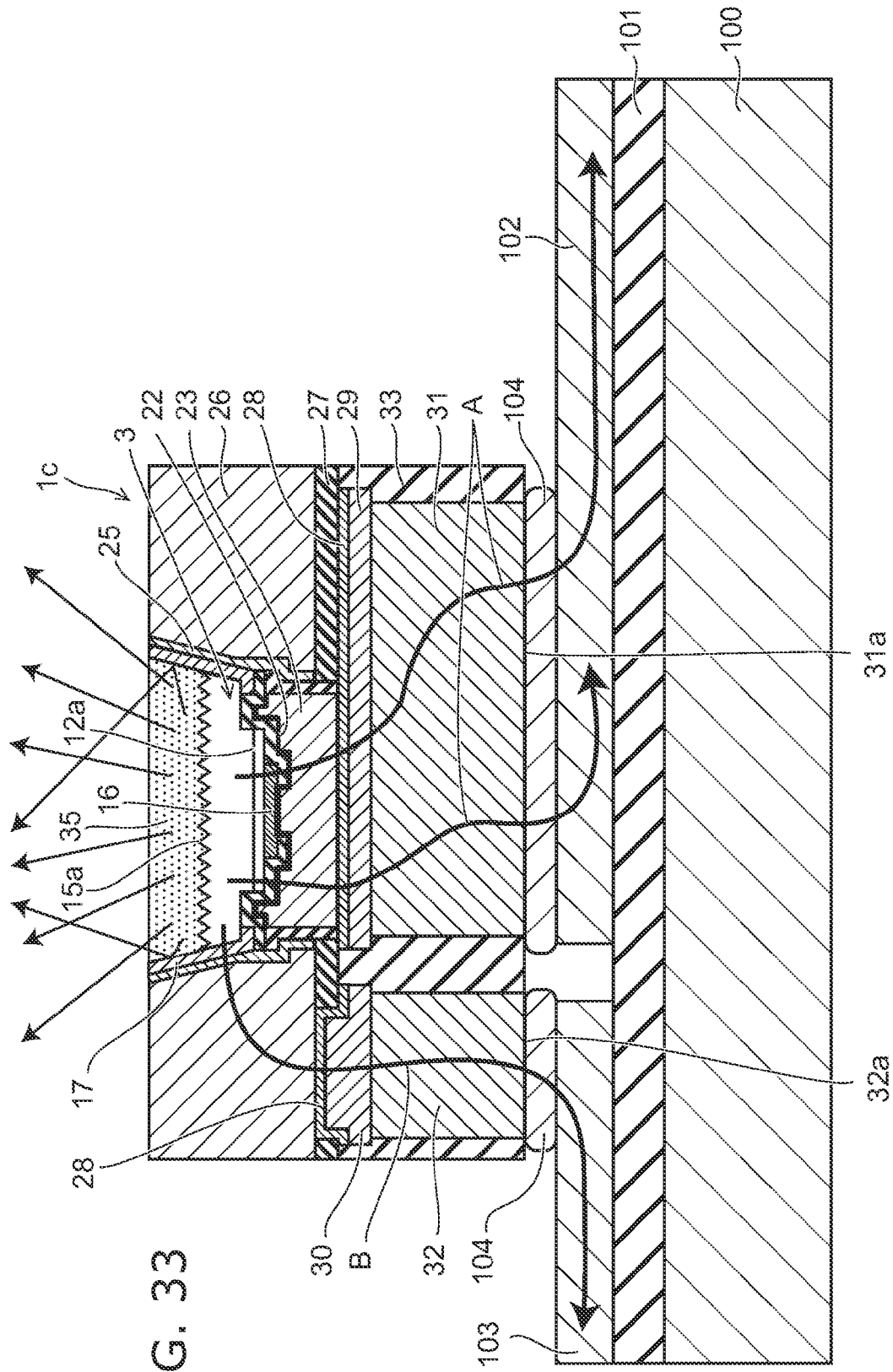
FIG. 33 is a schematic cross-sectional view in a state where the semiconductor light emitting device of the third embodiment is mounted on a mounting substrate.

FIG. 33 is a schematic cross-sectional view in a state where the semiconductor light emitting device 1c of the third embodiment is mounted on a mounting substrate 100.

On the mounting substrate 100, an insulating film 101 is provided, and, on the insulating film 101, wiring layers 102 and 103 are provided. The wiring layer 102 and the wiring layer 103 are insulated and separated from each other on the mounting substrate 100. The p-side external terminal 31a is joined to the wiring layer 102, for example, by solder 104 as a jointing material. The n-side external terminal 32a is joined to the wiring layer 103, for example, by the solder 104.

The semiconductor light emitting device 1c is mounted in a state where the mounting surface including the p-side external terminal 31a and the n-side external terminal 32a faces the mounting substrate 100 side. In the state, the first face 15a and the phosphor layer 35 on the first face 15a face above the mounting substrate 100.

According to the third embodiment, the phosphor layer 35 surrounded by the n-side electrode 17 is provided on the first face 15a. As the n-side electrode 17, when a metal having reflectivity with respect to the emitting light of the light emitting layer 12a and the wavelength-converted light of the phosphor layer 35 is used, the leak of light from the side face of the chip 3 and from the side face of the phosphor layer 35 can be avoided, which improves the light extraction efficiency.

Moreover, light distribution in which the directivity toward the upside of the surface of the mounting substrate is strengthened may be realized, and the formation of a reflection plate on the surface of the mounting substrate becomes unnecessary and an optical design of lighting devices becomes easy, to achieve cost reduction.

Heat generated in the light emitting layer 12a is, as shown by an arrow A in FIG. 33, conducted through a metallic body on the p-side (a wiring part) including the first p-side metal layer 23, the metal film 28, the second p-side metal layer 29 and the third p-side metal layer 31 from the second face side, and, furthermore, is dissipated to the mounting substrate 100 via the solder 104. Since the p-side metallic body (the wiring part) is provided on the second face side with a larger area and larger thickness than the chip 3, a high heat dissipation performance can be obtained.

Heat generated in the light emitting layer 12a is, as shown by an arrow B in FIG. 33, conducted through a metallic body on the n-side (a wiring part) including the n-side electrode 17, the metal film 25, the first n-side metal layer 26, the metallic film 28, the second n-side metal layer 30 and the third n-side metal layer 32, and, furthermore, is dissipated to the mounting substrate 100 via the solder 104. The heat dissipation route includes the first n-side metal layer 26 which is provided around the chip 3 and is larger in area and thicker than the chip 3. Accordingly, the heat dissipation performance from the side face side of the chip 3 is also high.

Next, with reference to FIGS. 34A to 49, the method for manufacturing the semiconductor light emitting device 1c of the third embodiment will be explained.

Figure 34A:
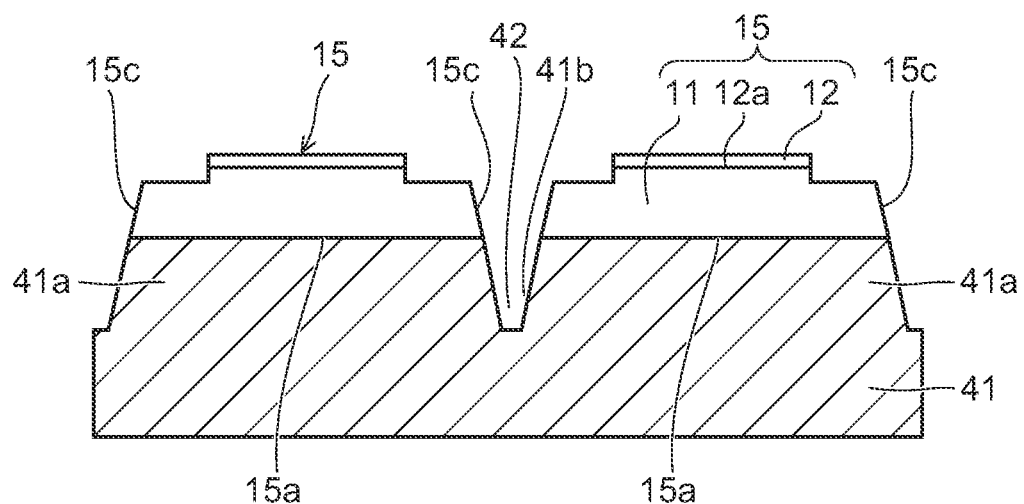

In the third embodiment, as a substrate 41, the semiconductor layer 15 is formed, for example, on a silicon substrate. After the formation of the semiconductor layer 15 on the substrate 41, the second semiconductor layer 12 is removed selectively, for example, by RIE using a resist not shown to expose selectively, as shown in FIG. 34A, the first semiconductor layer 11. The region 5 from which the first semiconductor layer 11 is exposed does not include the light emitting layer 12a.

Moreover, for example, by RIE using a resist mask not shown, the trench 42 is formed to separate the semiconductor layer 15 into a plurality of parts. The trench 42 penetrates through the semiconductor layer 15, and is formed also in the surface of the substrate 41. Accordingly, on the surface of the substrate 41, a convex part 41a and a concave part 41b are formed. The side face 15c of the semiconductor layer 15 faces the trench 42. Similarly, a side face between the concave part 41b and the convex part 41a faces the trench 42.

Figure 34B:
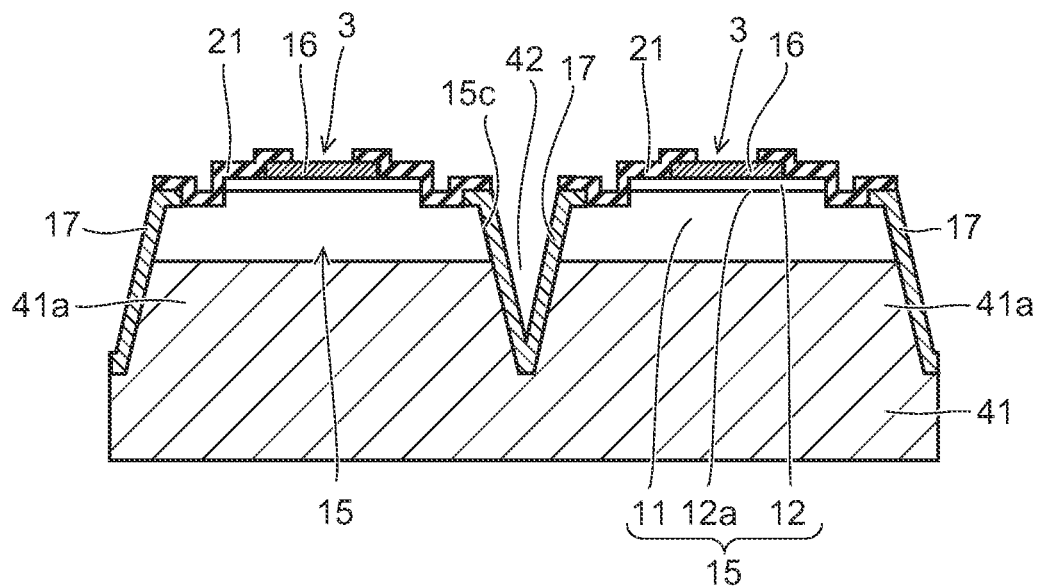

On a region including the light emitting layer 12a in the second face of the semiconductor layer 15, as shown in FIG. 34B, the p-side electrode 16 is formed.

The n-side electrode 17 is formed on the side face 15c of the semiconductor layer 15 facing the trench 42 and on the side face of the convex part 41a of the substrate 41. The n-side electrode 17 does not fill up the inside of the trench 42.

In the second face, on the face where the p-side electrode 16 and the n-side electrode 17 have not been formed, the insulating film 21 is formed. A part of the insulating film 21 on the p-side electrode 16 is opened. After that, by a heat treatment, the p-side electrode 16 and the n-side electrode 17 are ohmic-contacted with the semiconductor layer 15.

Figure 35A:
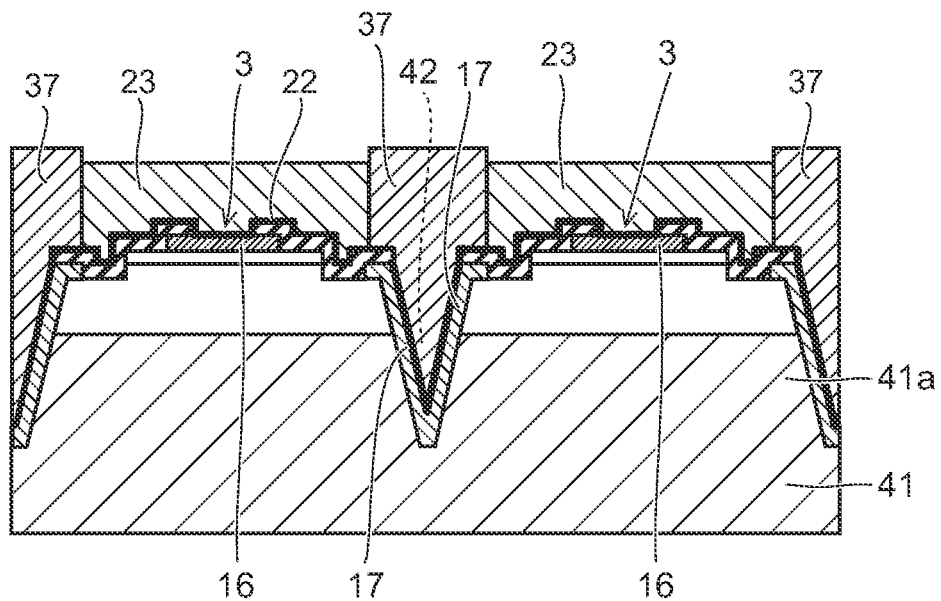

Next, on the exposed part on the substrate 41, the metal film 22 shown in FIG. 35A is formed conformally. Then, on the metal film 22, the resist 37 is formed selectively, and Cu electrolytic plating using the metal film 22 as a current path is performed. The resist 37 is formed in the trench 42 and on the trench 42.

By the electrolytic plating, the first p-side metal layer 23 is formed on the metal film 22. The first p-side metal layer 23 is connected with the p-side electrode 16 through the opening formed in the insulating film 21.

Figure 35B:
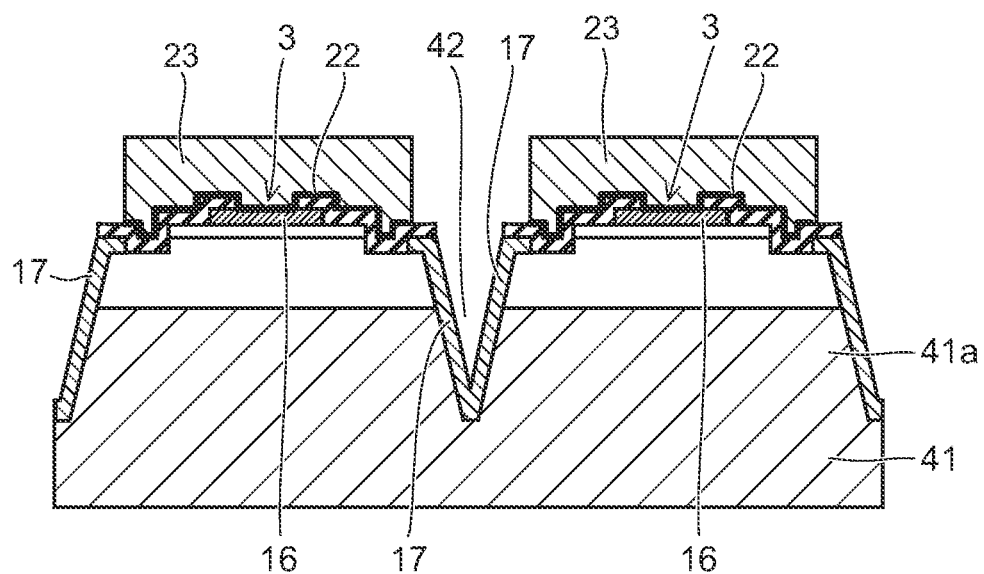

Next, the resist 37 is removed, and furthermore, as shown in FIG. 35B, the exposed part of the metal film 22 having been used as the seed metal is removed. Thereby, the connection between the p-side electrode 16 and the n-side electrode 17 through the metal film 22 is disconnected.

Figure 36A:
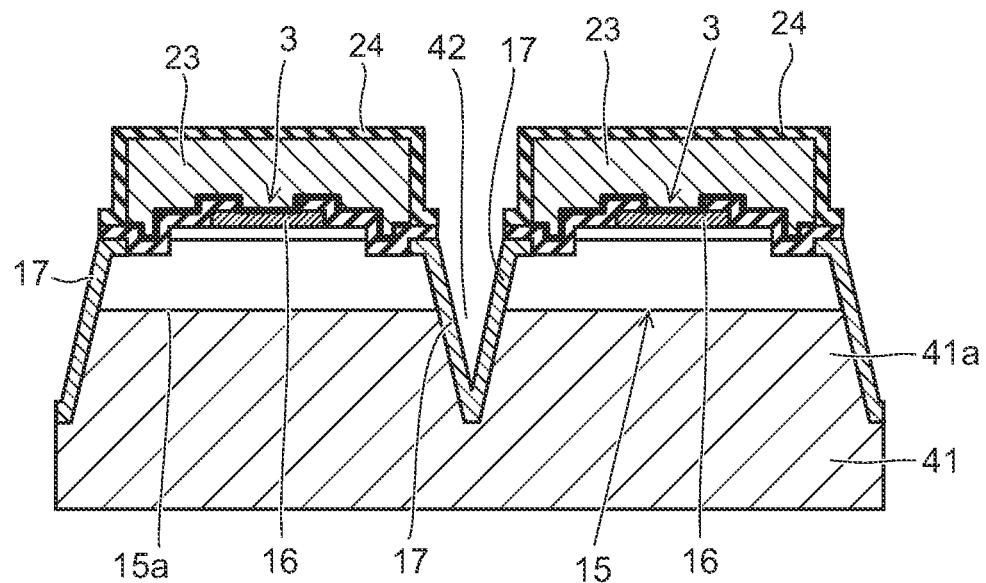

Next, after the formation of the insulating film 24 shown in FIG. 36A conformally over the whole face of the exposed part, for example, by a CVD method, the insulating film 24 in the trench 42 is removed. The n-side electrode 17 is exposed.

Figure 36B:
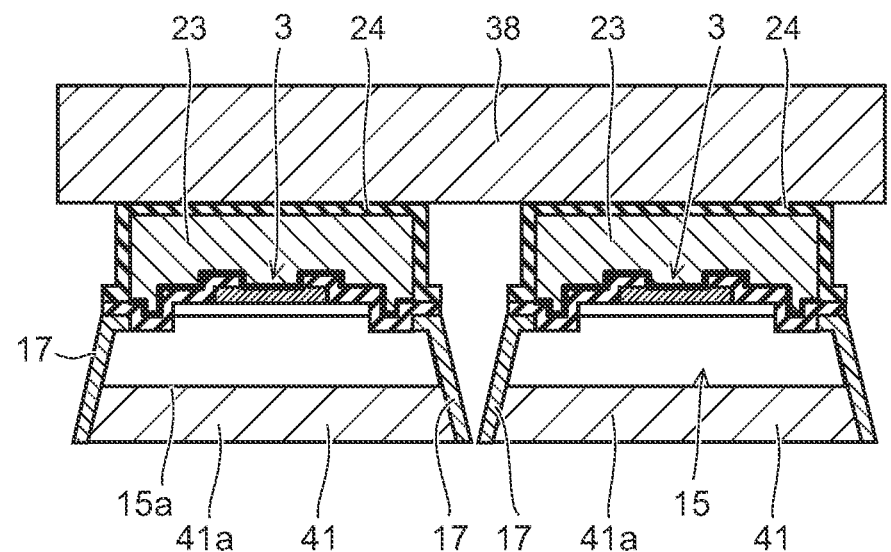

Next, as shown in FIG. 36B, to the upper face of the insulating film 24, for example, the film (or the sheet) 38 made of a resin is attached as a support.

Then, the rear face of the substrate 41 is ground until the trench 42 is reached. Thereby, the chips 3 linked in a wafer shape via the substrate 41 are separated into a plurality of parts on the film 38. In the region surrounded by the n-side electrode 17 on the first face 15a, a part of the convex part 41a of the substrate 41 is left.

Next, the distance between the chips 3 that have been separated into a plurality of parts is extended. For processes continued afterward, highly precise distance between the chips 3 is not required. Accordingly, a method, in which, for example, a film 38 having stretch properties is used and the film 38 is extended, as shown in FIG. 37, to extend the distance between the plurality of chips 3 supported on the film 38, can be used.

Alternatively, the chips 3 are picked up from on the film 38, and may be rearranged on another support with an extended inter-chip distance. In this case, too, since precise inter-chip 3 distance is not required, rearrangement of the chips 3 using a high-speed mounting machine is possible.

Figure 38:
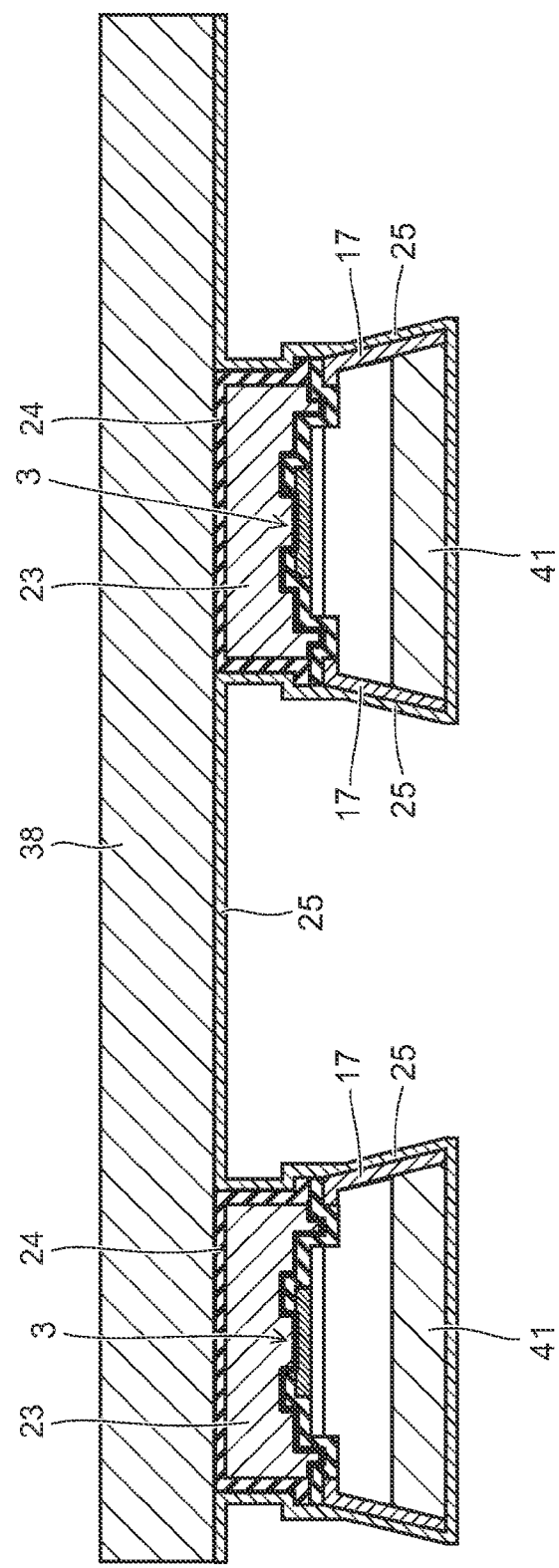

Next, as shown in FIG. 38, in the exposed part on the film 38, the metal film 25 that functions as a seed metal in plating is formed. Then, Cu electrolytic plating using the metal film 25 as a current path is performed.

Figure 39:
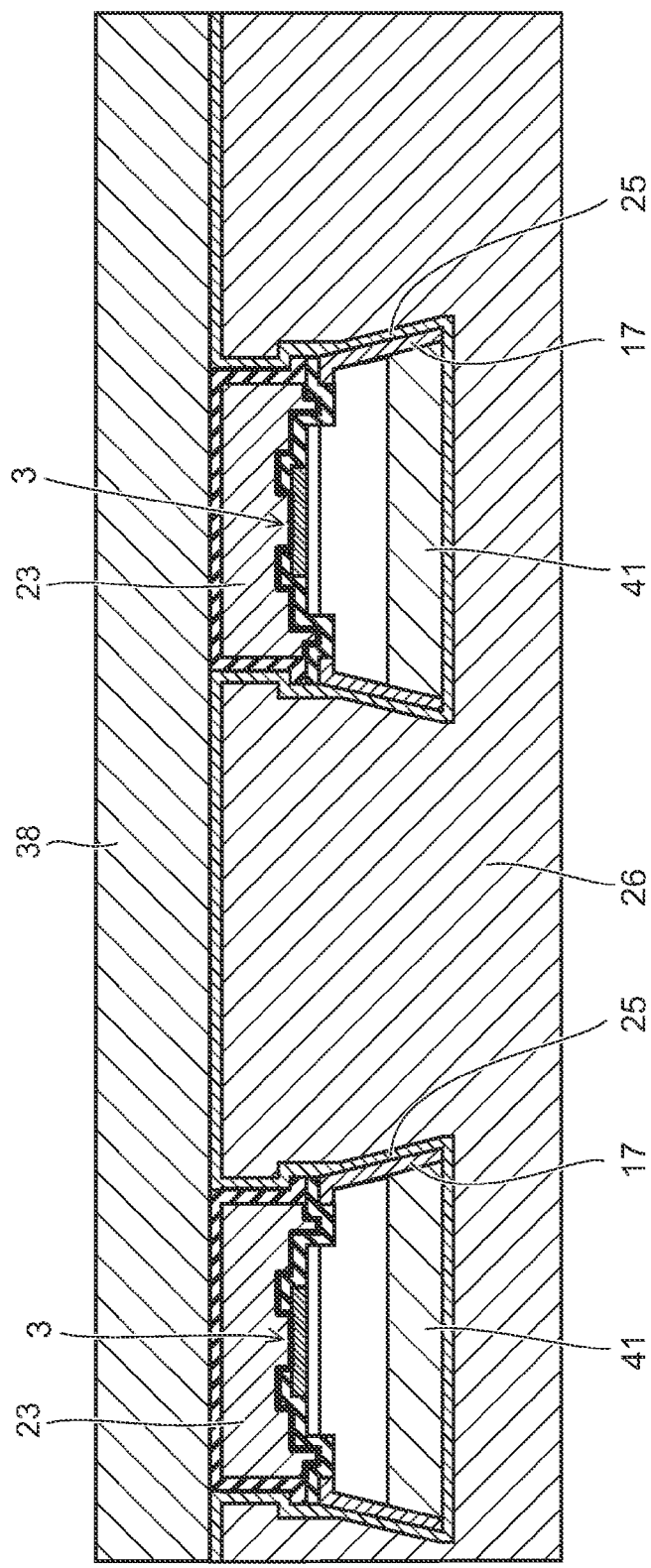

Consequently, as shown in FIG. 39, the first n-side metal layer 26 is formed on the metal film 25. The first n-side metal layer 26 is formed around the chip 3 and on the first face 15a.

Figure 40:
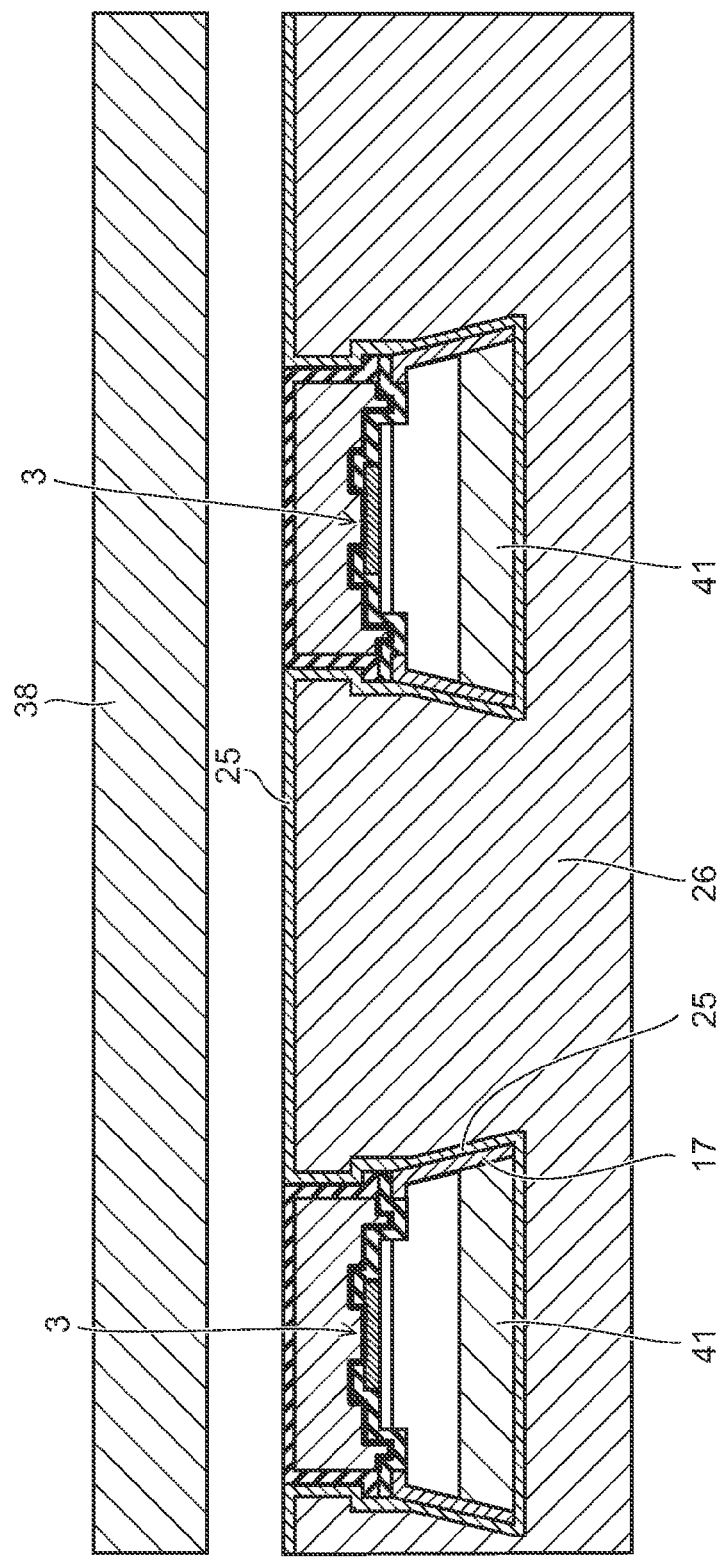

After the formation of the first n-side metal layer 26, as shown in FIG. 40, the film 38 is peeled. By the peeling of the film 38, surfaces of the metal film 25 and the insulating film 24 are exposed.

Figure 41:
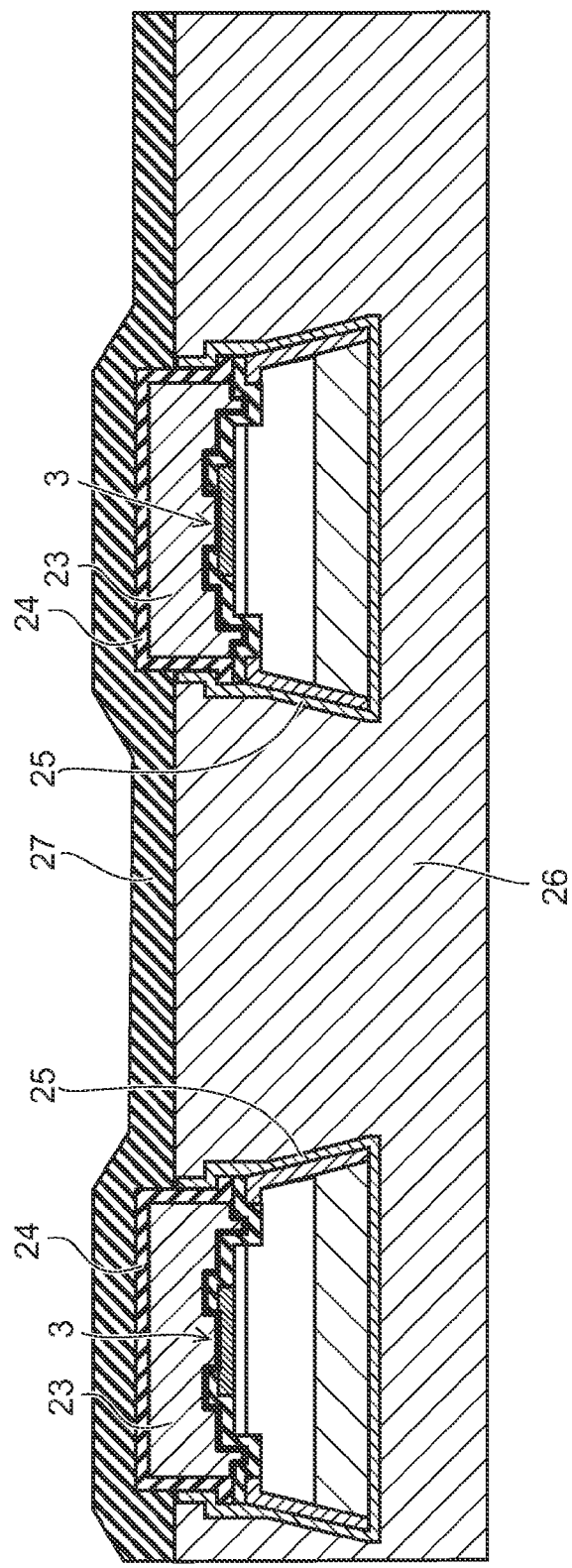

Then, the metal film 25 and the first n-side metal layer 26 are etched back so that, as shown in FIG. 41, the surface of the first p-side metal layer 23 and the surface of the insulating film 24 are made to protrude from the surface of the first n-side metal layer 26 to form a step between the surface of the first p-side metal layer 23 and the surface of the insulating film 24, and the surface of the first n-side metal layer 26.

Then, so as to cover the step, on the surface of the insulating film 24 and on the surface of the first n-side metal layer 26, the insulating layer 27 is formed.

Next, for example, by a CMP method, the insulating layer 27 on the surface of the insulating film 24 and the insulating film 24 are removed to expose, as shown in FIG. 42A, the surface of the first p-side metal layer 23. On the surface of the first n-side metal layer 26, the insulating layer 27 is left.

Next, as shown in FIG. 42B, in the insulating layer 27 on the peripheral region of the chip 3, an opening 27a is formed selectively to expose a part of the first n-side metal layer 26.

Figure 43:
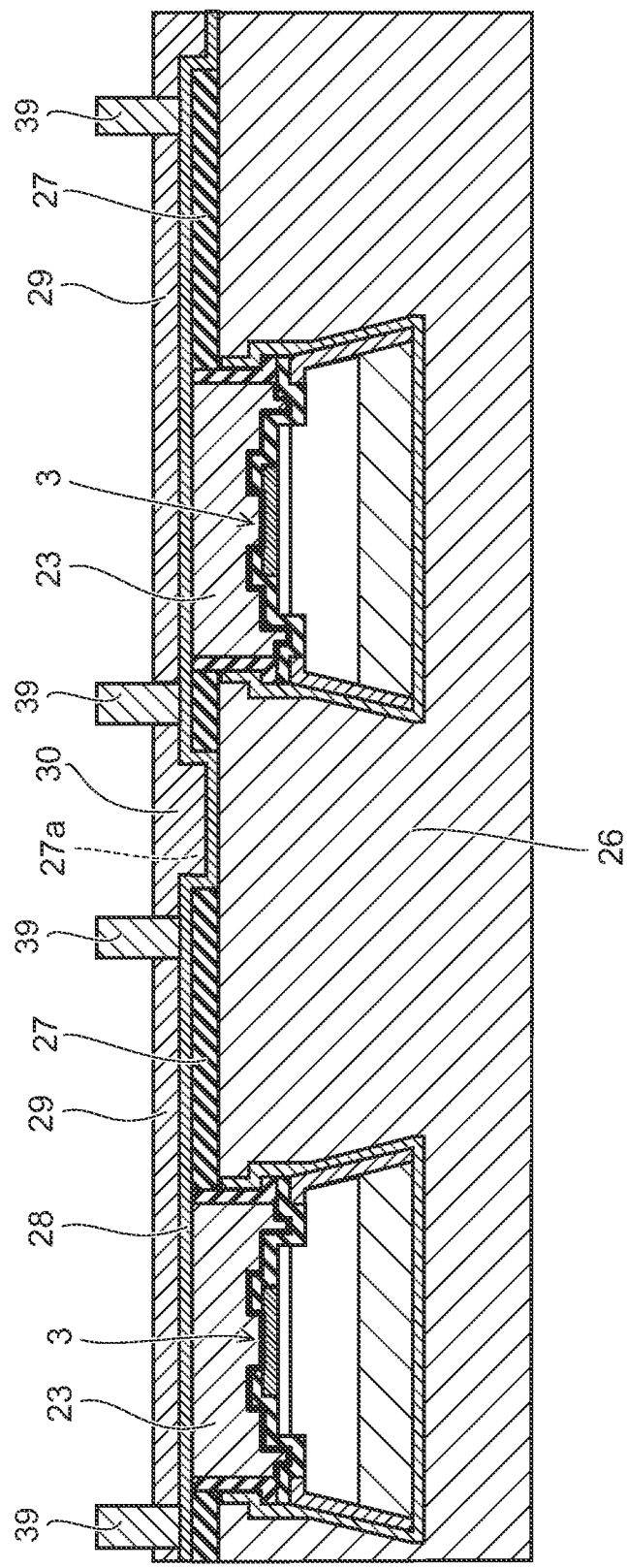

Next, as shown in FIG. 43, in the opening 27a, on the surface of the insulating layer 27 and on the surface of the first p-side metal layer 23, the metal film 28 that functions as a seed metal in plating is formed. Then, using the resist 39, Cu electrolytic plating using the metal film 28 as a current path is performed. Consequently, on the metal film 28, the second p-side metal layer 29 and the second n-side metal layer 30 are formed.

Figure 44:
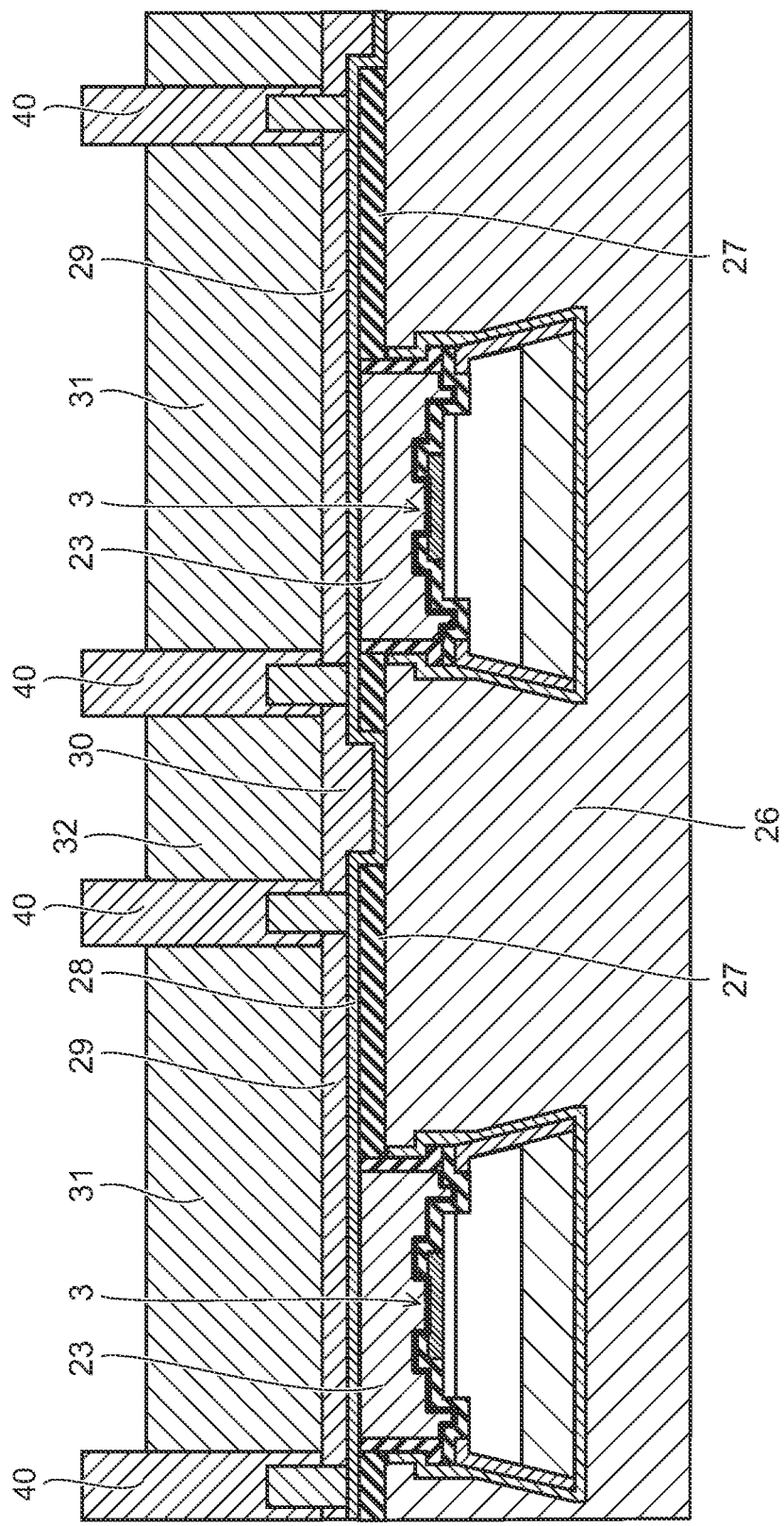

Next, as shown in FIG. 44, using the resist 40, Cu electrolytic plating using the metal film 28 as a current path is performed. Thereby, the third p-side metal layer 31 is formed on the second p-side metal layer 29, and the third n-side metal layer 32 is formed on the second n-side metal layer 30.

Figure 45:
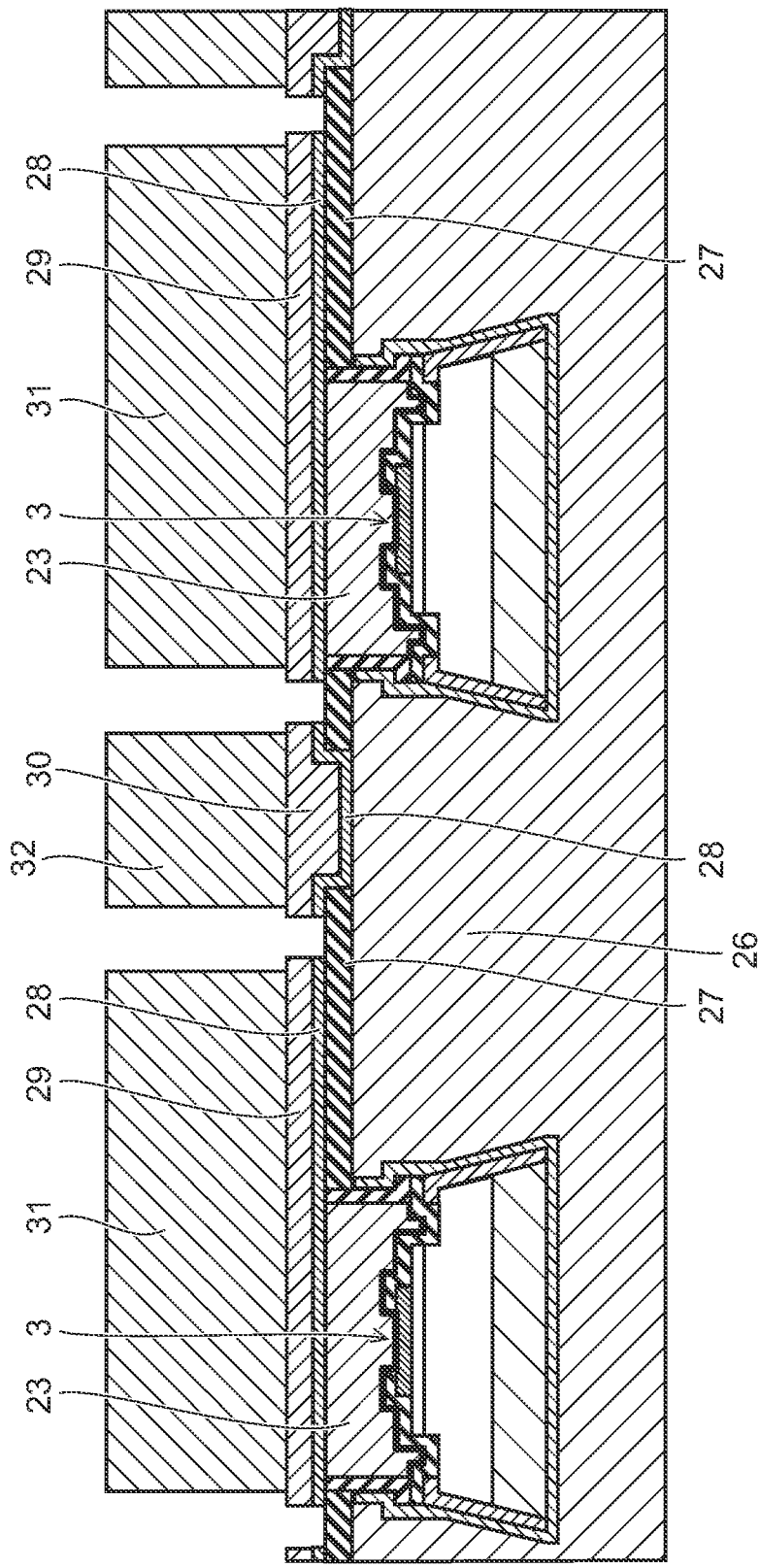

Next, the resist 40 is removed, and furthermore, as shown in FIG. 45, the exposed part of the metal film 28 having been used as the seed metal is removed. Thereby, the connection between the second p-side metal layer 29 and the second n-side metal layer 30, and the connection between the third p-side metal layer 31 and the third n-side metal layer 32, through the metal film 28, are disconnected.

Figure 46:
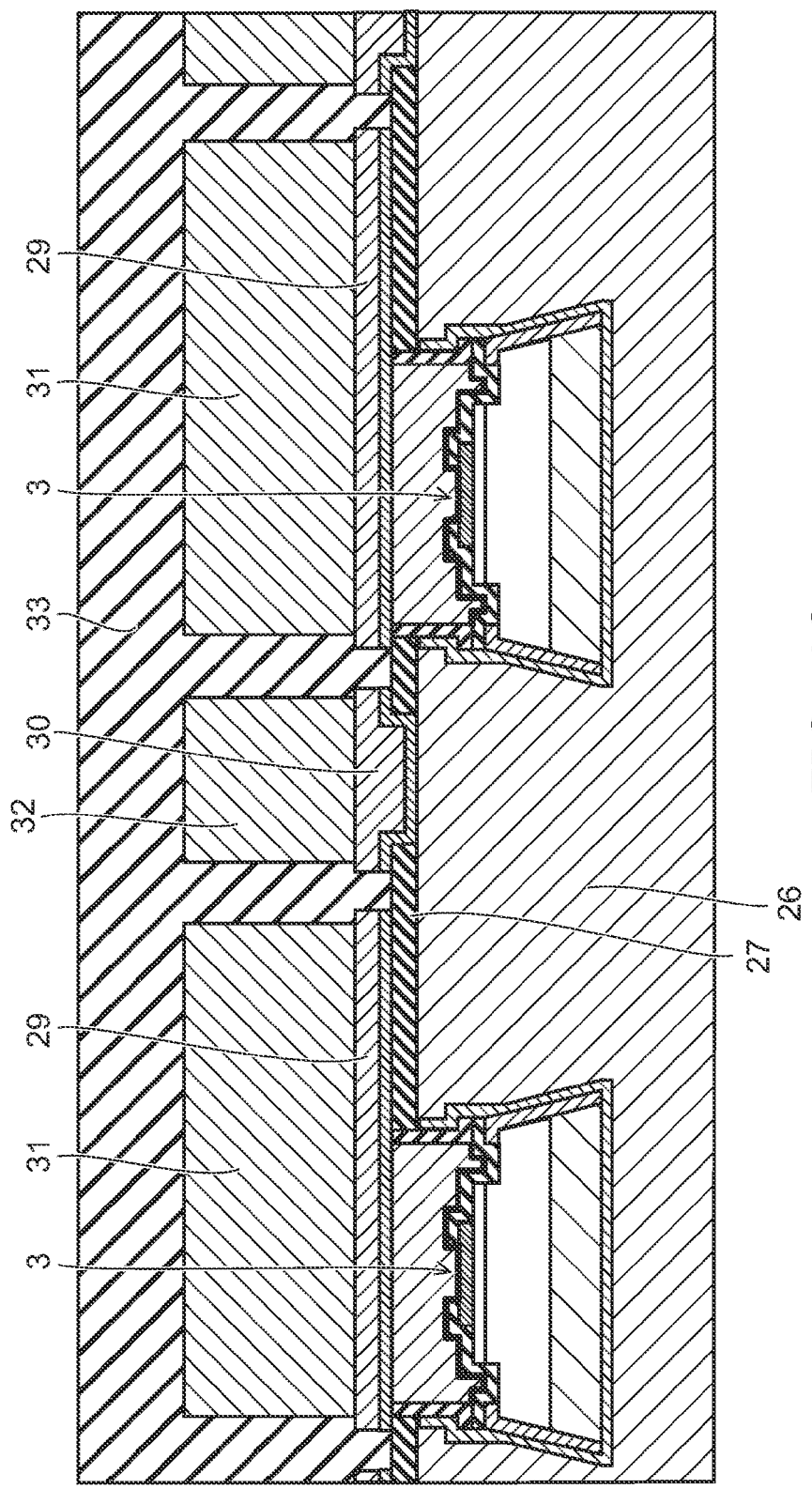

Next, on the insulating layer 27, the resin layer 33 shown in FIG. 46 is formed. The resin layer 33 covers the insulating layer 27, the second p-side metal layer 29, the second n-side metal layer 30, the third p-side metal layer 31, and the third n-side metal layer 32.

Figure 47:
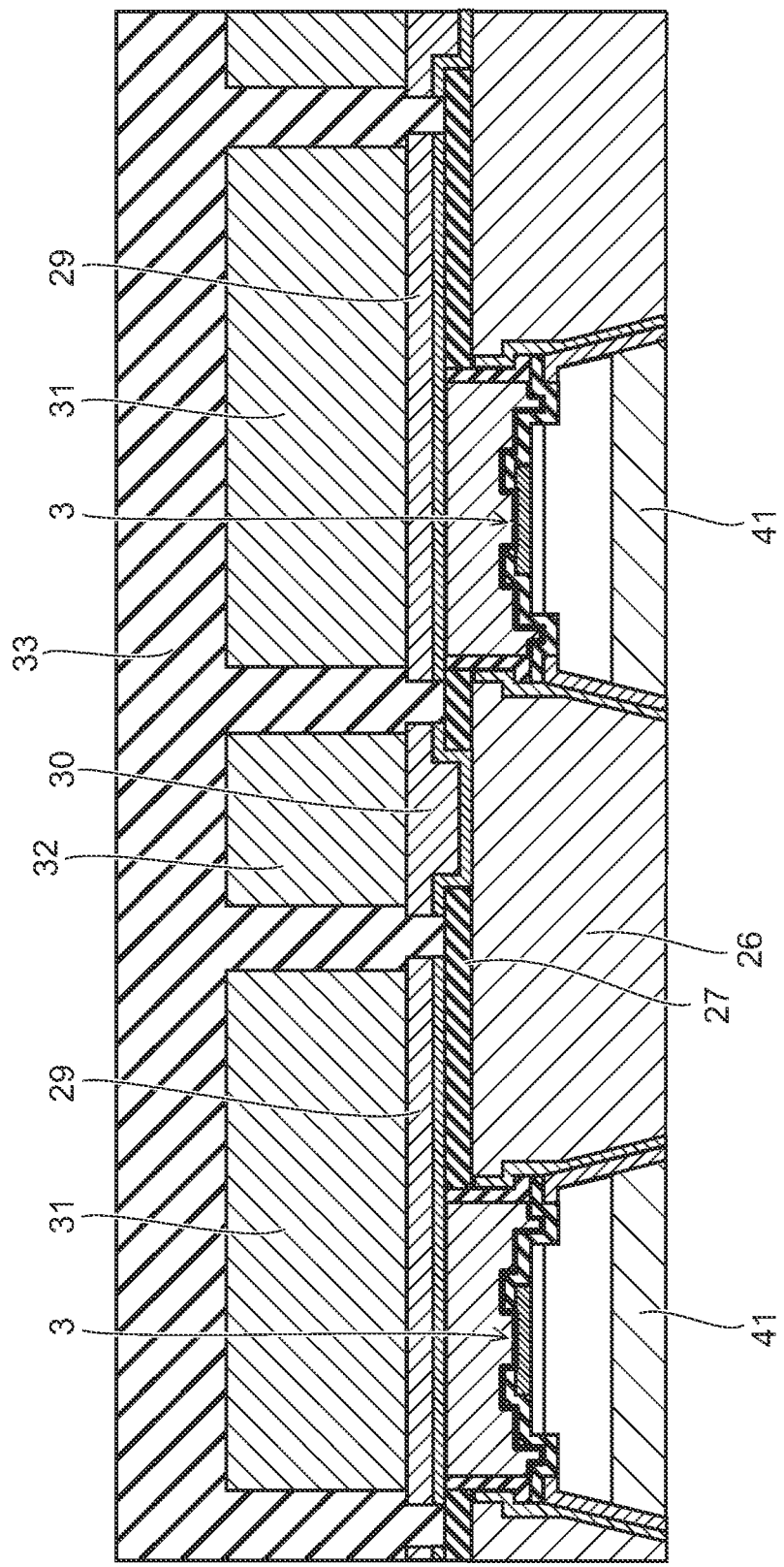

Next, the surface of the first n-side metal layer 26 (the lower face in FIG. 46) is ground, and furthermore the metal film 25 is removed to expose, as shown in FIG. 47, the surface of the substrate 41 left on the first face 15a.

Next, the substrate 41 remaining on the first face 15a is removed. Since the substrate 41 is a silicon substrate, the substrate 41 can easily be removed by wet etching or dry etching.

By the removal of the substrate 41, as shown in FIG. 48, on the first face 15a, the space 43 surrounded by the n-side electrode 17 is formed. After that, the first face 15a is subjected to frost processing.

Figure 49:
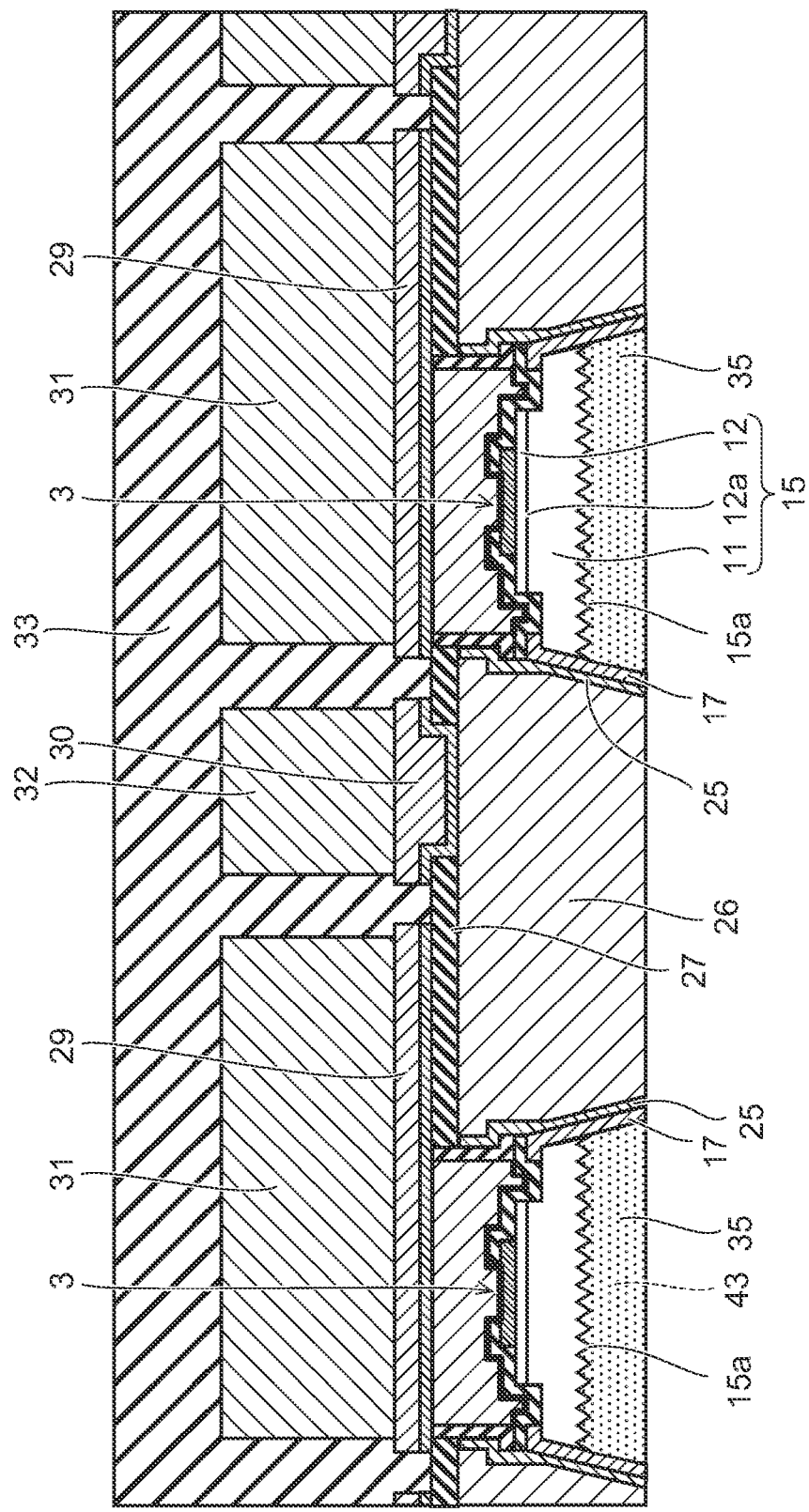

After the frost processing, in the space 43, as shown in FIG. 49, the phosphor layer 35 is embedded. The formation of the phosphor layer 35 only on the first face 15a is possible, and the utilization efficiency of the material is good.

After that, the surface of the resin layer 33 is ground to expose, as shown in FIG. 31, the p-side external terminal 31a and the n-side external terminal 32a.

Then, in a position between a chip 3 and another chip 3, the resin layer 33, the insulating layer 27 and the first n-side metal layer 26 are diced and separated into pieces of the semiconductor light emitting device 1c shown in FIG. 31.

Fourth Embodiment

Figure 50:
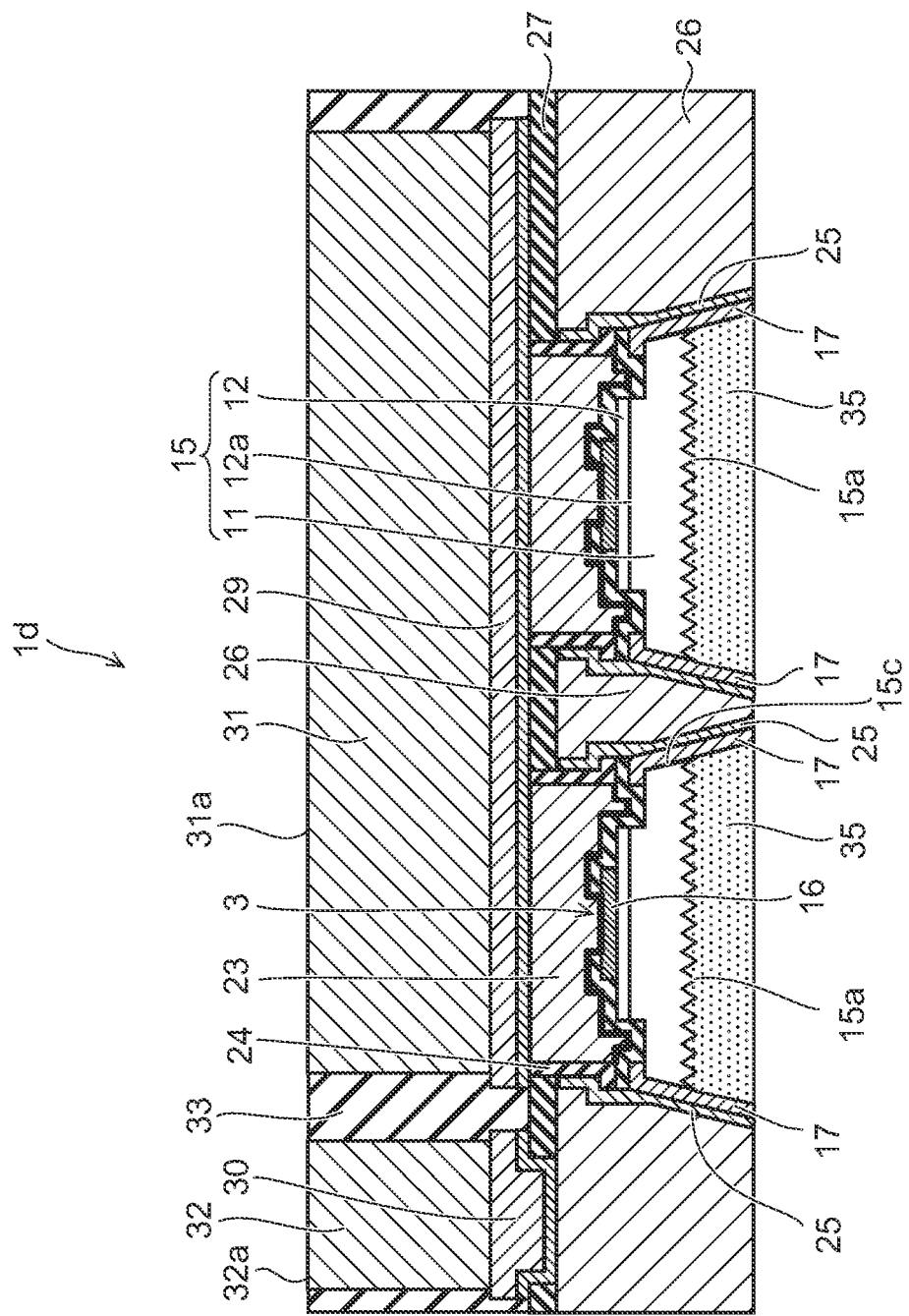
FIG. 50 is a schematic cross-sectional view of a semiconductor light emitting device of a fourth embodiment.

FIG. 50 is a schematic cross-sectional view of a semiconductor light emitting device 1d of a fourth embodiment.

Figure 51A:
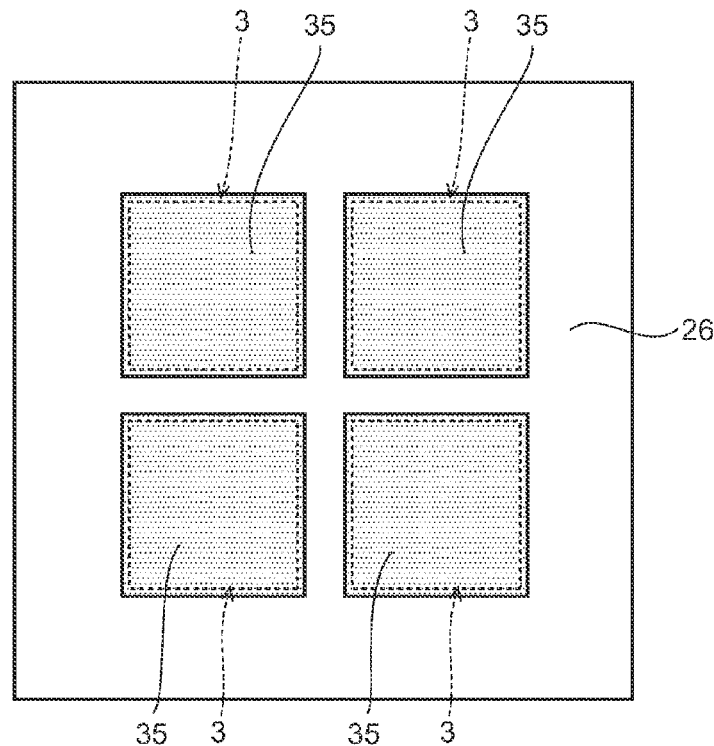
FIGS. 51A and 51B are schematic plan views of the semiconductor light emitting device of the fourth embodiment.

FIG. 51A is a schematic plan view showing the planar arrangement relation of the chip 3, the first n-side metal layer 26 and the phosphor layer 35 in the semiconductor light emitting device 1d.

Figure 51B:
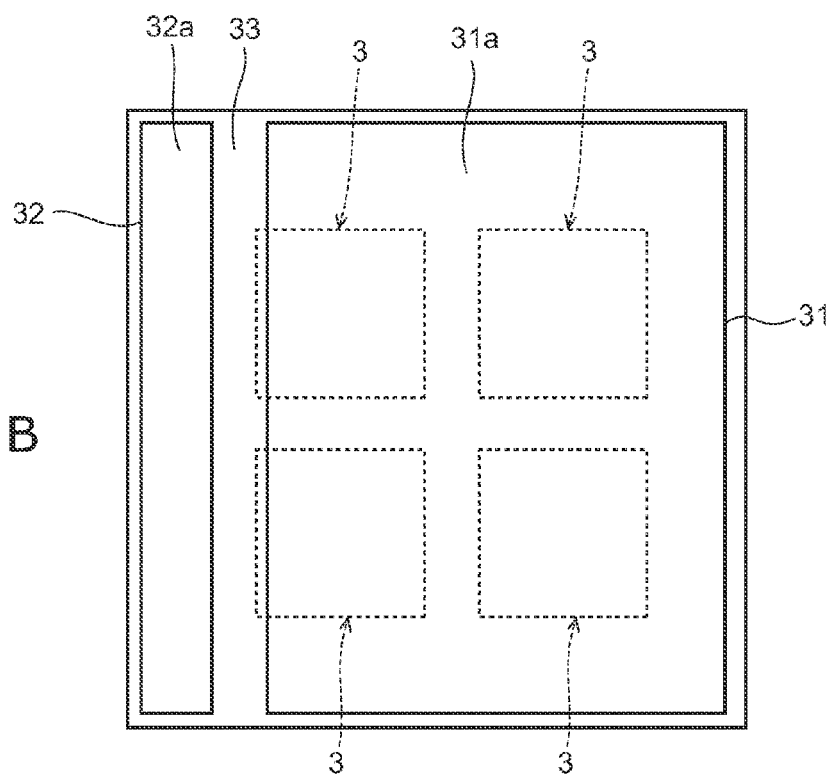

FIG. 51B is a schematic plan view of the mounting surface side in the semiconductor light emitting device 1d.

The semiconductor light emitting device 1d of the fourth embodiment is different from the semiconductor light emitting device 1c of the third embodiment in point of including a plurality of chips 3. As shown in FIGS. 51A and 51B, the semiconductor light emitting device 1d includes, for example, four chips 3. Alternatively, the number of chips 3 included in the semiconductor light emitting device 1d is not limited to four, but may be less or more than four.

Between side faces 15c of adjacent semiconductor layers 15, via the n-side electrode 17 and the metal film 25, the first n-side metal layer 26 is provided. As shown in FIG. 51A, the first n-side metal layer 26 surrounds continuously the periphery of each of the chips 3. That is, the first n-side metal layer 26 provided on the outside of the chip 3 and the first n-side metal layer 26 provided between the chips 3 are formed integrally and are linked electrically. The n-side electrode 17 and the metal film 25 surround continuously the periphery of the side face 15c, and are connected electrically with the first n-side metal layer 26 provided between the chips 3.

Between side faces of adjacent phosphor layers 35, too, via the n-side electrode 17 and the metal film 25, the first n-side metal layer 26 is provided. The first n-side metal layer 26 surrounds continuously the periphery of each of the phosphor layers 35. The n-side electrode 17 and the metal film 25 also surround continuously the periphery of the side face of the phosphor layer 35.

According to the fourth embodiment, by an n-side metallic body (or an n-side wiring part) provided between chips 3 and including the first n-side metal layer 26, the metal film 25 and the n-side electrode 17, the current distribution to each of the chips 3 can be equalized. Moreover, thermal resistance of the side face of each of the chips 3 can be lowered, and the heat dissipation performance of each of the chips 3 can be enhanced.

FIG. 52 is a schematic cross-sectional view of a state where the semiconductor light emitting device 1d of the fourth embodiment is mounted on the mounting substrate 100.

The p-side electrode 16 of each of the plurality of chips 3 is connected electrically, via the first p-side metal layer 23 and the second p-side metal layer 29, with the common third p-side metal layer 31. The p-side external terminal 31a of the third p-side metal layer 31 is joined to the wiring layer 102, for example, by the solder 104.

The n-side electrode 17 of each of the plurality of chips 3 is connected electrically, via the first n-side metal layer 26 and the second n-side metal layer 30, with the common third n-side metal layer 32. The n-side external terminal 32a of the third n-side metal layer 32 is joined to the wiring layer 103, for example, by the solder 104.

The semiconductor light emitting device 1d is mounted in a state where the mounting surface including the p-side external terminal 31a and the n-side external terminal 32a faces the mounting substrate 100 side. In the state, the first face 15a and the phosphor layer 35 on the first face 15a of each of the chips 3 face the upside of the mounting substrate 100.

According to the fourth embodiment, the phosphor layer 35 surrounded by the n-side electrode 17 is provided on the first face 15a. As the n-side electrode 17, when a metal having reflectivity with respect to the emitting light of the light emitting layer 12a and the wavelength-converted light of the phosphor layer 35 is used, the leak of light from the side face of the chip 3 and from the side face of the phosphor layer 35 can be avoided, which improves the light extraction efficiency.

Moreover, light distribution in which the directivity toward the upside of the surface of the mounting substrate is strengthened may be realized, and the formation of a reflection plate on the surface of the mounting substrate becomes unnecessary and an optical design of lighting devices becomes easy, resulting in achievement of cost reduction.

Heat generated in the light emitting layer 12a is, as shown by an arrow A in FIG. 52, conducted through the metallic body on the p-side (the wiring part) including the first p-side metal layer 23, the metal film 28, the second p-side metal layer 29 and the third p-side metal layer 31 from the second face side, and, furthermore, is dissipated to the mounting substrate 100 via the solder 104. Since the p-side metallic body (the wiring part) is provided on the second face side with a larger area and larger thickness than the chip 3, a high heat dissipation performance can be obtained.

Heat generated in the light emitting layer 12a is, as shown by an arrow B in FIG. 52, conducted through the metallic body on the n-side (the wiring part) including the n-side electrode 17, the metal film 25, the first n-side metal layer 26, the metal film 28, the second n-side metal layer 30 and the third n-side metal layer 32, and, furthermore, is dissipated to the mounting substrate 100 via the solder 104. The heat dissipation route includes the first n-side metal layer 26 provided around the chip 3 and being larger in area and thicker than the chip 3. Accordingly, the heat dissipation performance from the side face side of the chip 3 is also high.

Next, with reference to FIGS. 53A to 65, a method for manufacturing the semiconductor light emitting device 1d of the fourth embodiment will be explained.

Up to the process in which the rear face of the substrate 41 is ground on the film 38 until the trench 42 is reached and the chips 3 are separated into a plurality of parts, the method is advanced in the same manner as in the aforementioned third embodiment.

After that, as shown in FIG. 53A, on a film (or a sheet) 48 as another support, the plurality of chips 3 are rearranged.

On the film 38 for grinding the substrate 41, individual chips 3 are arranged at equal intervals. In contrast, on the film 48, chips 3 are gathered for every group of a plurality of chips that are to be included in one semiconductor light emitting device 1d, and are rearranged in a state where the distance between the chip groups is extended as compared with the state having been supported on the film 38.

Then, as shown in FIG. 53B, in the exposed part on the film 48, the metal film 25 that functions as a seed metal in plating is formed. The metal film 25 is also formed conformally on the side face between the adjacent chips 3. Then, Cu electrolytic plating using the metal film 25 as a current path is performed.

Figure 54:
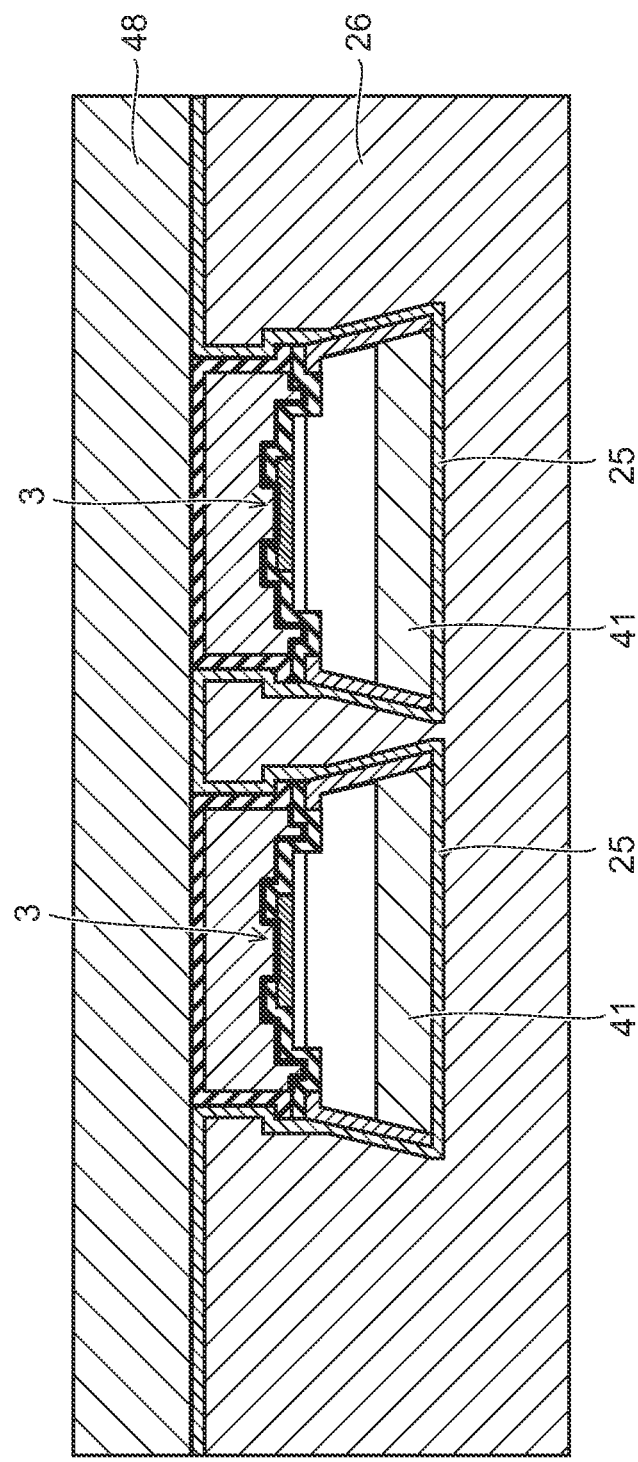

Consequently, as shown in FIG. 54, on the metal film 25, the first n-side metal layer 26 is formed. The first n-side metal layer 26 is formed around the chip 3 and on the first face 15a. Furthermore, the first n-side metal layer 26 is also embedded between the chips 3.

Figure 55:
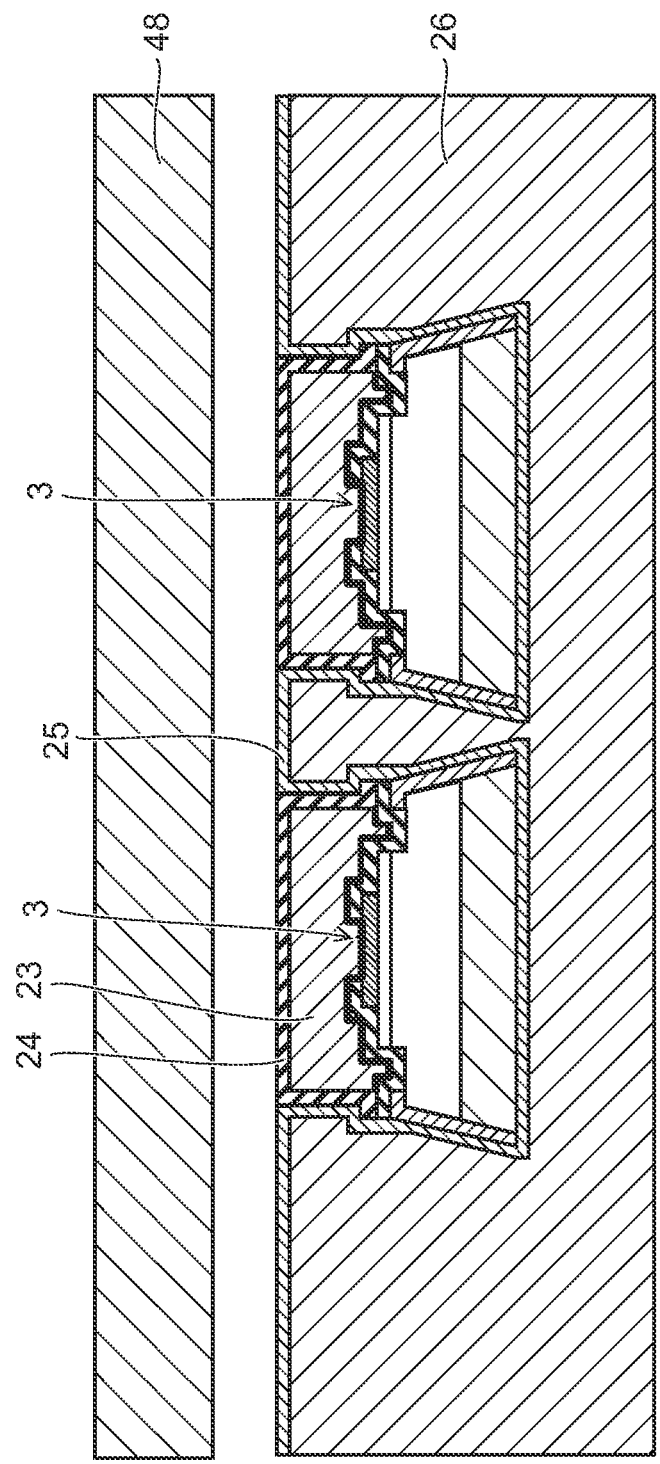

After the formation of the first n-side metal layer 26, as shown in FIG. 55, the film 48 is peeled. By the peeling of the film 48, surfaces of the metal film 25 and the insulating film 24 are exposed.

Figure 56:
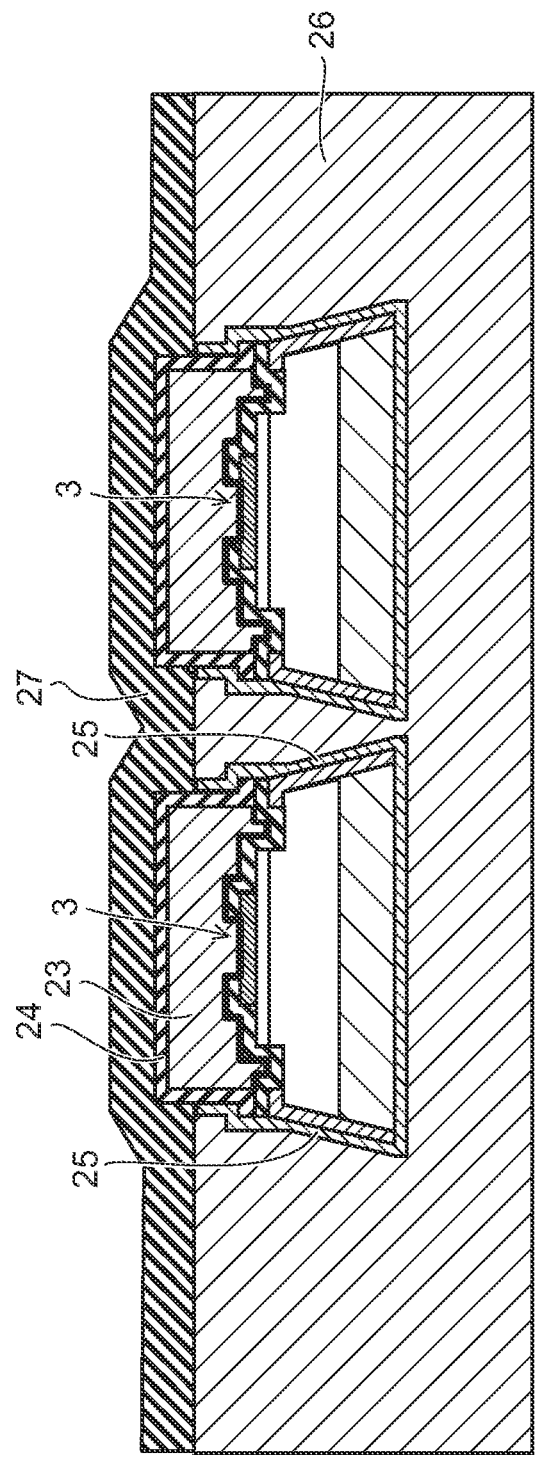

Then, the metal film 25 and the first n-side metal layer 26 are etched back so that, as shown in FIG. 56, the surface of the first p-side metal layer 23 and the surface of the insulating film 24 are made to protrude from the surface of the first n-side metal layer 26 to form a step between the surface of the first p-side metal layer 23 and the surface of the insulating film 24, and the surface of the first n-side metal layer 26.

Then, so as to cover the step, on the surface of the insulating film 24 and on the surface of the first n-side metal layer 26, the insulating layer 27 is formed.

Figure 57:
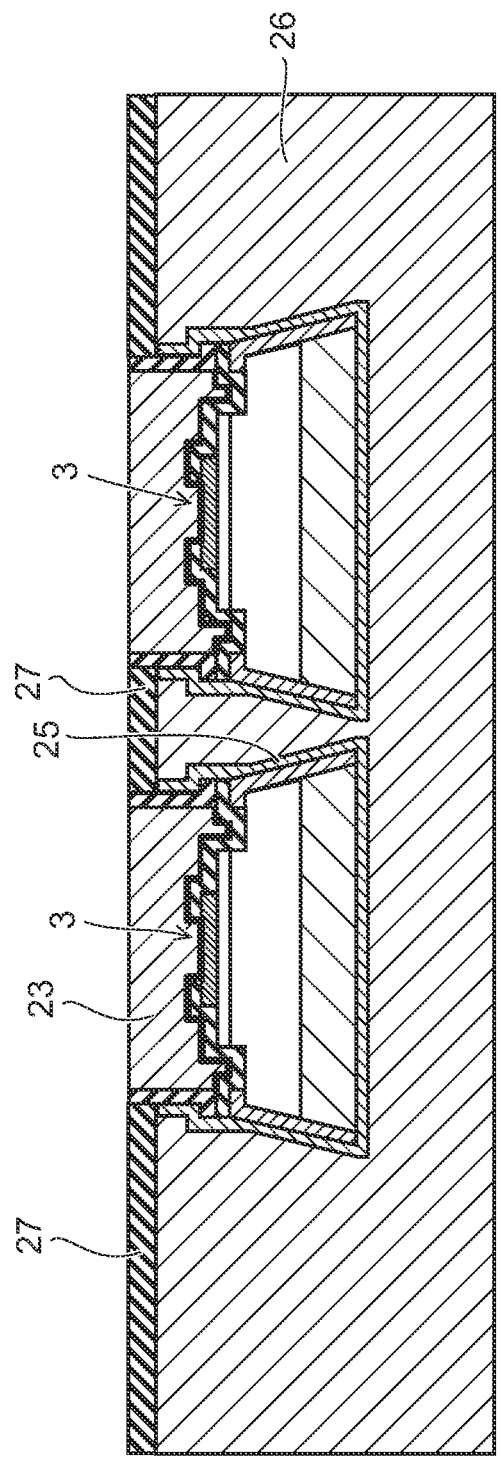

Next, for example, by a CMP method, the insulating layer 27 on the surface of the insulating film 24 and the insulating film 24 are removed to expose, as shown in FIG. 57, the surface of the first p-side metal layer 23. On the surface of the first n-side metal layer 26, the insulating layer 27 is left.

Figure 58:
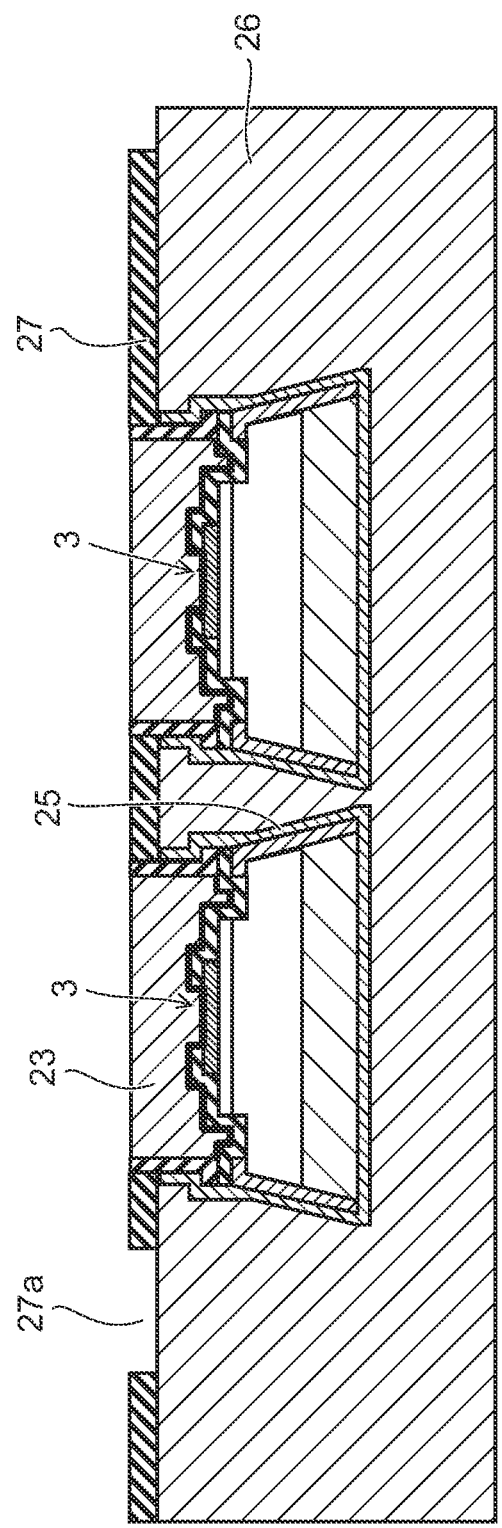

Next, as shown in FIG. 58, the opening 27a is formed selectively in the insulating layer 27 on the peripheral region of the chip 3 to expose a part of the first n-side metal layer 26.

Figure 59:
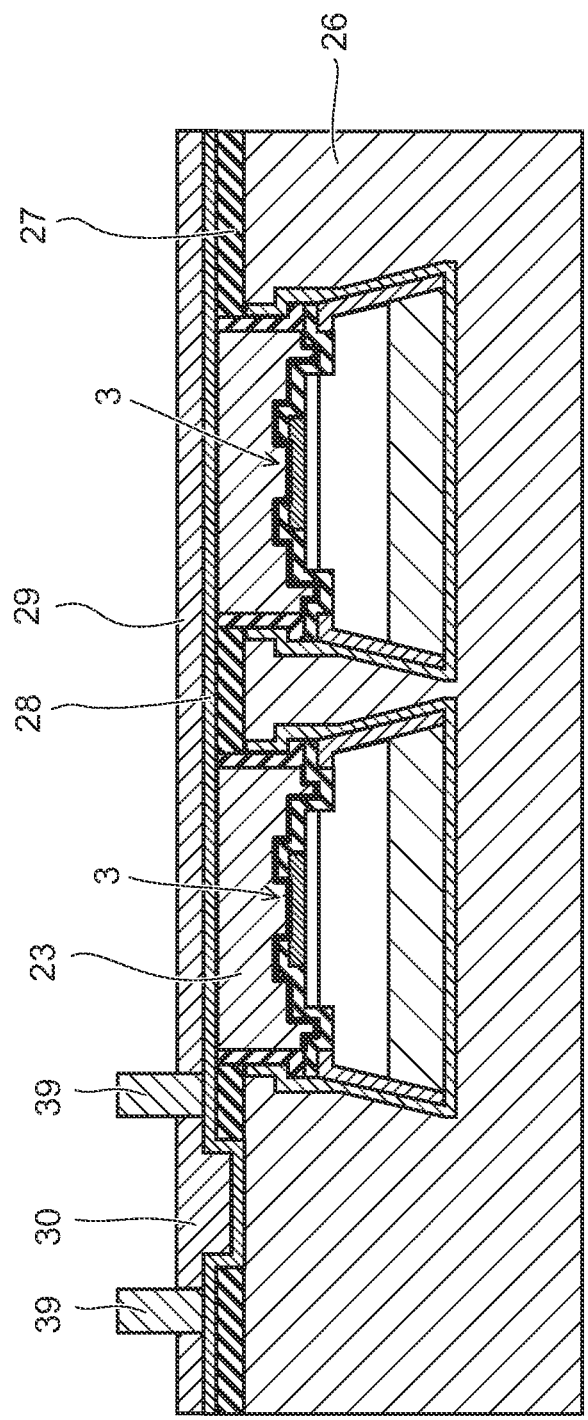

Next, as shown in FIG. 59, in the opening 27a, on the surface of the insulating layer 27 and on the surface of the first p-side metal layer 23, the metal film 28 that functions as a seed metal in plating is formed. Then, using the resist 39, Cu electrolytic plating using the metal film 28 as a current path is performed. Consequently, on the metal film 28, the second p-side metal layer 29 and the second n-side metal layer 30 are formed.

Figure 60:
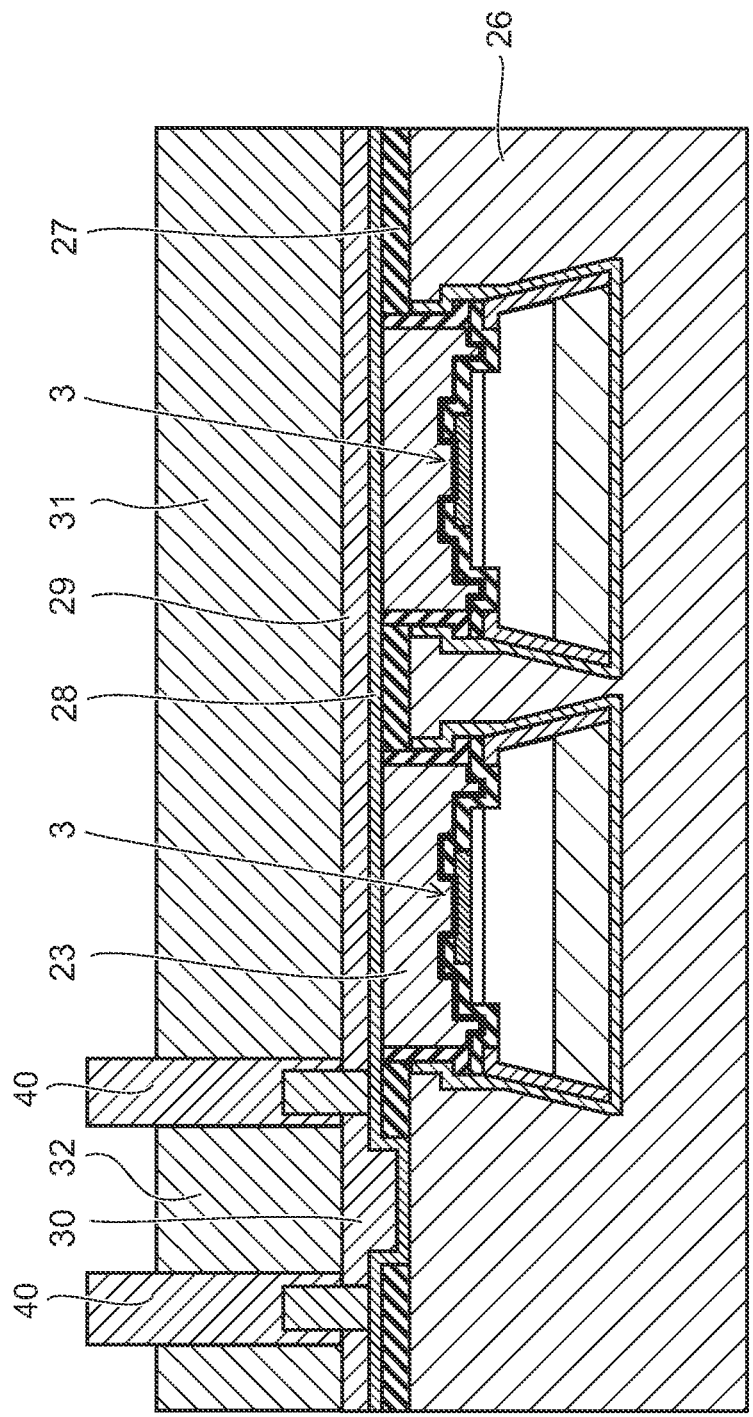

Next, as shown in FIG. 60, using the resist 40, Cu electrolytic plating using the metal film 28 as a current path is performed. Consequently, the third p-side metal layer 31 is formed on the second p-side metal layer 29, and the third n-side metal layer 32 is formed on the second n-side metal layer 30.

Figure 61:
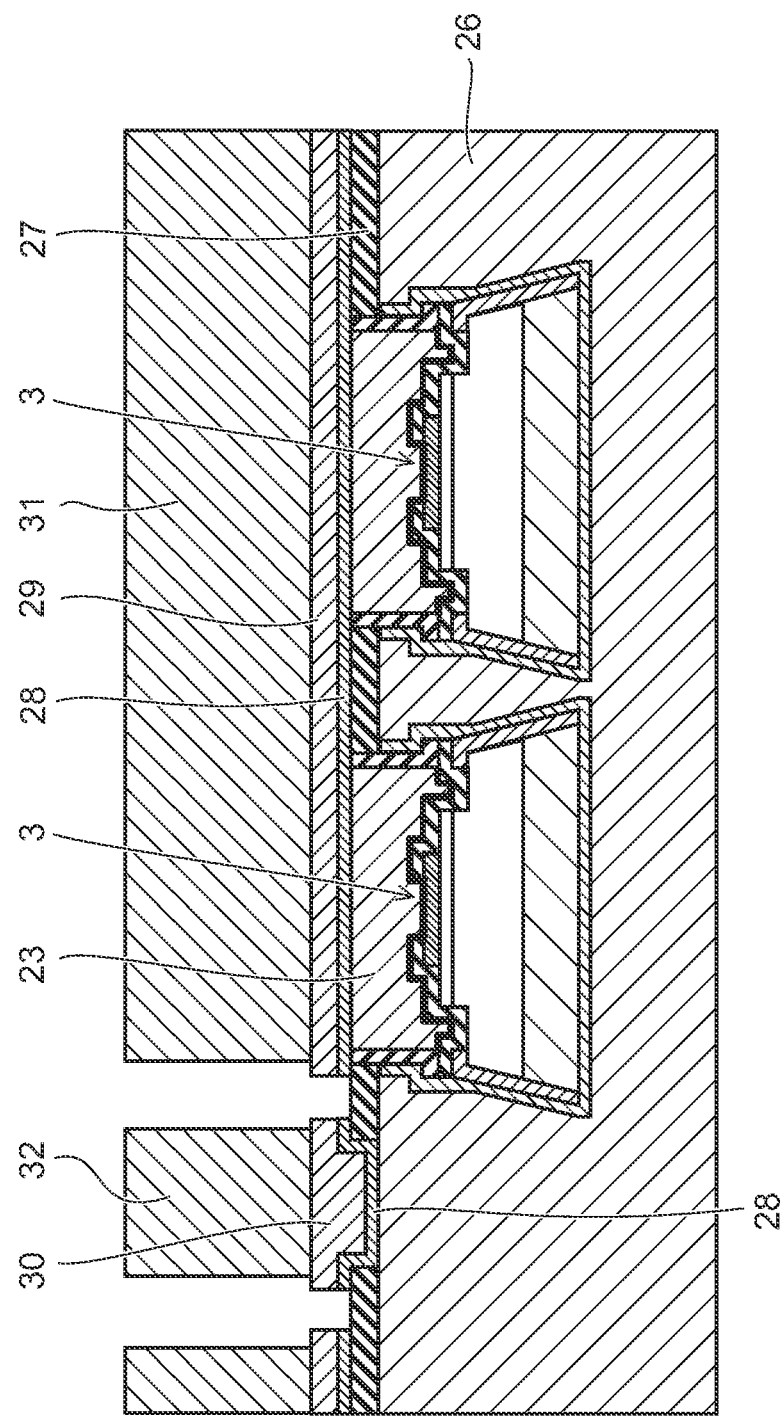

Next, the resist 40 is removed, and furthermore, as shown in FIG. 61, the exposed part of the metal film 28 having been used as the seed metal is removed. Thereby, the connection between the second p-side metal layer 29 and the second n-side metal layer 30, and the connection between the third p-side metal layer 31 and the third n-side metal layer 32, through the metal film 28, are disconnected.

Figure 62:
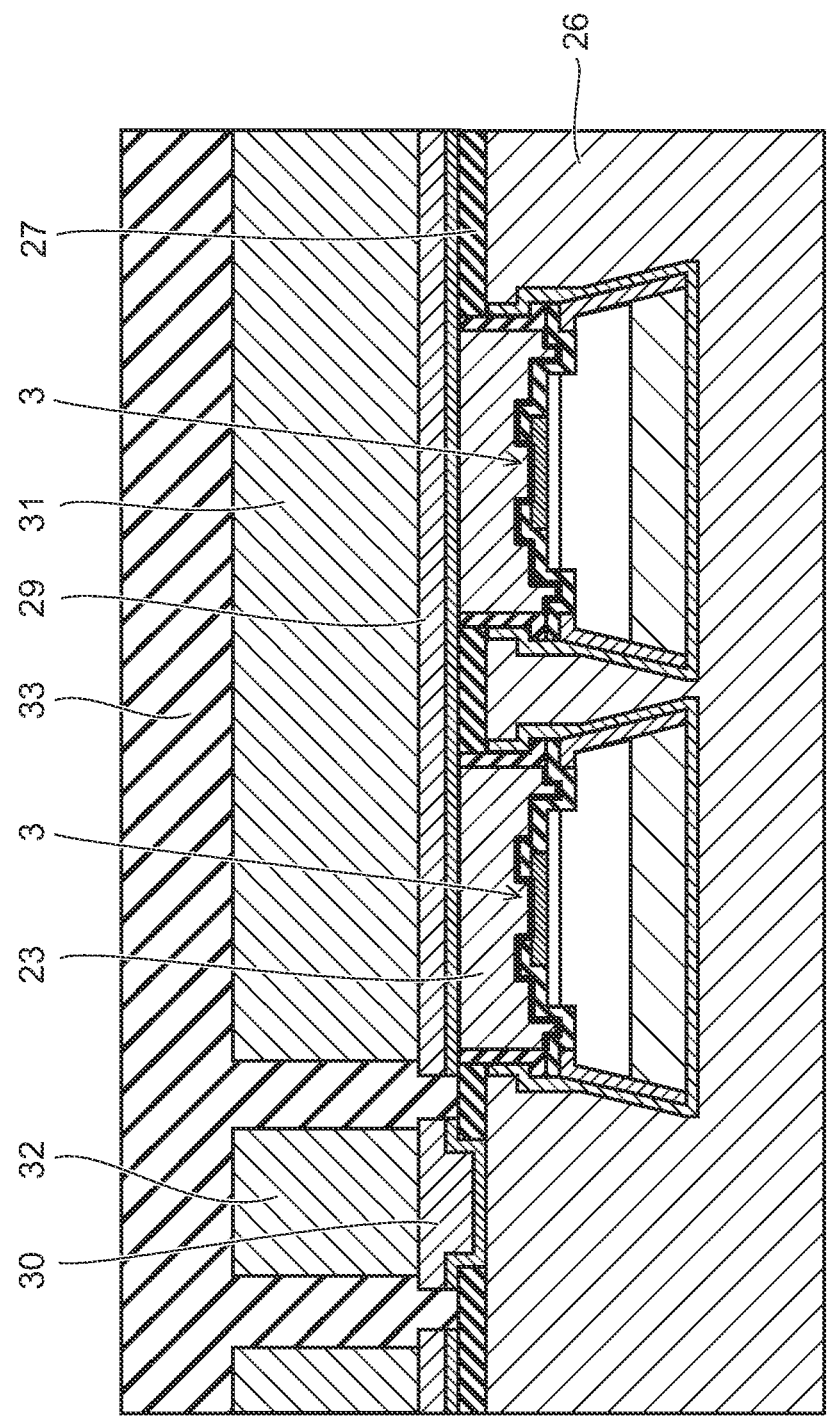

Next, on the insulating layer 27, the resin layer 33 shown in FIG. 62 is formed. The resin layer 33 covers the insulating layer 27, the second p-side metal layer 29, the second n-side metal layer 30, the third p-side metal layer 31, and the third n-side metal layer 32.

Figure 63:
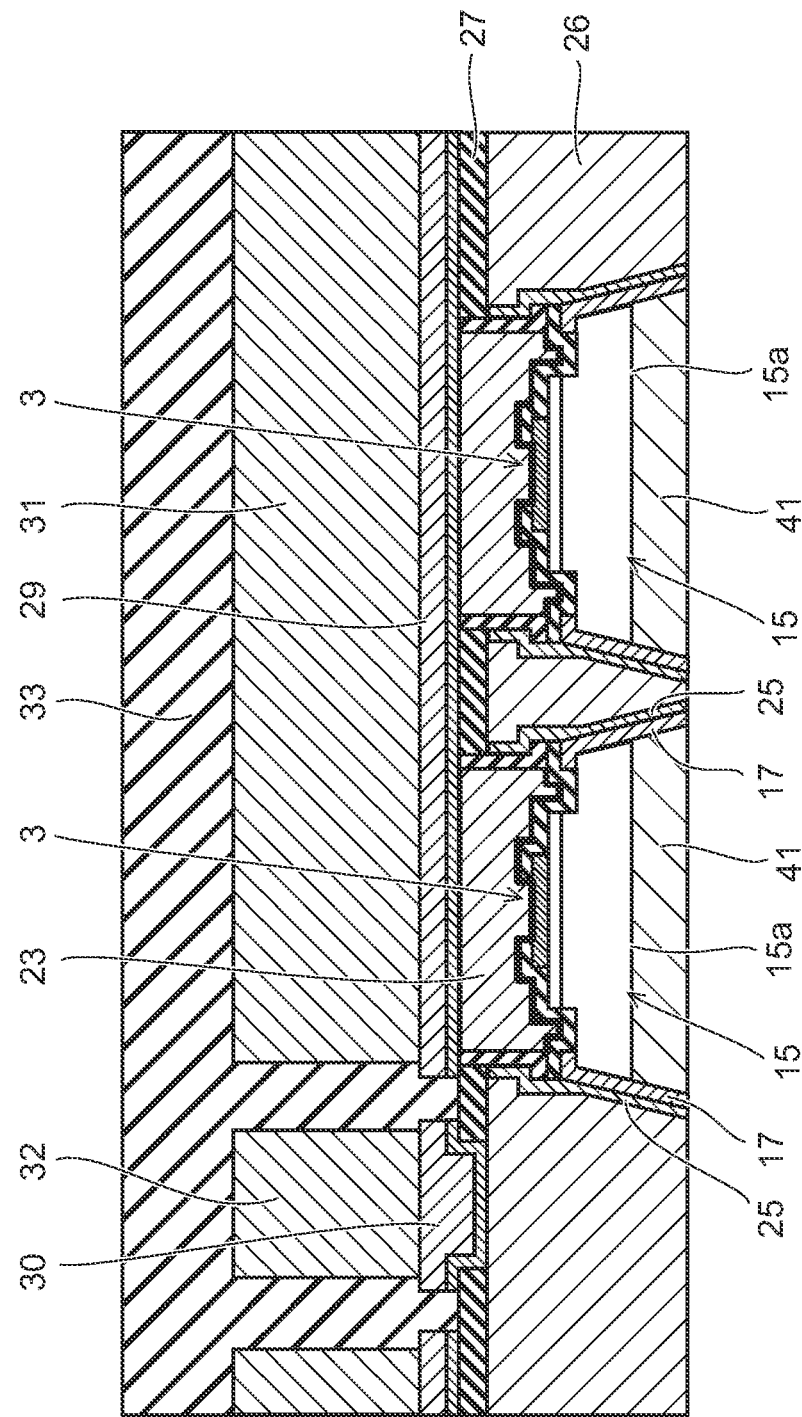

Next, the surface of the first n-side metal layer 26 (the lower face in FIG. 62) is ground, and furthermore the metal film 25 is removed to expose, as shown in FIG. 63, the surface of the substrate 41 left on the first face 15a.

Figure 64:
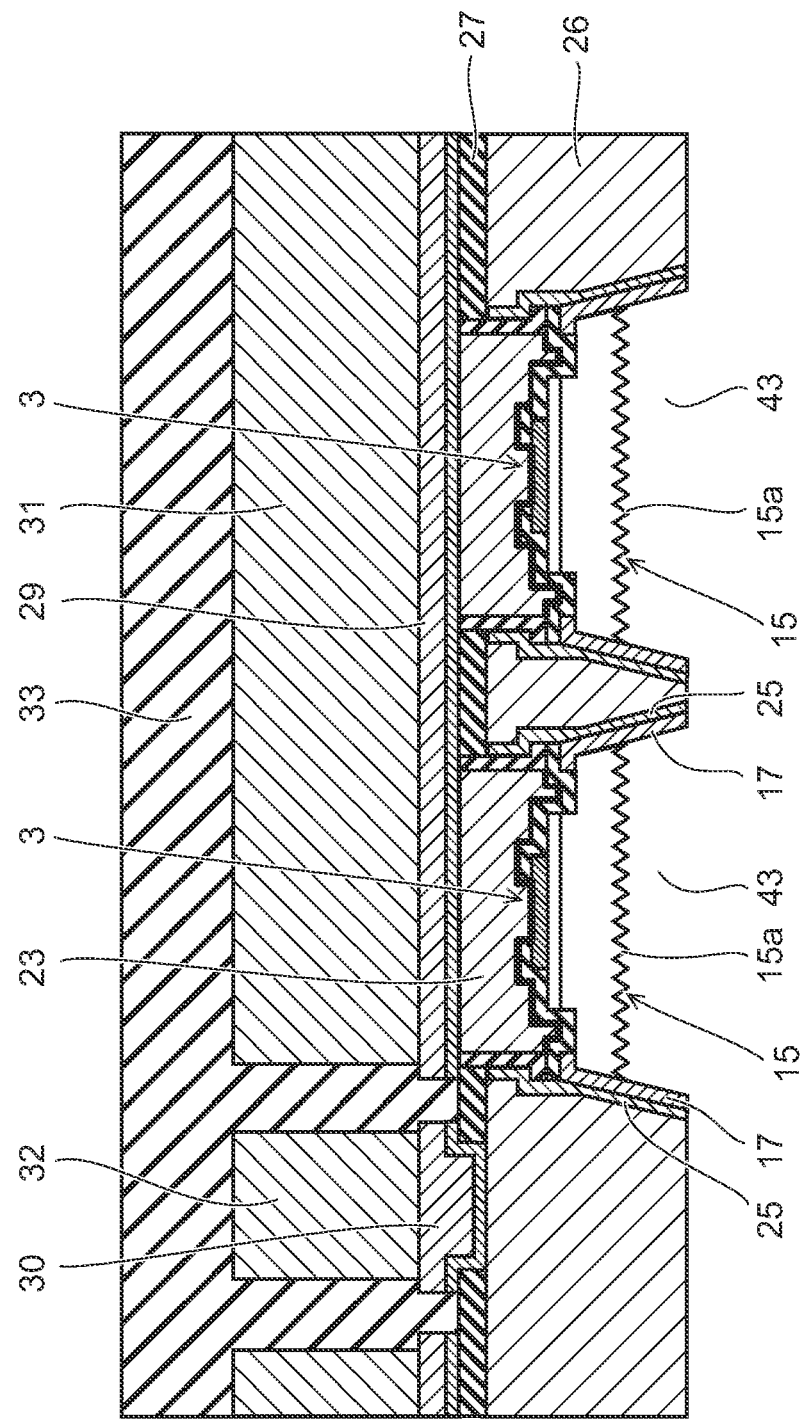

Next, the substrate 41 remaining on the first face 15a is removed. By the removal of the substrate 41, as shown in FIG. 64, the space 43 surrounded by the n-side electrode 17 is formed on the first face 15a. After that, the first face 15a is subjected to the frost processing.

Figure 65:
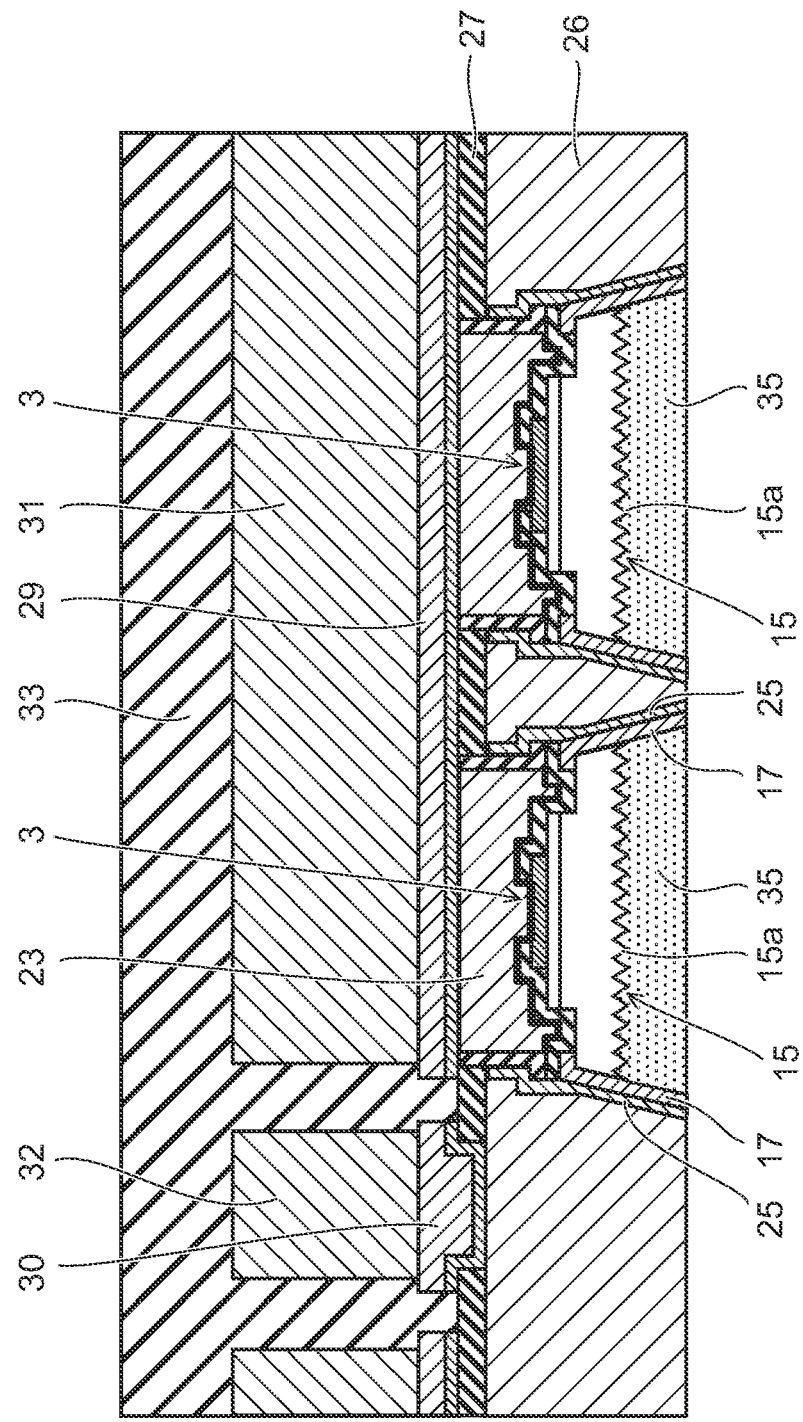

After the frost processing, in the space 43, as shown in FIG. 65, the phosphor layer 35 is embedded. The formation of the phosphor layer 35 only on the first face 15a is possible, and the utilization efficiency of the material is good.

After that, the surface of the resin layer 33 is ground to expose, as shown in FIG. 50, the p-side external terminal 31a and the n-side external terminal 32a.

Then, in an intended position between a chip 3 and another chip 3, the resin layer 33, the insulating layer 27 and the first n-side metal layer 26 are diced and separated into pieces of the semiconductor light emitting device 1d shown in FIG. 50.

Fifth Embodiment

Figure 66:
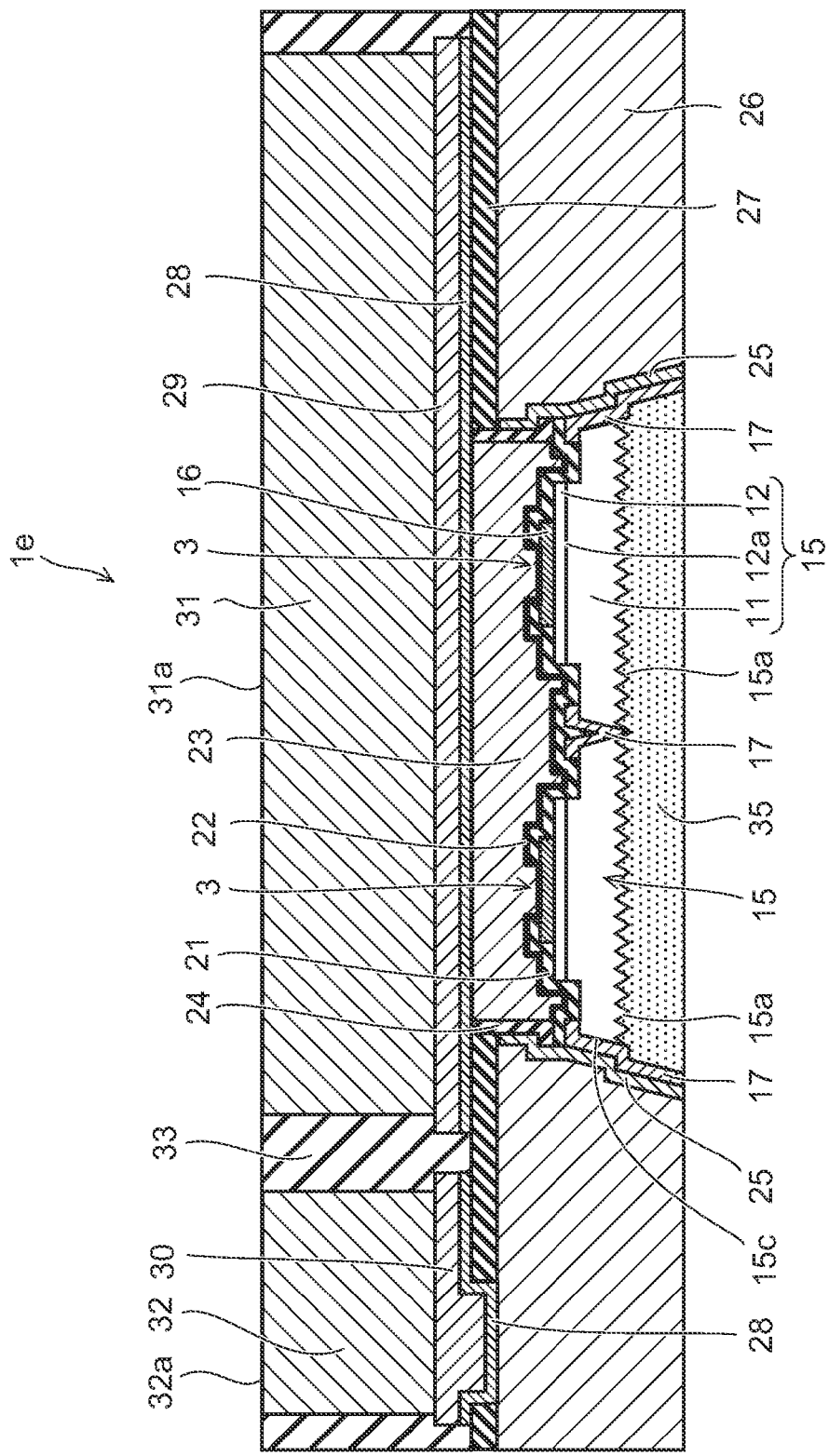
FIG. 66 is a schematic cross-sectional view of a semiconductor light emitting device of a fifth embodiment.

FIG. 66 is a schematic cross-sectional view of a semiconductor light emitting device 1e of a fifth embodiment.

The semiconductor light emitting device 1e of the fifth embodiment also includes a plurality of chips 3 in the same manner as the device in the fourth embodiment. However, in the semiconductor light emitting device 1e of the fifth embodiment, the phosphor layer 35 continued in common and integrated relative to the plurality of chips 3 is provided.

The phosphor layer 35 is surrounded continuously by the n-side electrode 17 on the first face 15a of the plurality of chips 3. As the n-side electrode 17, when a metal having reflectivity with respect to the emitting light of the light emitting layer 12a and the wavelength-converted light of the phosphor layer 35 is used, the leak of light from the side face of the chip 3 and from the side face of the phosphor layer 35 can be avoided, which improves the light extraction efficiency.

The n-side electrodes 17 provided on the side face 15c between the plurality of semiconductor layers 15 are connected with each other on the bottom part side of the trench 36. Accordingly, the n-side electrodes 17 provided on the side face 15c between the plurality of semiconductor layers 15 are connected electrically with each other.

Consequently, current distribution to each of the chips 3 can be made uniform. Moreover, thermal resistance of the side face of each of the chips 3 can be lowered, and heat dissipation performance of each of the chips 3 can be enhanced.

The first p-side metal layer 23, the second p-side metal layer 29 and the third p-side metal layer 31 extend continuously on the plurality of chips 3 to the region including the plurality of chips 3 to reinforce integrally the plurality of chips 3.

Next, with reference to FIGS. 67A to 86, a method for manufacturing the semiconductor light emitting device 1e of the fifth embodiment will be explained.

After the formation of the semiconductor layer 15 on the substrate 41, the second semiconductor layer 12 is removed selectively, for example, by RIE using a resist not shown to expose selectively the first semiconductor layer 11. The region 5 from which the first semiconductor layer 11 is exposed does not include the light emitting layer 12a.

After that, as shown in FIG. 67A, the resist film 44 is formed on the semiconductor layer 15, and, for example, by RIE using the resist film 44 as a mask, the semiconductor layer 15 is separated into a plurality of parts.

Next, as shown in FIG. 67B, on the semiconductor layer 15, the resist film 45 is formed, and, for example, by RIE using the resist film 45 as a mask, the trench 42 is formed on the surface of the substrate 41. By the trench 42, on the surface of the substrate 41, the convex part 41a and the concave part 41b are formed. The side face 15c of the semiconductor layer 15 faces the trench 42. Similarly, a side face between the convex part 41a and the concave part 41b faces the trench 42.

After the formation of the trench 42, the resist film 45 is removed (FIG. 68A). Then, on the region including the light emitting layer 12a in the second face of the semiconductor layer 15, as shown in FIG. 68B, the p-side electrode 16 is formed.

The n-side electrode 17 is formed on the side face 15c of the semiconductor layers 15 facing the trench 42, and on the side face of the convex part 41a of the substrate 41.

In the second face, on the face where the p-side electrode 16 and the n-side electrode 17 have not been formed, the insulating film 21 is formed. The insulating film 21 covers the n-side electrode 17 in the trench 42. A part of the insulating film 21 on the p-side electrode 16 is opened. After that, by a heat treatment, the p-side electrode 16 and the n-side electrode 17 are ohmic-contacted with the semiconductor layer 15. The heat treatment may be performed before subjecting the insulating film 21 to the opening formation on the p-side electrode 16.

Figure 69:
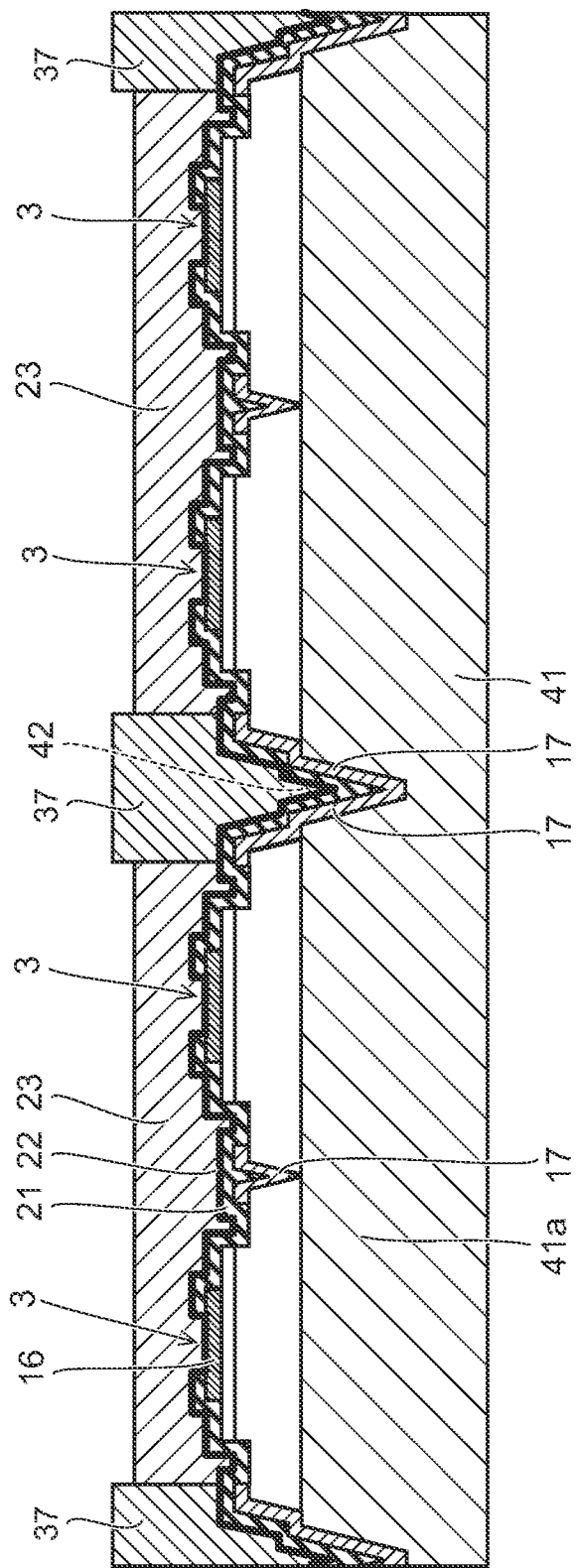

Next, in the exposed part on the substrate 41, the metal film 22 shown in FIG. 69 is formed conformally. Then, on the metal film 22, the resist 37 is formed selectively, and Cu electrolytic plating using the metal film 22 as a current path is performed. The resist 37 is formed on the trench 42.

By the electrolytic plating, the first p-side metal layer 23 is formed on the metal film 22. The first p-side metal layer 23 is formed continuously in common among the plurality of chips 3 in a region surrounded by the trench 42. The first p-side metal layer 23 is connected with the p-side electrode 16 through the opening formed in the insulating film 21.

Figure 70:
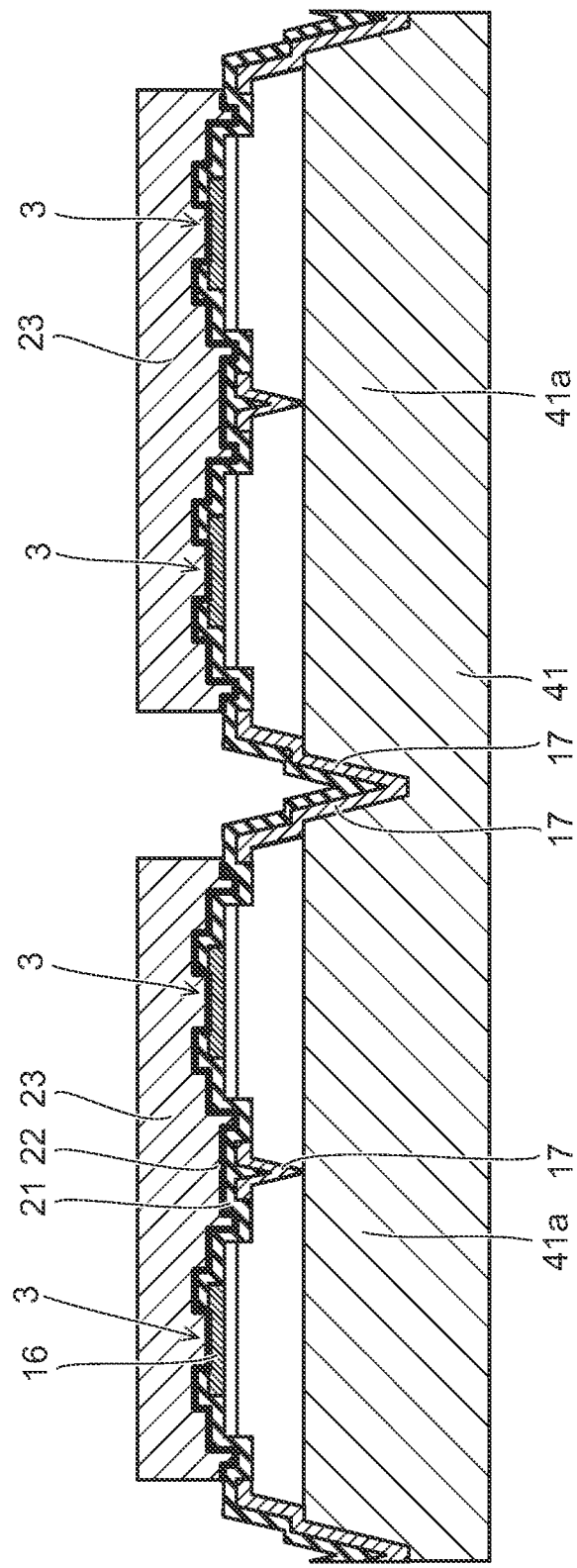

Next, the resist 37 is removed, and furthermore, as shown in FIG. 70, the exposed part of the metal film 22 having been used as the seed metal is removed.

Figure 71:
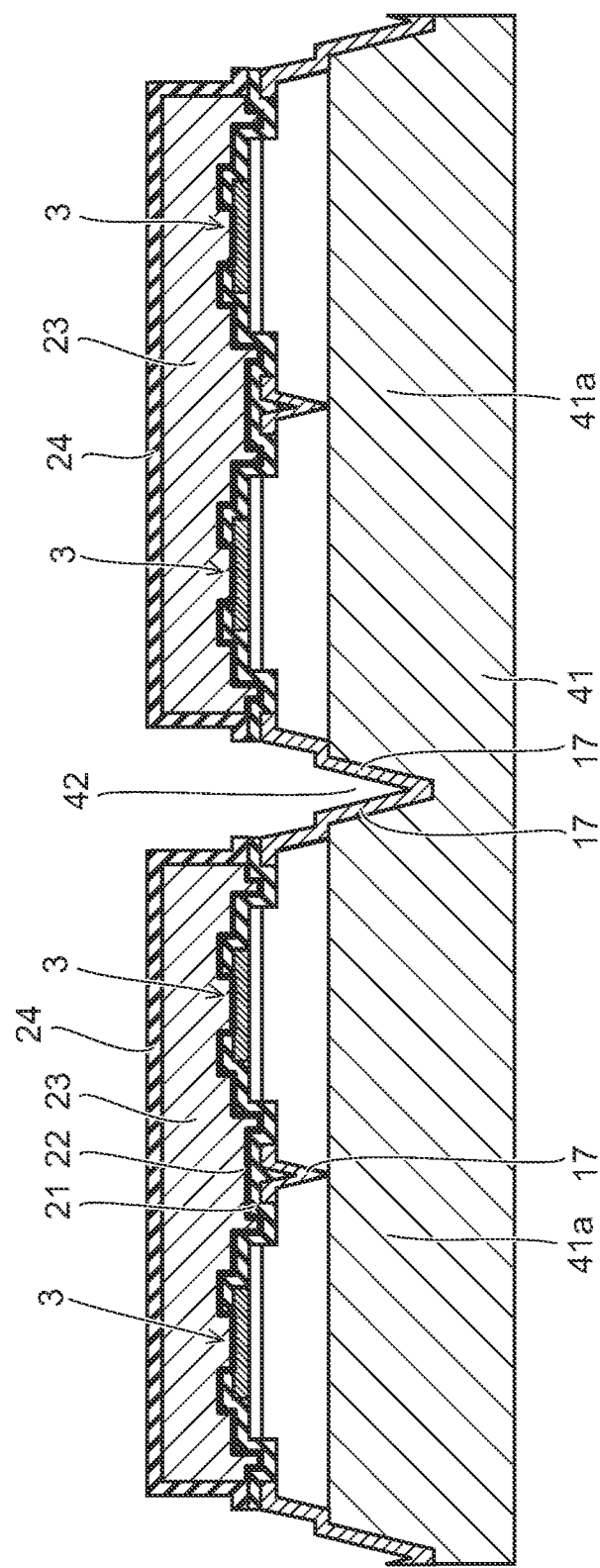

Next, for example, by a CVD method, the insulating film 24 shown in FIG. 71 is formed conformally on the whole face of the exposed part, and, after that, the insulating film 24 in the trench 42 and the insulating film 21 are removed. The n-side electrode 17 in the trench 42 is exposed.

Figure 72:
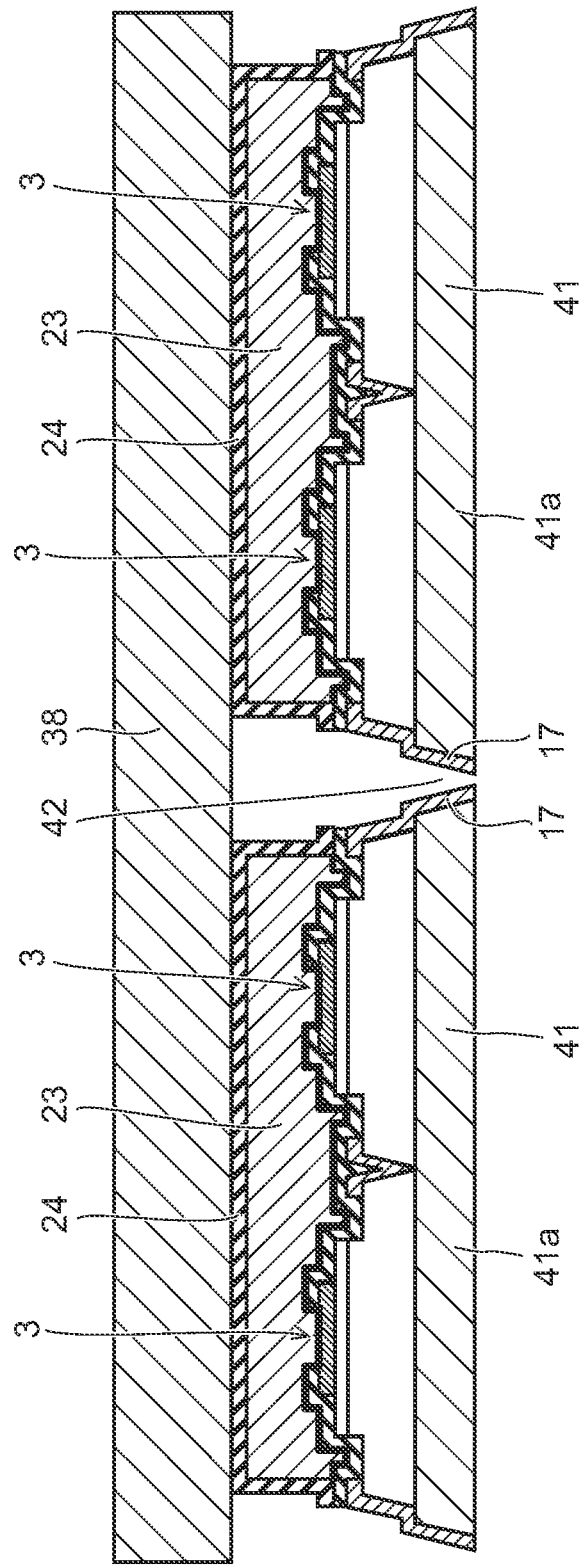

Next, as shown in FIG. 72, to the upper face of the insulating film 24, for example, the film (or a sheet) 38 made of resin is attached as a support.

Then, the rear face of the substrate 41 is ground until the trench 42 is reached. Consequently, the plurality of chips 3 linked in a wafer shape via the substrate 41 are separated in a unit of arbitrary number in the position of the trench 42. In the region surrounded by the n-side electrode 17 on the first face 15a, a part of the convex part 41a of the substrate 41 is left.

Figure 73:
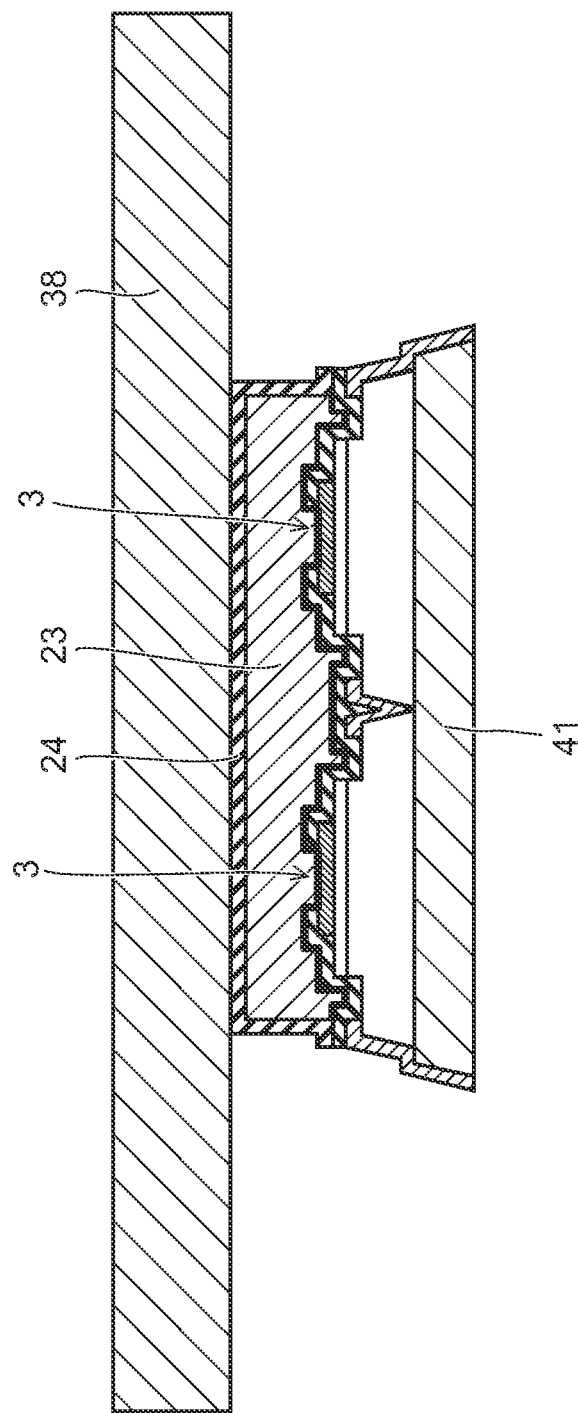

Next, the distance between a plurality of elements separated by the trench 42, wherein each thereof includes the plurality of chips 3, is extended. FIG. 73 shows one element in which the distance between the adjacent elements has been extended from the state in the grinding of the substrate 41. The one element includes a plurality of chips 3.

For processes continued afterward, highly precise distance between elements is not required. Accordingly, a method, in which, for example, a film 38 having stretch properties is used and the film 38 is extended to extend the distance between the plurality of elements supported on the film 38, can be used.

Alternatively, elements are picked up from on the film 38 having been used for grinding the substrate 41, and may be rearranged on another support with an extended inter-element distance. In this case, too, since precise inter-element distance is not required, rearrangement of elements using a high-speed mounting machine is possible.

In one element, since the plurality of chips 3 are reinforced by the continuous and integrated first p-side metal layer 23, the plurality of chips 3 can be processed as if they were one chip. Moreover, since chips 3 are supported by the common first p-side metal layer 23 in a separated state, stress applied to the chip 3 can be alleviated as compared with a case of a string of chips in the same size.

Figure 74:
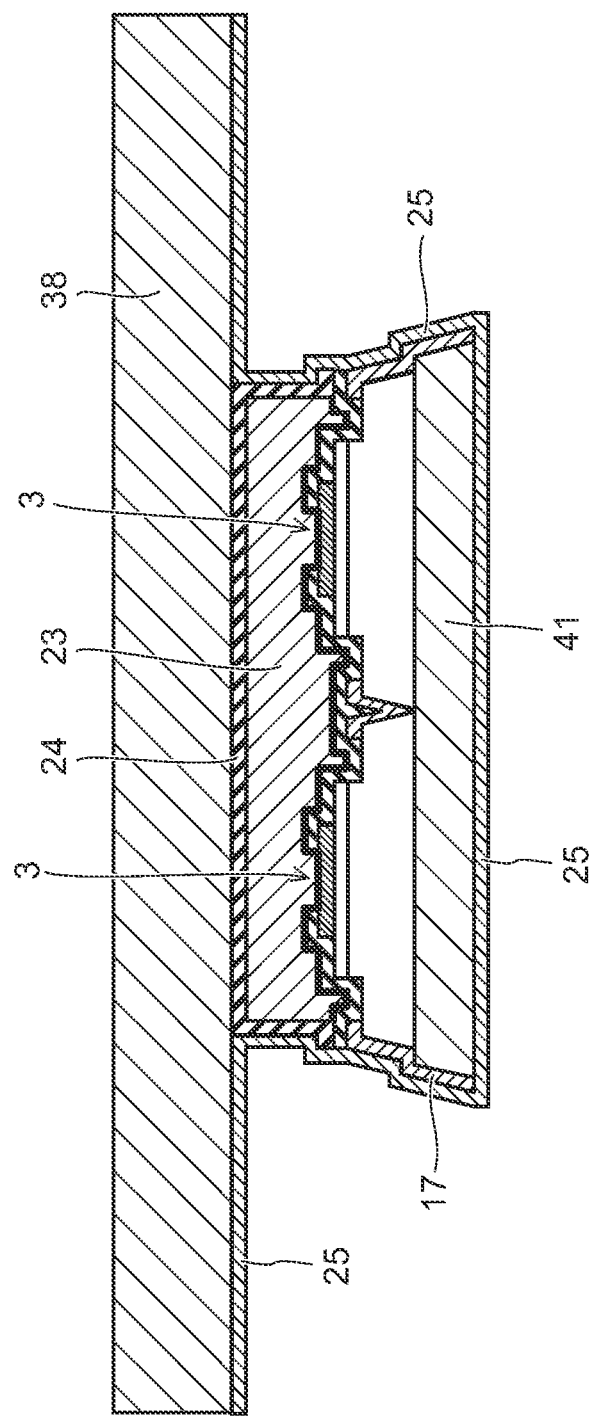

Then, as shown in FIG. 74, in the exposed part on the film 38, the metal film 25 that functions as a seed metal in plating is formed. Then, Cu electrolytic plating using the metal film 25 as a current path is performed.

Figure 75:
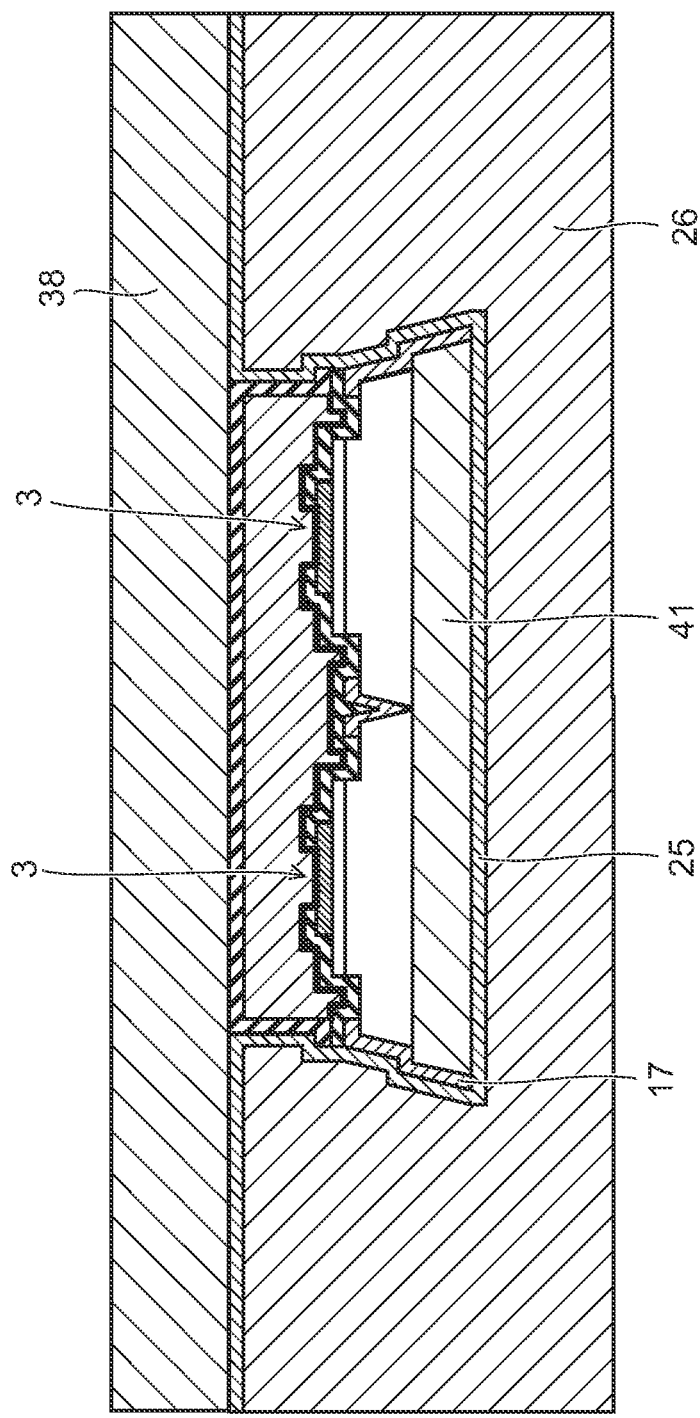

Consequently, as shown in FIG. 75, on the metal film 25, the first n-side metal layer 26 is formed. The first n-side metal layer 26 is formed around the chip 3 and on the first face 15a.

Figure 76:
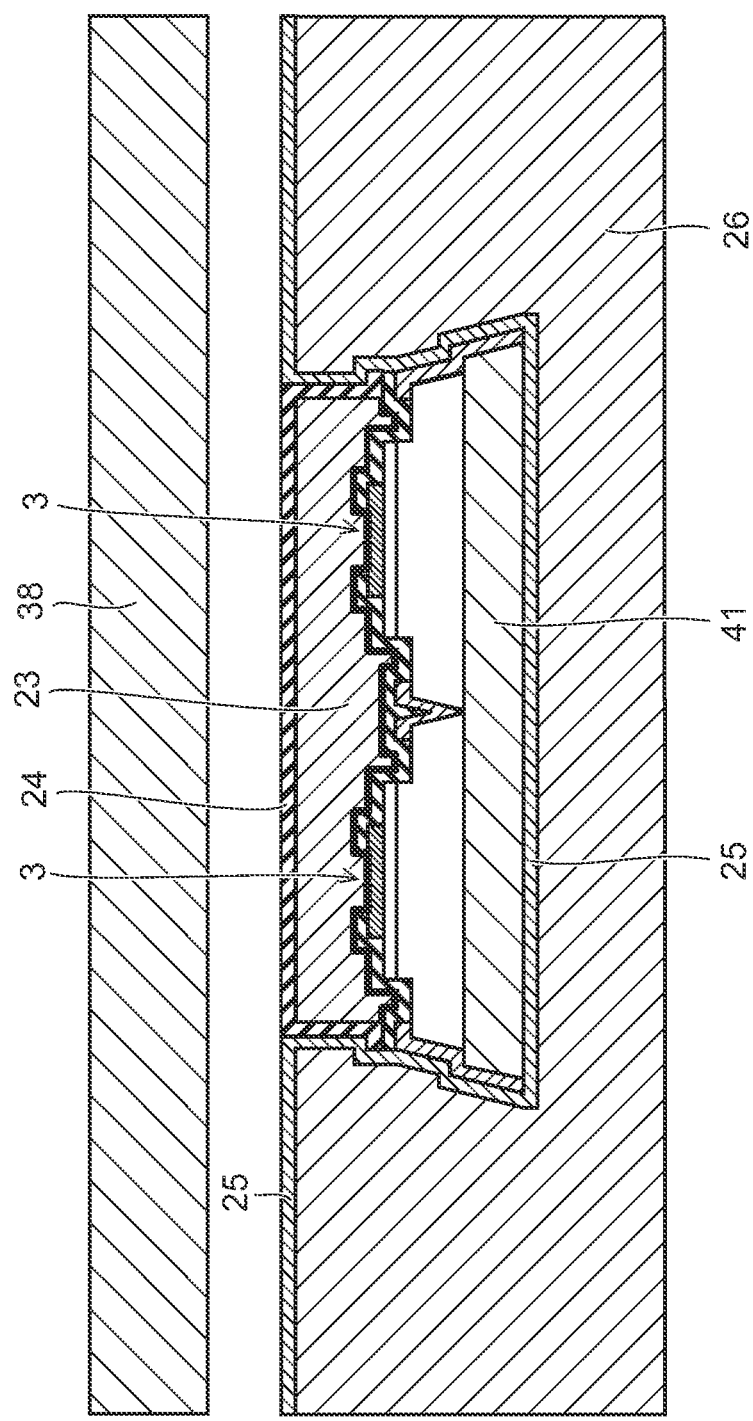

After the formation of the first n-side metal layer 26, as shown in FIG. 76, the film 38 is peeled. By the peeling of the film 38, surfaces of the metal film 25 and the insulating film 24 are exposed.

Figure 77:
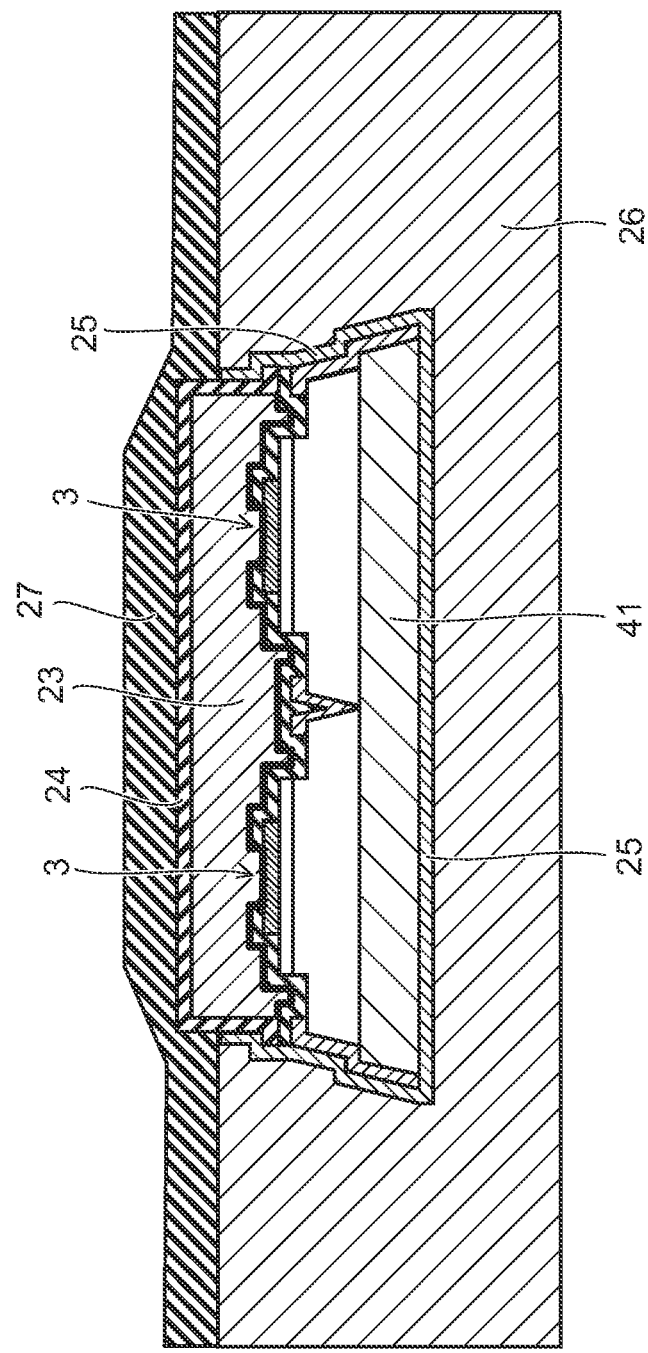

Then, the metal film 25 and the first n-side metal layer 26 are etched back so that, as shown in FIG. 77, the surface of the first p-side metal layer 23 and the surface of the insulating film 24 are made to protrude from the surface of the first n-side metal layer 26 to form a step between the surface of the first p-side metal layer 23 and the surface of the insulating film 24, and the surface of the first n-side metal layer 26.

Then, so as to cover the step, on the surface of the insulating film 24 and on the surface of the first n-side metal layer 26, the insulating layer 27 is formed.

Figure 78:
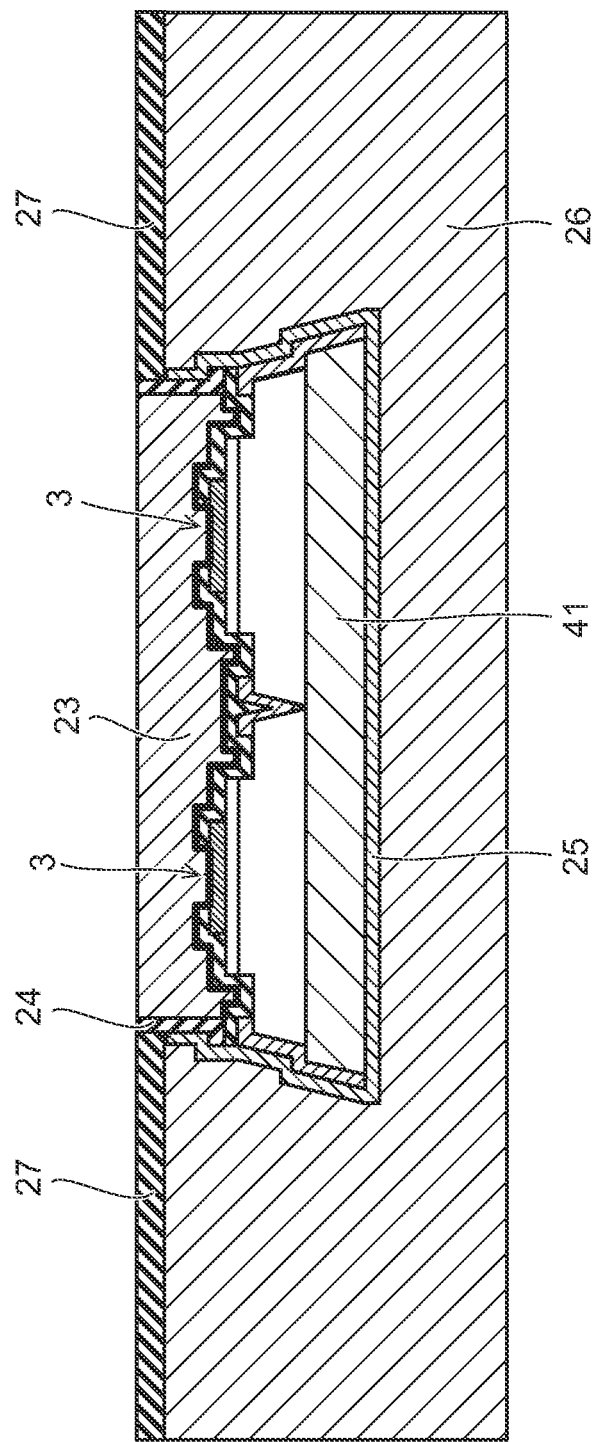

Next, for example, by a CMP method, the insulating layer 27 on the surface of the insulating film 24 and the insulating film 24 are removed to expose, as shown in FIG. 78, the surface of the first p-side metal layer 23. On the surface of the first n-side metal layer 26, the insulating layer 27 is left.

Figure 79:
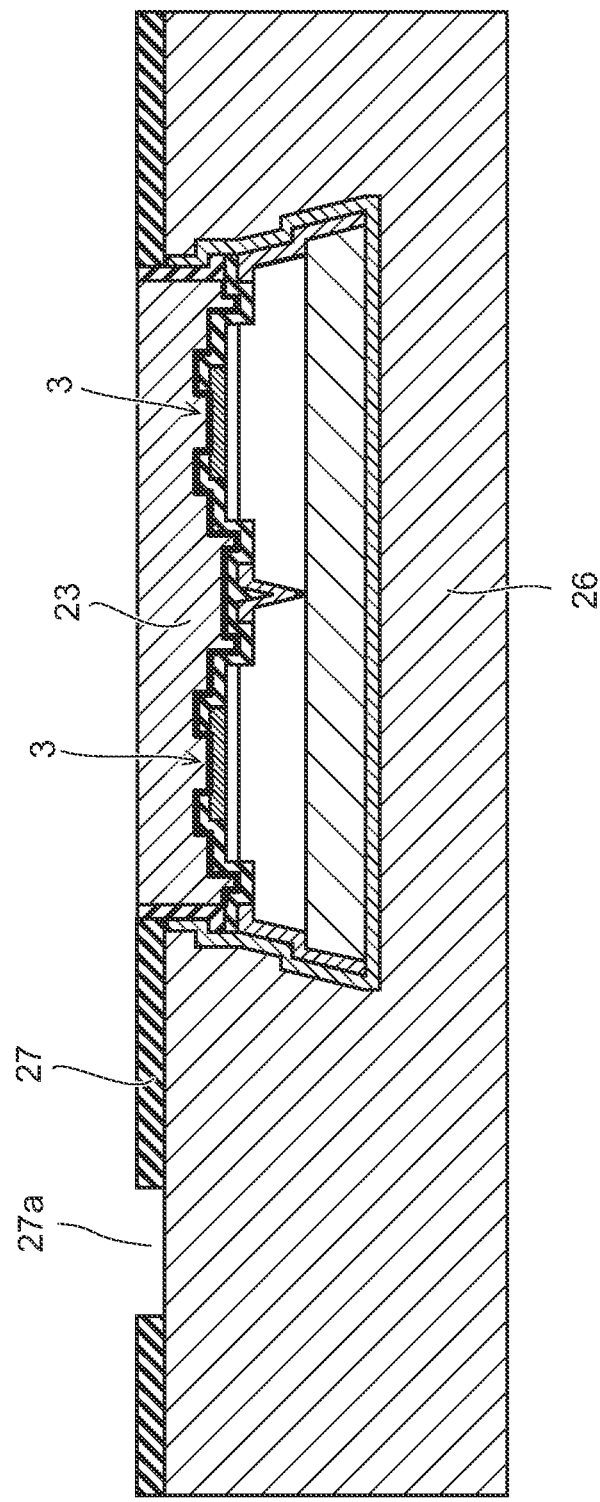

Next, as shown in FIG. 79, the opening 27a is formed selectively in the insulating layer 27 on the peripheral region of the chip 3 to expose a part of the first n-side metal layer 26.

Figure 80:
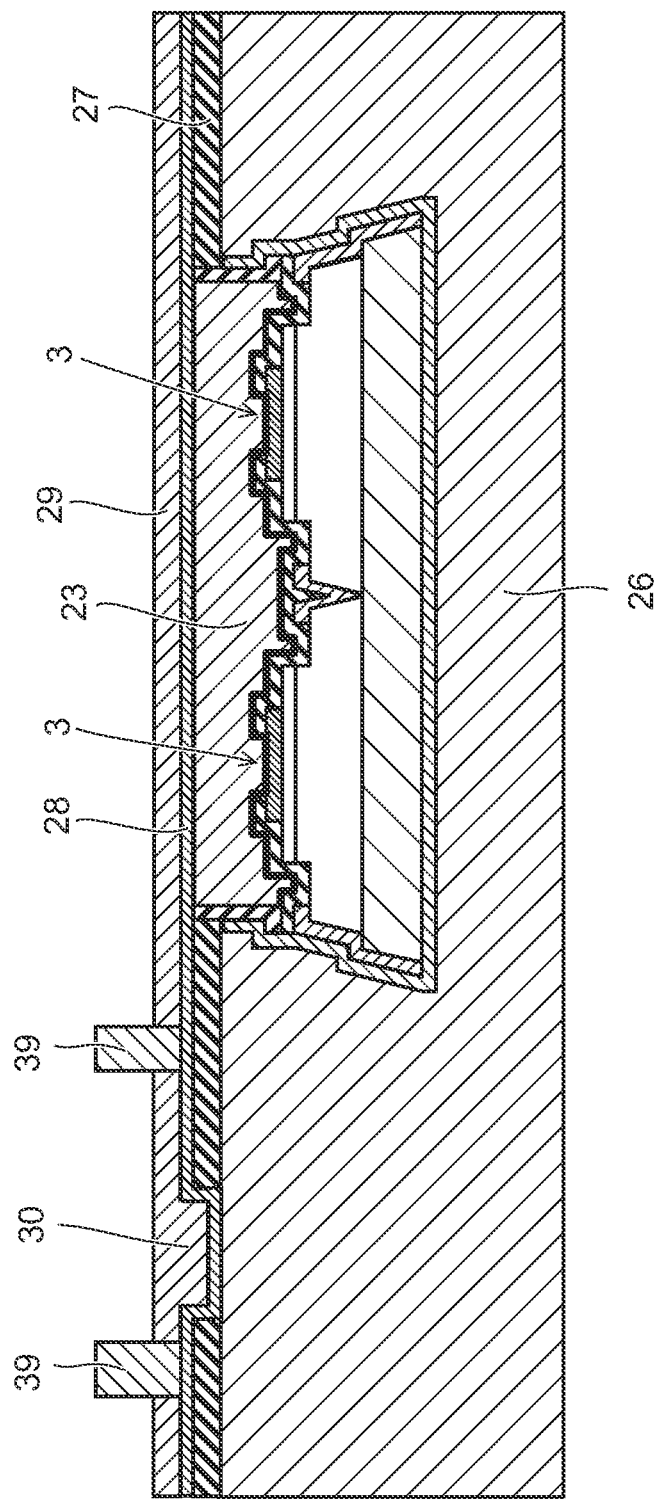

Next, as shown in FIG. 80, in the opening 27a, on the surface of the insulating layer 27 and on the surface of the first p-side metal layer 23, the metal film 28 that functions as a seed metal in plating is formed. Then, using the resist 39, Cu electrolytic plating using the metal film 28 as a current path is performed. Consequently, on the metal film 28, the second p-side metal layer 29 and the second n-side metal layer 30 are formed.

Figure 81:
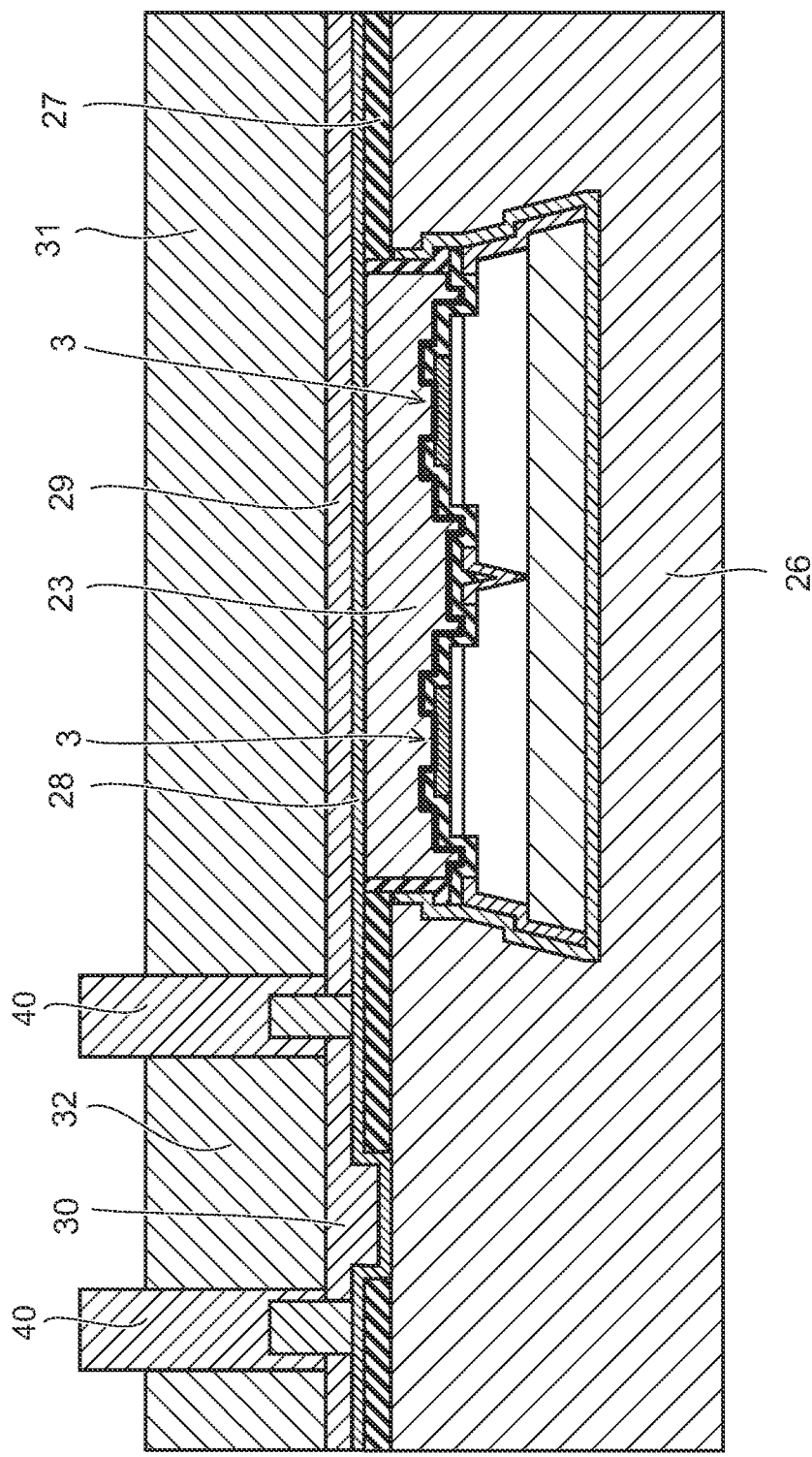

Next, as shown in FIG. 81, using the resist 40, Cu electrolytic plating using the metal film 28 as a current path is performed. Consequently, the third p-side metal layer 31 is formed on the second p-side metal layer 29, and the third n-side metal layer 32 is formed on the second n-side metal layer 30.

Figure 82:
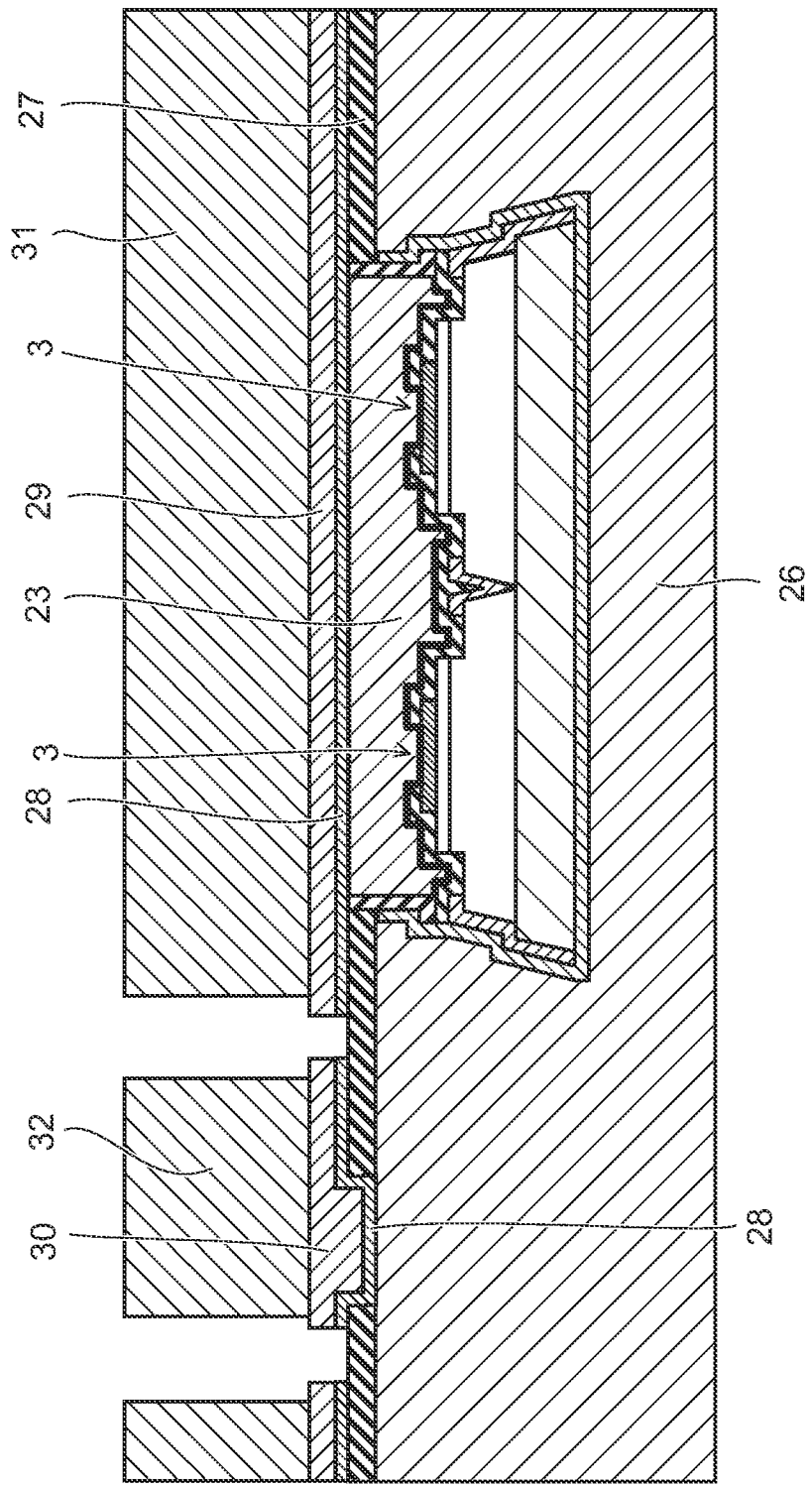

Next, the resist 40 is removed, and furthermore, as shown in FIG. 82, the exposed part of the metal film 28 having been used as the seed metal is removed. Consequently, the connection between the second p-side metal layer 29 and the second n-side metal layer 30, and the connection between the third p-side metal layer 31 and the third n-side metal layer 32, through the metal film 28, are disconnected.

Figure 83:
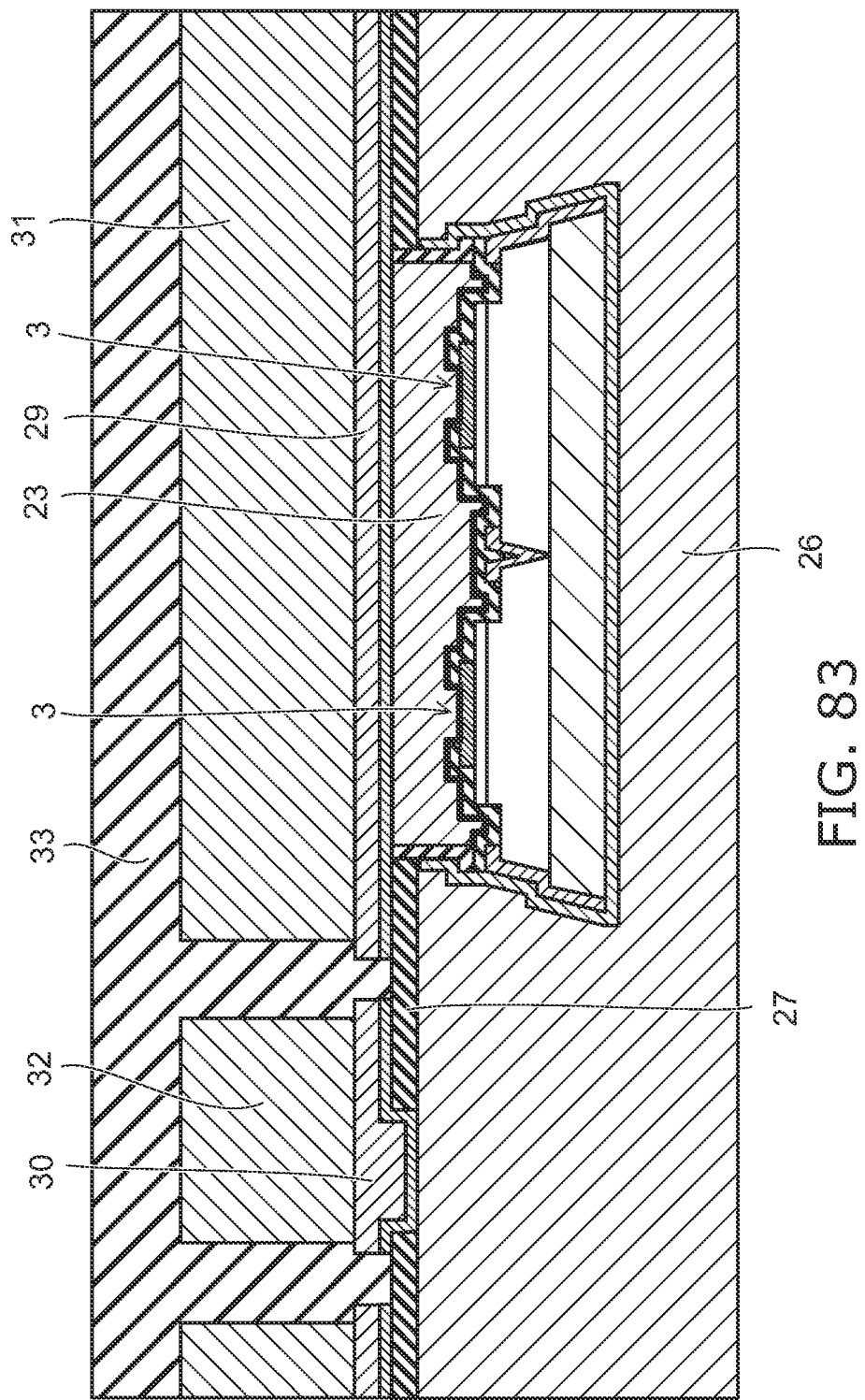

Next, on the insulating layer 27, the resin layer 33 shown in FIG. 83 is formed. The resin layer 33 covers the insulating layer 27, the second p-side metal layer 29, the second n-side metal layer 30, the third p-side metal layer 31, and the third n-side metal layer 32.

Figure 84:
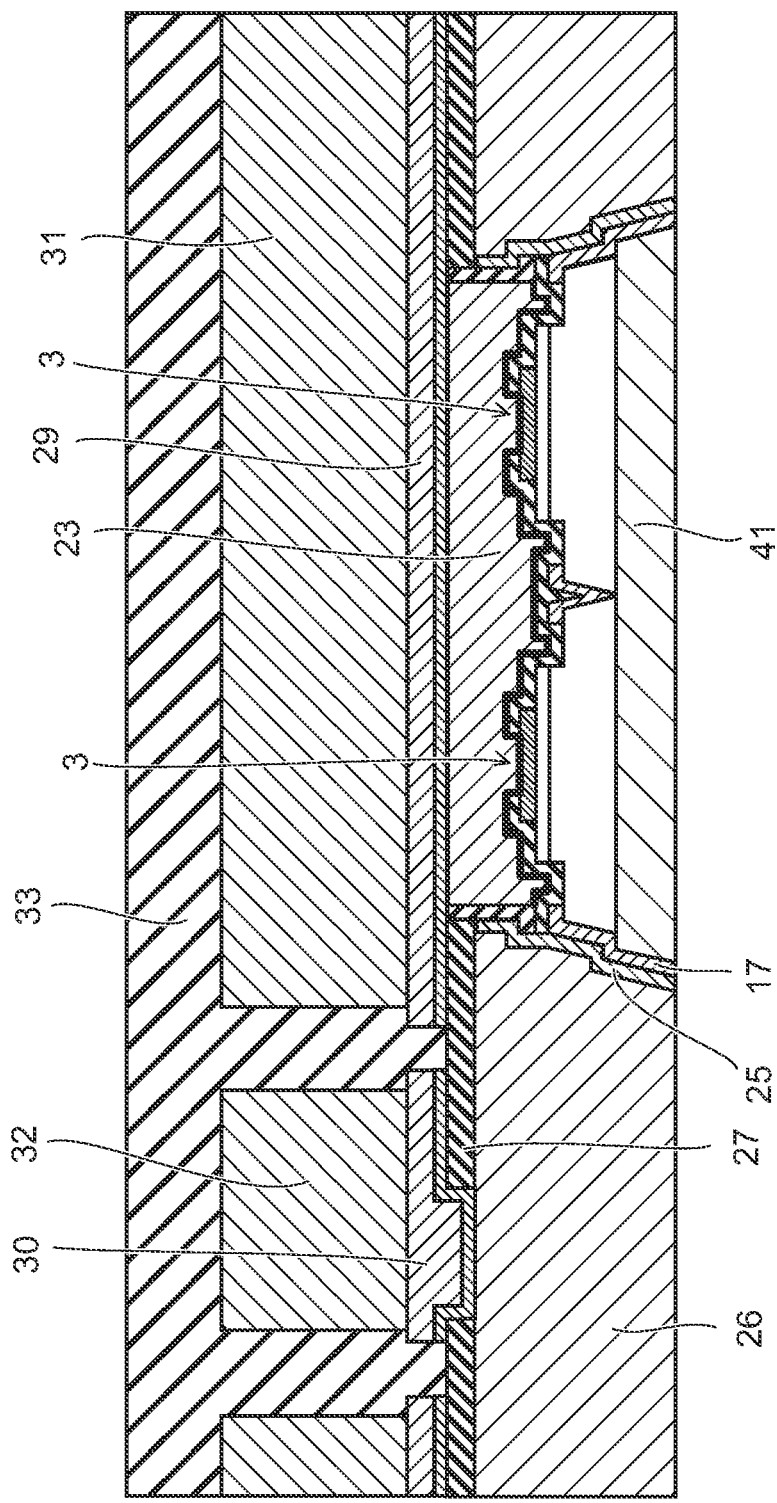

Next, the surface of the first n-side metal layer 26 (the lower face in FIG. 83) is ground, and furthermore the metal film 25 is removed to expose, as shown in FIG. 84, the surface of the substrate 41 that has been left on the first face 15a.

Figure 85:
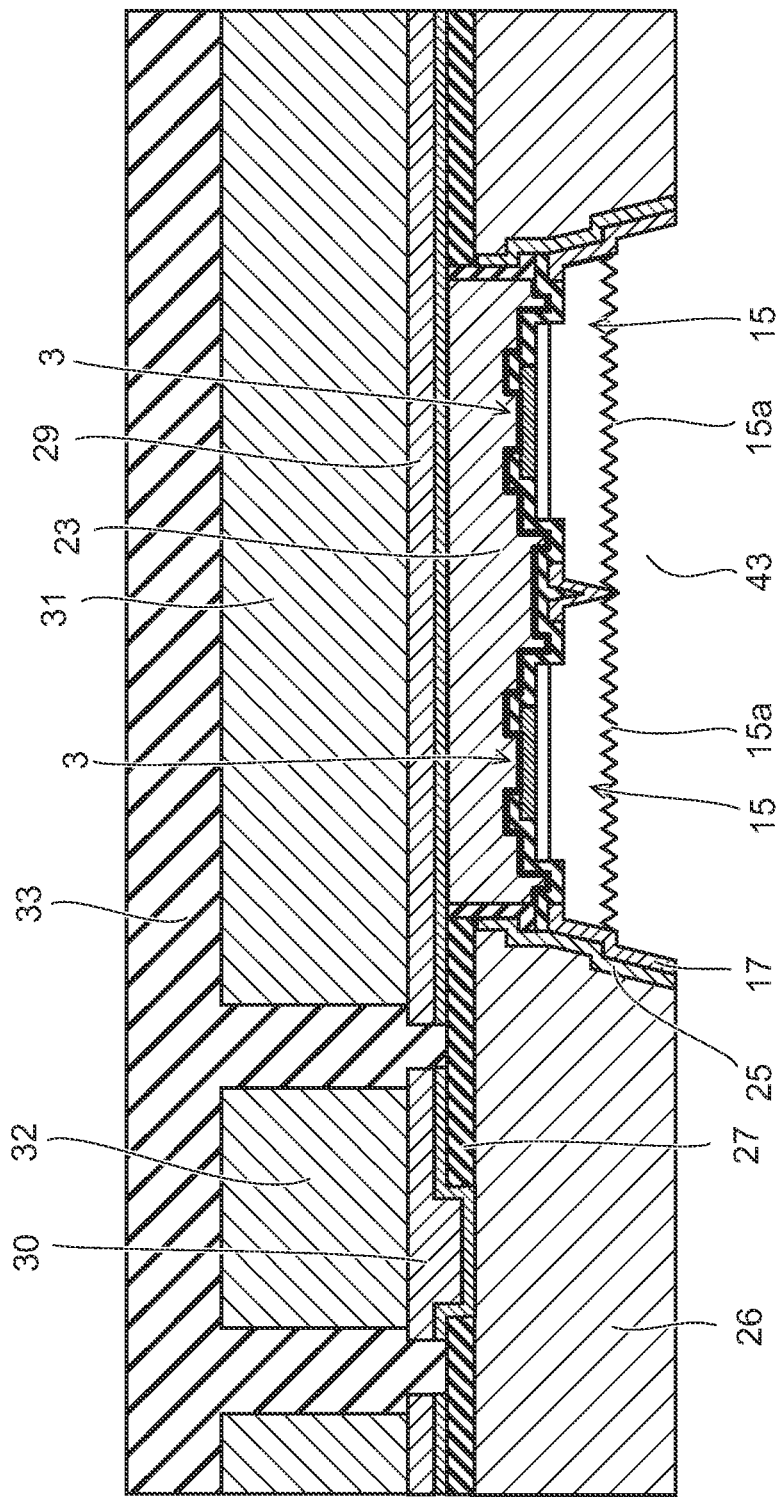

Next, the substrate 41 remaining on the first face 15a is removed. By the removal of the substrate 41, as shown in FIG. 85, on the first face 15a, the space 43 surrounded by the n-side electrode 17 is formed. After that, the first face 15a is subjected to frost processing.

Figure 86:
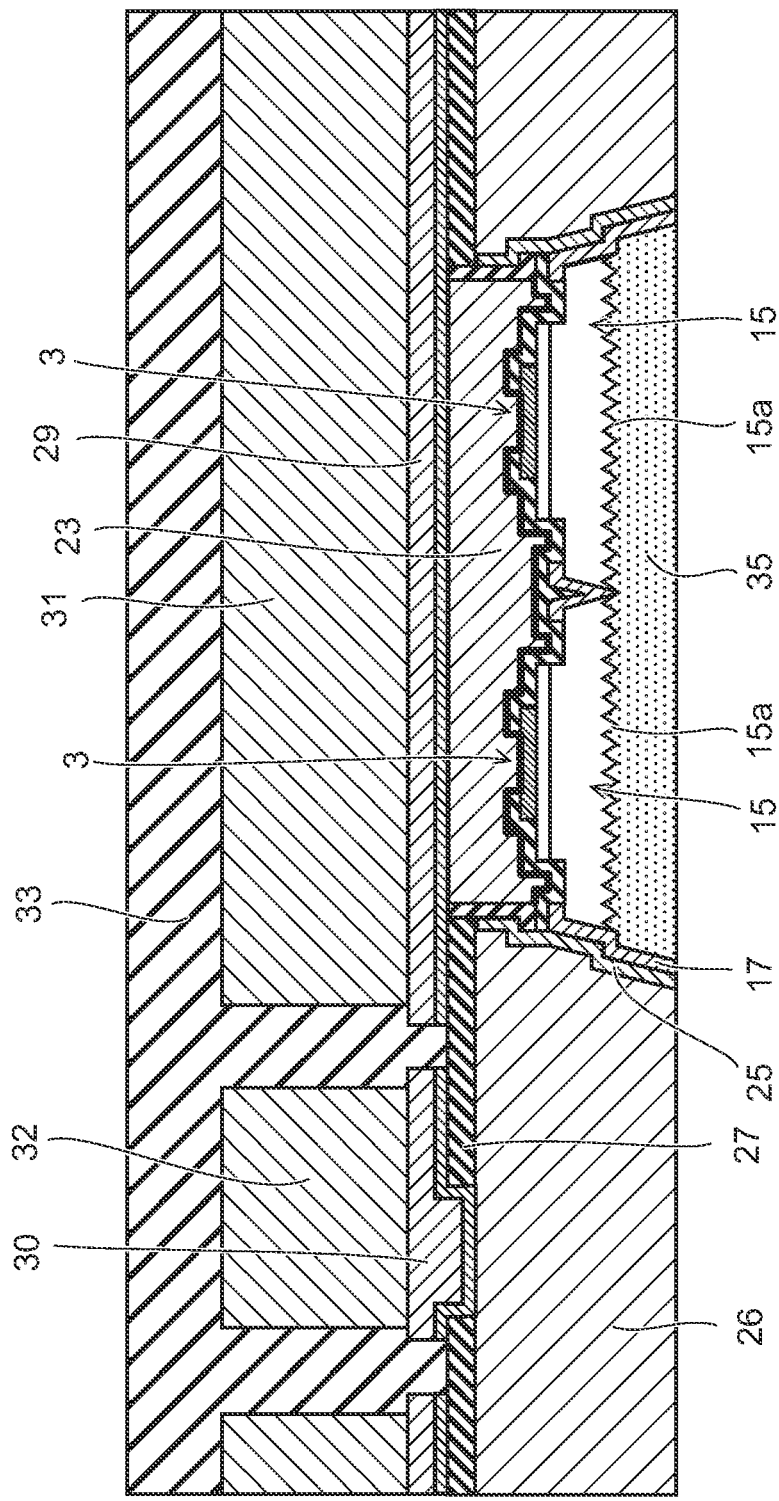

After the frost processing, in the space 43, as shown in FIG. 86, the phosphor layer 35 is embedded. The formation of the phosphor layer 35 only on the first face 15a is possible, and the utilization efficiency of the material is good.

After that, the surface of the resin layer 33 is ground to expose, as shown in FIG. 66, the p-side external terminal 31a and the n-side external terminal 32a.

Then, in an intended position, the resin layer 33, the insulating layer 27 and the first n-side metal layer 26 are diced and separated into pieces of the semiconductor light emitting device 1e shown in FIG. 66.

Sixth Embodiment

Figure 87:
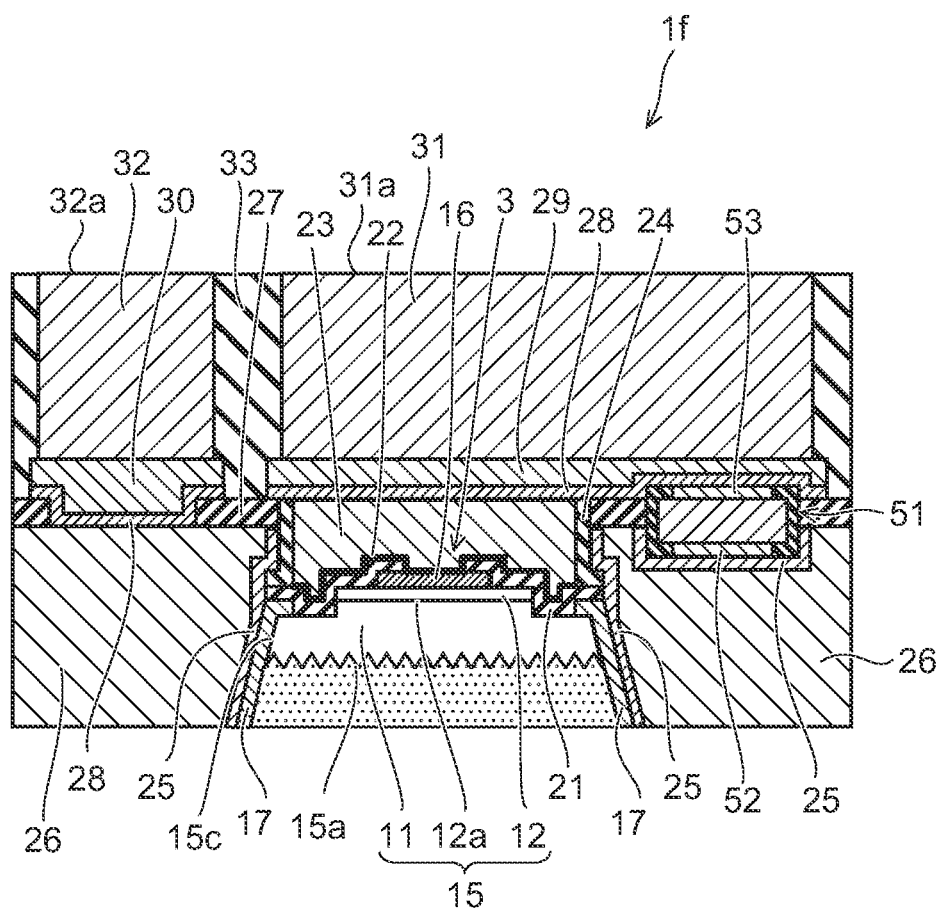
FIG. 87 is a schematic cross-sectional view of a semiconductor light emitting device of a sixth embodiment.

FIG. 87 is a schematic cross-sectional view of a semiconductor light emitting device 1f of a sixth embodiment.

The semiconductor light emitting device 1f of the sixth embodiment has a varistor 51. In the sixth embodiment, a structure, in which the varistor is added to the semiconductor light emitting device of the aforementioned third embodiment, is illustrated, but the varistor may be added to the semiconductor light emitting device of another embodiment.

The varistor 51 is provided between the first n-side metal layer 26 and the second p-side metal layer 29 in the peripheral region of the first p-side metal layer 23.

The varistor 51 has a first electrode (or terminal) 52 and a second electrode (or terminal) 53. The first electrode 52 is connected electrically with the first n-side metal layer 26 via the metal film 25. The second electrode 53 is connected electrically with the second p-side metal layer 29 via the metal film 28.

Accordingly, the varistor 51 is connected electrically between the p-side external terminal 31a and the n-side external terminal 32a. That is, the chip 3 and the varistor 51 are connected in parallel between the p-side external terminal 31a and the n-side external terminal 32a.

The varistor 51 has such a characteristic that the electric resistance is high when the voltage between both the electrodes 52 and 53 is low, but that the electric resistance rapidly becomes low when the voltage becomes high above a certain level.

Accordingly, the varistor 51 functions as a protection element that protects the chip 3 from a surge voltage, and makes it possible to provide the semiconductor light emitting device 1f that is highly resistant to electrostatic breakdown.

Next, with reference to FIGS. 88A to 100, a method for manufacturing the semiconductor light emitting device 1f of the sixth embodiment will be explained.

Up to the process shown in FIG. 37, the method is advanced as in the third embodiment. Then, in the sixth embodiment, as shown in FIG. 88A, the varistor 51 is also mounted in the region adjacent to the chip 3 on the film 38. The second electrode 53 of the varistor 51 is attached to the film 38.

Next, as shown in FIG. 88B, in the exposed part on the film 38, the metal film 25 to be used as a seed metal in plating is formed. The metal film 25 also covers the exposed face of the varistor 51 conformally.

Figure 89:
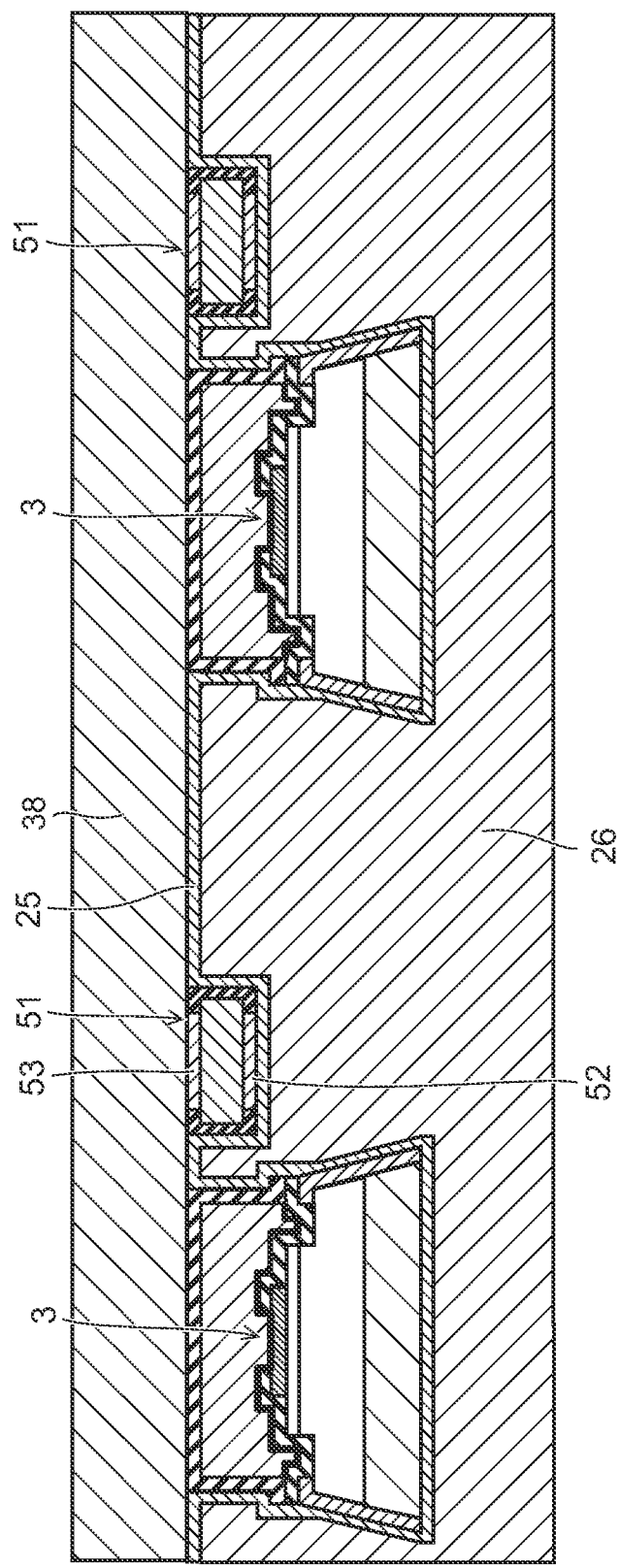

Then, Cu electrolytic plating using the metal film 25 as a current path is performed. Consequently, as shown in FIG. 89, the first n-side metal layer 26 is formed on the metal film 25.

The varistor 51 on the film 38 is covered with the first n-side metal layer 26 via the metal film 25.

Figure 90:
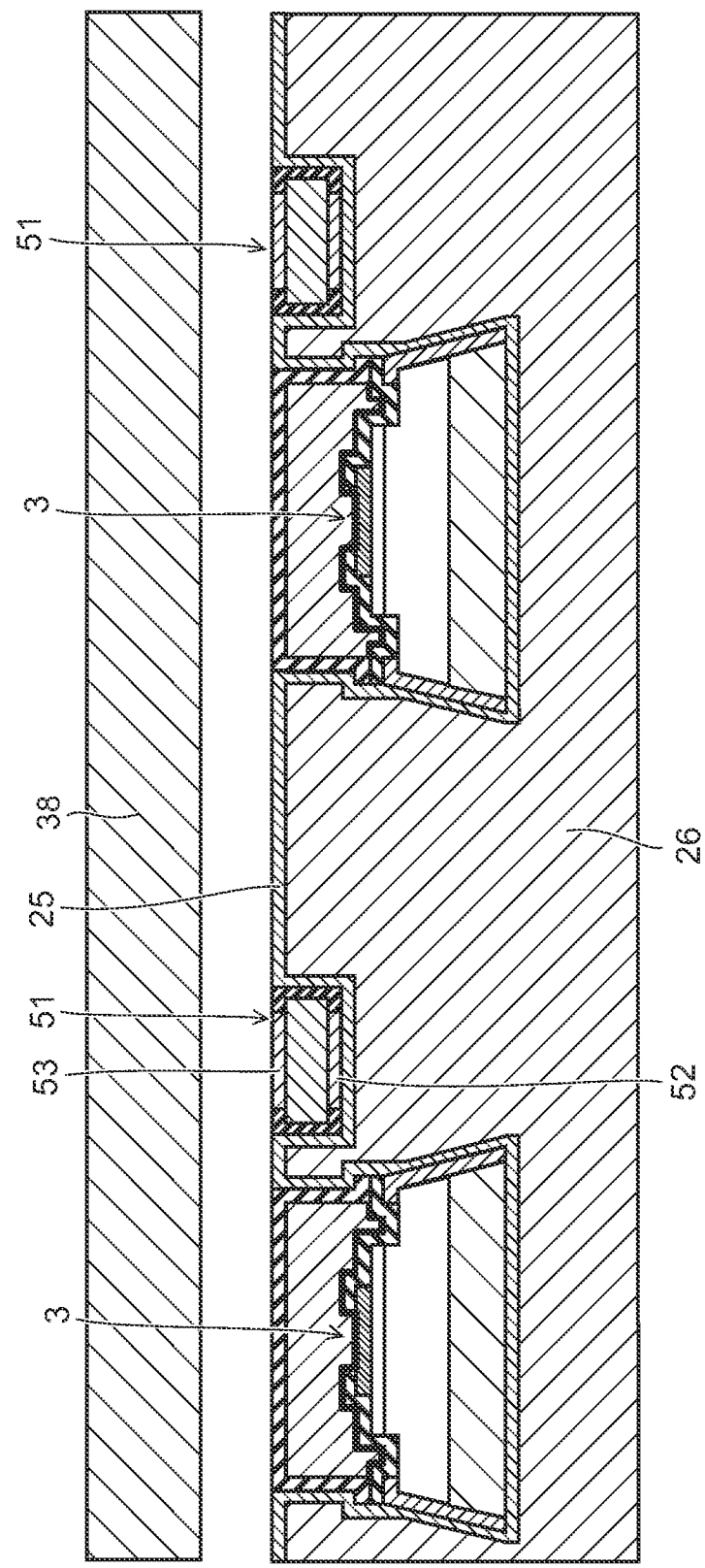

After the formation of the first n-side metal layer 26, as shown in FIG. 90, the film 38 is peeled. By the peeling of the film 38, surfaces of the metal film 25 and the insulating film 24 are exposed. Furthermore, the second electrode 53 of the varistor 51 is also exposed.

Figure 91:
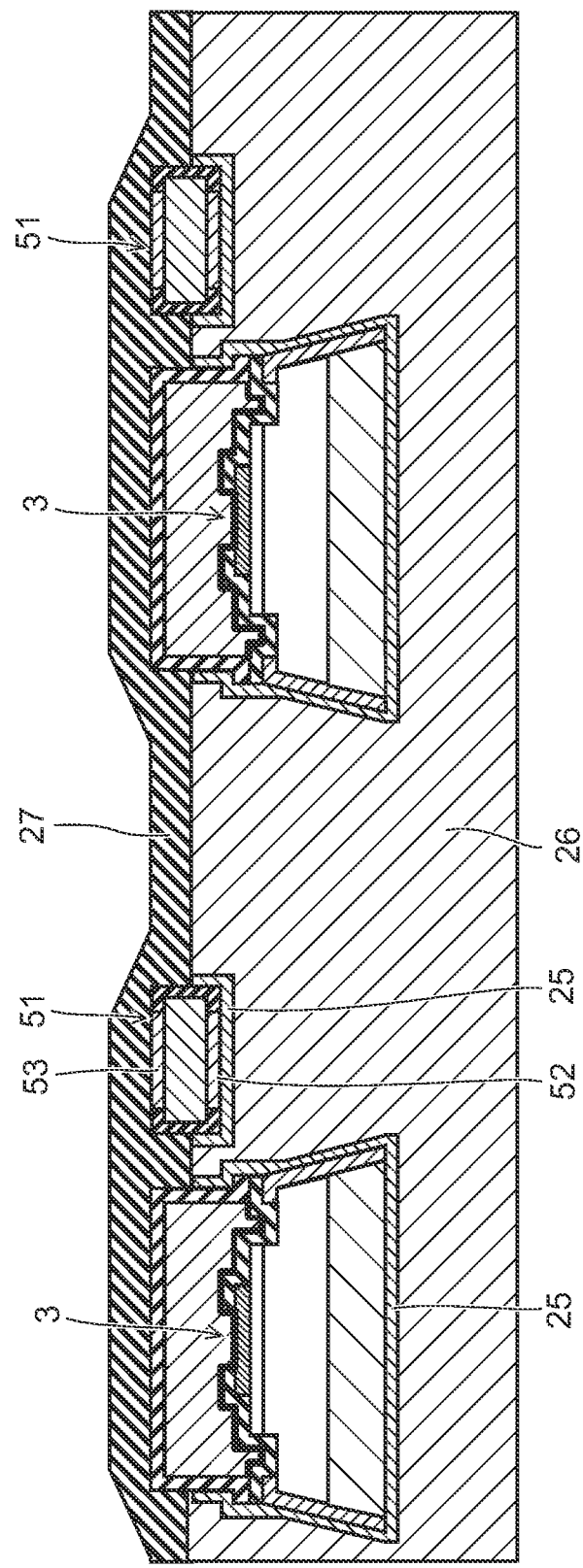

Then, the metal film 25 and the first n-side metal layer 26 are etched back so that, as shown in FIG. 91, the surface of the first p-side metal layer 23 and the surface of the insulating film 24 are made to protrude from the surface of the first n-side metal layer 26 to form a step between the surface of the first p-side metal layer 23 and the surface of the insulating film 24, and the surface of the first n-side metal layer 26. Moreover, the second electrode 53 of the varistor 51 also protrudes from the surface of the first n-side metal layer 26.

Then, on the surface of the insulating film 24, on the surface of the first n-side metal layer 26, and on the second electrode 53 of the varistor 51, the insulating layer 27 is formed.

Figure 92:
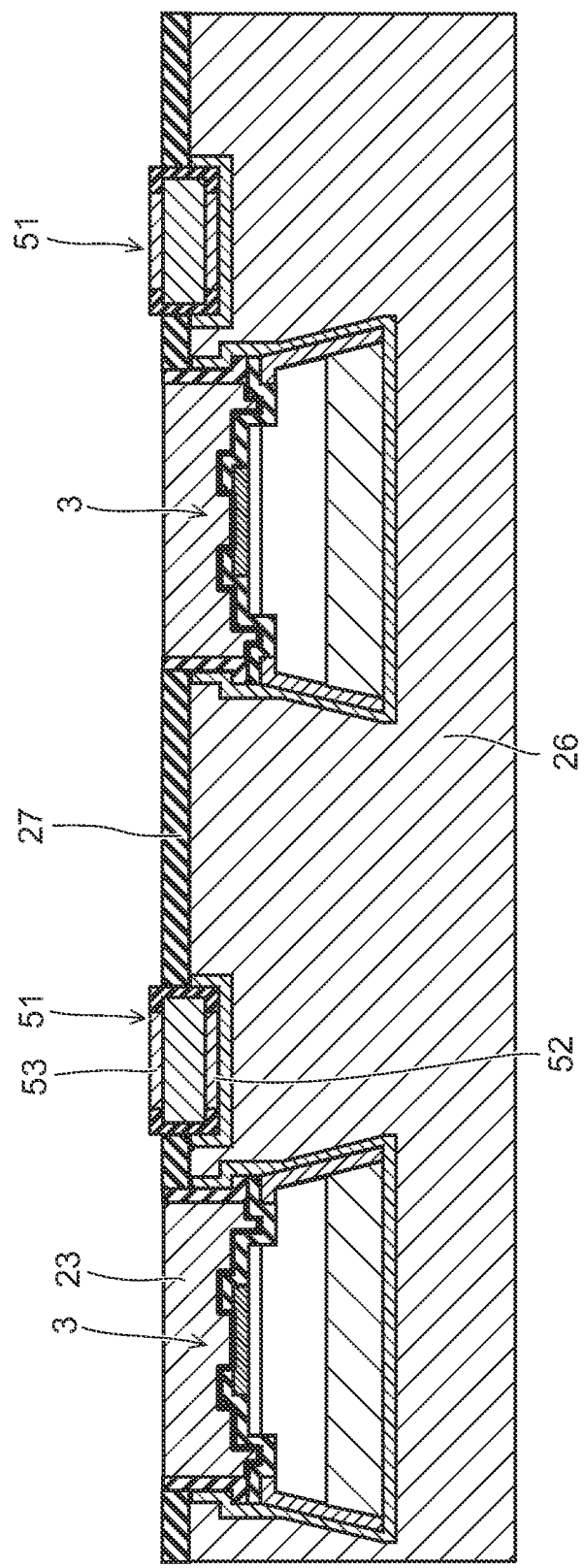

Next, for example, by a CMP method, the insulating layer 27 on the surface of the insulating film 24 and the insulating film 24 are removed to expose, as shown in FIG. 92, the surface of the first p-side metal layer 23. The insulating layer 27 on the second electrode 53 of the varistor 51 is also removed to expose the surface of the second electrode 53.

Figure 93:
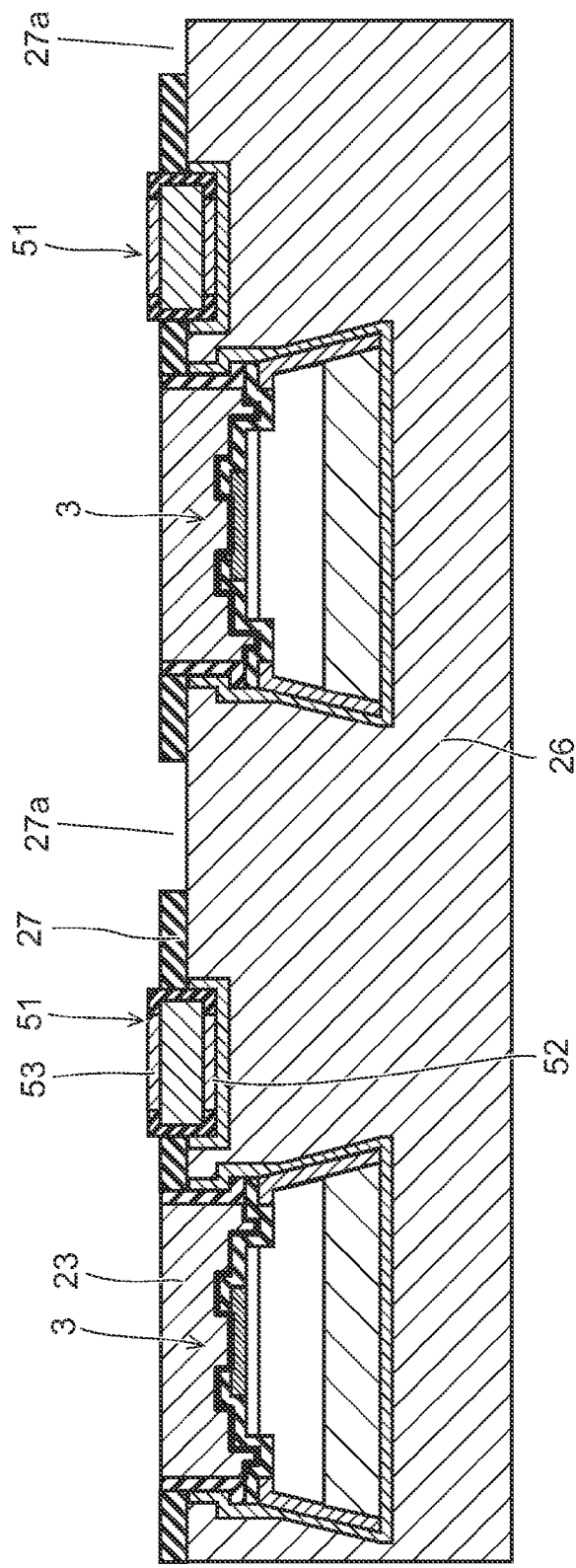

Next, as shown in FIG. 93, opening 27a is formed selectively in the insulating layer 27 on a region not provided with the varistor 51 in an outer circumference of the chip 3, to expose a part of the first n-side metal layer 26.

Figure 94:
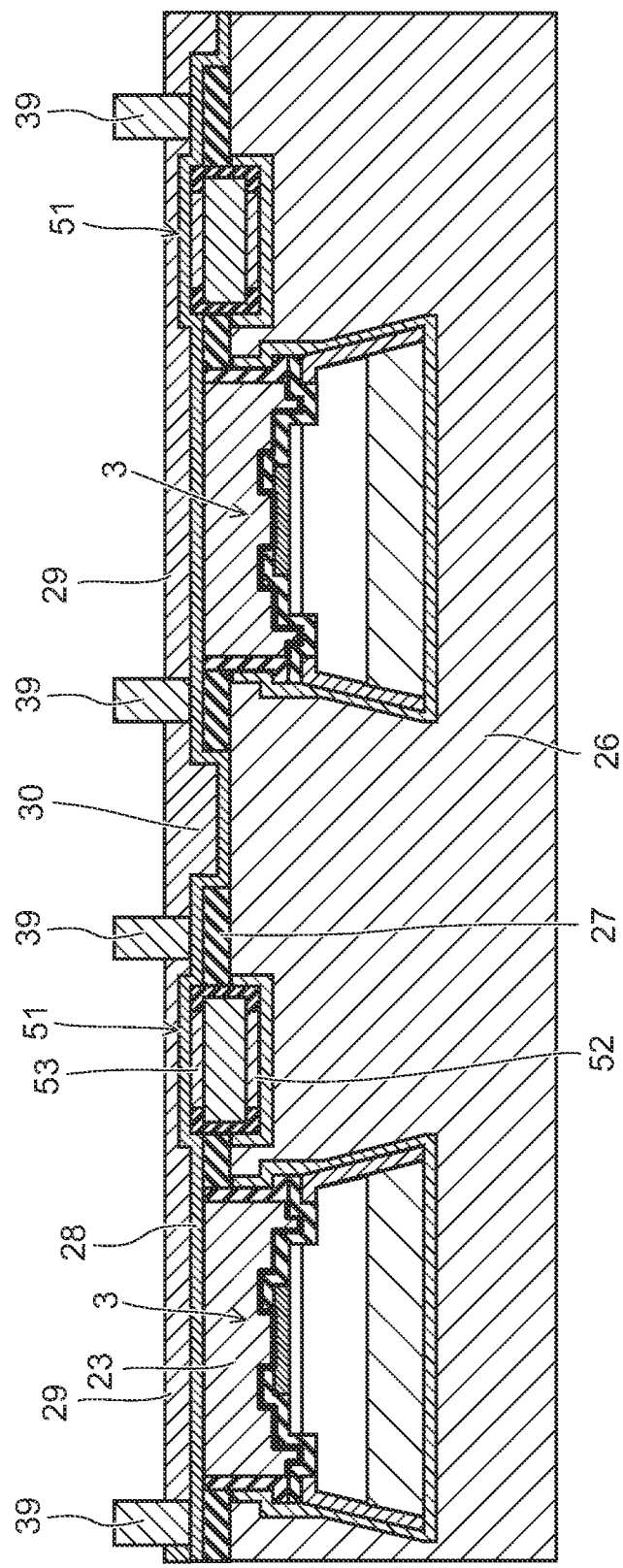

Next, as shown in FIG. 94, in the opening 27a, on the surface of the insulating layer 27, on the surface of the first p-side metal layer 23, and on the second electrode 53 of the varistor 51, the metal film 28 that functions as a seed metal in plating is formed. Then, using the resist 39, Cu electrolytic plating using the metal film 28 as a current path is performed.

Consequently, on the metal film 28, the second p-side metal layer 29 and the second n-side metal layer 30 are formed. The second p-side metal layer 29 is formed on the first p-side metal layer 23 and on the second electrode 53 of the varistor 51, and, via the metal film 28, is connected electrically with the first p-side metal layer 23 and the second electrode 53 of the varistor 51.

Figure 95:
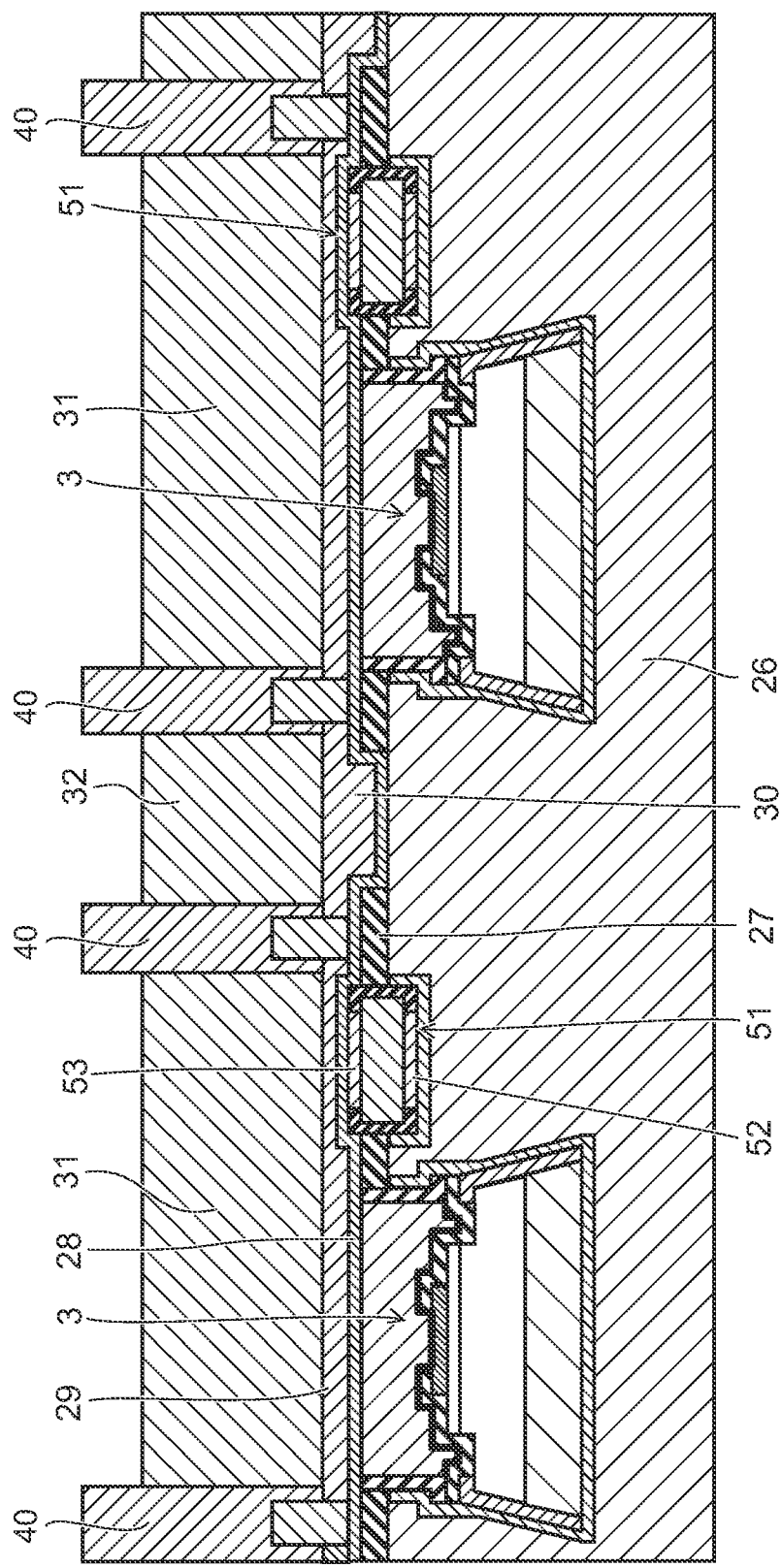

Next, as shown in FIG. 95, using the resist 40, Cu electrolytic plating using the metal film 28 as a current path is performed.

Consequently, the third p-side metal layer 31 is formed on the second p-side metal layer 29, and the third n-side metal layer 32 is formed on the second n-side metal layer 30.

Figure 96:
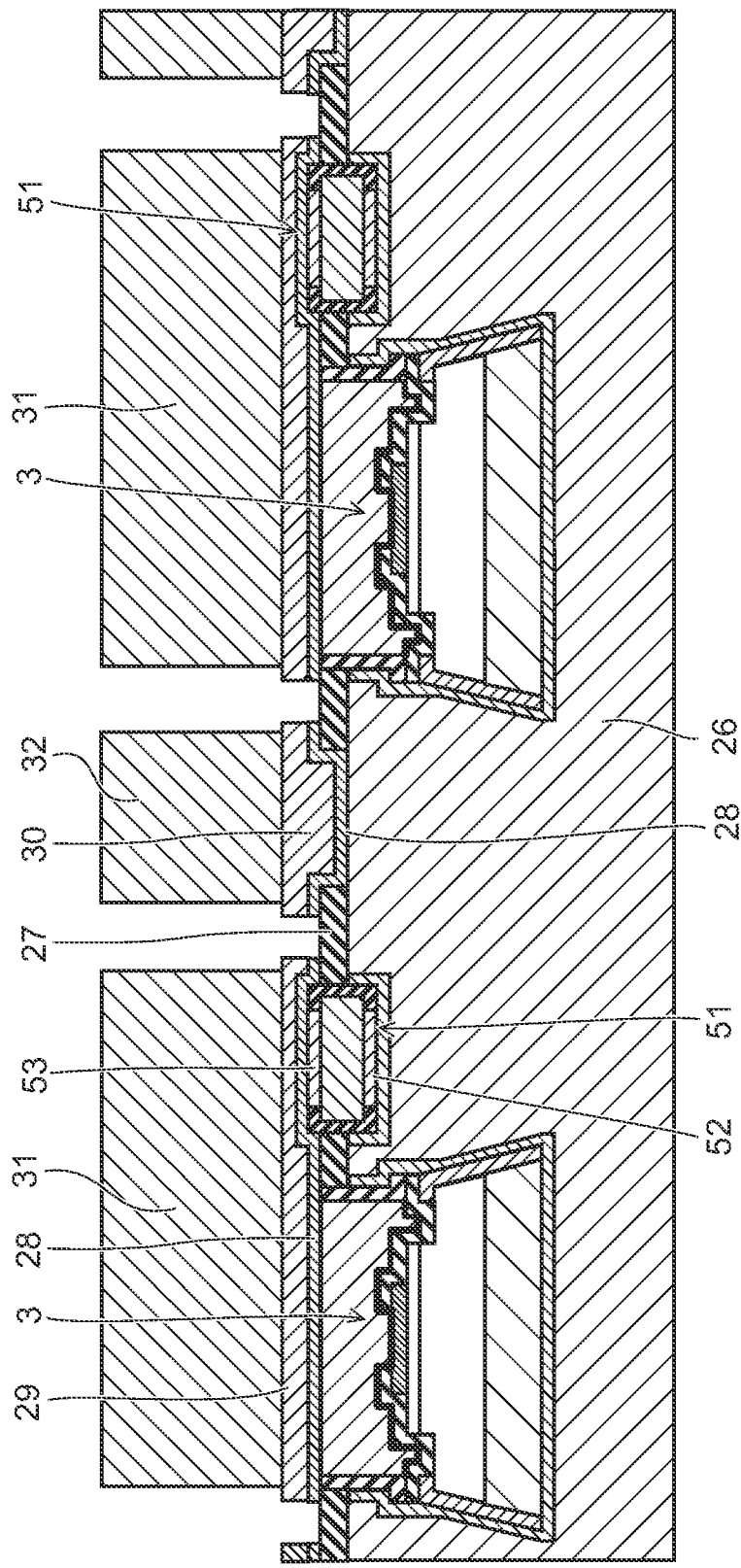

Next, the resist 40 is removed, and furthermore, as shown in FIG. 96, the exposed part of the metal film 28 having been used as the seed metal is removed. Consequently, the connection between the second p-side metal layer 29 and the second n-side metal layer 30 through the metal film 28 is disconnected.

Figure 97:
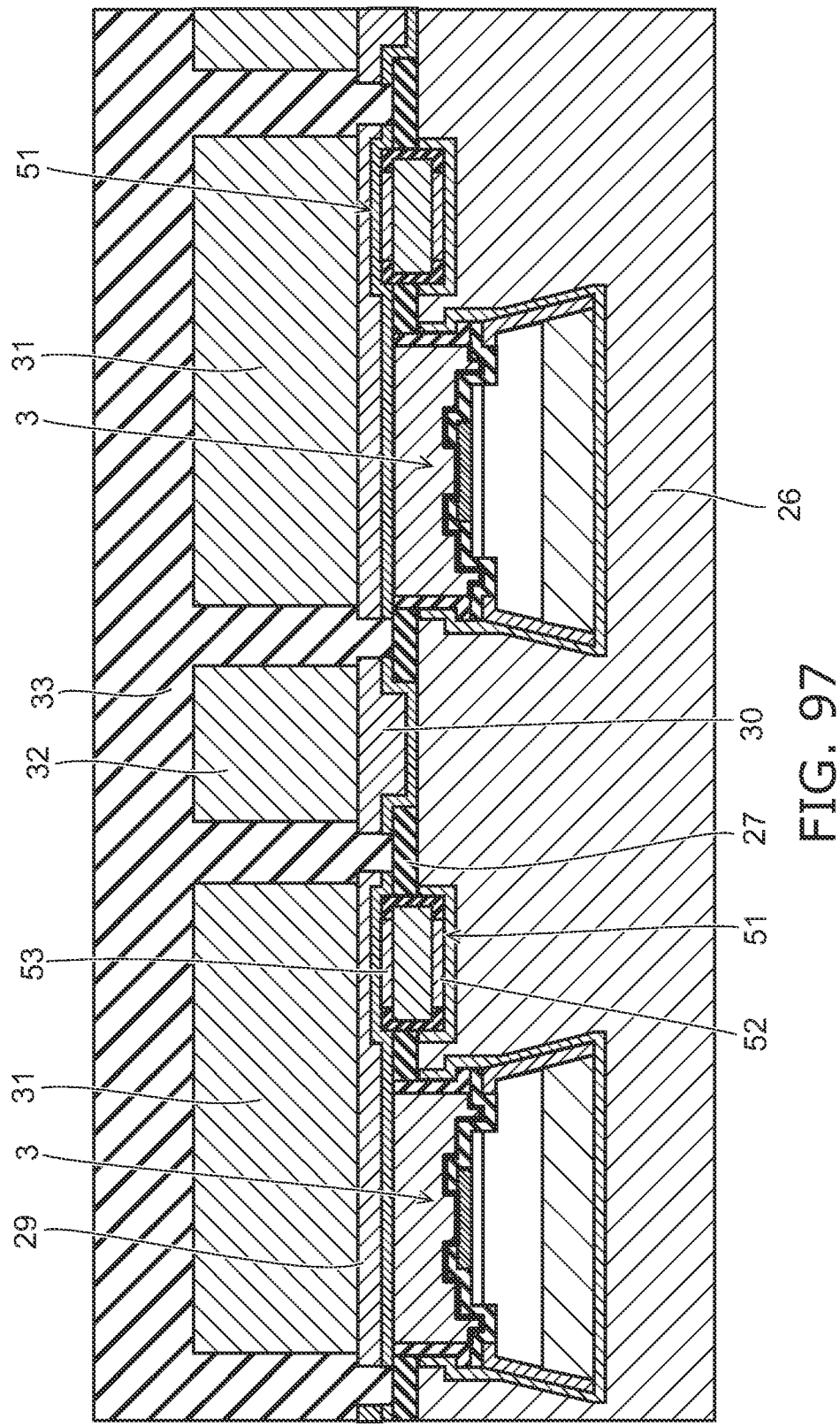

Next, on the insulating layer 27, the resin layer 33 shown in FIG. 97 is formed. The resin layer 33 covers the insulating layer 27, the second p-side metal layer 29, the second n-side metal layer 30, the third p-side metal layer 31, and the third n-side metal layer 32.

Figure 98:
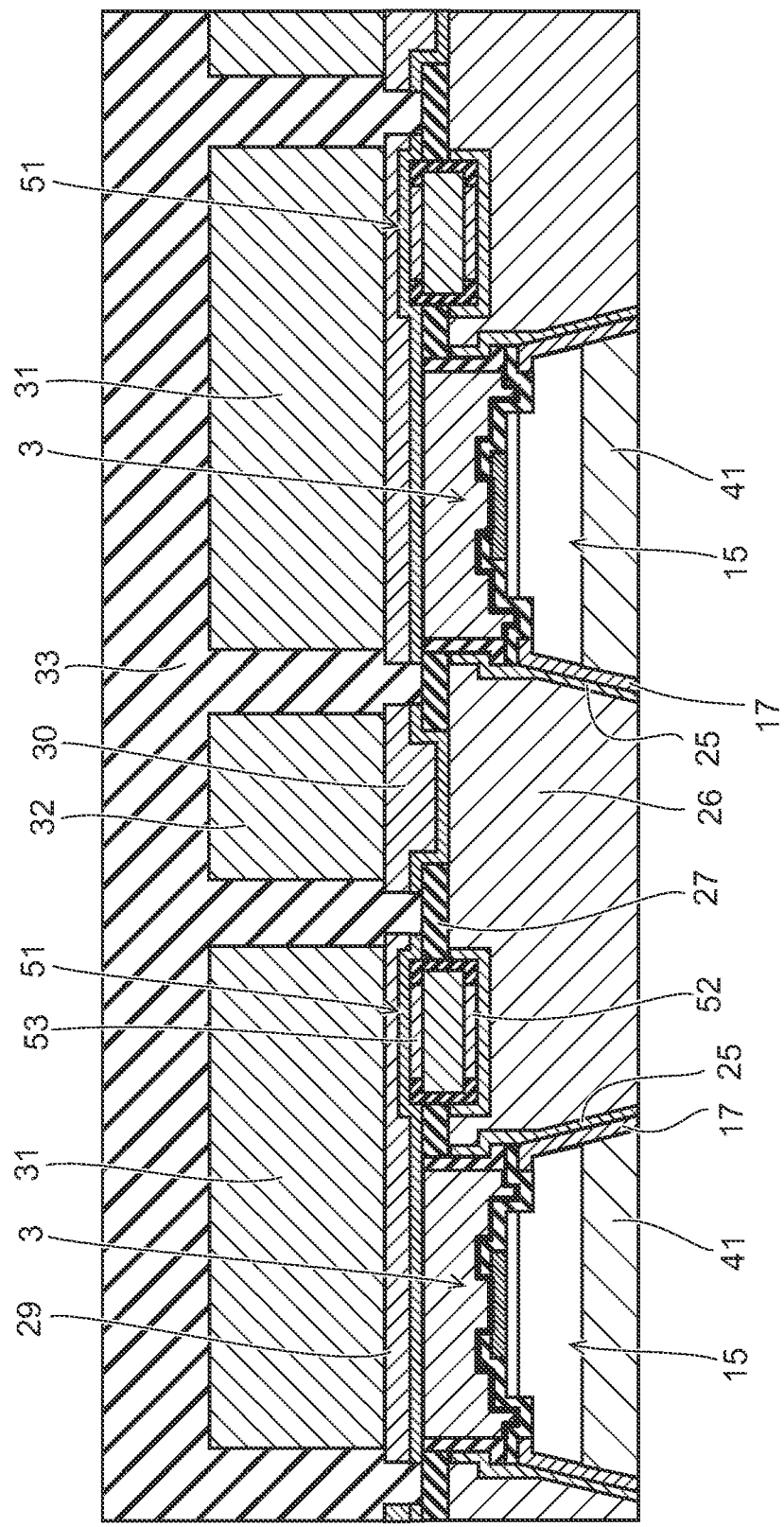

Next, the surface of the first n-side metal layer 26 (the lower face in FIG. 97) is ground, and furthermore the metal film 25 is removed to expose, as shown in FIG. 98, the substrate 41 remaining on the first face 15a.

Figure 99:
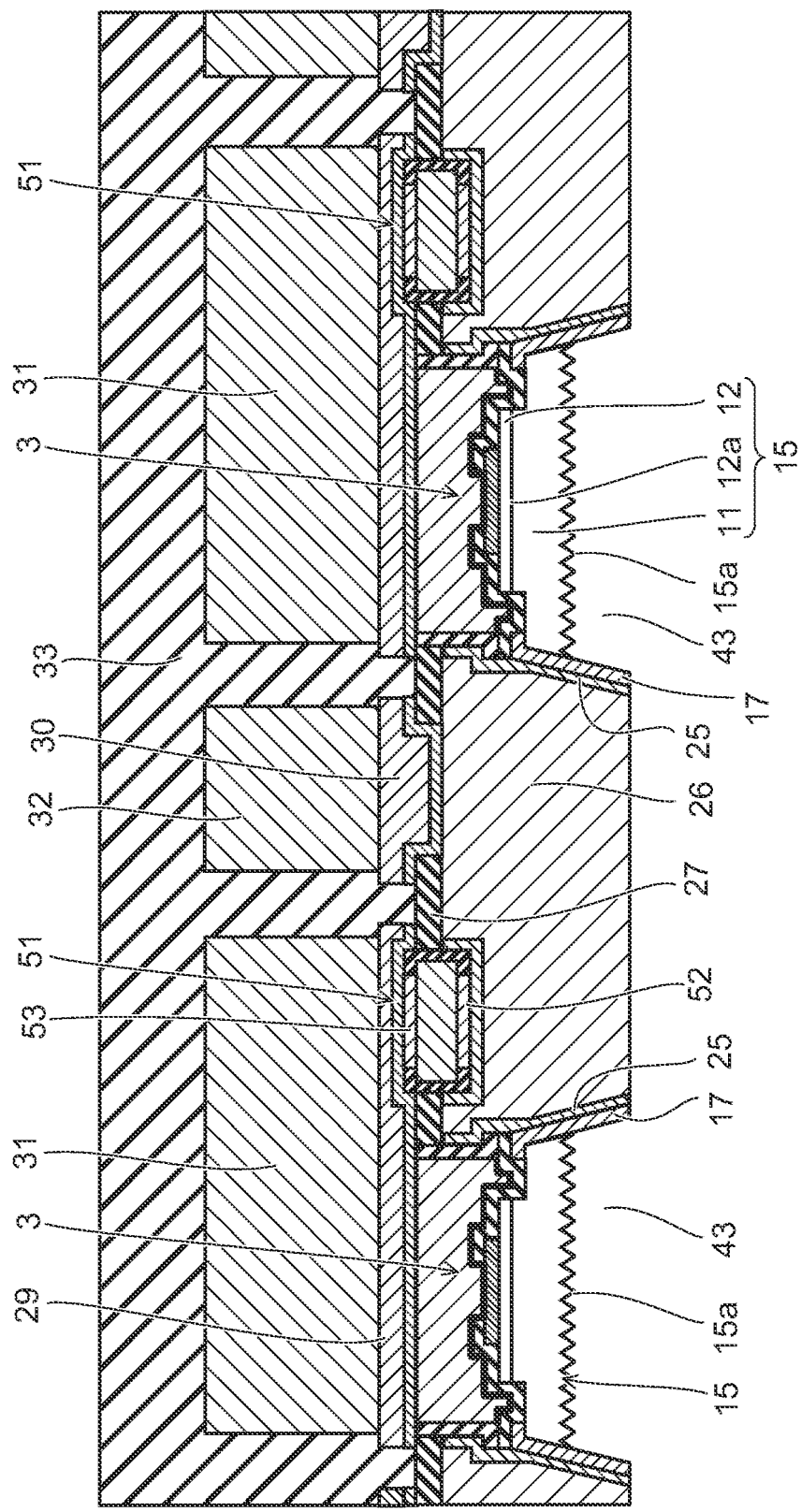

Next, by wet etching or dry etching, the substrate 41 is removed. By the removal of the substrate 41, as shown in FIG. 99, on the first face 15a, the space 43 surrounded by the n-side electrode 17 is formed. After that, the first face 15a is subjected to frost processing.

Figure 100:
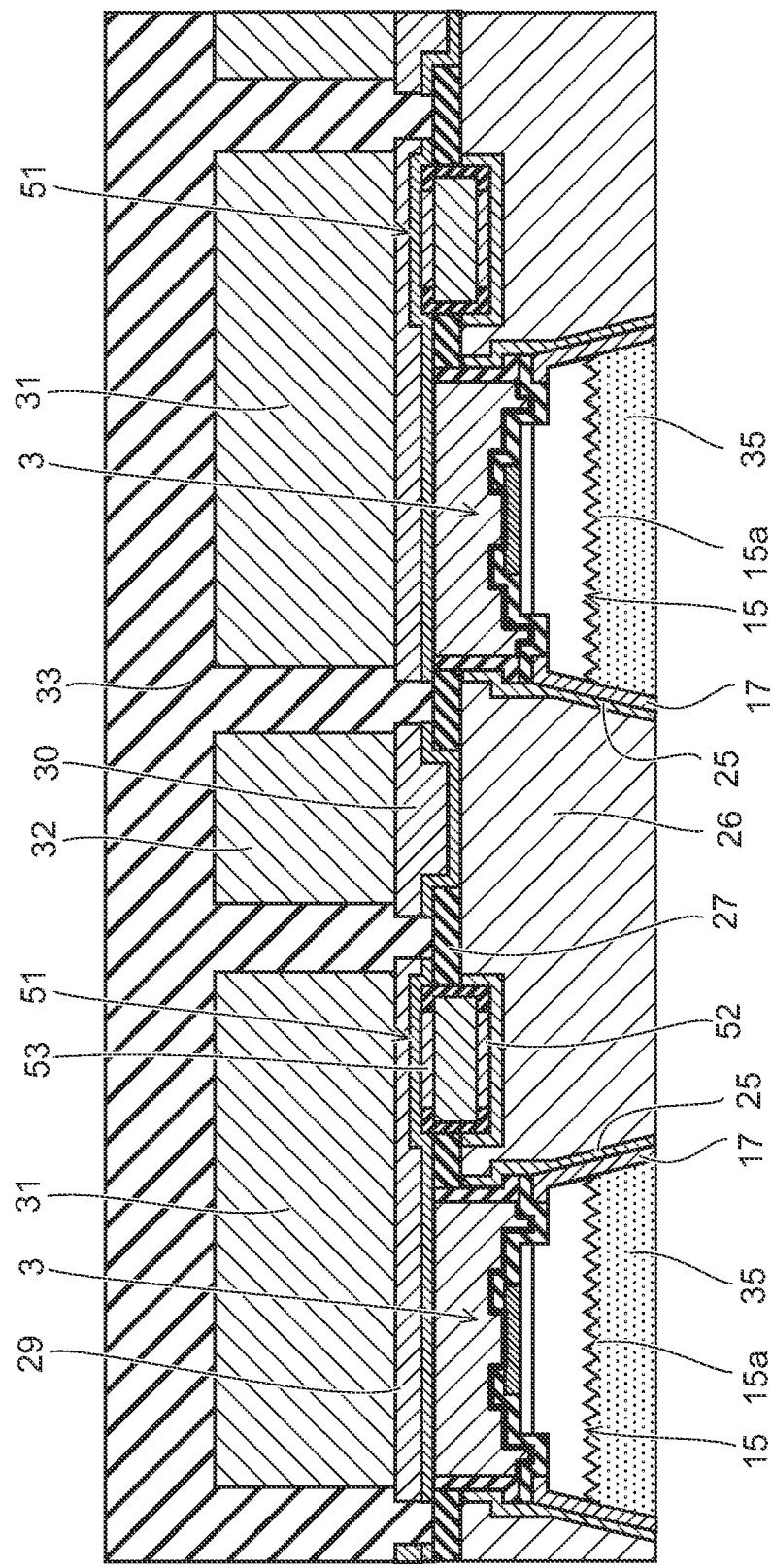

After the frost processing, in the space 43, as shown in FIG. 100, the phosphor layer 35 is embedded. The formation of the phosphor layer 35 only on the first face 15a is possible, and the utilization efficiency of the material is good.

The surface of the resin layer 33 is ground to expose, as shown in FIG. 87, the p-side external terminal 31a and the n-side external terminal 32a.

Then, in an intended position, the resin layer 33, the insulating layer 27 and the first n-side metal layer 26 are diced and separated into pieces of the semiconductor light emitting device 1f shown in FIG. 87.

The mounting position of the varistor 51 on the film 38 in the process in FIG. 88A does not require high positional preciseness, and the productivity can be heightened to achieve cost lowering.

Seventh Embodiment

Figure 101:
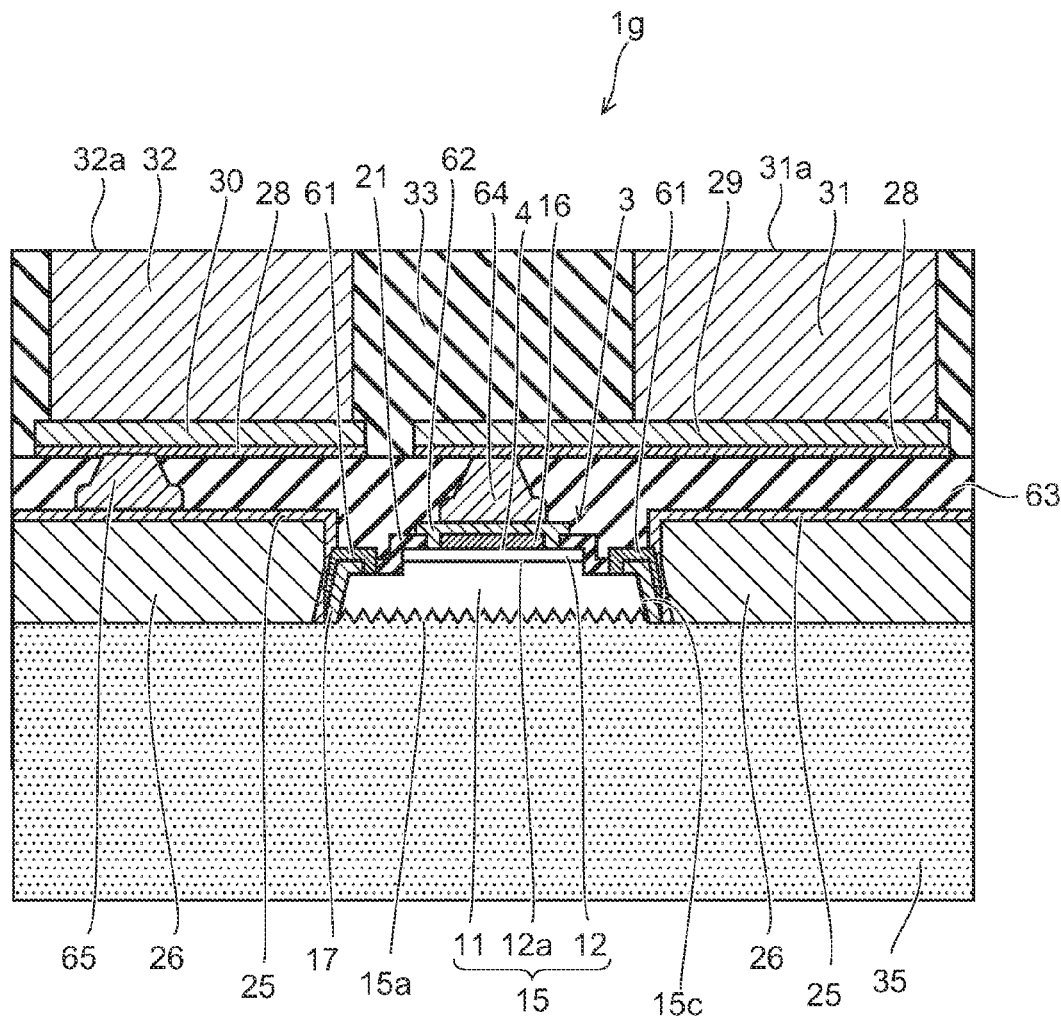
FIG. 101 is a schematic cross-sectional view of a semiconductor light emitting device of a seventh embodiment.

FIG. 101 is a schematic cross-sectional view of a semiconductor light emitting device 1g of a seventh embodiment.

The semiconductor light emitting device 1g has the chip 3, a package part (or a wiring part) that is thicker and larger in a planar size than the chip 3, and the phosphor layer 35.

On the region 4 including the light emitting layer 12a in the second face of the semiconductor layer 15, the p-side electrode 16 is provided. The p-side electrode 16 is covered with a p-side barrier metal 62.

On the side face 15c of the semiconductor layer 15, the n-side electrode 17 is provided. The n-side electrode 17 is covered with an n-side barrier metal 61.

A step between the n-side barrier metal 61 and the p-side barrier metal 62 in the second face is covered with the insulating film 21.

In the seventh embodiment, as the first p-side metal layer, a p-side stud bump 64 is provided on the p-side electrode 16. The p-side stud bump 64 is connected electrically with the p-side electrode 16 via the p-side barrier metal 62.

Around the n-side electrode 17 and the n-side barrier metal 61, the first n-side metal layer 26 is provided. The first n-side metal layer 26 is thicker than the chip 3, and surrounds continuously the periphery of the side face 15c of the semiconductor layer 15, the n-side electrode 17 and the n-side barrier metal 61.

The first n-side metal layer 26 contains copper that is formed, for example, by an electrolytic plating method. The metal film 25 that is a seed metal in plating is provided between the first n-side metal layer 26 and the n-side barrier metal 61, and between the first n-side metal layer 26 and the n-side electrode 17. The metal film 25 is also provided on the surface of the first n-side metal layer 26 (the upper face in FIG. 101).

On the metal film 25 in the peripheral region of the semiconductor layer 15 (the chip 3), an n-side stud bump 65 is provided. The n-side stud bump 65 is connected electrically with the first n-side metal layer 26 via the metal film 25.

On the first n-side metal layer 26, via the metal film 25, an insulating layer 63 is provided. The insulating layer 63 is, for example, a resin layer. Alternatively, as the insulating layer 63, an inorganic material may be used. The insulating layer 63 is also provided on the n-side barrier metal 61, on the insulating film 21, on the p-side barrier metal 62, on the periphery of the p-side stud bump 64, and on the periphery of the n-side stud bump 65.

The surface of the insulating layer 63, the upper face of the n-side stud bump 65, and the upper face of the p-side stud bump 64 configure a flush and flat face.

On the surface of the insulating layer 63, the second p-side metal layer 29 is provided. The second p-side metal layer 29 is provided, extending from directly on the chip 3 onto the peripheral region of the chip 3, and has an area larger than the area of the p-side electrode 16 and the area of the p-side barrier metal 62.

The second p-side metal layer 29 contains copper that is formed, for example, by an electrolytic plating method. The metal film 28 that works as a seed metal in the plating is provided between the second p-side metal layer 29 and the insulating layer 63. The second p-side metal layer 29 is connected electrically, via the metal film 28, with the p-side stud bump 64.

On the insulating layer 63, the second n-side metal layer 30 is provided, separated relative to the second p-side metal layer 29. The second n-side metal layer 30 contains copper that is formed, for example, by an electrolytic plating method. The metal film 28 that is a seed metal in the plating is provided between the second n-side metal layer 30 and the insulating layer 63.

The second n-side metal layer 30 is provided on the n-side stud bump 65, in the peripheral region of the semiconductor layer 15 (the chip 3). The second n-side metal layer 30 is connected electrically, via the metal film 28, the n-side stud bump 65 and the metal film 25, with the first n-side metal layer 26.

On the face opposite to the insulating layer 63 in the second p-side metal layer 29, the third p-side metal layer (or the p-side metal pillar) 31 is provided. On the face opposite to the insulating layer 63 in the second n-side metal layer 30, the third n-side metal layer (or the n-side metal pillar) 32 is provided.

On the insulating layer 63, as the second insulating layer, the resin layer 33 is provided. The resin layer 33 covers the periphery of the second p-side metal layer 29, the periphery of the third p-side metal layer 31, the periphery of the second n-side metal layer 30, and the periphery of the third n-side metal layer 32.

Faces other than the connection face with the third p-side metal layer 31 in the second p-side metal layer 29, and faces other than the connection face with the third n-side metal layer 32 in the second n-side metal 30 are covered with the resin layer 33. Moreover, the resin layer 33 is provided, being filled between the third p-side metal layer 31 and the third n-side metal layer 32 to cover the side face of the third p-side metal layer 31 and the side face of the third n-side metal layer 32.

The face opposite to the second p-side metal layer 29 in the third p-side metal layer 31 is not covered with the resin layer 33 but is exposed, and functions as the p-side external terminal 31a joined to the mounting substrate. The face opposite to the second n-side metal layer 30 in the third n-side metal layer 32 is not covered with the resin layer 33 but is exposed, and functions as the n-side external terminal 32a joined to the mounting substrate.

The p-side stud bump 64, the second p-side metal layer 29 and the third p-side metal layer 31 as the first p-side metal layer form a p-side wiring part that connects electrically between the p-side external terminal 31a and the p-side electrode 16.

The first n-side metal layer 26, the n-side stud bump 65, the second n-side metal layer 30 and the third n-side metal layer 32 form an n-side wiring part that connects between the n-side external terminal 32a and the n-side electrode 17.

On the first face 15a of the semiconductor layer 15, the phosphor layer 35 is provided. The semiconductor light emitting device 1g may emit a mixed light of the light from the light emitting layer 12a and the wavelength-converted light by the phosphor layer 35.

In the semiconductor light emitting device 1g of the seventh embodiment, too, the n-side electrode 17 is provided on the side face 15c of the semiconductor layer 15. Consequently, the area of the region 4 including the light emitting layer 12a that is a region in which the p-side electrode 16 is provided can be made large, to make it possible to assure a large light-emitting face while achieving the reduction of the planar size of the chip 3.

Heat generated in the light emitting layer 12a is conducted through the metallic body on the p-side (the wiring part) including the p-side electrode 16, the p-side barrier metal 62, the p-side stud bump 64, the metal film 28, the second p-side metal layer 29 and the third p-side metal layer 31, and, furthermore, is dissipated from the p-side external terminal 31a joined with the mounting substrate by solder etc. to the mounting substrate. Since the p-side metallic body (the wiring part) is provided on the second face with a larger area and larger thickness than the chip 3, a high heat dissipation performance can be obtained.

Moreover, the heat generated in the light emitting layer 12a is conducted through the metallic body on the n-side (the wiring part) including the n-side electrode 17, the n-side barrier metal 61, the metal film 25, the first n-side metal layer 26, the n-side stud bump 65, the metal film 28, the second n-side metal layer 30, and the third n-side metal layer 32, and furthermore is dissipated from the n-side external terminal 32a joined with the mounting substrate by solder etc. to the mounting substrate. The dissipation route includes the first n-side metal layer 26 provided around the chip 3 and being larger in area and thicker than the chip 3. Accordingly, a heat dissipation performance from the side face side of the chip 3 is also high.

Next, with reference to FIGS. 102A to 108, a method for manufacturing the semiconductor light emitting device 1g of the seventh embodiment will be explained.

Figure 102A:
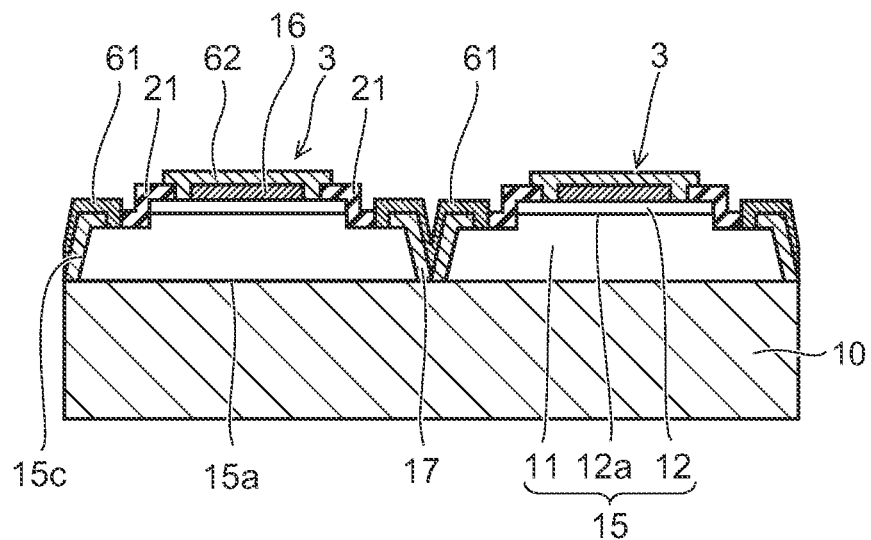

Up to the formation of the p-side electrode 16, the n-side electrode 17 and the insulating film 21, the method is advanced in the same manner as in the first embodiment. And, in the seventh embodiment, as shown in FIG. 102A, on the p-side electrode 16, the p-side barrier metal 62 is formed. The p-side barrier metal 62 covers and protects the upper face and the side face of the p-side electrode 16. Furthermore, on the n-side electrode 17 and the side face of the n-side electrode 17, the n-side barrier metal 61 is formed. The n-side barrier metal 61 covers and protects the upper face and the side face of the n-side electrode 17.

Figure 102B:
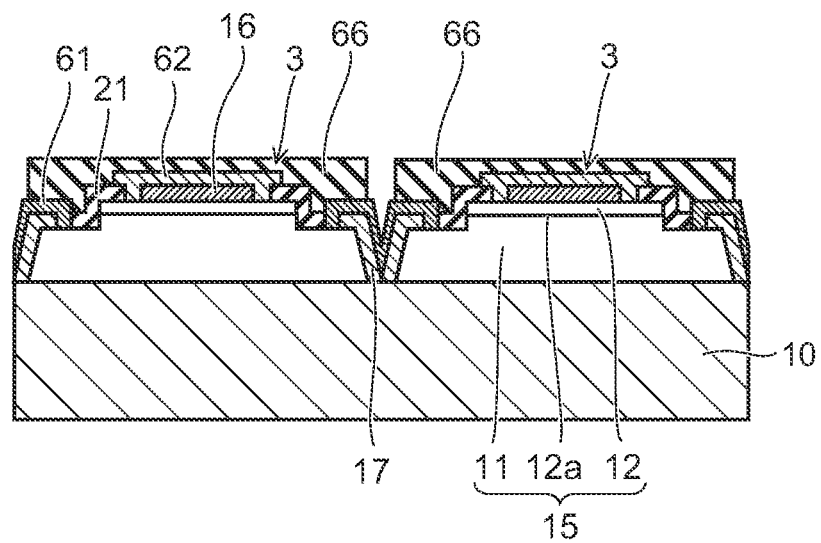

Next, as shown in FIG. 102B, on the chip 3, an insulating film 66 is formed. The insulating film 66 covers the n-side barrier metal 61, the p-side barrier metal 62 and the insulating film 21. The upper face of the insulating film 66 is made flat. The insulating film 66 is made, for example, of a photosensitive polyimide.

Figure 103A:
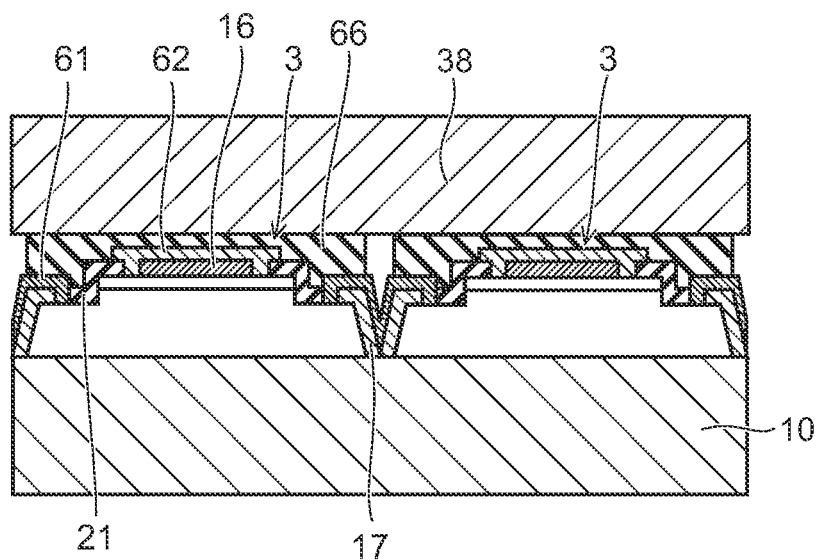
Figure 103B:
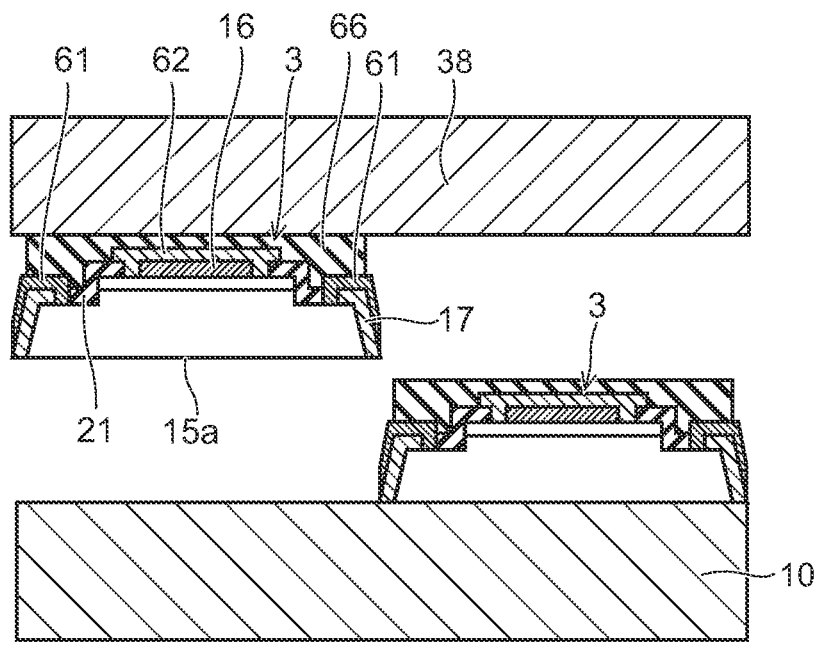

Next, as shown in FIG. 103A, to the upper face of the insulating film 66, as a support, for example, a film (or a sheet) 38 made of a resin is attached. Then, as shown in FIG. 103B, the target chip 3 selected from chips 3 on the substrate 10 is removed from on the substrate 10 and is transferred to the film 38. The substrate 10 that is a sapphire substrate can be separated from the semiconductor layer 15 by a laser liftoff method.

Next, as shown in FIG. 104A, in the exposed part on the film 38, the metal film 25 that functions as a seed metal in plating is formed. Then, Cu electrolytic plating using the metal film 25 as a current path is performed.

Consequently, as shown in FIG. 104B, on the metal film 25, the first n-side metal layer 26 is formed. The first n-side metal layer 26 is formed on the periphery of the chip 3 and on the first face 15a. The surface of the first n-side metal layer 26 (the lower face in FIG. 104B) is ground, if necessary, to be flattened as shown in FIG. 105A.

Figures 105A, 105B:
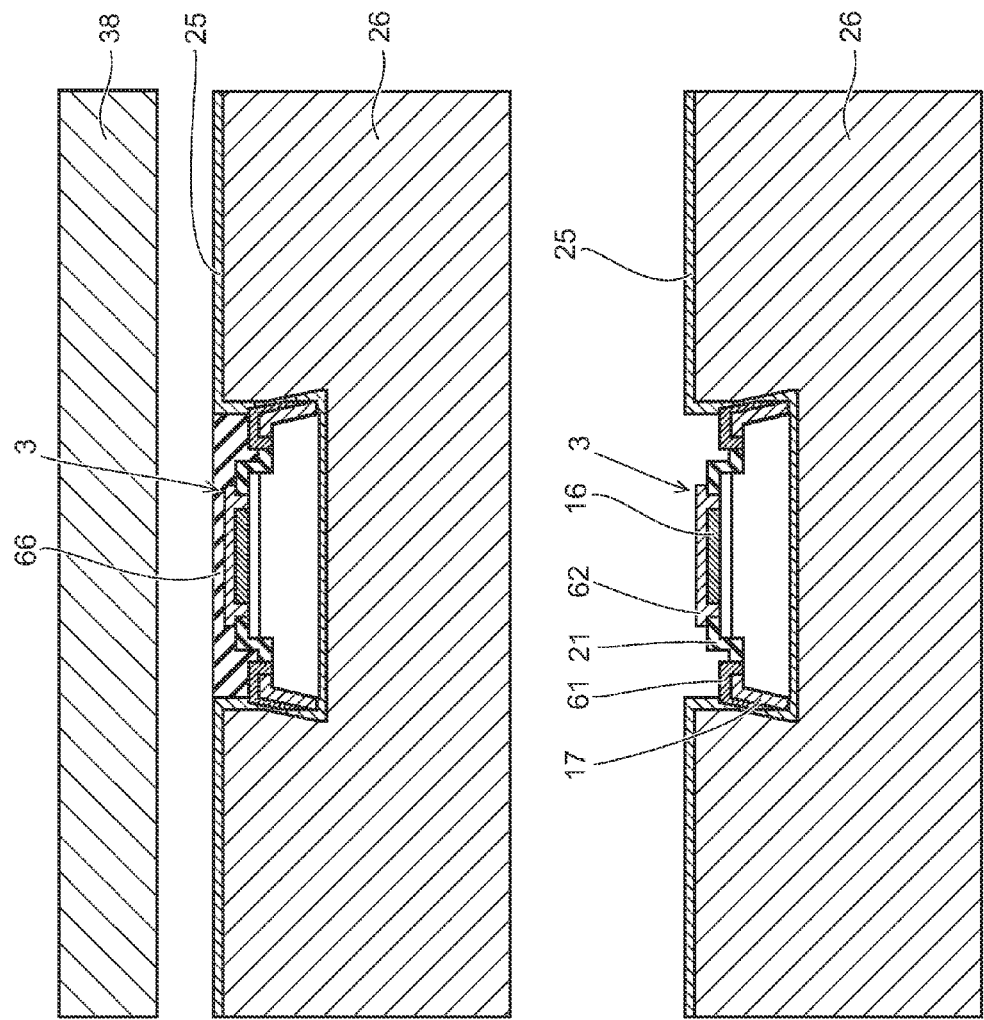

After the formation of the first n-side metal layer 26, as shown in FIG. 105A, the film 38 is peeled. By the peeling of the film 38, surfaces of the metal film 25 and the insulating film 66 are exposed.

Then, the insulating film 66 is removed, for example, by an ashing method using oxygen. Consequently, as shown in FIG. 105B, the upper face of the p-side barrier metal 62 is exposed. Alternatively, the whole insulating film 66 is not necessarily removed, but an opening may be formed in the insulating film 66 on the p-side barrier metal 62 to expose the upper face of the p-side barrier metal 62.

Next, as shown in FIG. 106A, on the p-side barrier metal 62, the p-side stud bump 64 is formed. Moreover, on the metal film 25 in the peripheral region of the chip 3, the n-side stud bump 65 is formed.

Next, as shown in FIG. 106B, after the formation of the insulating layer 63 on the metal film 25, the upper face of the insulating layer 63 is flattened. The upper face of the p-side stud bump 64 and the upper face of the n-side stud bump 65 are also flattened, and are exposed from the insulating layer 63. The insulating layer 63 covers the periphery of the p-side stud bump 64 and the periphery of the n-side stud bump 65.

Figure 107:
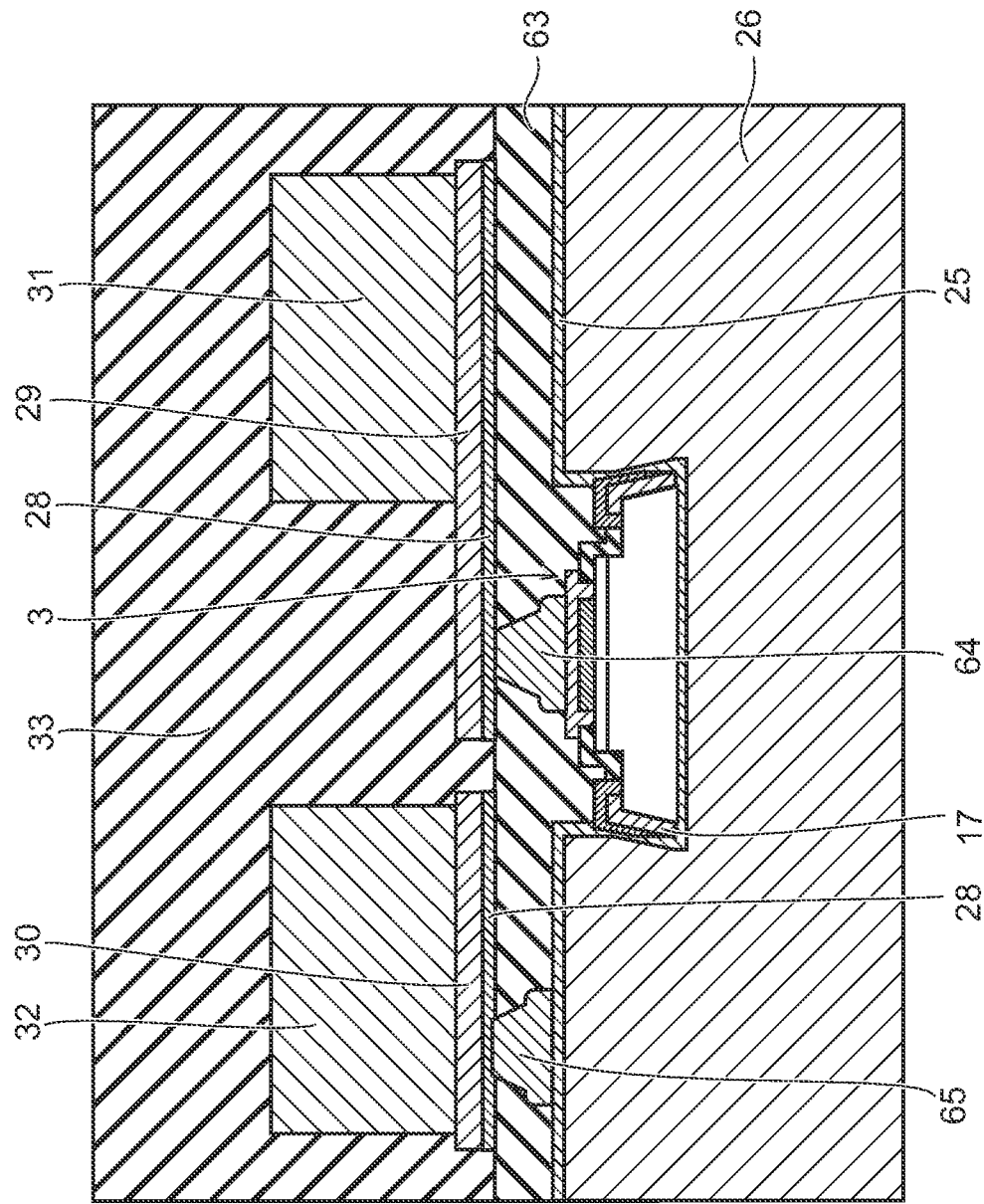

Next, as shown in FIG. 107, on the surface of the insulating layer 63, the upper face of the p-side stud bump 64 and the upper face of the n-side stud bump 65, the metal film 28 that functions as a seed metal in the plating is formed. Then, in the same manner as in the first embodiment, by Cu electrolytic plating using the metal film 28 as a current path, on the metal film 28, the second p-side metal layer 29 and the second n-side metal layer 30 are formed. Furthermore, by Cu electrolytic plating using the metal film 28 as a current path, the third p-side metal layer 31 is formed on the second p-side metal layer 29, and the third n-side metal layer 32 is formed on the second n-side metal layer 30.

After the removal of the resist having been used in the plating, furthermore, the exposed part of the metal film 28 having been used as the seed metal is removed. Then, on the insulating layer 63, the resin layer 33 is formed. The resin layer 33 covers the insulating layer 63, the second p-side metal layer 29, the second n-side metal layer 30, the third p-side metal layer 31, and the third n-side metal layer 32.

Figure 108:
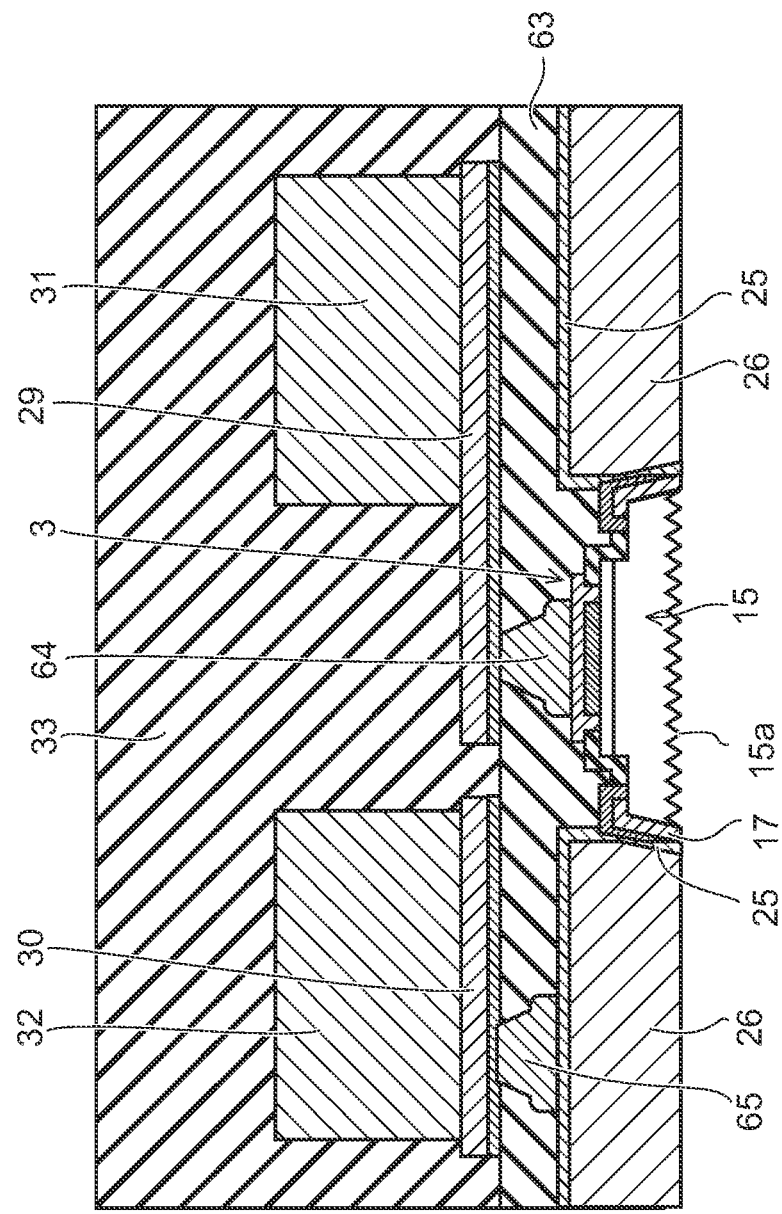

Next, the surface of the first n-side metal layer 26 (the lower face in FIG. 107) is ground to expose the metal film 25 on the first face 15a, and furthermore the metal film 25 is removed to expose, as shown in FIG. 108, the first face 15a. The exposed first face 15a is cleaned and, after that, is subjected to frost processing for forming irregularities.

After the frost processing, as shown in FIG. 101, on the first face 15a and on the first n-side metal layer 26, the phosphor layer 35 is formed.

The surface of the resin layer 33 is ground to expose the p-side external terminal 31a and the n-side external terminal 32a.

Then, in a position between a chip 3 and another chip 3, the resin layer 33, the insulating layer 63, the metal film 25, the first n-side metal layer 26, and the phosphor layer 35 are diced and separated into pieces of the semiconductor light emitting device 1g shown in FIG. 101.

In the dicing region, no semiconductor layer 15 is provided, but, for example, a resin and metal that are more flexible than the GaN-based semiconductor layer 15 are provided. Consequently, damage that is given to the semiconductor layer 15 in the dicing can be avoided.

Respective processes before the dicing are performed collectively in a wafer state. Accordingly, there is no necessity to perform a formation of a support, a formation of a wiring part, a formation of a radiator and the protection of the chip 3 for every chip 3 after the dicing, which makes a considerable cost reduction possible.

Eighth Embodiment

Figure 109:
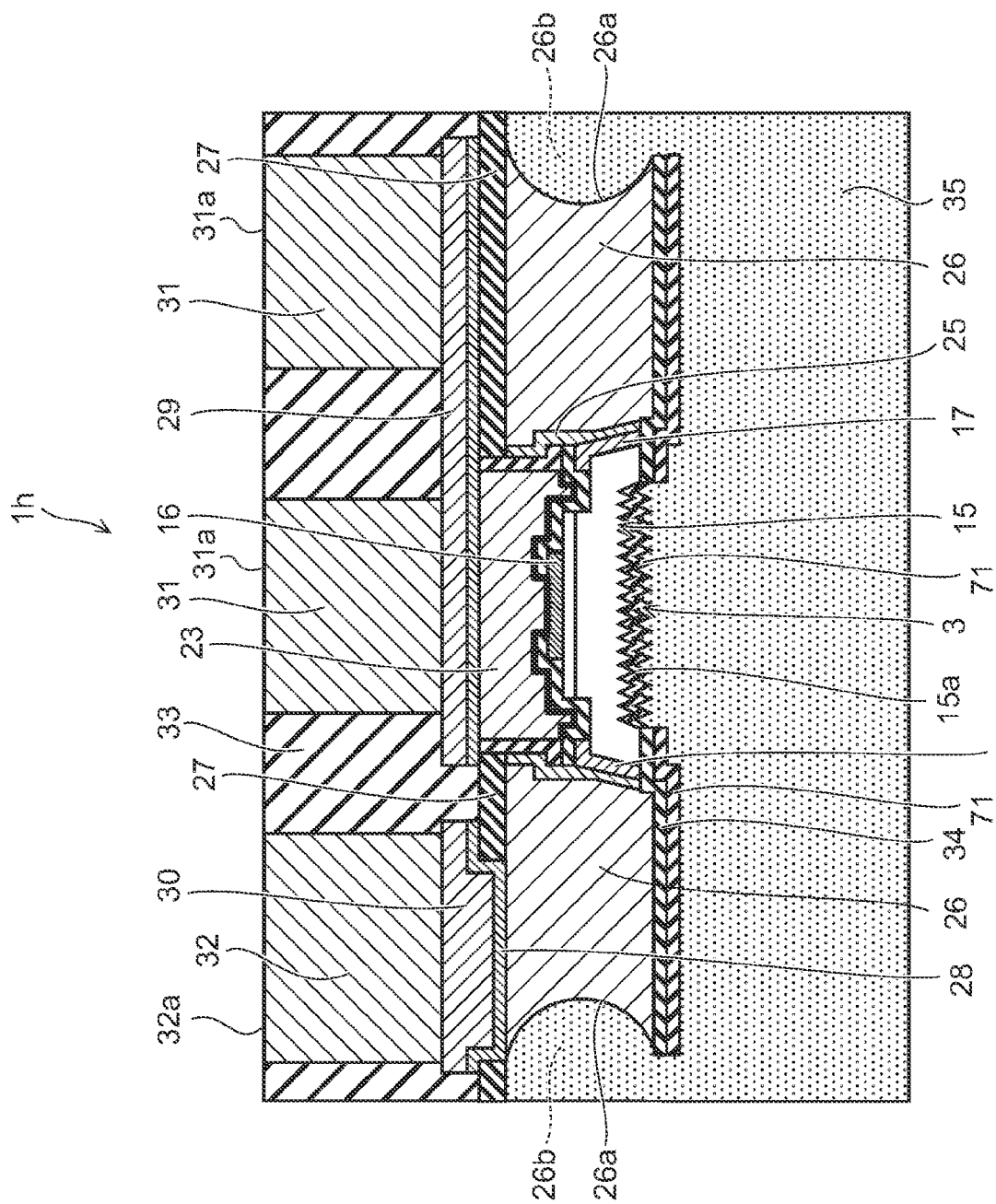
FIG. 109 is a schematic cross-sectional view of a semiconductor light emitting device of an eighth embodiment.

FIG. 109 is a schematic cross-sectional view of a semiconductor light emitting device 1h of an eighth embodiment.

In the semiconductor light emitting device 1h, the phosphor layer 35 is provided also on the side face 26a of the first n-side metal layer 26.

Consequently, the light emitted (leaked) from the side face of the semiconductor layer 15 can be made to enter the phosphor layer 35 provided on the side face 26a of the first n-side metal layer 26, to make the suppression of chromaticity unevenness possible.

In the semiconductor light emitting device 1h of the eighth embodiment, on the second p-side metal layer 29, a plurality of third p-side metal layers 31 are provided. Between the plurality of third p-side metal layers 31, too, the resin layer 33 is provided, and the resin layer 33 reinforces the plurality of third p-side metal layers 31.

Figure 110:
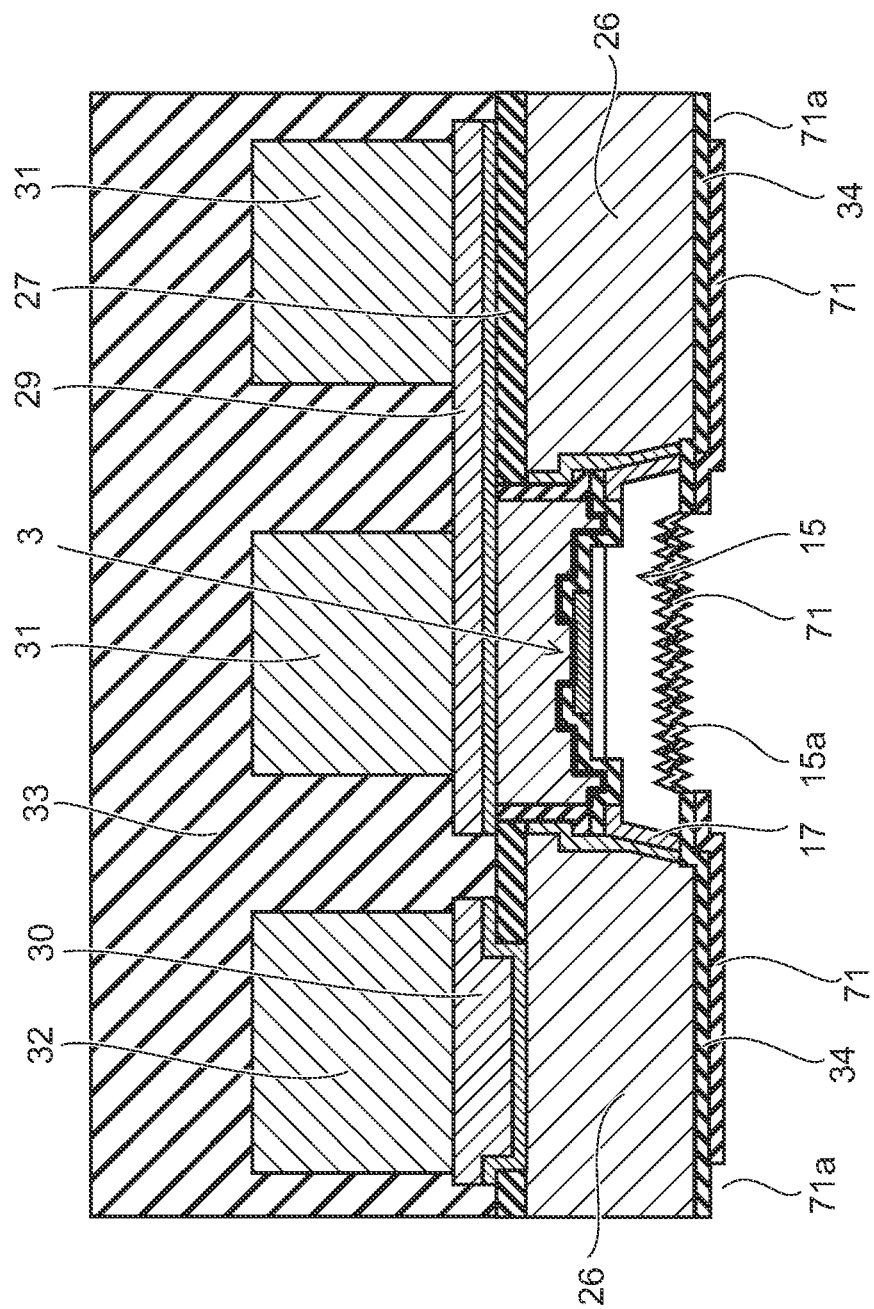
FIGS. 110 to 112 are schematic cross-sectional views showing a method for manufacturing the semiconductor light emitting device of the eighth embodiment.
Figure 111:
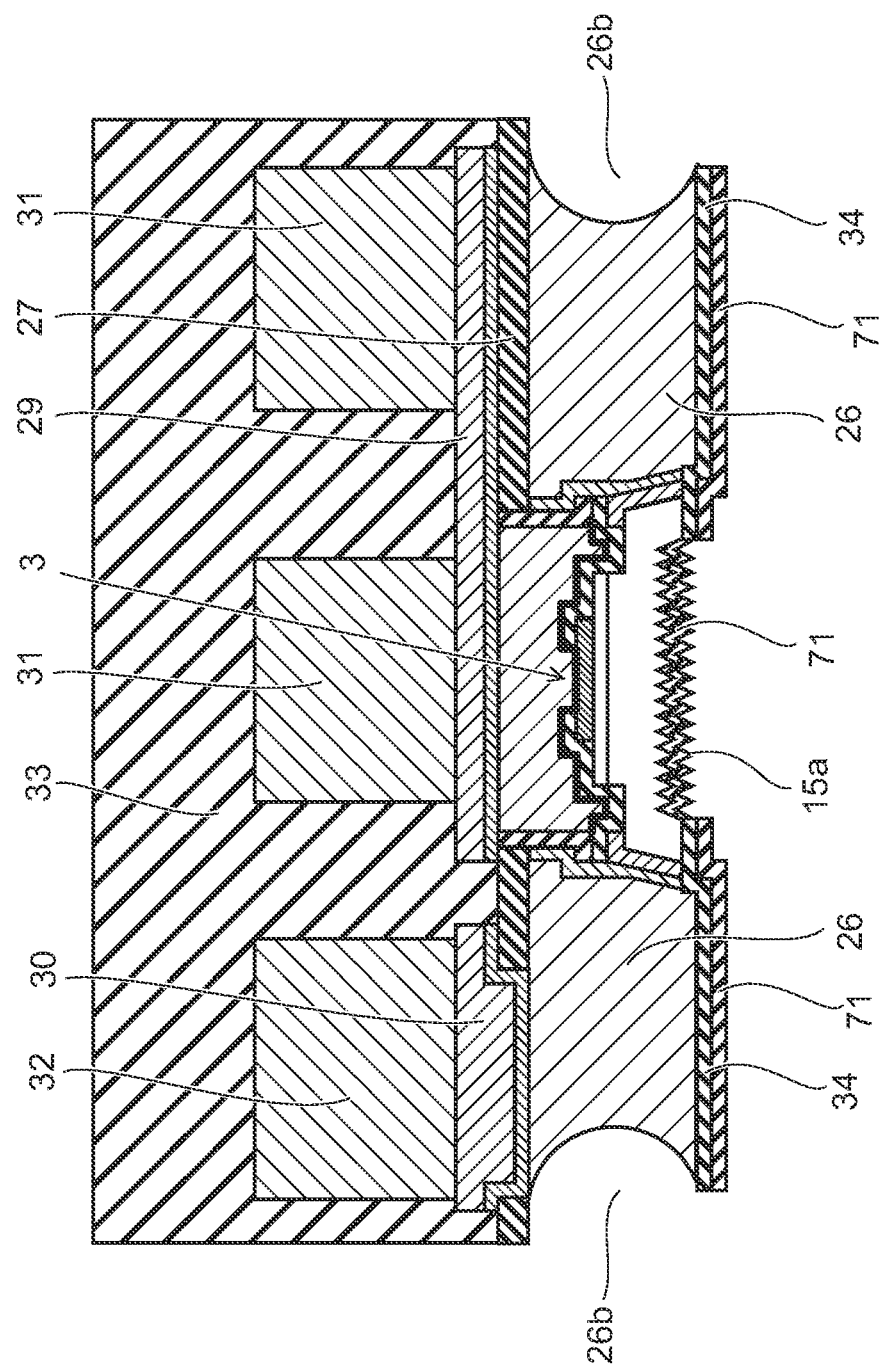

Next, with reference to FIGS. 110 to 112, a method for manufacturing the semiconductor light emitting device 1h of the eighth embodiment will be explained.

The method is advanced until the process shown in FIG. 14 in the first embodiment in the same manner as in the first embodiment. After that, as shown in FIG. 110, on the surface of the protection film 34 and the first face 15a, a hard mask 71 that functions as an etching mask is formed. The hard mask 71 is, for example, a silicon nitride film.

The hard mask 71 is patterned and has an opening 71a. And, the protection film 34 exposed from the opening 71a is removed selectively, and the surface of the first n-side metal layer 26 is exposed in the opening 71a.

Then, through the opening 71a, for example, the first n-side metal layer 26 containing, for example, copper is subjected to wet etching. Consequently, as shown in FIG. 111, concave 26b is formed in the first n-side metal layer 26.

Figure 112:
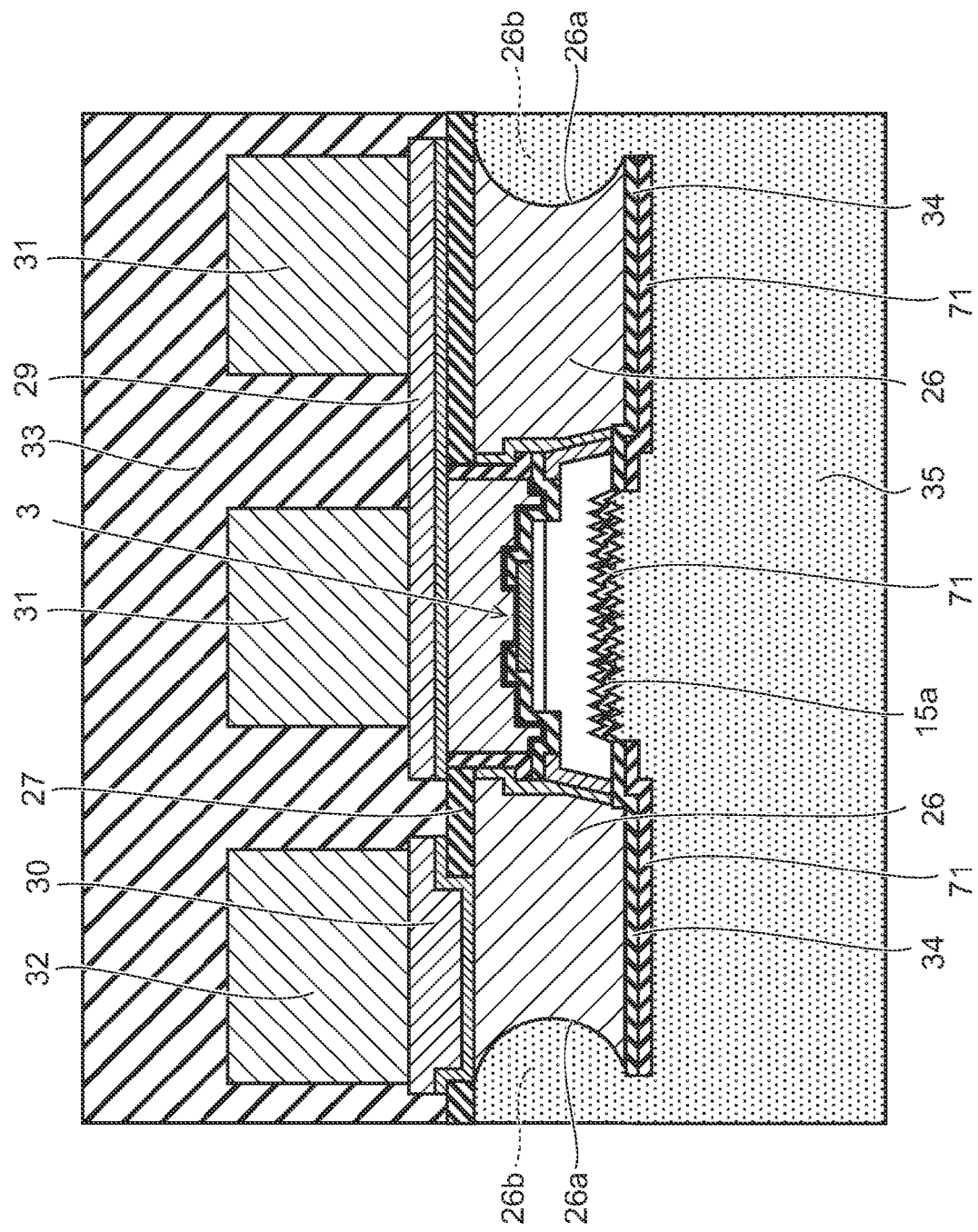

Then, as shown in FIG. 112, on the hard mask 71 and the concave 26b, the phosphor layer 35 is formed.

After that, the resin layer 33 is ground to expose, as shown in FIG. 109, the p-side external terminal 31a and the n-side external terminal 32a.

After that, in the position of the concave 26b, the phosphor layer 35, the insulating layer 27 and the resin layer 33 are diced and separated into pieces of the semiconductor light emitting device 1h shown in FIG. 109.

On the first face 15a, the hard mask 71 is left, but, for example, a silicon nitride film that is used as the hard mask 71 is transparent to the emitting light of the light emitting layer 12a. Therefore, it does not disturb the light extraction.

Rather, for the first face 15a containing, for example, gallium nitride, when a silicon nitride film having a refractive index between refractive indices of the gallium nitride and air is provided, a large change of refractive indices of media in the light extraction direction through the first face 15a can be inhibited to improve the light extraction efficiency.

According to at least one of the abovementioned embodiments, it is possible, while miniaturizing chips, to achieve a structure excellent in heat dissipation performance and mechanical strength with high productivity, and to provide semiconductor light emitting devices of low cost and high reliability.

As phosphor layers, red phosphor layers, yellow phosphor layers, green phosphor layers, and blue phosphor layers that are illustrated below can be used.

The red phosphor layer can contain, for example, a nitride-based phosphor $CaAlSiN_3$:Eu, or a sialon-based phosphor.

When a sialon-based phosphor is used, in particular:

$$(M_{1-x},R_x)_{a1}AlSi_{b1}O_{c1}N_{d1} \quad \text{composition formula (1)}$$

(M is at least one kind of metal element excluding Si and Al, in particular, at least one of Ca and Sr is desirable. R is an emission center element, in particular, Eu is desirable. x, a1, b1, c1 and d1 satisfy the following relation. $0<x\le1$, $0.6<a1<0.95$, $2<b1<3.9$, $0.25<c1<0.45$, $4<d1<5.7$) may be used.

The use of the sialon-based phosphor shown by the composition formula (1) can improve temperature characteristics of the wavelength conversion efficiency, and can furthermore improve the efficiency in large current density regions.

The yellow phosphor layer can contain, for example, a silicate-based phosphor $(Sr,Ca,Ba)_2SiO_4$:Eu.

The green phosphor layer can contain, for example, a holophosphoric acid-based phosphor $(Ba,Ca,Mg)_{10}(PO_4)_6.Cl_2$:Eu, or a sialon-based phosphor.

When a sialon-based phosphor is used, in particular:

$$(M_{1-x},R_x)_{a2}AlSi_{b2}O_{c2}N_{d2} \quad \text{composition formula(2)}$$

(M is at least one kind of metal element excluding Si and Al, in particular, at least one of Ca and Sr is desirable. R is an emission center element, in particular, Eu is desirable. x, a2, b2, c2 and d2 satisfy the following relation. $0<x\le1$, $0.93<a2<1.3$, $4.0<b2<5.8$, $0.6<c2<1$, $6<d2<11$) can be used.

The use of the sialon-based phosphor shown by the composition formula (2) can improve temperature characteristics of the wavelength conversion efficiency, and can furthermore improve the efficiency in large current density regions.

The blue phosphor layer can contain, for example, an oxide-based phosphor $BaMgAl_{10}O_{17}$:Eu.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, comprising:

forming a first p-side metal layer connected electrically with a p-side electrode on the p-side electrode in a plurality of chips separated on a substrate, each of the plurality of chips including a semiconductor layer including a first face, a second face opposite to the first face, a side face and a light emitting layer, the p-side electrode provided on the second face and an n-side electrode provided on the side face;

transferring a target chip among the plurality of chips to a support;

forming a first n-side metal layer connected electrically with the n-side electrode on a periphery of the n-side electrode on the support;

removing the support and forming a first insulating layer on a surface of the first n-side metal layer from which the support has been removed;

forming a second p-side metal layer connected electrically with the first p-side metal layer on the first p-side metal layer and extending onto the first insulating layer in a first peripheral region of the semiconductor layer; and forming a second n-side metal layer provided on the first n-side metal layer in a second peripheral region of the semiconductor layer and penetrating through the first insulating layer to be connected electrically with the first n-side metal layer, the second peripheral region being opposite the first peripheral region.

2. The method according to claim 1, wherein:

a trench separating the plurality of semiconductor layers is also formed on a surface of the substrate, and a concave part and a convex part are formed on the surface of the substrate;

the side face of the semiconductor layer faces the trench;

a side face between the concave part and the convex part faces the trench;

the n-side electrode is formed on the side face of the semiconductor layer and on the side face between the concave part and the convex part;

the substrate is ground from a rear face side until reaching the trench to thereby separate the chip into a plurality of parts and the first p-side metal layer side is supported by the support;

the substrate remaining on the first face is removed to form a space surrounded by the n-side electrode on the first face; and a phosphor layer is formed in the space.

3. The method according to claim 1, wherein:

after the removal of the support, a surface of the first p-side metal layer is protruded from a surface of the first n-side metal layer to form a step between the surface of the first p-side metal layer and the surface of the first n-side metal layer;

the first insulating layer is formed on the surface of the first p-side metal layer and on the surface of the first n-side metal layer so as to cover the step; and the first insulating layer on the surface of the first p-side metal layer is removed to expose the surface of the first p-side metal layer, while the first insulating layer is left on the surface of the first n-side metal layer.

4. The method according to claim 1, wherein the target chip is supported by the support on the first p-side metal layer side before the transferring of the target chip.

5. The method according to claim 1, further comprising removing the substrate from the target chip.

6. The method according to claim 1, wherein the first n-side metal layer has a first portion and a second portion, the second p-side metal layer overlaps the first portion with the first insulating layer being interposed between the second p-side metal layer and the first portion, the second n-side metal layer is formed on the second portion.

* * * * *